(12) United States Patent
Inasaki et al.

(10) Patent No.: US 9,563,121 B2
(45) Date of Patent: Feb. 7, 2017

(54) ACTINIC RAY-SENSITIVE OR RADIATION-SENSITIVE RESIN COMPOSITION, AND, ACTINIC RAY-SENSITIVE OR RADIATION-SENSITIVE FILM AND PATTERN FORMING METHOD, EACH USING THE COMPOSITION

(71) Applicant: FUJIFILM Corporation, Minato-ku, Tokyo (JP)

(72) Inventors: Takeshi Inasaki, Haibara-gun (JP); Takeshi Kawabata, Haibara-gun (JP); Tomotaka Tsuchimura, Haibara-gun (JP); Toru Tsuchihashi, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/452,093

(22) Filed: Aug. 5, 2014

(65) Prior Publication Data

US 2014/0342275 A1    Nov. 20, 2014

Related U.S. Application Data

(63) Continuation of application No. PCT/JP2013/056378, filed on Mar. 1, 2013.

(30) Foreign Application Priority Data

Mar. 5, 2012   (JP) ................. 2012-048562

(51) Int. Cl.
| | | |
|---|---|---|
| *C08F 212/12* | (2006.01) | |
| *G03F 7/039* | (2006.01) | |
| *G03F 7/20* | (2006.01) | |
| *G03F 7/038* | (2006.01) | |
| *C08F 212/14* | (2006.01) | |
| *C08F 12/22* | (2006.01) | |
| *C08F 12/24* | (2006.01) | |
| *C08F 8/02* | (2006.01) | |
| *C09D 125/18* | (2006.01) | |
| *G03F 1/00* | (2012.01) | |
| *G03F 7/00* | (2006.01) | |
| *C08F 261/02* | (2006.01) | |
| *C08F 12/30* | (2006.01) | |

(52) U.S. Cl.
CPC ............. *G03F 7/0388* (2013.01); *C08F 8/02* (2013.01); *C08F 12/22* (2013.01); *C08F 12/24* (2013.01); *C08F 212/14* (2013.01); *C08F 261/02* (2013.01); *C09D 125/18* (2013.01); *G03F 1/00* (2013.01); *G03F 7/0002* (2013.01); *G03F 7/0392* (2013.01); *G03F 7/0397* (2013.01); *G03F 7/20* (2013.01); *C08F 12/30* (2013.01)

(58) Field of Classification Search
CPC ...... G03F 7/004; G03F 7/0045; G03F 7/0392; G03F 7/0397; G03F 7/20; C08F 212/12; C08F 212/14; C08F 212/24; C08F 212/32
See application file for complete search history.

(56) References Cited

U.S. PATENT DOCUMENTS

| | | | |
|---|---|---|---|
| 6,042,997 A | 3/2000 | Barclay et al. | |
| 2004/0091817 A1 | 5/2004 | Komatsu et al. | |
| 2007/0178405 A1* | 8/2007 | Kanda et al. | ............. 430/270.1 |
| 2007/0206279 A1* | 9/2007 | Brueck et al. | ............... 359/391 |
| 2008/0090052 A1* | 4/2008 | Hori et al. | .................... 428/172 |
| 2010/0183975 A1* | 7/2010 | Takahashi et al. | ........ 430/270.1 |
| 2011/0171577 A1* | 7/2011 | Tsuchimura | .......... C07C 309/29 430/270.1 |
| 2012/0301817 A1 | 11/2012 | Inasaki et al. | |
| 2014/0099572 A1 | 4/2014 | Inasaki et al. | |

FOREIGN PATENT DOCUMENTS

| | | | |
|---|---|---|---|
| JP | 2004-158287 A | | 6/2004 |
| JP | 2005-157401 A | | 6/2005 |
| JP | 2008-162101 A | | 7/2008 |
| JP | 2009069630 A | | 4/2009 |
| JP | 2011175230 A | | 9/2011 |
| JP | 2013-020226 A | | 1/2013 |
| WO | WO 2010/035905 | * | 4/2010 |
| WO | WO 2011/093520 | * | 8/2011 |

OTHER PUBLICATIONS

Machine translation of JP 2009-069630, published on Apr. 2, 2009.*
International Search Report of PCT/JP2013/056378 dated Apr. 9, 2013, 2 pages.
Written Opinion of the International Searching Authority of PCT/JP2013/056378 dated Apr. 9, 2013, 4 pages.

(Continued)

*Primary Examiner* — Anca Eoff
(74) *Attorney, Agent, or Firm* — Sughrue Mion, PLLC

(57) ABSTRACT

An actinic ray-sensitive or radiation-sensitive resin composition contains a compound (P) that contains at least one phenolic hydroxyl group and at least one group in which a hydrogen atom of a phenolic hydroxyl group has been substituted with a group represented by the following General Formula (1) (in the formula, $M^{11}$ represents a single bond or a divalent linking group; $Q^{11}$ represents an alkyl group, a cycloalkyl group, or an aryl group).

[Chem. 1]

$$\left[ \begin{array}{c} H \\ | \\ -C- \\ | \\ \diagdown \end{array} -O-M^{11}-Q^{11} \right] \quad (1)$$

13 Claims, 2 Drawing Sheets

(56) References Cited

OTHER PUBLICATIONS

Notice of Reasons for Rejection, dated Dec. 16, 2014, issued in corresponding JP Application No. 2013-042984, 8 pages in English and Japanese.
Notice Requesting Submission of Opinion, mailed Jan. 6, 2015, issued in corresponding Korean Application No. 10-2014-7022942, 14 pages in English and Korean.
Notice of Reasons for Determination of Rejection, dated May 6, 2015, issued in corresponding Korean Application No. 10-2014-7022942, 7 pages in English and Korean.
Extended European Search Report dated Sep. 17, 2015 from the European Patent Office in counterpart European Application No. 13758306.8.

* cited by examiner

ACTINIC RAY-SENSITIVE OR RADIATION-SENSITIVE RESIN COMPOSITION, AND, ACTINIC RAY-SENSITIVE OR RADIATION-SENSITIVE FILM AND PATTERN FORMING METHOD, EACH USING THE COMPOSITION

CROSS-REFERENCE TO RELATED APPLICATIONS

This application is a Continuation of PCT International Application No. PCT/JP2013/056378, filed Mar. 1, 2013, which claims priority under 35 U.S.C. §119(a) to Japanese Patent Application No. 2012-048562, filed Mar. 5, 2012. Each of the above application(s) is hereby expressly incorporated by reference, in its entirety, into the present application.

BACKGROUND OF THE INVENTION

1. Field of the Invention

The present invention relates to an actinic ray-sensitive or radiation-sensitive resin composition, and, an actinic ray-sensitive or radiation-sensitive film and a pattern forming method, each using the composition. Particularly, the present invention relates to an actinic ray-sensitive or radiation-sensitive resin composition that is suitably used for a production process of VLSIs and high-capacity microchips, a fabrication process of molds for nanoimprint, an ultramicrolithography process applicable for a production process of high-density information recording media, and other photofabrication processes, and relates to an actinic ray-sensitive or radiation-sensitive film and a pattern forming method, each using the composition. More specifically, the present invention relates to an actinic ray-sensitive or radiation-sensitive resin composition that is suitably usable for microfabrication of semiconductor devices using an electron beam, X-rays, or EUV light, and relates to an actinic ray-sensitive or radiation-sensitive film and a pattern forming method, each using the composition.

2. Description of the Related Art

In the microfabrication using a resist composition, ultra-micro patterns are required to be formed since integrated circuits are increasingly highly integrated. Consequently, exposure wavelengths tend to be shortened, and for example, lithography techniques that use an electron beam, X-rays, or EUV light instead of excimer laser light are under development.

In electron beam (EB) lithography, it is known that the influence of electron scattering, that is, the influence of forward scattering in a resist film is diminished by increasing an accelerating voltage of an EB. Consequently, in recent years, the accelerating voltage of the EB has tended to increase. However, if the accelerating voltage of the EB is increased, while the influence of forward scattering is diminished, the influence of the scattering of electrons reflected in a resist substrate, that is, the influence of backward scattering is increased. The influence of backward scattering is particularly great when an independent line pattern having a large exposure area is formed. Accordingly, for example, if the accelerating voltage of the EB is increased, resolution of the independent line pattern is likely to deteriorate.

Particularly, in a case of forming patterns in photomask blanks used for semiconductor exposure, the lower layer of a resist film includes a light-shielding film that contains heavy atoms such as chromium, molybdenum, and tantalum. In this case, the influence of backward scattering caused by reflection from the lower layer of a resist is more marked compared to a case of coating a resist onto a silicon wafer. Consequently, when the independent line pattern is formed on the photomask blanks, there is a possibility that the pattern will be easily influenced particularly by the backward scattering and that the resolution will deteriorate.

Generally, a chemical amplification type positive resist is a photosensitive composition that contains a compound (photoacid generator) generating a strong acid by being irradiated with light and a compound that is turned into an alkali-soluble substance due to the decomposition of a hydrophobic acid labile group caused by the catalytic action of the generated acid. In some cases, this photosensitive composition further contains a basic compound to inhibit a dark reaction in an unexposed portion. Due to this basic compound, the acid generated by the influence of scattered electrons is deactivated by a neutralization reaction, whereby film reduction in an unexposed portion can be inhibited. However, if an acetal group having low activation energy of an acid degradation reaction is used as an acid labile group, the degradation reaction of the acid labile group competes with the neutralization reaction between the generated acid and the basic compound. Accordingly, the film reduction of the unexposed portion cannot be completely inhibited, and particularly, the resolution of the independent line pattern deteriorates.

As a method of improving the resolution of the independent line pattern, the use of a resin containing a group that adjusts the solubility of the resin has been examined (for example, see JP2005-157401A). However, this is not fundamental means for solving the above problems and cannot sufficiently satisfy the resolution of the independent line pattern.

Microfabrication using a resist composition is not only directly used for producing integrated circuits but also has been applied for producing a so-called imprinting mold structure in recent years (for example, see JP2004-158287A, JP2008-162101A, and "Science and New Technology in Nanoimprint", edited by Yoshihiko Hirai, Frontier Publishing (published in June 2006). Even in producing an imprinting mold structure, the influence of backward scattering becomes remarkable in accordance with the increase in drawing area. Therefore, resolution thereof is likely to deteriorate.

Accordingly, even in producing any of a photomask and molds for imprint, when X-rays, soft X-rays, or an electron beam is used as an exposure light source, it is important to satisfy high sensitivity, high resolution, and excellent roughness characteristics at the same time under a large area exposure condition, and thus there is a problem that needs to be solved.

SUMMARY OF THE INVENTION

An object of the present invention is to provide an actinic ray-sensitive or radiation-sensitive resin composition that can form patterns to satisfy high sensitivity, high resolution, and excellent roughness characteristics at the same time, and particularly, an actinic ray-sensitive or radiation-sensitive resin composition that can form patterns (including independent line patterns) to satisfy these characteristics at the same time under a large area exposure condition. Moreover, another object of the present invention is to provide an actinic ray-sensitive or radiation-sensitive film that is formed using actinic ray-sensitive or radiation-sensitive resin composition and a pattern forming method.

An embodiment of the present invention is as follows.

[1] An actinic ray-sensitive or radiation-sensitive resin composition containing a compound (P) that contains at least one phenolic hydroxyl group and at least one group in which a hydrogen atom of a phenolic hydroxyl group has been substituted with a group represented by the following General Formula (1).

[Chem. 1]

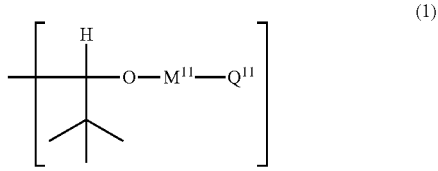

In the formula, $M^{11}$ represents a single bond or a divalent linking group; and $Q^{11}$ represents an alkyl group, a cycloalkyl group or an aryl group.

[2] The composition according to [1], wherein the compound (P) is a polymer compound containing a repeating unit represented by the following General Formula (2) or the following General Formula (7).

[Chem. 2]

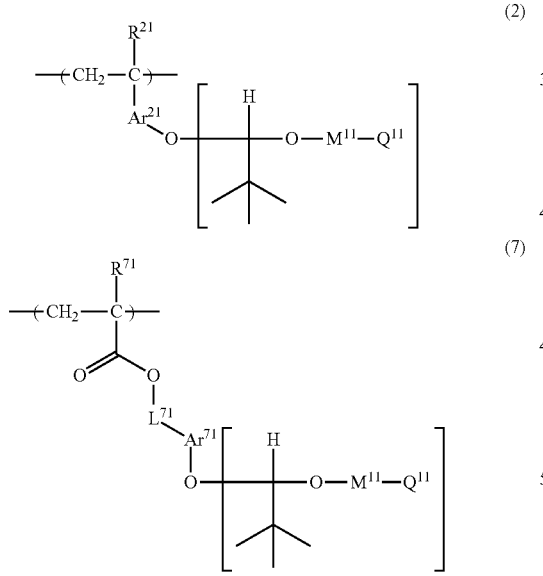

In the General Formula (2), $R^{21}$ represents a hydrogen atom or a methyl group;

$Ar^{21}$ represents an arylene group;

$M^{11}$ represents a single bond or a divalent linking group; and $Q^{11}$ represents an alkyl group, a cycloalkyl group or an aryl group.

In the General Formula (7), $R^{71}$ represents a hydrogen atom or a methyl group;

$L^{71}$ represents a single bond or an alkylene group;

$Ar^{71}$ represents an arylene group;

$M^{11}$ represents a single bond or a divalent linking group; and $Q^{11}$ represents an alkyl group, a cycloalkyl group or an aryl group.

[3] The composition according to [2], wherein $Ar^{21}$ and $Ar^{71}$ are a phenylene group.

[4] The composition according to any one of [1] to [3], wherein a group represented by -$M^{11}$-$Q^{11}$ is an alkyl group, an alkyl group substituted with a cycloalkyl group, a cycloalkyl group, an aralkyl group, or an aryloxyalkyl group.

[5] The composition according to any one of [1] to [4], wherein the group represented by -$M^{11}$-$Q^{11}$ is represented by —(CHR$^{101}$R$^{102}$), and wherein each of R$^{101}$ and R$^{102}$ independently represents an alkyl group, a cycloalkyl group, or an aryl group and R$^{101}$ and R$^{102}$ may form a ring by binding to each other.

[6] The composition according to any one of [2] to [5], wherein the compound (P) contains a repeating unit represented by the following General Formula (5) or the following General Formula (6).

[Chem. 3]

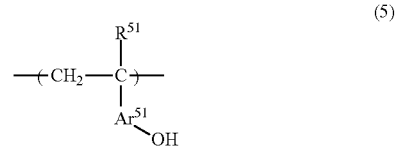

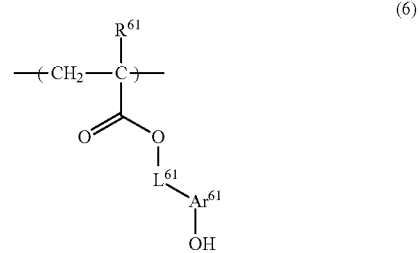

In the General Formula (5), $R^{51}$ represents a hydrogen atom or a methyl group; and $Ar^{51}$ represents an arylene group.

In the General Formula (6), $R^{61}$ represents a hydrogen atom or a methyl group;

$L^{61}$ represents a single bond or an alkylene group; and $Ar^{61}$ represents an arylene group.

[7] The composition according to any one of [2] to [6], wherein the compound (P) further contains a non-degradable repeating unit represented by the following General Formula (3).

[Chem. 4]

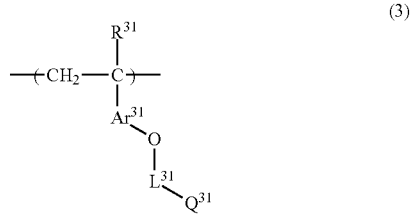

In the formula, $R^{31}$ represents a hydrogen atom or a methyl group;

$Ar^{31}$ represents an arylene group;

$L^{31}$ represents a single bond or a divalent linking group; and $Q^{31}$ represents a cycloalkyl group or an aryl group.

[8] The composition according to any one of [2] to [7], wherein the compound (P) further contains a repeating unit represented by the following General Formula (4).

[Chem. 5]

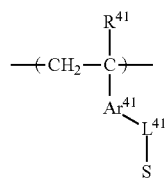

(4)

In the formula, $R^{41}$ represents a hydrogen atom or a methyl group;

$Ar^{41}$ represents an arylene group;

$L^{41}$ represents a single bond or a divalent linking group; and

S represents a structural moiety capable of degrading by actinic ray irradiation or radiation irradiation to generate an acid on a side chain.

[9] The composition according to any one of [1] to [8], which is exposed with an electron beam, X-rays, or EUV light.

[10] An actinic ray-sensitive or radiation-sensitive film formed using the composition according to any one of [1] to [9].

[11] A pattern forming method including irradiating the film according to [10] with an actinic ray or radiation ray and developing the film irradiated with the actinic ray or radiation ray.

[12] The pattern forming method according to [11], wherein an electron beam, X-rays, or EUV light is used as the actinic ray or radiation ray.

[13] Molds for nanoimprint formed by the pattern forming method according to [11] or [12].

[14] Mask blanks on which the actinic ray-sensitive or radiation-sensitive film according to [10] has been formed.

[15] A mask for producing semiconductors that is obtained by irradiating the mask blanks according to [14] with an actinic ray or radiation ray and developing the mask blanks irradiated with the actinic ray or radiation ray.

[16] A pattern forming method including irradiating the mask blanks according to [14] with an actinic ray or radiation ray and developing the mask blanks irradiated with the actinic ray or radiation ray.

[17] A polymer compound containing a repeating unit represented by the following General Formula (2).

[Chem. 6]

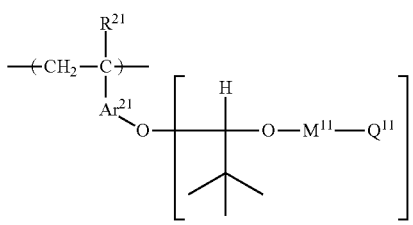

(2)

In the formula, $R^{21}$ represents a hydrogen atom or a methyl group;

$Ar^{21}$ represents an arylene group;

$M^{11}$ represents a single bond or a divalent linking group; and $Q^{11}$ represents an alkyl group, a cycloalkyl group or an aryl group.

According to the present invention, patterns (including independent line patterns) to satisfy high sensitivity, high resolution, and excellent roughness characteristics at the same time under a large area exposure condition can be formed.

DESCRIPTION OF THE PREFERRED EMBODIMENTS

Figure 1:
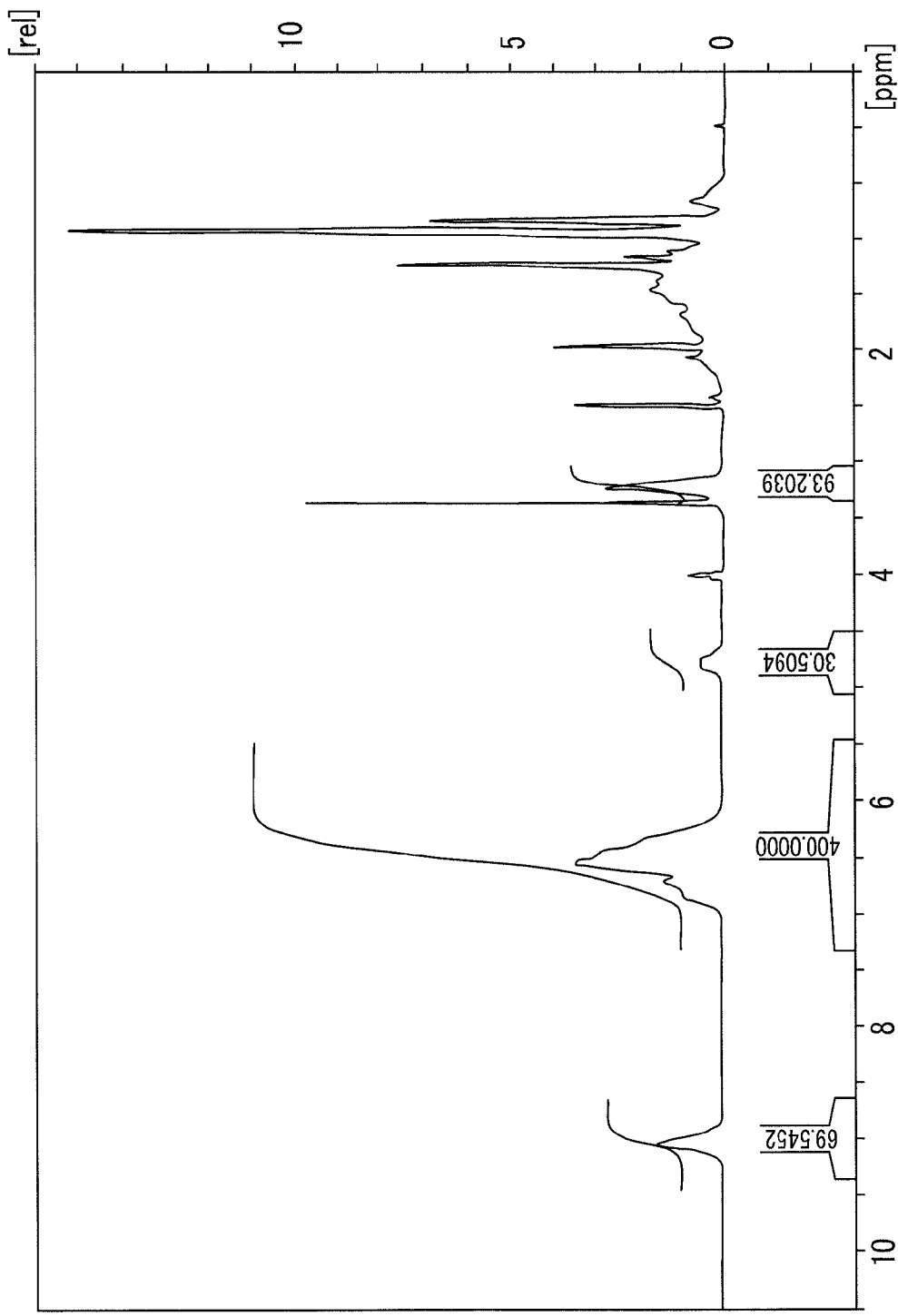
FIG. 1 is a view showing a $^1$H-NMR chart of a compound (P-1M) synthesized in Example.
Figure 2:
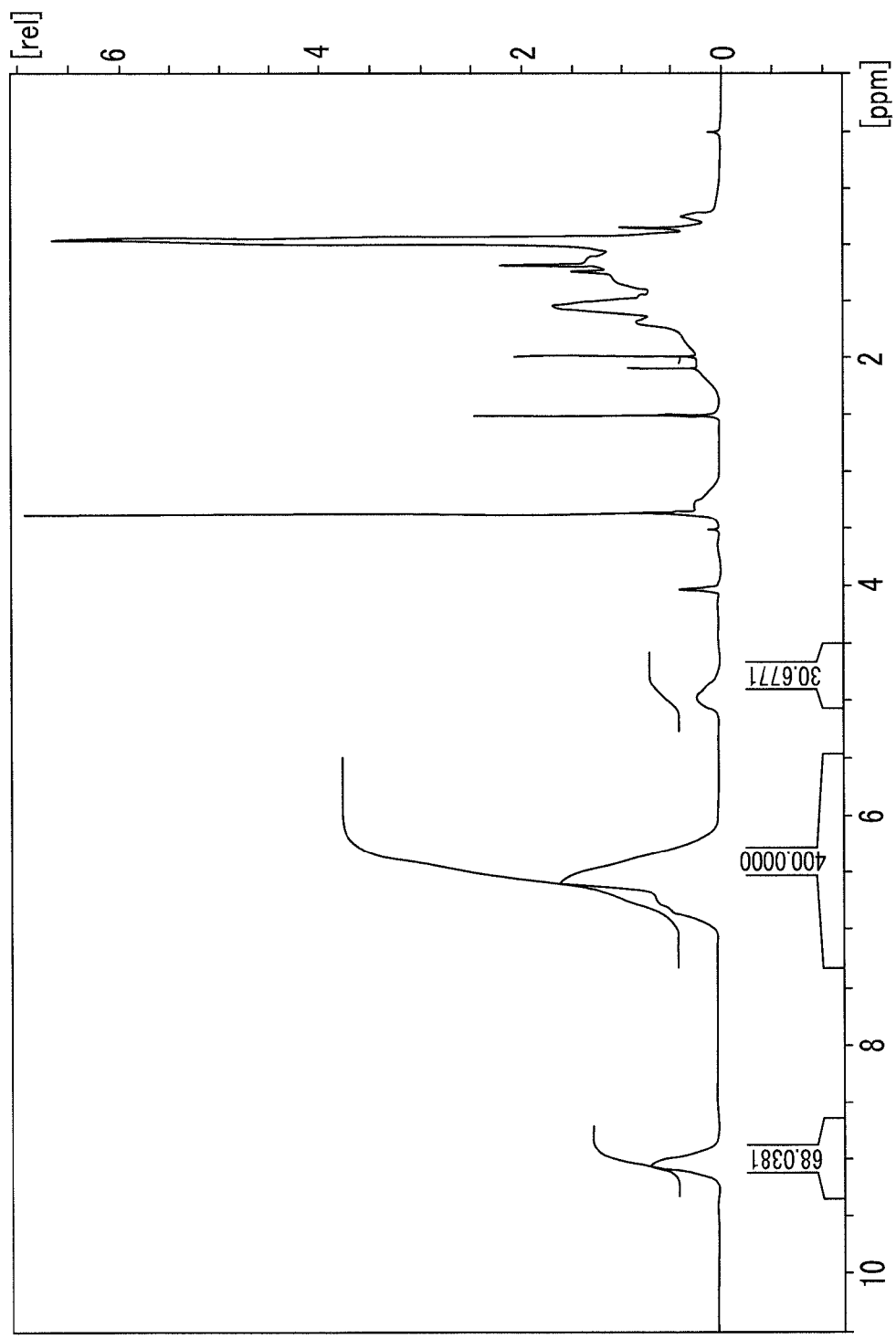
FIG. 2 is a view showing a $^1$H-NMR chart of a compound (P-2M) synthesized in Example.

Hereinbelow, embodiments of the present invention will be described in detail.

Regarding the description for a group (atomic group) in the present specification, if a group is not described in regard to whether the group is substituted or unsubstituted, this group includes not only those not having a substituent but also those having a substituent. For example, an "alkyl group" includes not only an alkyl group (unsubstituted alkyl group) not having a substituent but also an alkyl group (substituted alkyl group) having a substituent.

In the present invention, the term "actinic rays" or "radiation" refers to, for example, a bright line spectrum of a mercury lamp, far-ultraviolet rays represented by an excimer laser, extreme ultraviolet rays (EUV light), X-rays, an electron beam and the like. In addition, the "light" in the present invention refers to the actinic rays or the radiation. The term "exposure" in this specification includes not only the exposure performed using a mercury lamp, far-ultraviolet rays represented by an excimer laser, X-rays, EUV light, and the like, but also drawing performed using particle beams such as an electron beam and an ion beam, unless otherwise specified.

The actinic ray-sensitive or radiation-sensitive resin composition according to the present invention is, for example, a positive composition, and typically is a positive resist composition. The constitution of this composition will be described below.

[1] Compound (P)

The composition of the present invention contains a compound (P) which includes at least one phenolic hydroxyl group and at least one of the hydrogen atoms in the phenolic hydroxyl group includes a group which is substituted by a group (referred to below as an "acid labile group") represented by the following General Formula (1). The "acid labile group" refers to a group eliminated when a chemical bond is broken by the action of an acid. In addition, the "phenolic hydroxyl group" refers to a hydroxyl group directly binding to an aromatic ring.

[Chem. 7]

$$\left[\begin{array}{c} H \\ | \\ -C-O-M^{11}-Q^{11} \\ | \end{array}\right] \quad (1)$$

In the General Formula (1), $M^{11}$ represents a single bond or a divalent linking group.

$Q^{11}$ represents an alkyl group, a cycloalkyl group or an aryl group.

The divalent linking group represented by $M^{11}$ is, for example, an alkylene group (preferably an alkylene group having 1 to 8 carbon atoms, for example, a methylene group, an ethylene group, a propylene group, a butylene group, a hexylene group, or an octylene group), a cycloalkylene group (preferably a cycloalkylene group having 3 to 15 carbon atoms, for example, a cyclopentylene group or a cyclohexylene group), —S—, —O—, —CO—, —CS—, —SO$_2$—, —N(R$_0$)—, or a combination of two or more of the same. The divalent linking group preferably has 20 or less carbon atoms in total. Herein, R$_0$ is a hydrogen atom or an alkyl group (for example, an alkyl group having 1 to 8 carbon atoms, specifically a methyl group, an ethyl group, a propyl group, an n-butyl group, a sec-butyl group, a hexyl group, an octyl group, and the like).

$M^{11}$ is preferably a single bond, an alkylene group, or a divalent linking group including a combination of an alkylene group with at least one of —O—, —CO—, —CS—, and —N(R$_0$)—, and more preferably a single bond, an alkylene group, or a divalent linking group including a combination of an alkylene group with —O—. Herein, R$_0$ has the same definition as R$_0$ described above.

$M^{11}$ may further have a substituent, and the substituent that $M^{11}$ may further have is, for example, a cycloalkyl group, an aryl group, an amino group, an amide group, a ureide group, a urethane group, a hydroxy group, a carboxy group, a halogen atom, an alkoxy group, an aralkyloxy group, a thioether group, an acyl group, an acyloxy group, an alkoxycarbonyl group, a cyano group, and a nitro group.

Examples of the alkyl group represented by $Q^{11}$ include a methyl group, an ethyl group, a propyl group, an isopropyl group, an n-butyl group, a sec-butyl group, a t-butyl group, a hexyl group, a 2-ethylhexyl group, an octyl group, and a dodecyl group. Among these, a methyl group, an ethyl group, a propyl group, an isopropyl group, and a t-butyl group are particularly preferable. The number of carbon atoms in the alkyl group is preferably 20 or less, and is more preferably 8 or less.

The cycloalkyl group represented by $Q^{11}$ may be monocyclic or polycyclic. The cycloalkyl group preferably has 3 to 10 carbon atoms. Examples of the cycloalkyl group include a cyclopropyl group, a cyclobutyl group, a cyclopentyl group, a cyclohexyl group, a cycloheptyl group, a cyclooctyl group, a 1-adamantyl group, a 2-adamantyl group, a 1-norbornyl group, a 2-norbornyl group, a bornyl group, an isobornyl group, a 4-tetracyclo[6.2.1.1$^{3,6}$.0$^{2,7}$]dodecyl group, an 8-tricyclo[5.2.1.0$^{2,6}$]decyl group, and a 2-bicyclo[2.2.1]heptyl group. Among these, a cyclopentyl group, a cyclohexyl group, a 2-adamantyl group, 8-tricyclo[5.2.1.0$^{2,6}$]decyl group, and a 2-bicyclo[2.2.1]heptyl group are preferable.

The aryl group represented by $Q^{11}$ may also contain a structure (for example, a biphenyl group or a terphenyl group) in which a plurality of aromatic rings are connected to each other via a single bond. The number of carbon atoms in the aryl group is preferably 4 to 20 and is more preferably 6 to 18. Examples of the aryl group include a phenyl group, a naphthyl group, an anthranyl group, a biphenyl group, a terphenyl group, and the like. Among these, a phenyl group, a naphthyl group, and a biphenyl group are particularly preferable.

The cycloalkyl group and the aryl group represented by $Q^{11}$ may have a substituent, and examples thereof include an alkyl group, a cycloalkyl group, a cyano group, a halogen atom, a hydroxyl group, an alkoxy group, a carboxyl group, and an alkoxycarbonyl group.

More preferable examples of (-$M^{11}$-$Q^{11}$) include an alkyl group, an alkyl group substituted with a cycloalkyl group, a cycloalkyl group, an aralkyl group, and an aryloxyalkyl group. Specific examples thereof include a methyl group, an ethyl group, an isopropyl group, a cyclopentyl group, a cyclohexyl group, a cyclohexylethyl group, a 2-adamantyl group, an 8-tricyclo[5.2.1.0$^{2,6}$]decyl group, and a 2-bicyclo[2.2.1]heptyl group, a benzyl group, a 2-phenethyl group, and a 2-phenoxyethyl group.

As (-$M^{11}$-$Q^{11}$), —(CHR$^{101}$R$^{102}$) is particularly preferable. Here, each of R$^{101}$ and R$^{102}$ independently represents an alkyl group, a cycloalkyl group, or an aryl group and R$^{101}$ and R$^{102}$ may form a ring by binding to each other. In this case, specific examples of (-$M^{11}$-$Q^{11}$) include an isopropyl group, an isobutyl group, a 3-pentyl group, a 2,4-dimethyl-3-pentyl group, a 4-methyl-2-pentyl group, a 3,3-dimethyl-2-butyl group, a diphenylmethyl group, a di(1-naphthyl)methyl group, a fluorenyl group, a 1-(1-naphthyl)ethyl group, a 1-phenylethyl group, a cyclopentyl group, a cyclohexyl group, a 2-adamantyl group, a 4-tetracyclo[6.2.1.1$^{3,6}$.0$^{2,7}$]dodecyl group, an 8-tricyclo[5.2.1.0$^{2,6}$]decyl group, and a 2-bicyclo[2.2.1]heptyl group.

Hereinbelow, specific examples of a group represented by the General Formula (1) will be described, but the present invention is not limited thereto.

[Chem. 8]

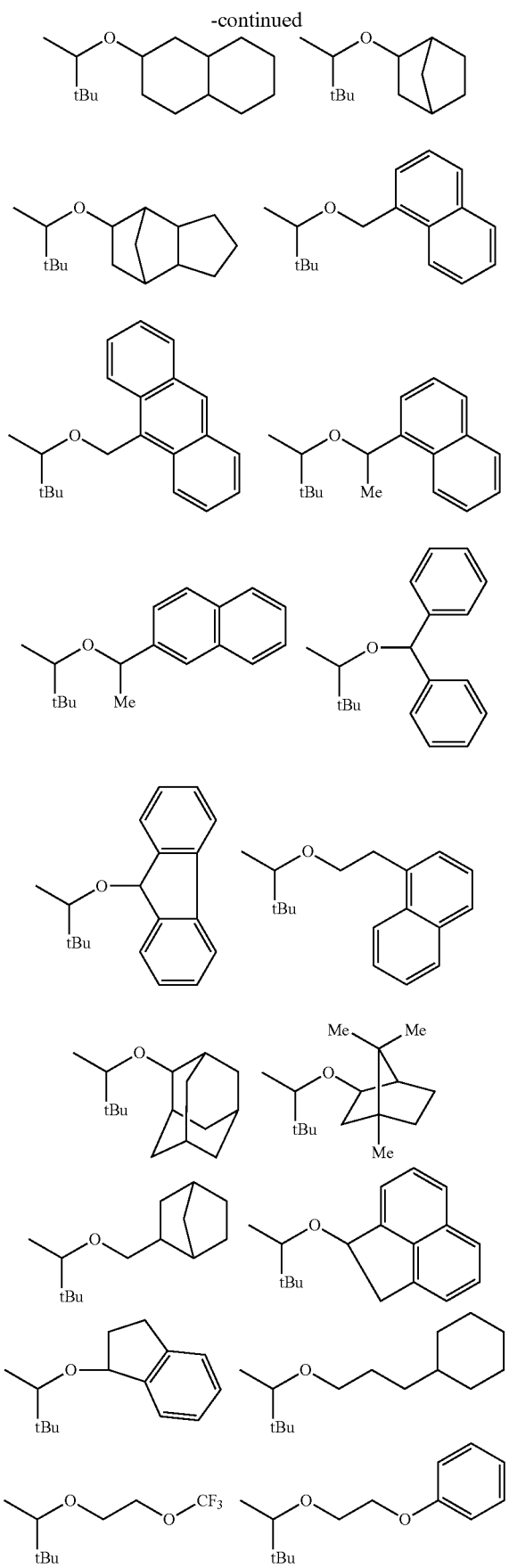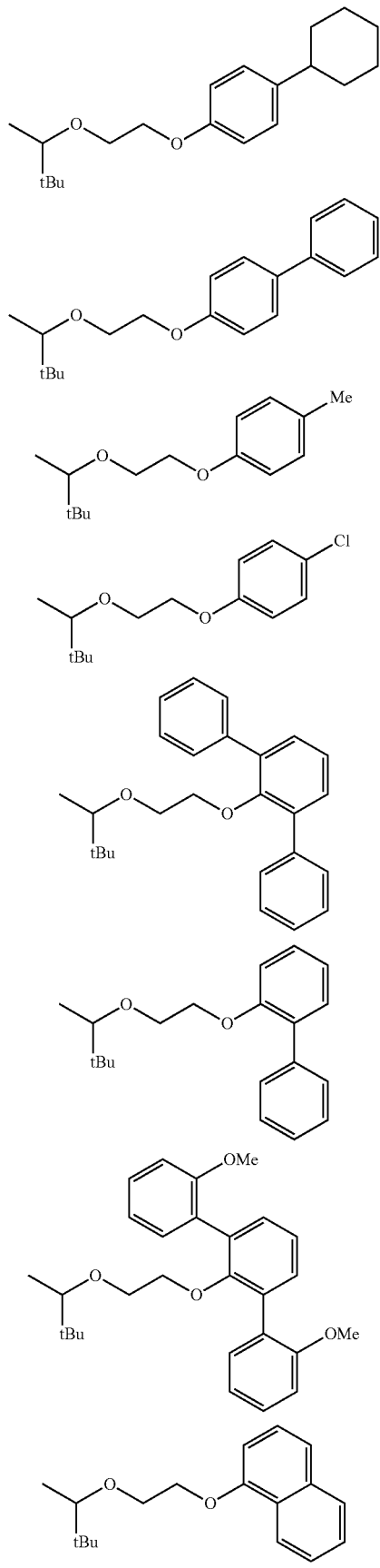

-continued
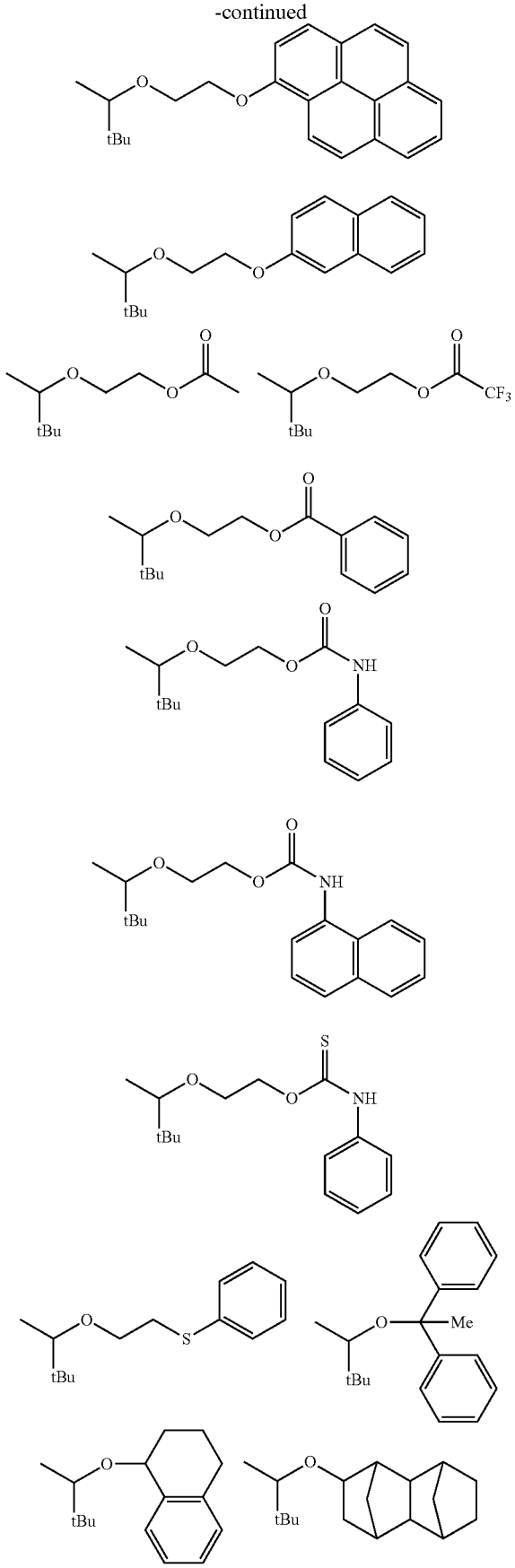
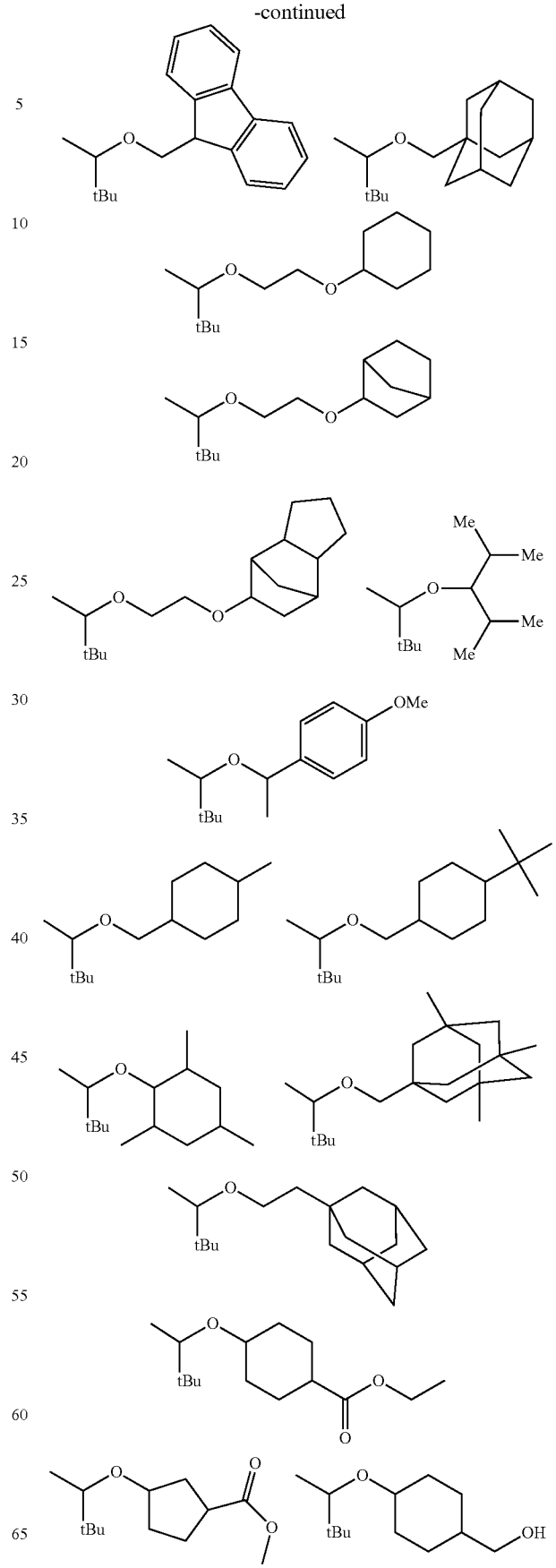

-continued

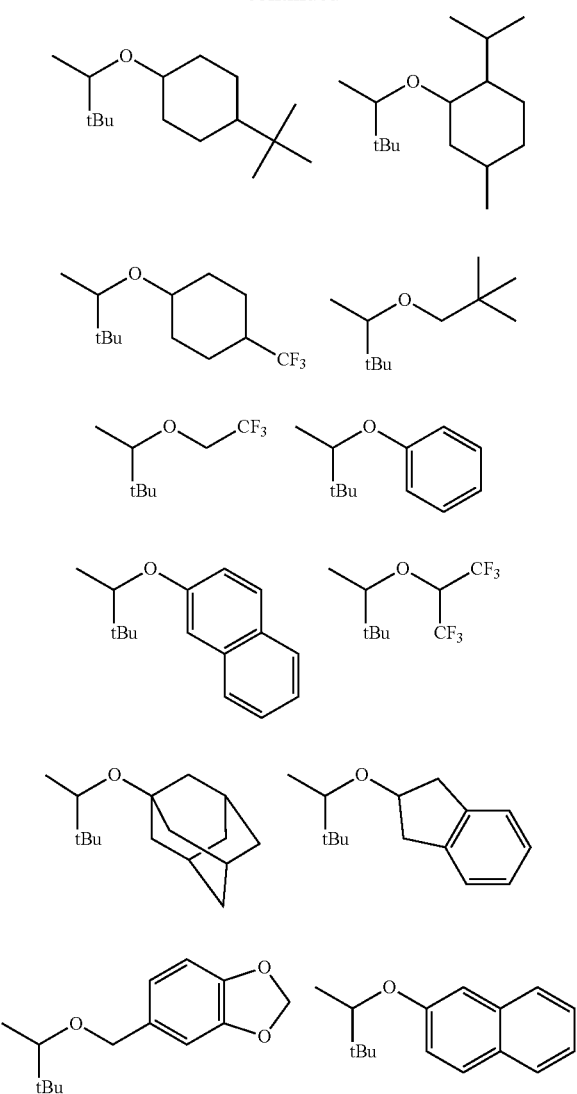

Presumably, since a carbocation intermediate that is generated in the degradation process of the acid labile group represented by the General Formula (1) caused by the action of an acid is not stable without the hyperconjugation effect by the C—Hσ bond, compared to, for example, the acid labile group represented by the formula (1') or the formula (1''), the activation energy of the acid degradation reaction is higher.

[Chem. 9]

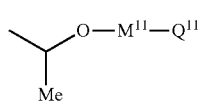

(1')

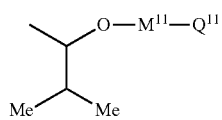

(1'')

-continued
[Chem. 10]

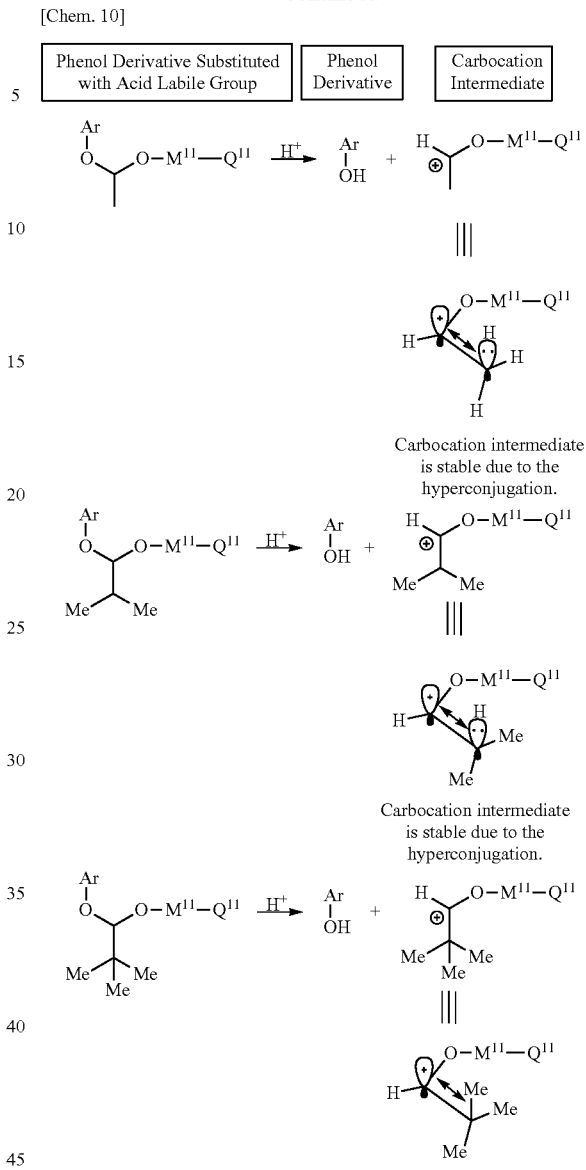

If the activation energy is increased, the degradation reaction of the acid labile group caused at a temperature around room temperature is inhibited. Accordingly, the neutralization reaction of the generated acid in a resist film does not compete with the degradation reaction of the acid labile group, whereby the resolution and the roughness characteristics are improved.

In the compound (P) of the present invention, the amount substituted with the acid labile group represented by the General Formula (1) preferably ranges from 1 mol % to 60 mol %, more preferably ranges from 5 mol % to 50 mol %, and particularly preferably ranges from 10 mol % to 40 mol %, based on the total phenolic hydroxyl groups.

In an embodiment, the compound (P) may be a polymer compound containing a repeating unit that contains a phenolic hydroxyl group and a repeating unit that contains a group in which a hydrogen atom of a phenolic hydroxyl group has been substituted with the acid labile group represented by the General Formula (1). In another embodiment, the compound (P) may be a low-molecular weight compound in which hydrogen atoms of a portion of phenolic hydroxyl groups in a core compound having a plurality of phenolic hydroxyl groups have been substituted with the acid labile group represented by the General Formula (1).

First, a case where the compound (P) is a polymer compound will be described.

As described above, in an embodiment, the compound (P) may be a polymer compound containing a repeating unit that contains a phenolic hydroxyl group and a repeating unit that contains a group in which a hydrogen atom of a phenolic hydroxyl group has been substituted with the acid labile group represented by General Formula (1).

Examples of the repeating unit that contains a phenolic hydroxyl group include repeating units represented by the following General Formula (5) or (6), and among these, the repeating unit represented by the General Formula (5) is more preferable.

[Chem. 11]

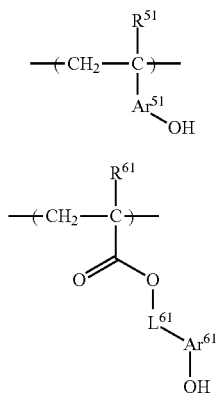

In the General Formulae (5) and (6), each of $R^{51}$ and $R^{61}$ independently represents a hydrogen atom or a methyl group, and each of $Ar^{51}$ and $Ar^{61}$ independently represents an arylene group. $L^{61}$ represents a single bond or an alkylene group.

$R^{51}$ is more preferably a hydrogen atom, and $R^{61}$ is more preferably a methyl group.

The arylene group represented by $Ar^{51}$ and $Ar^{61}$ may have a substituent. The arylene group is preferably an arylene group having 6 to 18 carbon atoms that may have a substituent, even more preferably a phenylene group or a naphthylene group that may have a substituent, and most preferably a phenylene group that may have a substituent. Examples of the substituent that these groups may have include an alkyl group, a halogen atom, a hydroxyl group, an alkoxy group, a carboxyl group, and an alkoxycarbonyl group.

As described above, $L^{61}$ represents a single bond or an alkylene group. The alkylene group preferably has 1 to 8 carbon atoms, and more preferably has 1 to 4 carbon atoms. Examples of the alkylene group include a methylene group, an ethylene group, a propylene group, a butylene group, a hexylene group, and an octylene group, and among these, a methylene group and an ethylene group are particularly preferable.

Specific examples of the repeating unit represented by the General Formula (5) will be described, but the present invention is not limited thereto.

[Chem. 12]

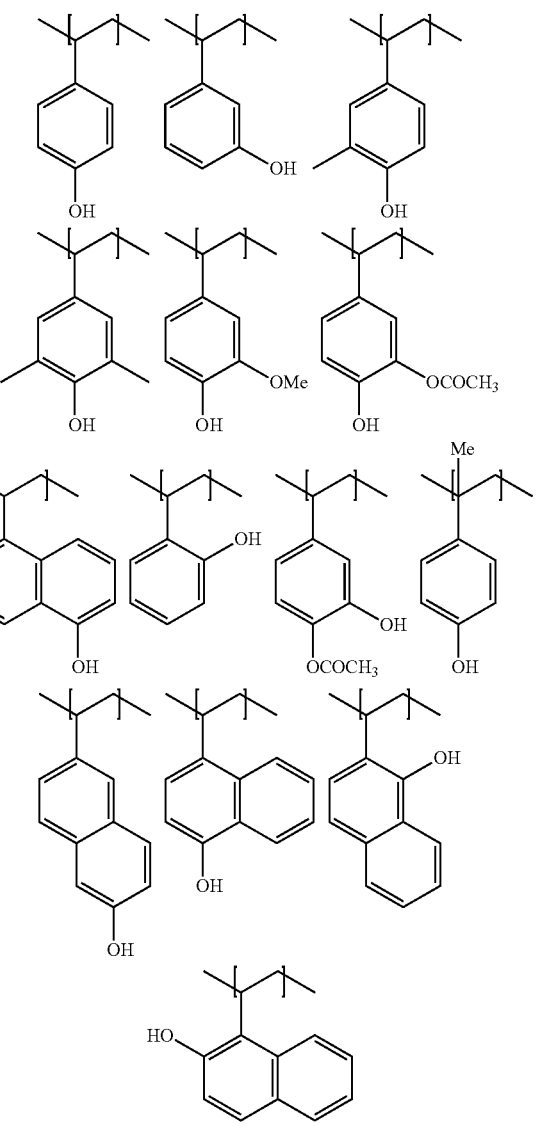

Specific examples of the repeating unit represented by the General Formula (6) will be described, but the present invention is not limited thereto.

[Chem. 13]

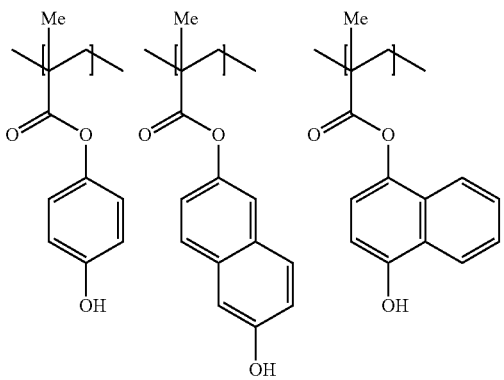

-continued

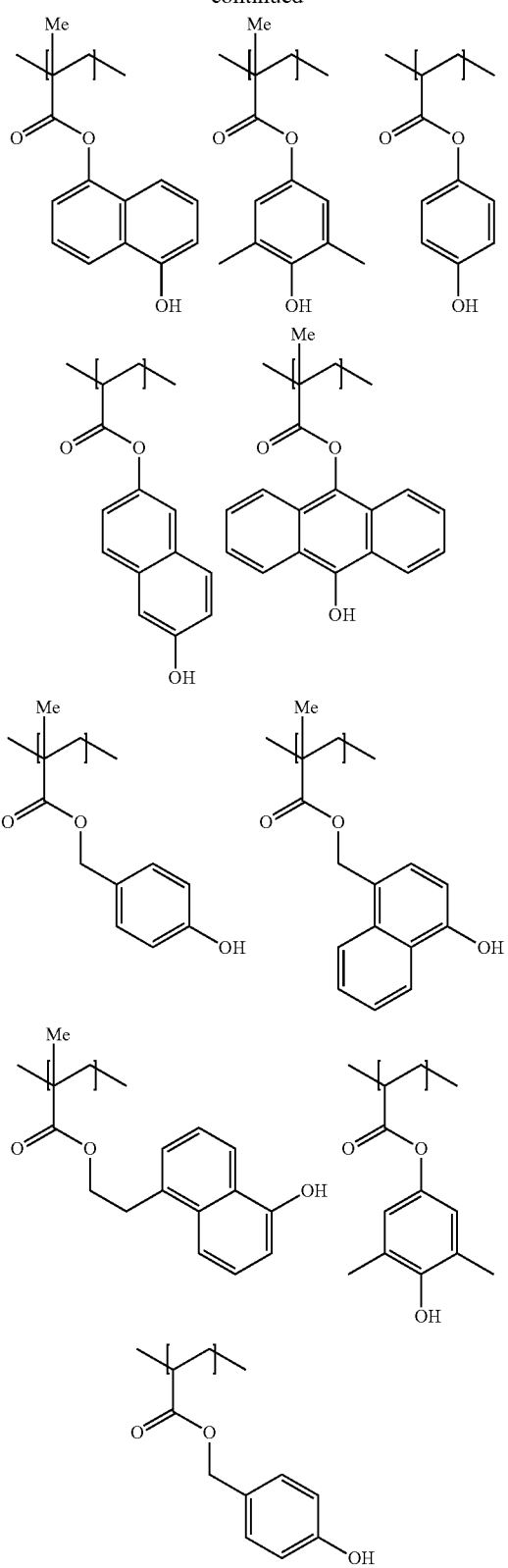

Examples of the repeating unit having a group in which a hydrogen atom of a phenolic hydroxyl group has been substituted with the acid labile group represented by the General Formula (1) include repeating units represented by the following General Formula (2) or (7), and among these, the repeating unit represented by the General Formula (2) is more preferable.

[Chem. 14]

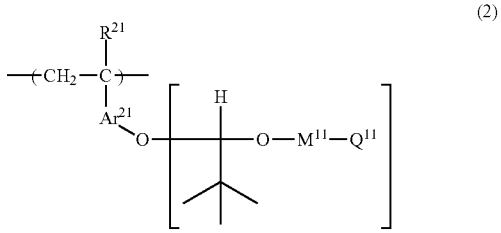

(2)

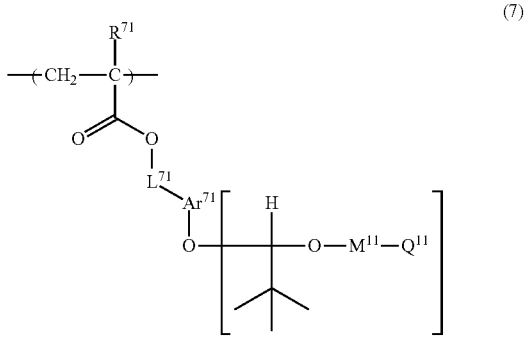

(7)

In the General Formulae (2) and (7), each of $R^{21}$ and $R^{71}$ independently represents a hydrogen atom or a methyl group;

each of $Ar^{21}$ and $Ar^{71}$ independently represents an arylene group;

$L^{71}$ represents a single bond or an alkylene group;

$M^{11}$ represents a single bond or a divalent linking group; and $Q^{11}$ represents an alkyl group, a cycloalkyl group or an aryl group.

$R^{21}$ is more preferably a hydrogen atom, and $R^{71}$ is more preferably a methyl group.

The arylene group represented by $Ar^{21}$ and $Ar^{71}$ may have a substituent, and specific examples thereof include the same groups as $Ar^{51}$ and $Ar^{61}$ in the General Formulae (5) and (6).

Specific examples of the alkylene group represented by $L^{71}$ include the same groups as $L^{61}$ in the General Formula (6)

$M^{11}$ and $Q^{11}$ have the same definition as the respective groups in the General Formula (1) described above.

Specific examples of the repeating unit represented by the General Formulae (2) and (7) include groups in which a hydrogen atom of the phenolic hydroxyl group in the specific examples of the repeating units represented by the General Formulae (5) and (6) described above has been substituted with the specific examples of the acid labile group represented by the General Formula (1) described above.

The compound (P) of the present invention may further contain a non-degradable repeating unit represented by the following General Formula (3).

[Chem. 15]

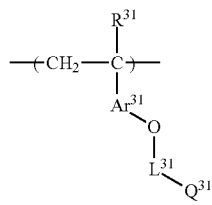

(3)

$R^{31}$ represents a hydrogen atom or a methyl group;
$Ar^{31}$ represents an arylene group;
$L^{31}$ represents a single bond or a divalent linking group; and
$Q^{31}$ represents a cycloalkyl group or an aryl group.

Herein, "non-degradable" means that a chemical bond is not broken by the action of an acid generated by exposure, an alkaline developer, and the like.

As described above, $R^{31}$ represents a hydrogen atom or a methyl group, and more preferably represents a hydrogen atom. As described above, $Ar^{31}$ represents an arylene group, and specific examples and a preferable range thereof are the same as the specific examples and the preferable range of $Ar^{21}$ in the General Formula (2).

Examples of the divalent linking group represented by $L^{31}$ include an alkylene group, an alkenylene group, —O—, —CO—, —NR$^{32}$—, —S—, —CS—, and a combination of the same. Herein, $R^{32}$ represents a hydrogen atom, an alkyl group, a cycloalkyl group, an aryl group, or an aralkyl group. The divalent linking group represented by $L^{31}$ preferably has 1 to 15 carbon atoms in total, and more preferably has 1 to 10 carbon atoms in total.

The above alkylene group preferably has 1 to 8 carbon atoms, and more preferably has 1 to 4 carbon atoms. Examples of the alkylene group include a methylene group, an ethylene group, a propylene group, a butylene group, a hexylene group, and an octylene group.

The above alkenylene group preferably has 2 to 8 carbon atoms, and more preferably has 2 to 4 carbon atoms.

Specific examples and preferable ranges of the alkyl group, the cycloalkyl group, the aryl group, and the aralkyl group represented by $R^{32}$ are the same as the specific examples and the preferable ranges of the alkyl group, the cycloalkyl group, the aryl group, and the aralkyl group represented by $R^{11}$ in the General Formula (1).

The group represented by $L^{31}$ is preferably a carbonyl group, a methylene group, *—CO—NR$^{32}$—, *—CO—(CH$_2$)$_n$—O—, *—CO—(CH$_2$)$_n$—O—CO—, *—(CH$_2$)$_n$—COO—, *—(CH$_2$)$_n$—CONR$^{32}$—, or *—CO—(CH$_2$)$_n$—NR$^{32}$—, particularly preferably a carbonyl group, a methylene group, *—CO—NR$^{32}$— *—CH$_2$—COO—, *—CO—CH$_2$—O—, *—CO—CH$_2$—O—CO—, *—CH$_2$—CONR$^{32}$—, or *—CO—CH$_2$—NR$^{32}$—, and most preferably a carbonyl group, a methylene group, *—CO—NR$^{32}$—, or *—CH$_2$—COO—. Herein, the n represents an integer from 1 to 10, and * represents a linking moiety of a main chain, that is, a moiety linked to an O atom in the formula.

As described above, $Q^{31}$ represents a cycloalkyl group or an aryl group, and specific examples and a preferable range thereof are the same as the specific examples and the preferable range of $Q^{11}$ in the General Formula (1).

Specific examples of the repeating unit represented by the General Formula (3) will be described, but the present invention is not limited thereto.

[Chem. 16]

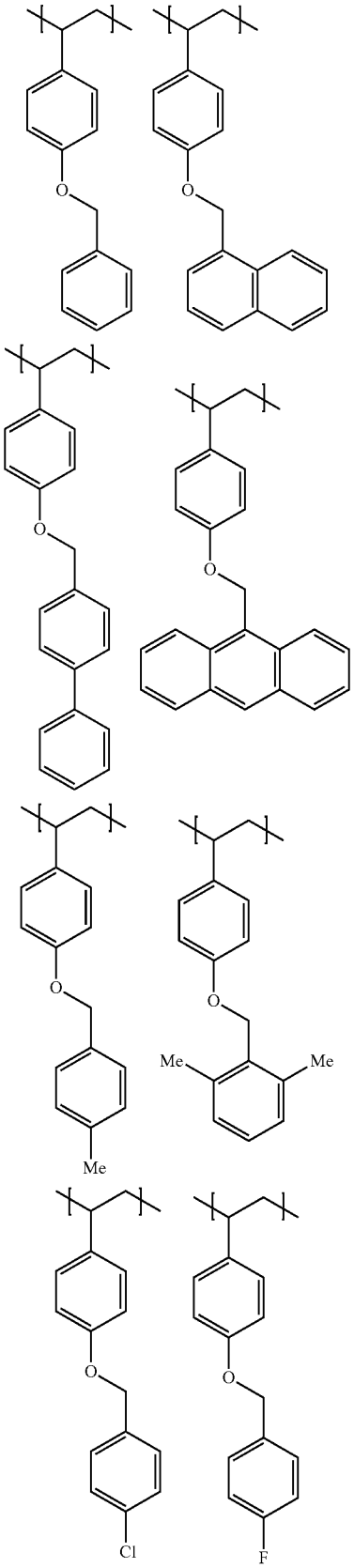

-continued
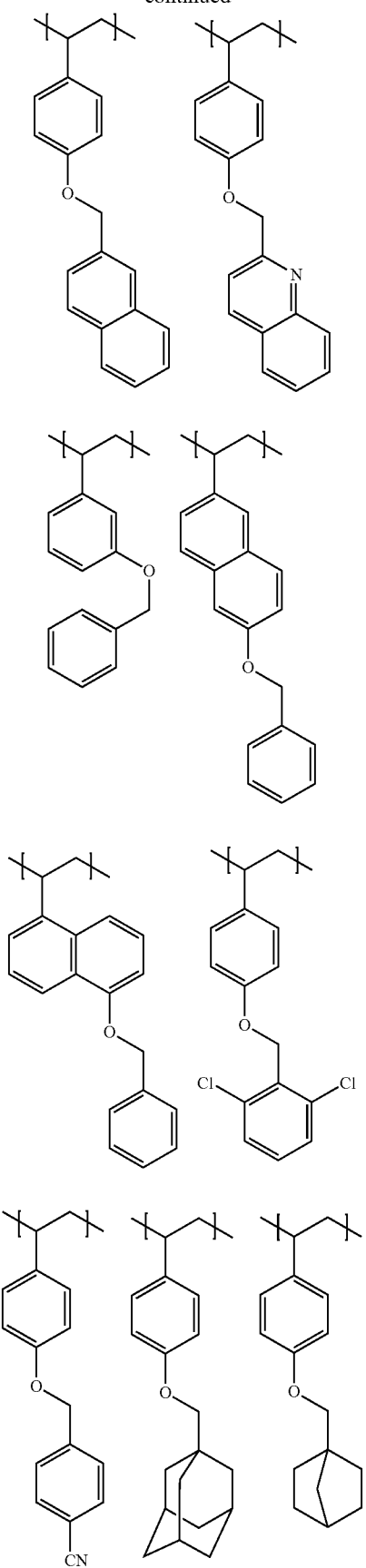
-continued
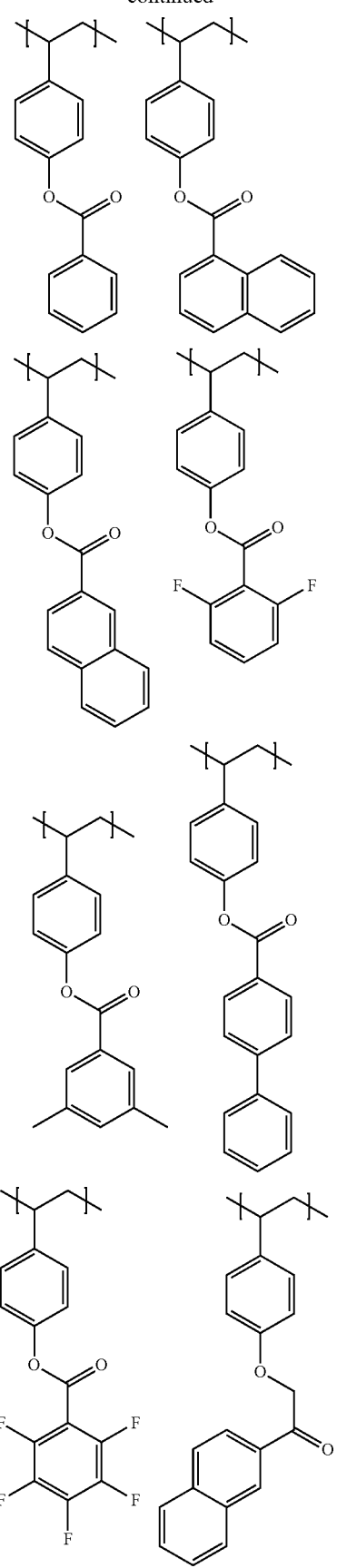

-continued

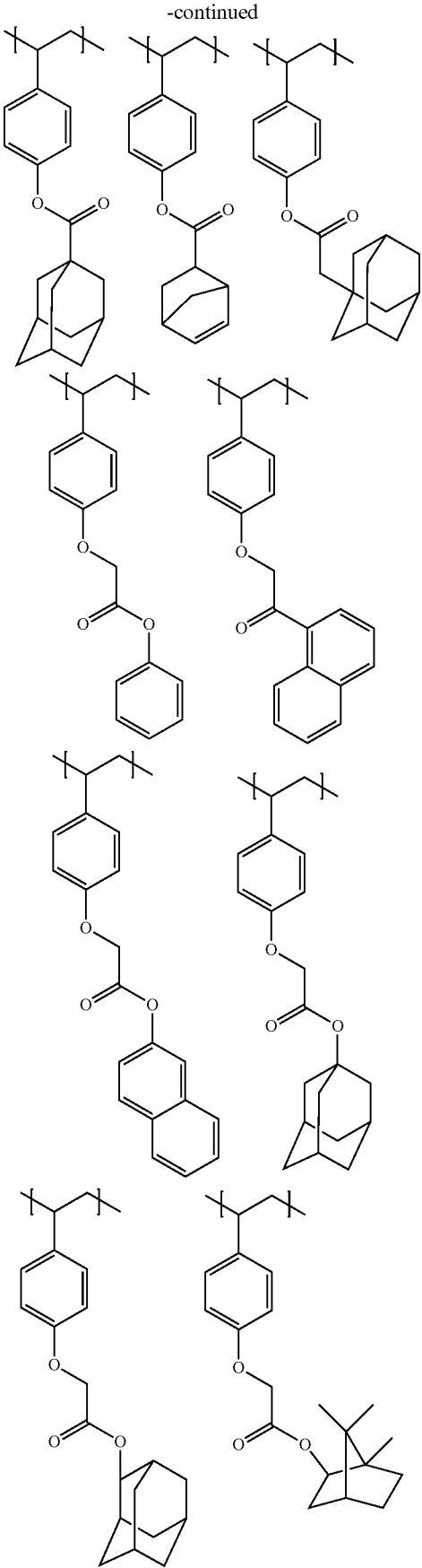

When the core is a polymer compound, the content of the repeating units represented by the General Formula (3) in the compound (P) of the present invention preferably ranges from 1 mol % to 30 mol %, more preferably ranges from 2 mol % to 20 mol %, and particularly preferably ranges from 2 mol % to 10 mol %, based on the total repeating units of the compound (P).

The resin compound of the present invention may have a structure obtained by generating an acid with actinic ray irradiation or radiation irradiation. As an embodiment thereof, for example, the compound (P) of the present invention may further contain a repeating unit represented by the following General Formula (4).

[Chem. 17]

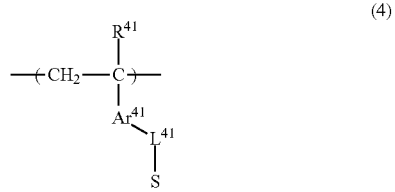

(4)

$R^{41}$ represents a hydrogen atom or a methyl group;
$Ar^{41}$ represents an arylene group;
$L^{41}$ represents a single bond or a divalent linking group; and
S represents a structural moiety capable of degrading by actinic ray irradiation or radiation irradiation to generate an acid on the side chain of the compound (P).

As described above, $R^{41}$ represents a hydrogen atom or a methyl group, and more preferably represents a hydrogen atom. As described above, $Ar^{41}$ represents an arylene group, and specific examples and a preferable range thereof are the same as the specific examples and the preferable range of $Ar^{21}$ in the General Formula (2).

$L^{41}$ represents a single bond or a divalent linking group. When $L^{41}$ is a divalent linking group, examples thereof include an alkylene group, a cycloalkylene group, an arylene group, —O—, —SO$_2$—, —CO—, —N(R)—, —S—, —CS—, and a combination of two or more kinds of the same, and these groups preferably have 20 or less carbon atoms in total. Herein, R represents an aryl group, an alkyl group, or a cycloalkyl group.

When the compound (P) contains the repeating unit represented by General Formula (4), for example, at least one of resolution, roughness characteristics, and EL (Exposure Latitude) is further improved.

Preferable examples of the alkylene group represented by $L^{41}$ include a methylene group, an ethylene group, a propylene group, a butylene group, a hexylene group, an octylene group, a dodecanylene group, and the like having 1 to 12 carbon atoms.

Preferable examples of the cycloalkylene group represented by $L^{41}$ include a cyclopentylene group, a cyclohexylene group, and the like having 5 to 8 carbon atoms.

Preferable examples of the arylene group represented by $L^{41}$ include a phenylene group, a naphthylene group, and the like having 6 to 14 carbon atoms.

This alkylene group, cycloalkylene group, and arylene group may further have a substituent. Examples of the substituent include an alkyl group, a cycloalkyl group, an aryl group, an amino group, an amide group, a ureide group, a urethane group, a hydroxy group, a carboxy group, a halogen atom, an alkoxy group, a thioether group, an acyl group, an acyloxy group, an alkoxycarbonyl group, a cyano group, and a nitro group.

S represents a structural moiety that generates an acid on a side chain by being degraded with actinic ray irradiation or radiation irradiation. S is preferably a structural moiety that generates an acid anion on a side chain of the compound (P) by being degraded with actinic ray irradiation or radiation irradiation. More preferably, S is, for example, a structural moiety of a photoinitiator of cationic photopolymerization, a photoinitiator of radical photopolymerization, a photodecolorant of dyes, a photodiscoloring agent, or a known compound that is used for a micro resist or the like and generates an acid due to light. The structural moiety is more preferably an ionic structural moiety.

S is more preferably an ionic structural moiety that contains a sulfonium salt or an iodonium salt. More specifically, S is preferably a group represented by the following General Formula (PZI) or (PZII).

[Chem. 18]

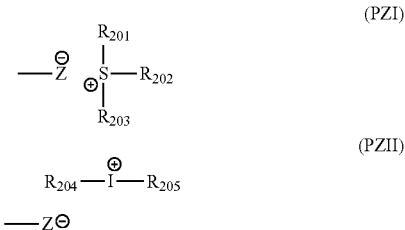

In the following General Formula (PZI), each of $R_{201}$ to $R_{203}$ independently represents an organic group;

The organic group represented by $R_{201}$ to $R_{203}$ generally has 1 to 30 carbon atoms, and preferably has 1 to 20 carbon atoms.

Two of $R_{201}$ to $R_{203}$ may form a ring structure by binding to each other, and an oxygen atom, a sulfur atom, an ester bond, an amide bond, or a carbonyl group may be included in the ring. Examples of the group that two of $R_{201}$ to $R_{203}$ form by binding to each other include an alkylene group (for example, a butylene group or a pentylene group). It is preferable to use the repeating unit in which a ring structure is formed by two of $R_{201}$ to $R_{203}$ binding to each other since it is expected that the exposing machine can be prevented from being contaminated with degradation products during exposure.

$Z^-$ represents an acid anion generated by the degradation caused by actinic ray irradiation or radiation irradiation, and is preferably a non-nucleophilic anion. Examples of the non-nucleophilic anion include a sulfonate anion, a carboxylic acid anion, a sulfonylimide anion, a bis(alkylsulfonyl) imide anion, a tris(alkylsulfonyl)methyl anion, and the like.

The non-nucleophilic anion is an anion with a very low ability for causing a nucleophilic reaction, which is an anion that can inhibit temporal degradation caused by an intramolecular nucleophilic reaction. Due to this property, the temporal stability of the resin is improved, and the temporal stability of the composition is also improved.

Examples of the organic group represented by $R_{201}$ to $R_{203}$ include an aryl group, an alkyl group, a cycloalkyl group, a cycloalkenyl group, an indolyl group, and the like.

Herein, in the cycloalkyl group and the cycloalkenyl group, at least one of the carbon atoms forming a ring may be a carbonyl carbon.

Preferably, at least one of $R_{201}$ to $R_{203}$ is an aryl group, and more preferably, all of three are aryl groups.

The aryl group in $R_{201}$, $R_{202}$, and $R_{203}$ is preferably a phenyl group or a naphthyl group, and more preferably a phenyl group.

Preferable examples of the alkyl group, the cycloalkyl group, and the cycloalkenyl group in $R_{201}$, $R_{202}$ and $R_{203}$ include a linear or branched alkyl group (for example, a methyl group, an ethyl group, a propyl group, a butyl group, or a pentyl group) having 1 to 10 carbon atoms, a cycloalkyl group (for example, a cyclopentyl group, a cyclohexyl group, or a norbornyl group) having 3 to 10 carbon atoms, and a cycloalkenyl group (for example, a pentadienyl group or a cyclohexenyl group) having 3 to 10 carbon atoms.

The organic groups represented by $R_{201}$, $R_{202}$ and $R_{203}$, such as an aryl group, an alkyl group, a cycloalkyl group, a cycloalkenyl group, and an indolyl group may further have a substituent. Examples of the substituent include a nitro group, a halogen atom such as a fluorine atom, a carboxy group, a hydroxyl group, an amino group, a cyano group, an alkyl group (preferably having 1 to 15 carbon atoms), an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an arylthio group (preferably having 6 to 14 carbon atoms), a hydroxyalkyl group (preferably having 1 to 15 carbon atoms), an alkylcarbonyl group (preferably having 2 to 15 carbon atoms), a cycloalkylcarbonyl group (preferably having 4 to 15 carbon atoms), an arylcarbonyl group (preferably having 7 to 14 carbon atoms), a cycloalkenyloxy group (preferably having 3 to 15 carbon atoms), a cycloalkenylalkyl group (preferably having 4 to 20 carbon atoms), and the like, but the present invention is not limited thereto.

In the cycloalkyl group and the cycloalkenyl group as the substituent that the respective groups of $R_{201}$, $R_{202}$ and $R_{203}$ may have, at least one of carbon atoms forming a ring may be a carbonyl carbon.

The substituent that the respective groups of $R_{201}$, $R_{202}$ and $R_{203}$ may have may further have a substituent. Examples of substituents that the substituent may further have include the same ones as the above-described examples of the substituent that the respective groups of $R_{201}$, $R_{202}$ and $R_{203}$ may have, and among the examples, an alkyl group and a cycloalkyl group are preferable.

When at least one of $R_{201}$ to $R_{203}$ is not an aryl group, examples of preferable structures include cationic structures of compounds exemplified as Formulae (I-1) to (I-70) in Paragraphs <0046> and <0047> of JP2004-233661A, Paragraphs <0040> to <0046> of JP2003-35948A, and compounds exemplified as Formulae (I-1) to (I-70) in US2003/0224288A, compounds exemplified as Formulae (IA-1) to (IA-54) and Formulae (IB-1) to (IB-24) in US2003/0077540A, and the like.

In the General Formula (PZII), each of R204 and R205 independently represents an aryl group, an alkyl group, or a cycloalkyl group. This aryl group, alkyl group, and cycloalkyl group are the same as the aryl group described as the aryl group, the alkyl group, and the cycloalkyl group of $R_{201}$ to $R_{203}$ in the compound (PZI).

The aryl group represented by $R_{204}$ and $R_{205}$ may be an aryl group having a heterocyclic structure that contains an oxygen atom, a nitrogen atom, a sulfur atom, or the like. Examples of the aryl group having a heterocyclic structure include a pyrrole residue (a group formed when pyrrole loses one hydrogen atom), a furan residue (a group formed when furan loses one hydrogen atom), a thiophene residue (a group formed when thiophene loses one hydrogen atom), an indole residue (a group formed when indole loses one hydrogen atom), a benzofuran residue (a group formed when benzofuran loses one hydrogen atom), a benzothiophene residue (a group formed when benzothiophene loses one hydrogen atom), and the like.

The aryl group, the alkyl group, and the cycloalkyl group represented by $R_{204}$ and $R_{205}$ may have a substituent. Examples of the substituent include the substituents that the aryl group, the alkyl group, and the cycloalkyl group represented by $R_{201}$ to $R_{203}$ in the compound (PZI) may have.

$Z^-$ represents an acid anion that is generated by degradation caused by actinic ray irradiation or radiation irradiation. $Z^-$ is preferably a non-nucleophilic anion, and examples thereof are the same as described for $Z^-$ in the General Formula (PZI).

Specific preferable examples of S will be described below, but the present invention is not particularly limited thereto. In addition, the symbol * represents a direct link to $L^{41}$.

[Chem. 19]

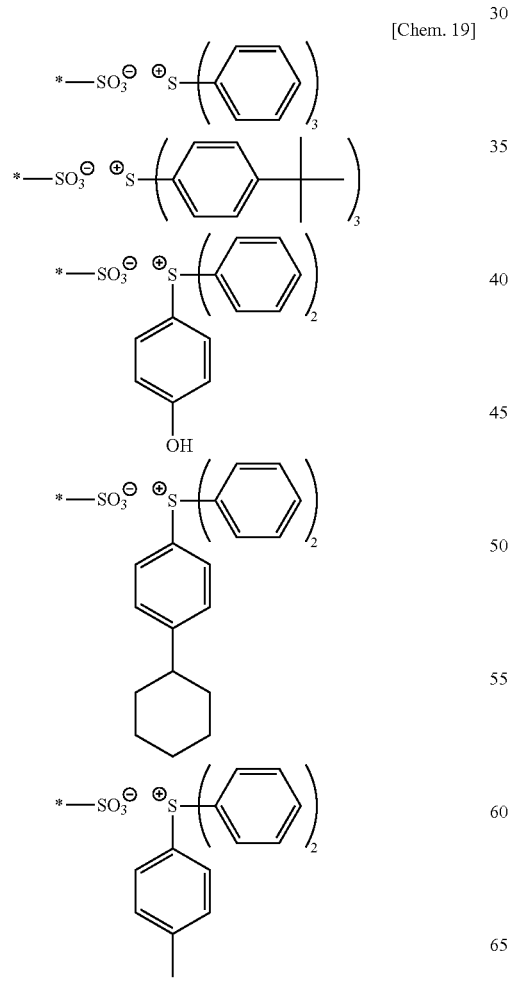
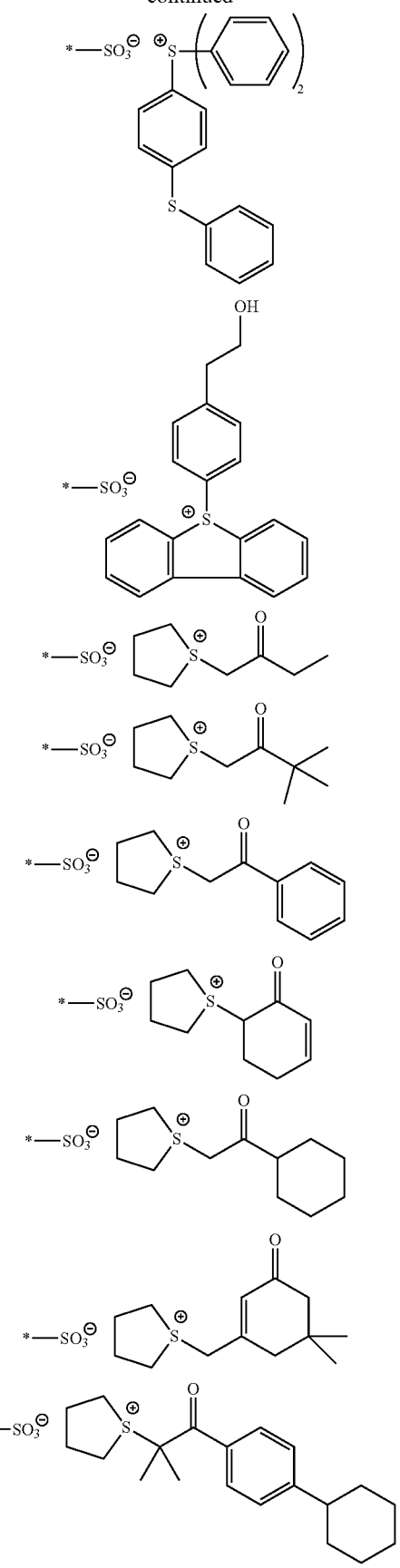

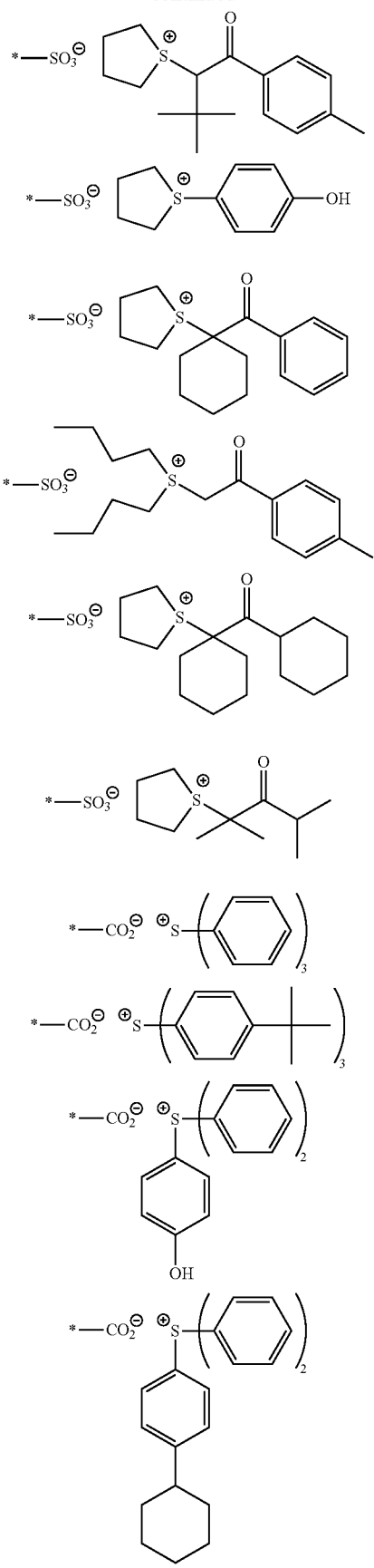
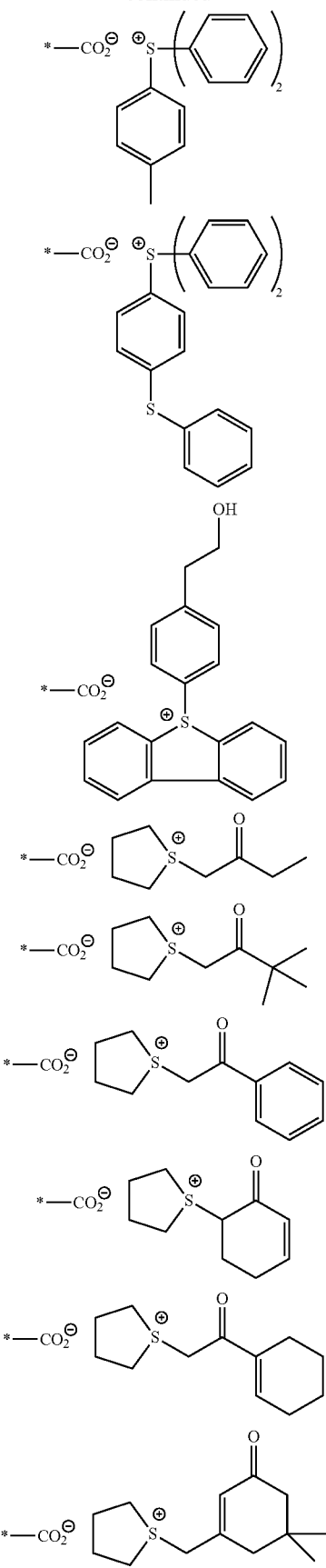
[Chem. 20]

-continued
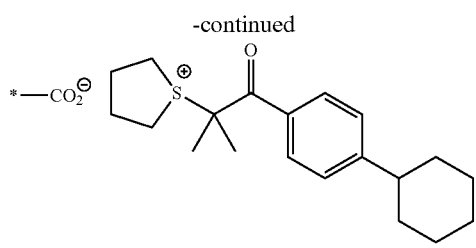
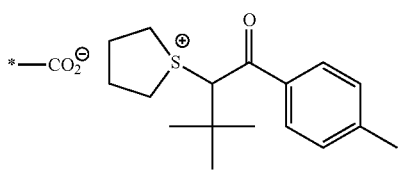
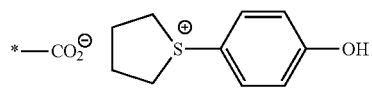
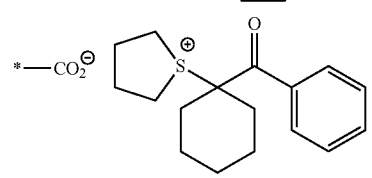
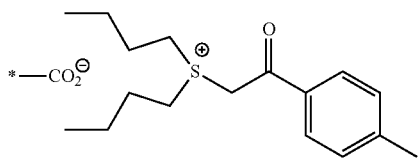
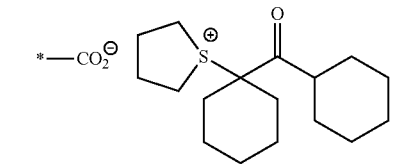
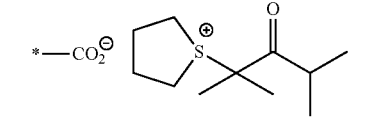
[Chem. 21]
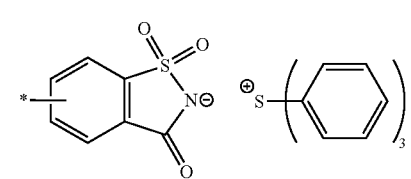
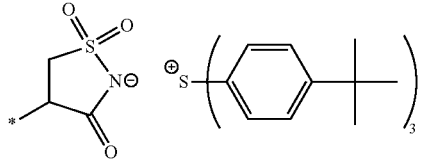
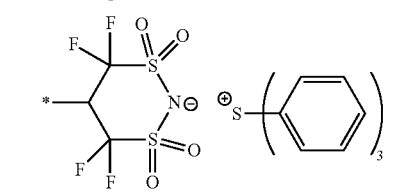
-continued
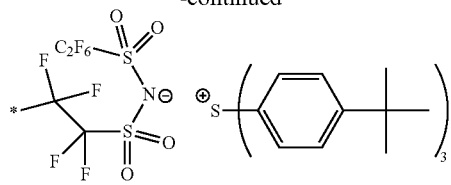
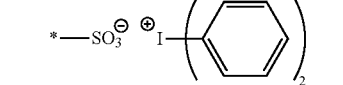
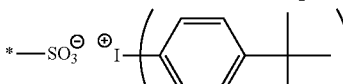
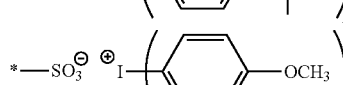
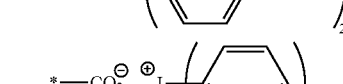
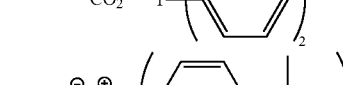
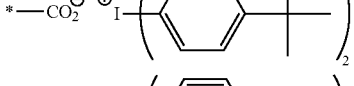
[Chem. 22]
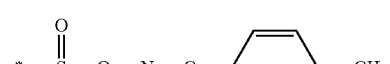
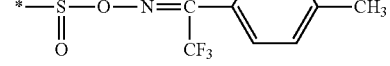
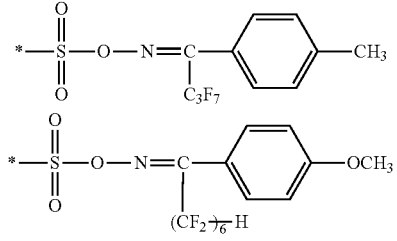
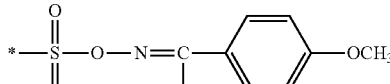
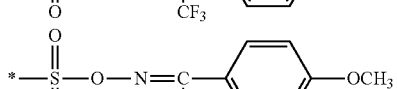
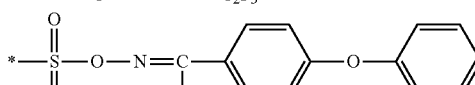
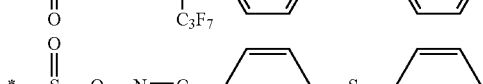
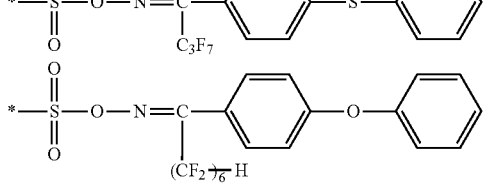

-continued
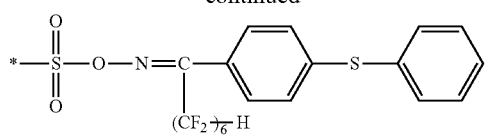
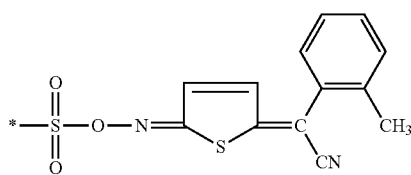
[Chem. 23]
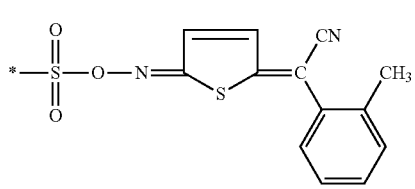
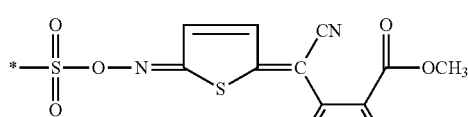
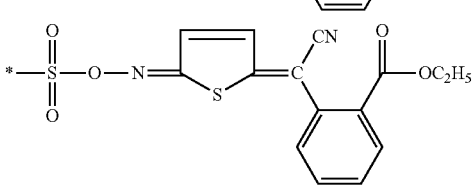
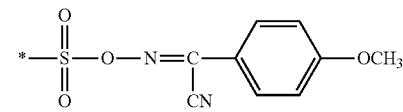
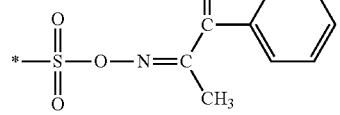
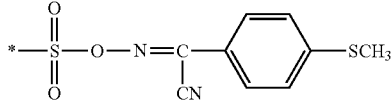
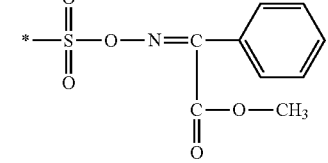
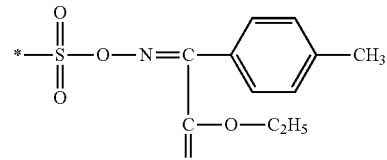
-continued
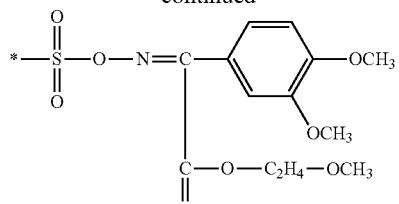
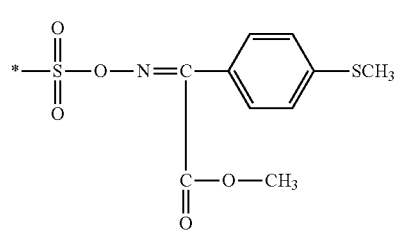
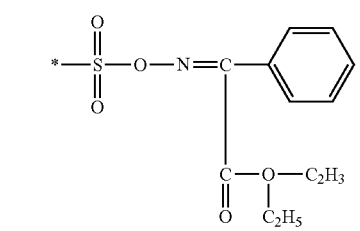
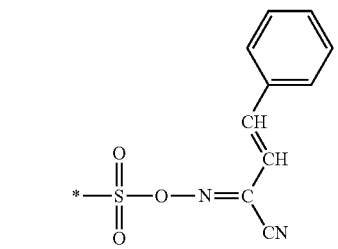
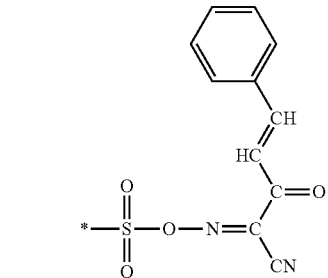
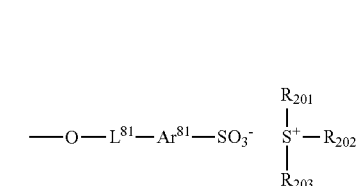
The moiety corresponding to (-L$^{41}$-S) of the repeating unit represented by the General Formula (4) is more preferably represented by the following General Formula (8).
[Chem. 24]
$$-O-L^{81}-Ar^{81}-SO_3^- \quad \begin{matrix} R_{201} \\ | \\ S^+-R_{202} \\ | \\ R_{203} \end{matrix} \qquad (8)$$
In the formula, L$^{81}$ represents a divalent organic group, and Ar$^{81}$ represents an arylene group.

Examples of the divalent organic group represented by $L^{81}$ include an alkylene group, a cycloalkylene group, —O—, —SO$_2$—, —CO—, —N(R)—, —S—, —CS—, and a combination of the same. Herein, R has the same definition as R in $L^{41}$ of the Formula (4). The divalent organic group represented by $L^{81}$ preferably has 1 to 15 carbon atoms in total, and more preferably has 1 to 10 carbon atoms in total.

The alkylene group and the cycloalkylene group represented by $L^{81}$ are the same as the alkylene group and the cycloalkylene group represented by $L^{41}$ of the Formula (4), and the preferable examples are also the same.

$L^{81}$ is preferably a carbonyl group, a methylene group, *—CO—(CH$_2$)$_n$—O—, *—CO—(CH$_2$)$_n$—O—CO—, *—(CH$_2$), —COO—, *—(CH$_2$)$_n$—CONR—, or *—CO—(CH$_2$)$_n$—NR—, and particularly preferably a carbonyl group, *—CH$_2$—COO—, *—CO—CH$_2$—O—, *—CO—CH$_2$—O—CO—, *—CH$_2$—CONR—, or *—CO—CH$_2$—NR—. Here, n represents an integer of 1 to 10. n is preferably an integer of 1 to 6, is more preferably an integer of 1 to 3, and most preferably is 1. In addition, * represents a linking moiety of a main chain, that is, a moiety linked to an O atom in the formula.

$Ar^{81}$ represents an arylene group and may have a substituent. Examples of a substituent which $Ar^{81}$ may have include an alkyl group (preferably having 1 to 8 carbon atoms and more preferably having 1 to 4 carbon atoms), an alkoxy group (preferably having 1 to 8 carbon atoms and more preferably having 1 to 4 carbon atoms), and a halogen atom (preferably a fluorine atom, a chlorine atom, a bromine atom, or an iodine atom and more preferably a fluorine atom). An aromatic ring of $Ar^{81}$ may be an aromatic hydrocarbon ring (for example, a benzene ring or a naphthalene ring) or an aromatic heterocycle (for example, a quinoline ring). The aromatic ring preferably has 6 to 18 carbon atoms, and more preferably has 6 to 12 carbon atoms.

$Ar^{81}$ is preferably an unsubstituted arylene group or an arylene group substituted with an alkyl group or a fluorine atom, and more preferably a phenylene group or a naphthylene group.

A method of synthesizing a monomer corresponding to the repeating unit represented by the General Formula (4) is not particularly limited. In a case of an onium structure, examples of the method include a method that synthesizes the monomer by exchanging an acid anion having a polymerizable unsaturated bond corresponding to the repeating unit and a halide of a known onium salt.

More specifically, a metal ion salt (for example, a sodium ion, a potassium ion, or the like) or an ammonium salt (ammonium, triethylammonium salt, or the like) of an acid having a polymerizable unsaturated bond corresponding to the repeating unit and an onium salt having a halogen ion (a chloride ion, a bromide ion, an iodide ion, or the like) are stirred in the presence of water or methanol to cause an anion exchange reaction, followed by liquid separation and washing by using an organic solvent such as dichloromethane, chloroform, ethyl acetate, methyl isobutyl ketone, or tetrahydroxyfuran and water, whereby a target monomer corresponding to the repeating unit represented by the General Formula (4) can be synthesized.

In addition, the acid anion and the onium salt are stirred in the presence of an organic solvent that can be separated from water, such as dichloromethane, chloroform, ethyl acetate, methyl isobutyl ketone, or tetrahydroxyfuran, and water to cause an anion exchange reaction, followed by liquid separation and washing by using water, whereby the monomer can be synthesized.

The repeating unit represented by the General Formula (4) can also be synthesized by introducing an acid anion moiety to a side chain through a polymer reaction and introducing an onium salt through salt exchange.

Specific examples of the repeating unit represented by the General Formula (4) will be shown below, but the present invention is not limited thereto.

[Chem. 25]

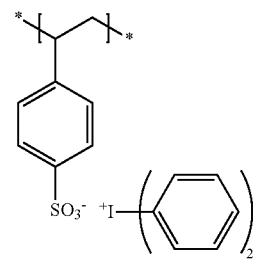

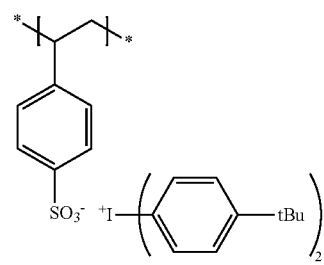

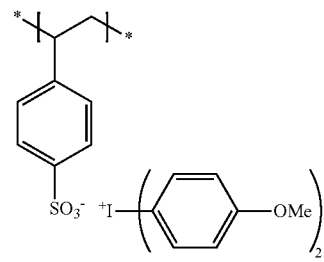

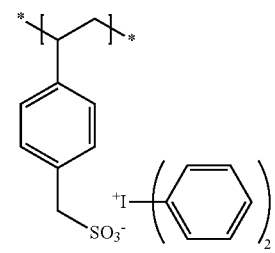

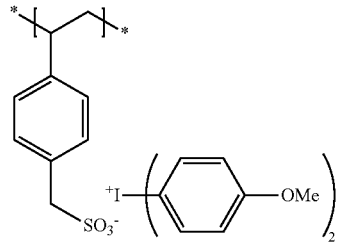

37
-continued
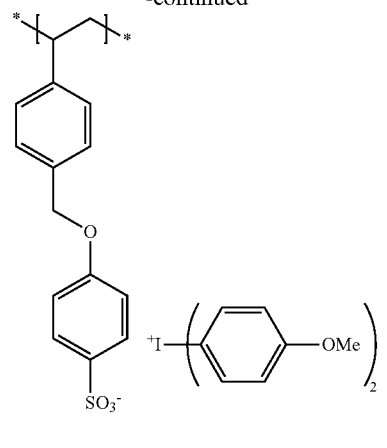
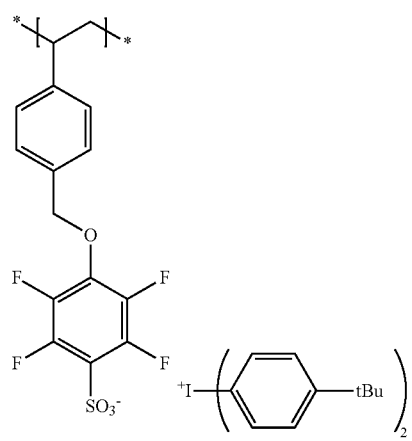
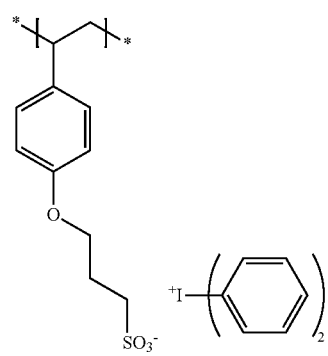
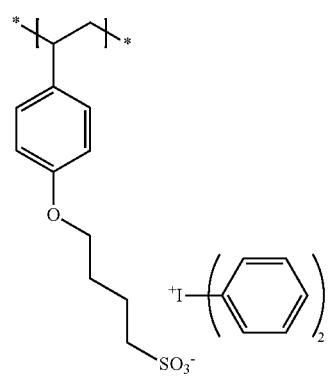
38
-continued
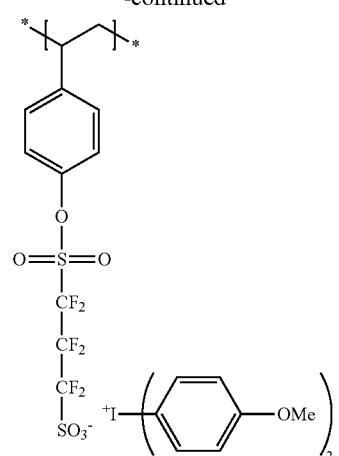
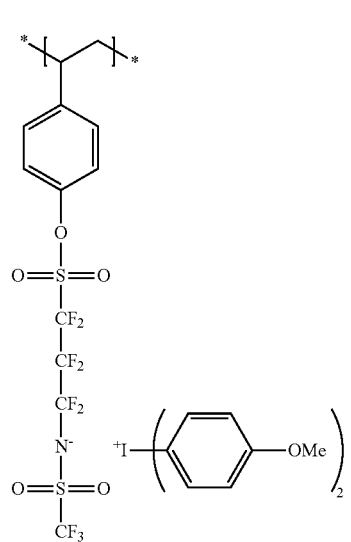
[Chem. 26]
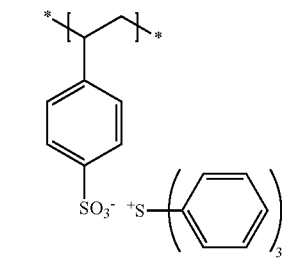
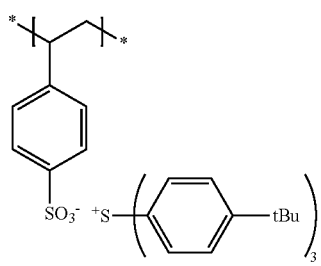

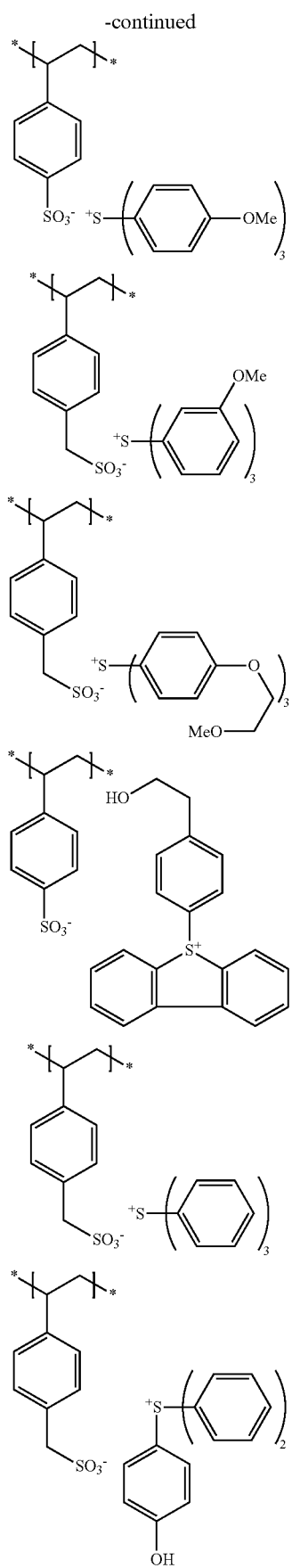
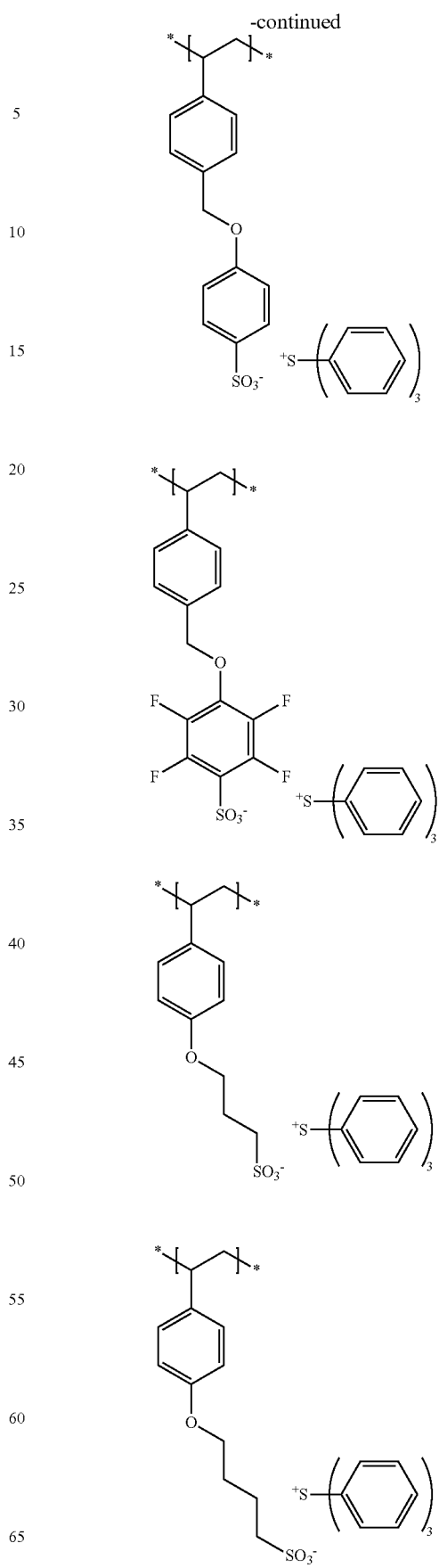

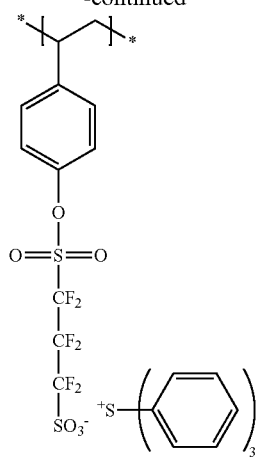
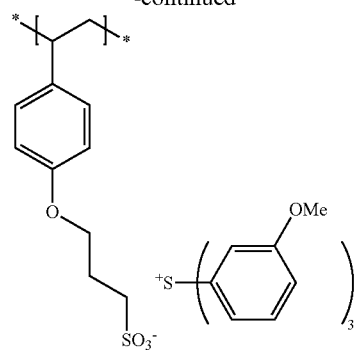
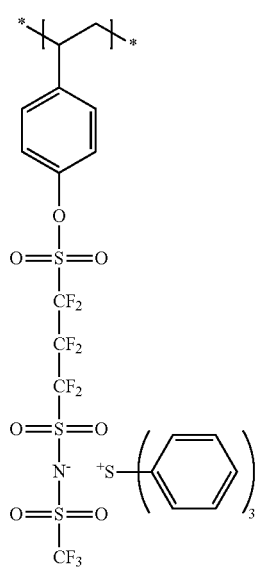
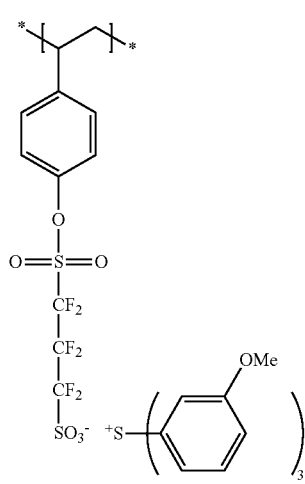
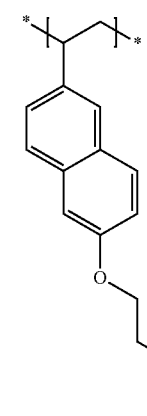
[Chem. 27]
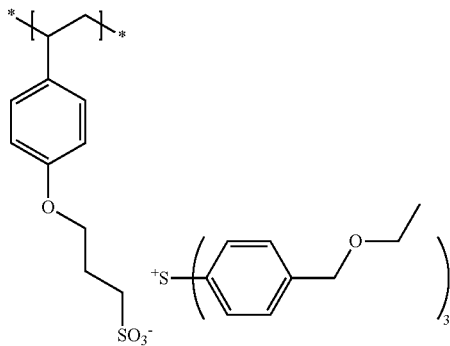
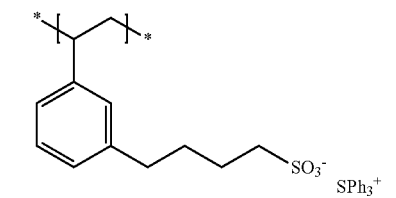
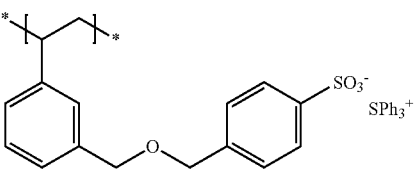

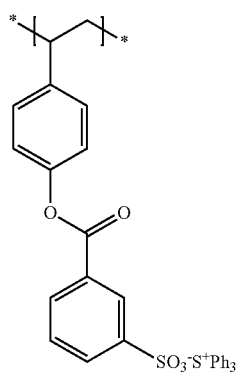
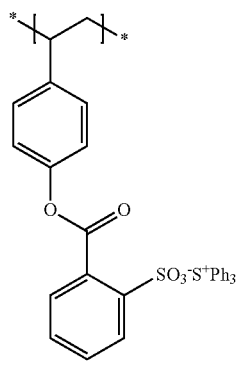
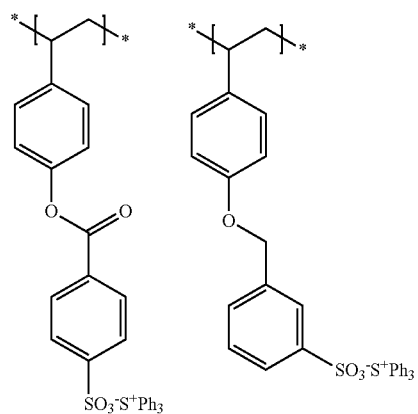
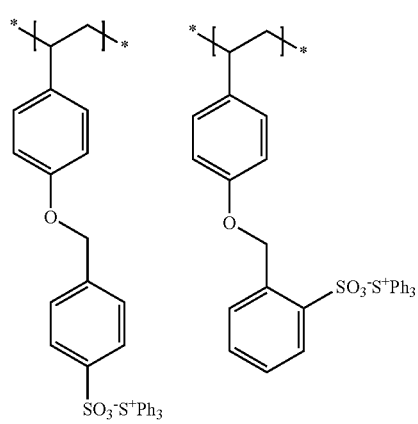
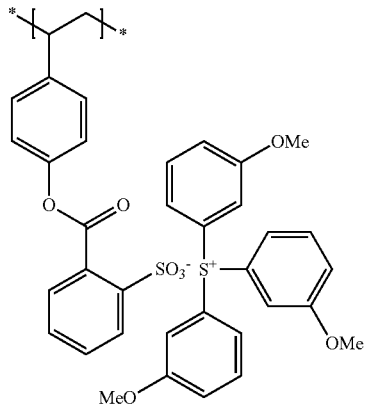
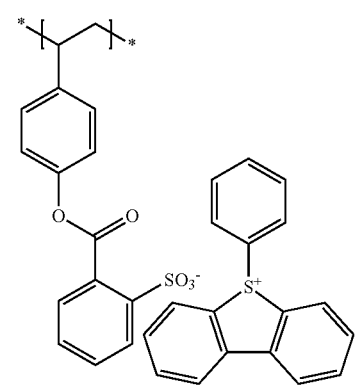
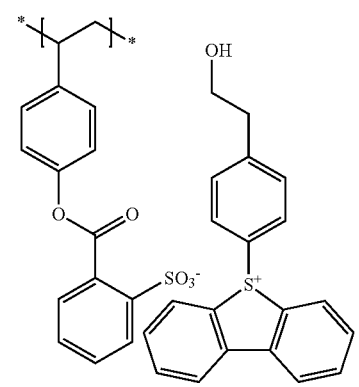
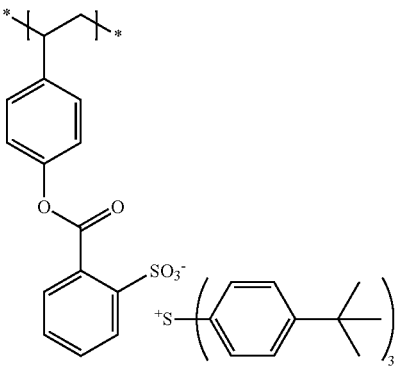

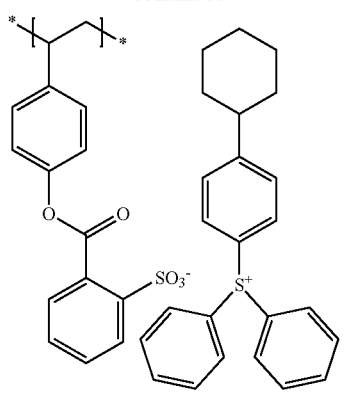
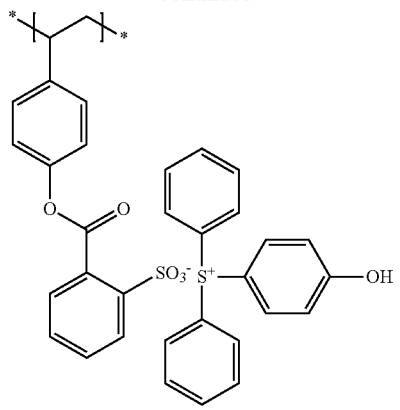
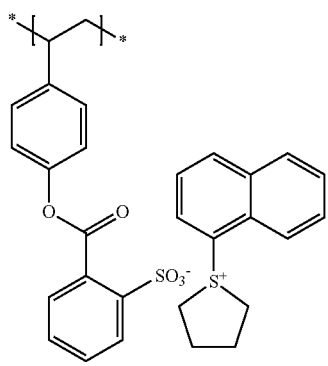
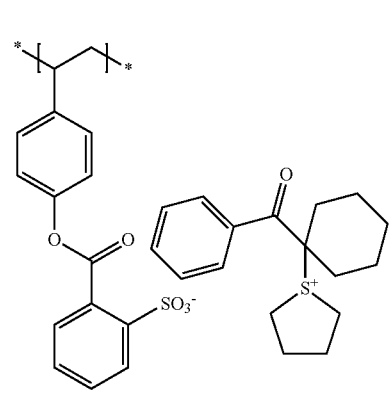
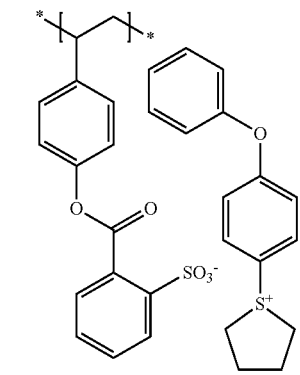
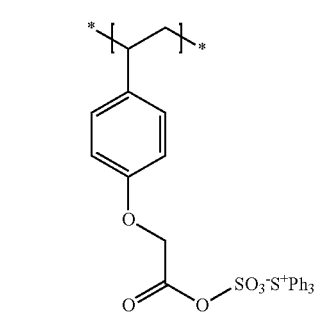
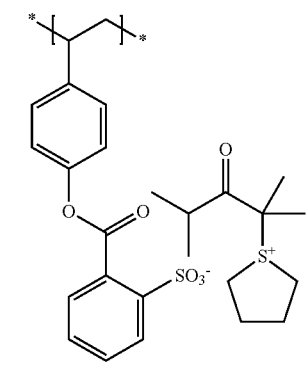
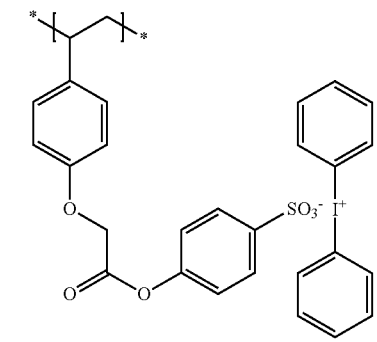

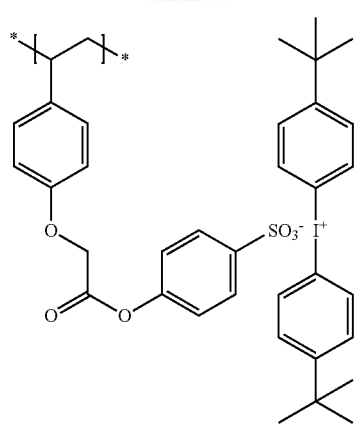
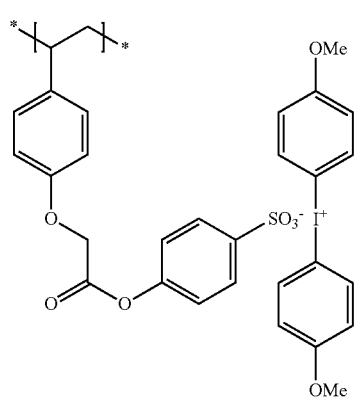
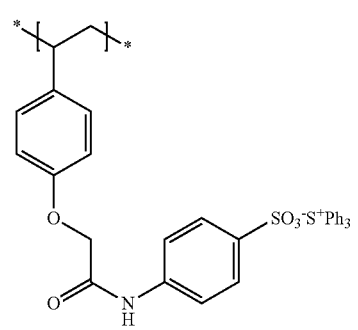
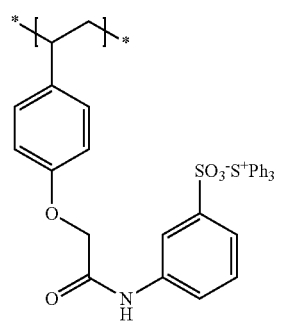
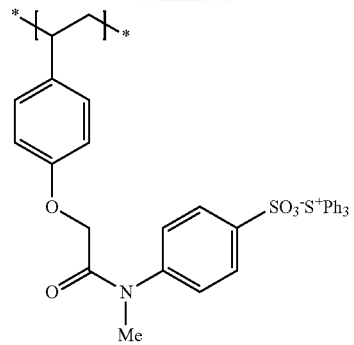
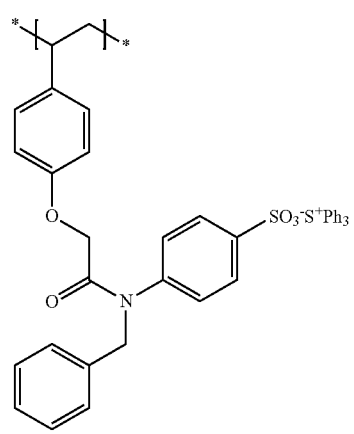
[Chem. 29]
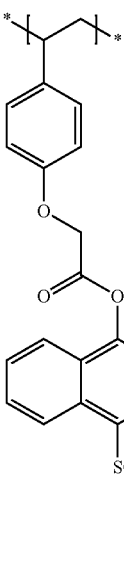

49
-continued
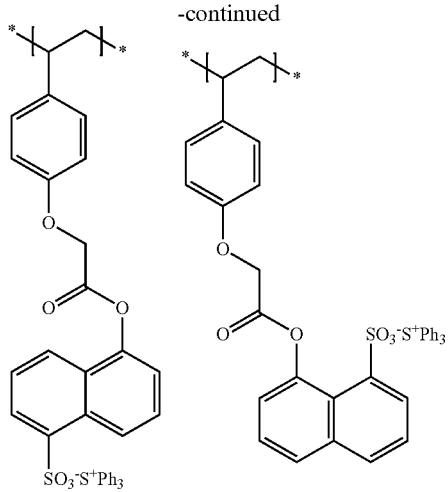
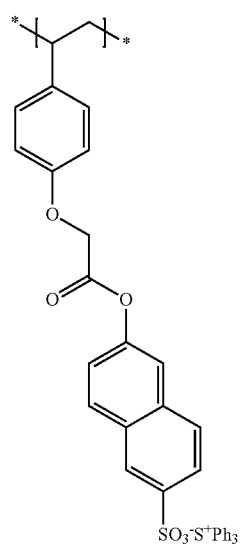
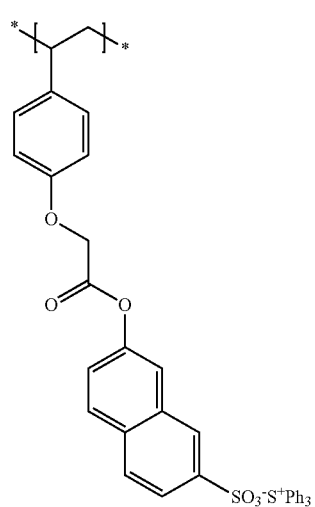
50
-continued
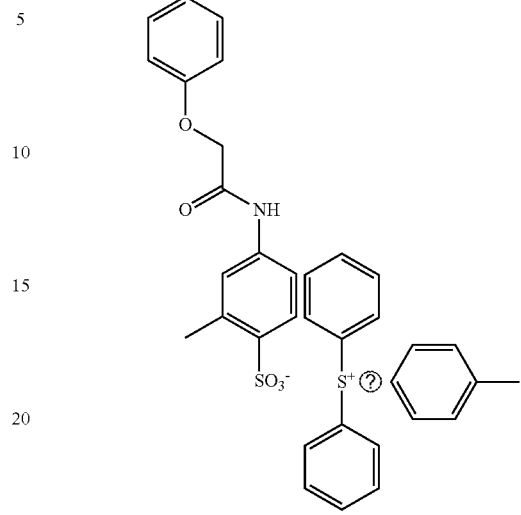
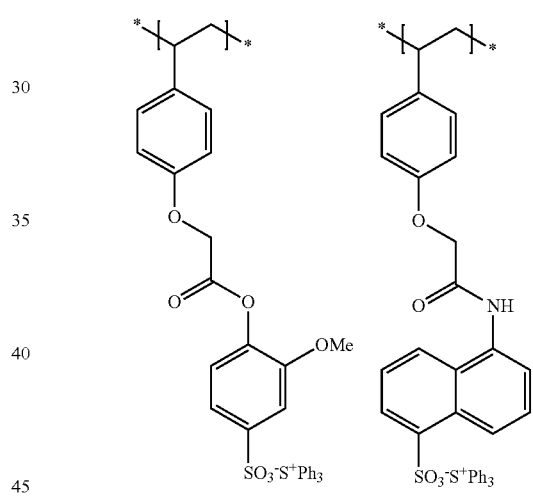
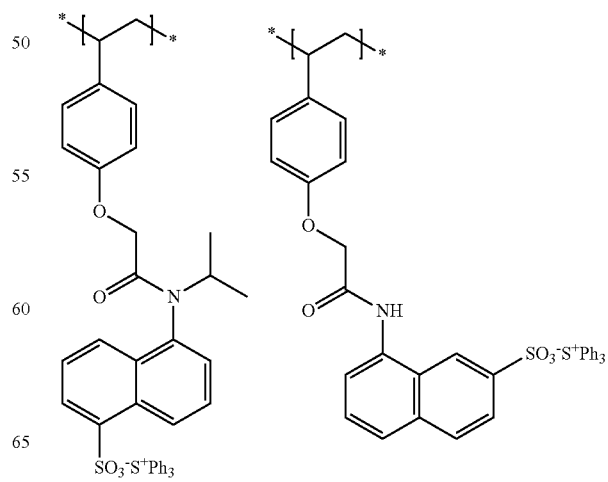

51
-continued
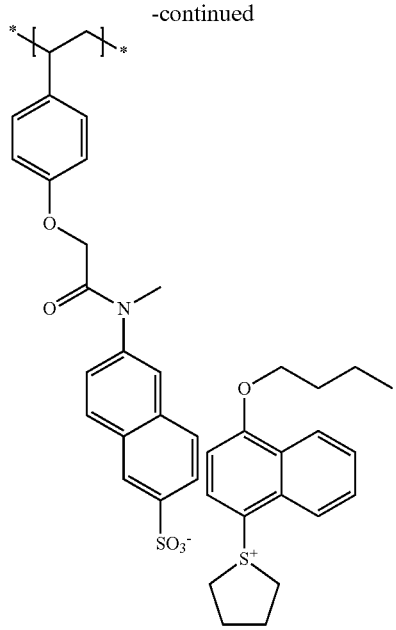
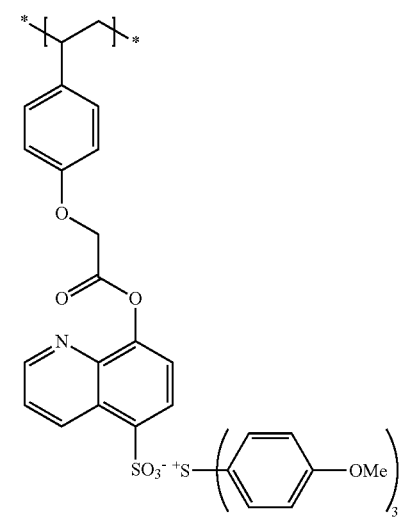
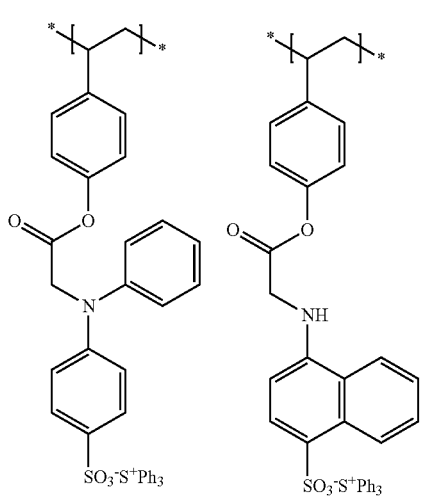
52
-continued
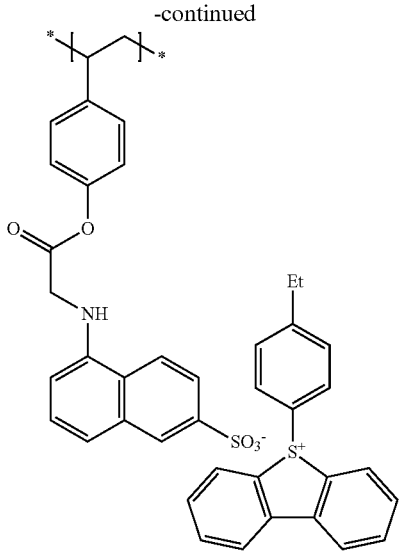
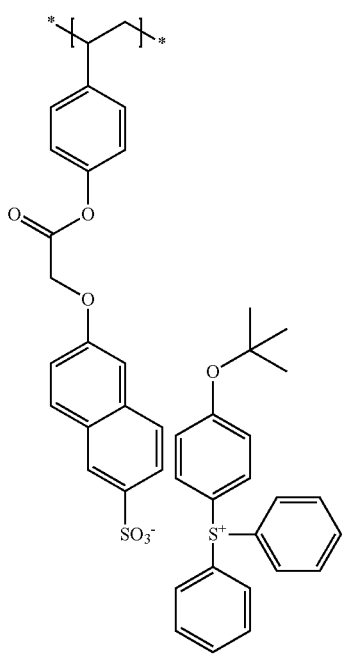
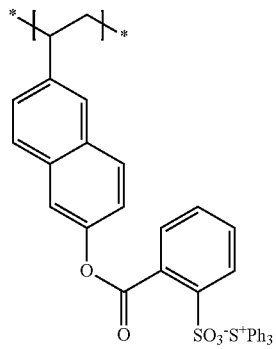

53
-continued
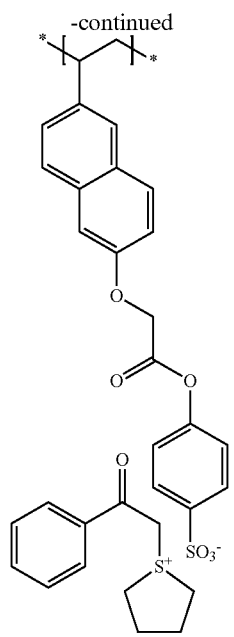
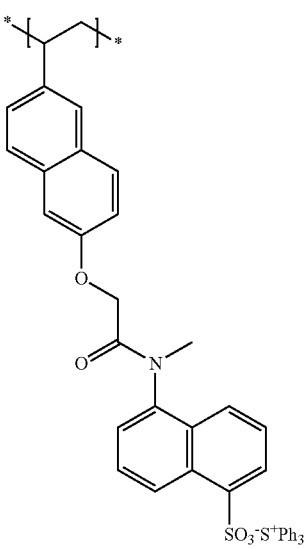
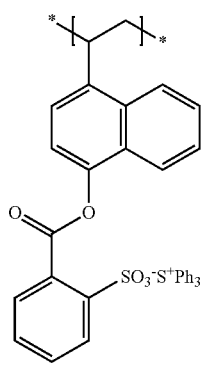
54
-continued
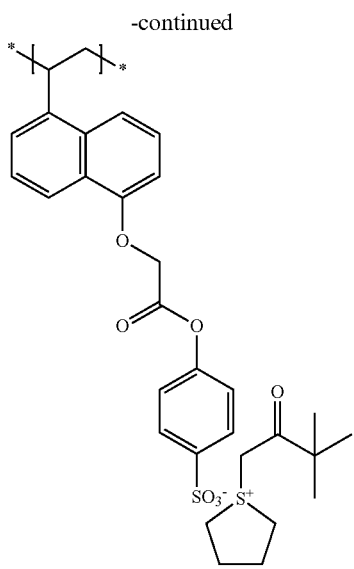
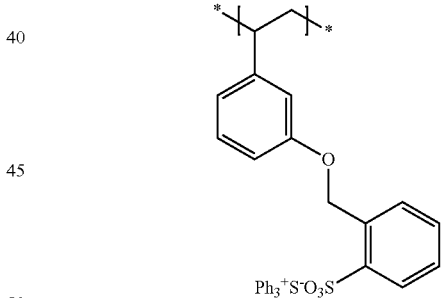
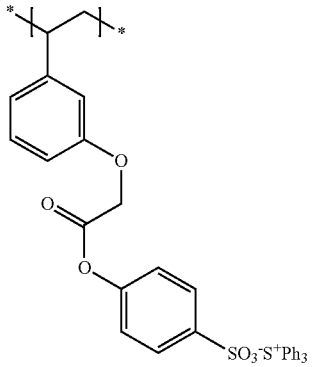

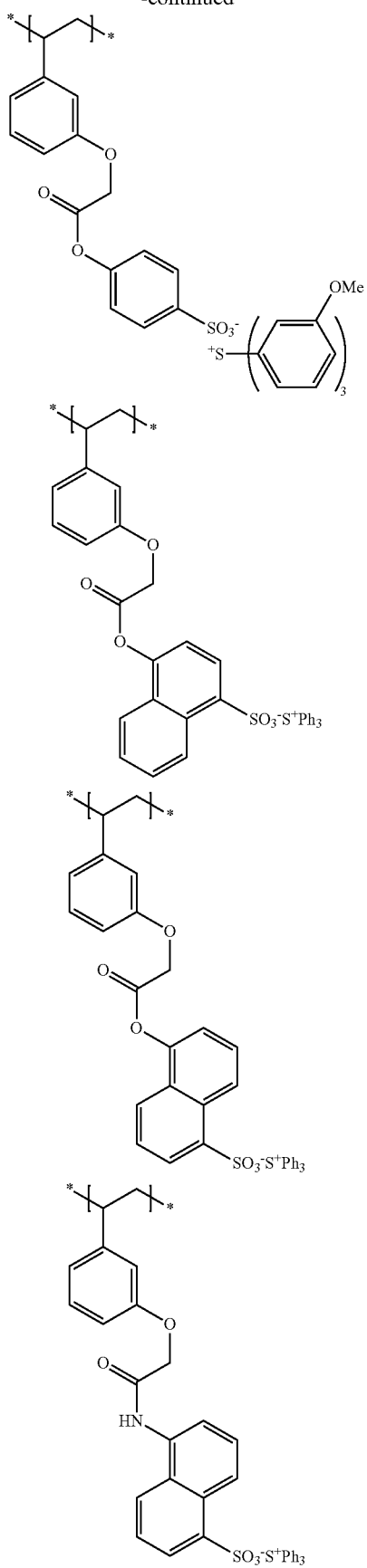

57
-continued
58
-continued
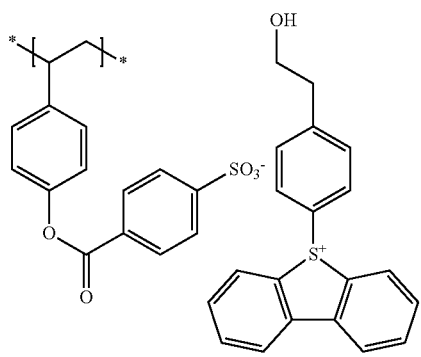
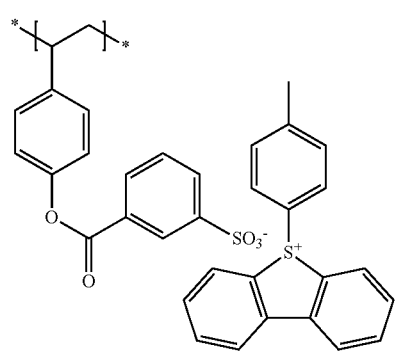
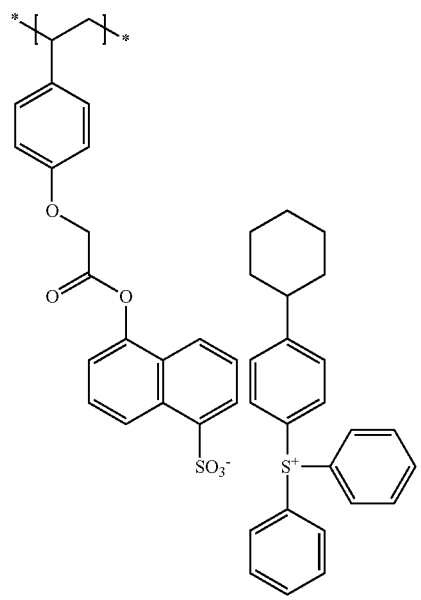
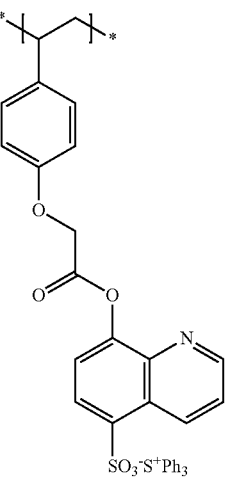
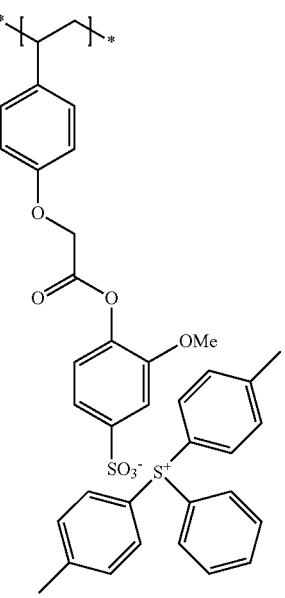
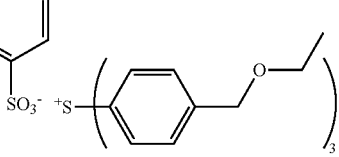

59
-continued
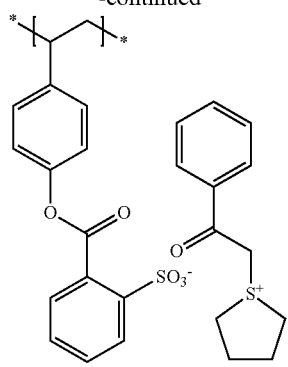
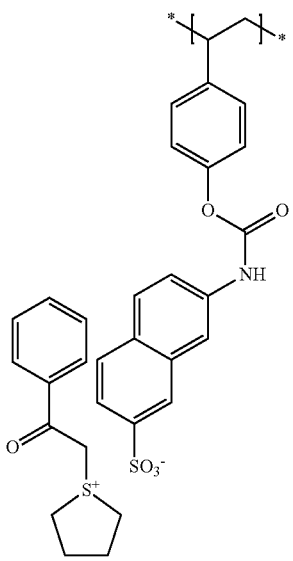
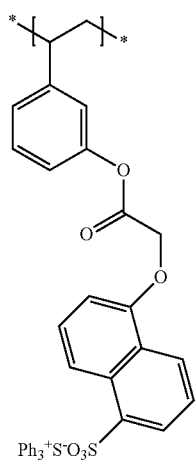
60
-continued
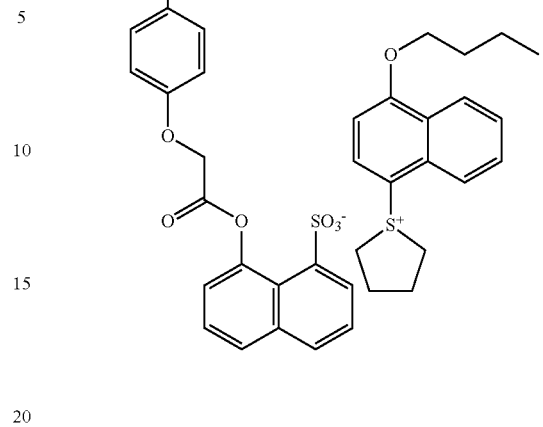
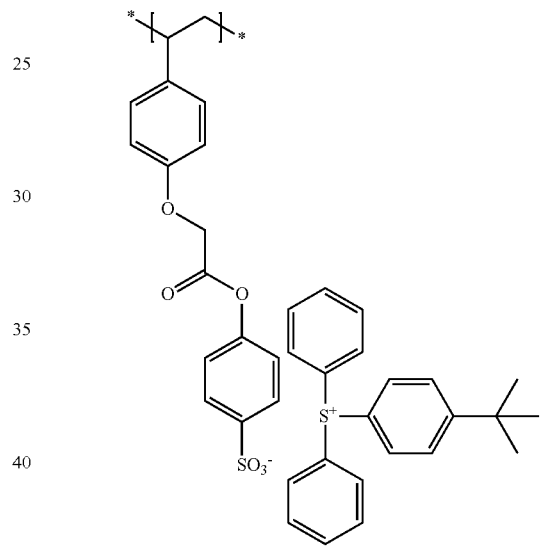
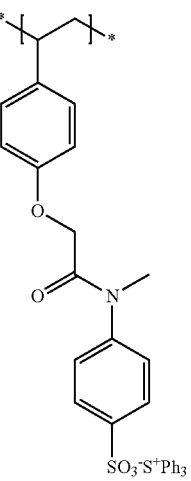

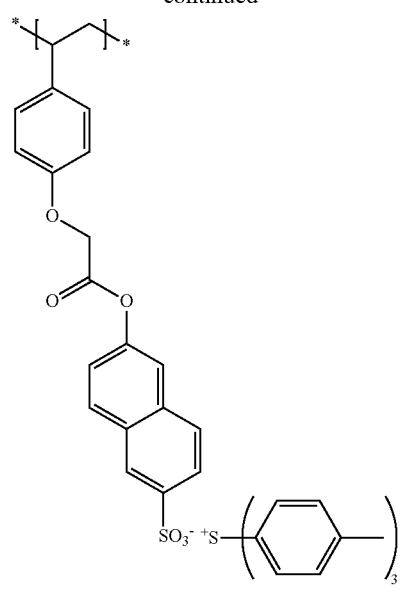
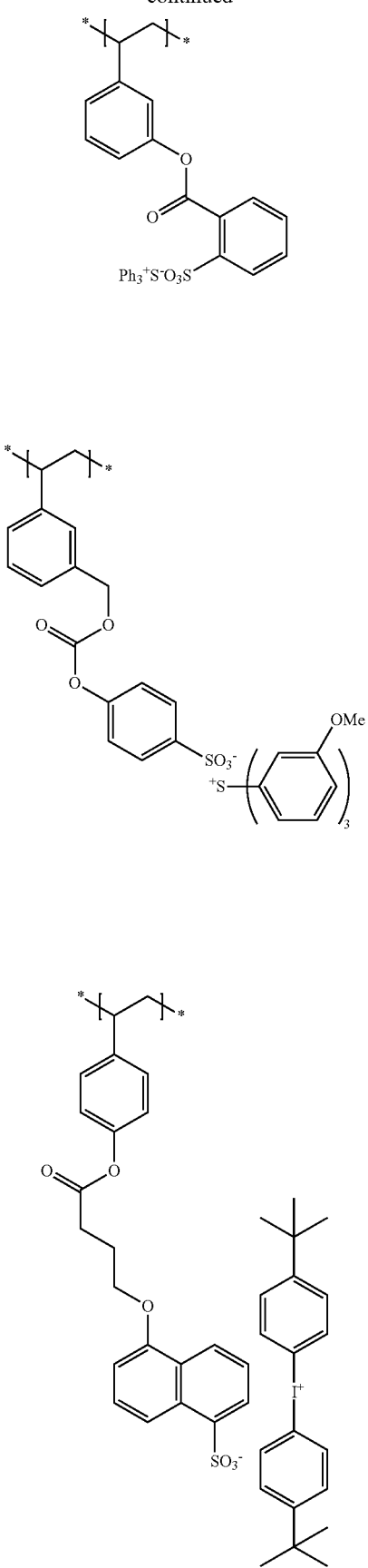

63
-continued
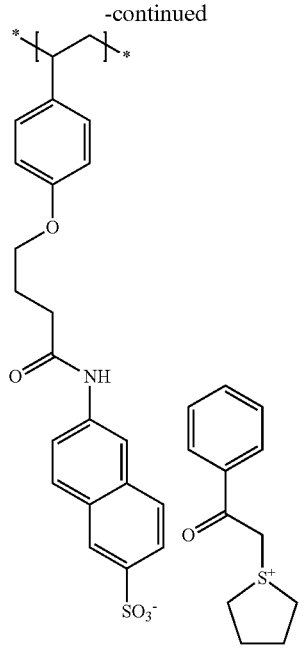
64
-continued
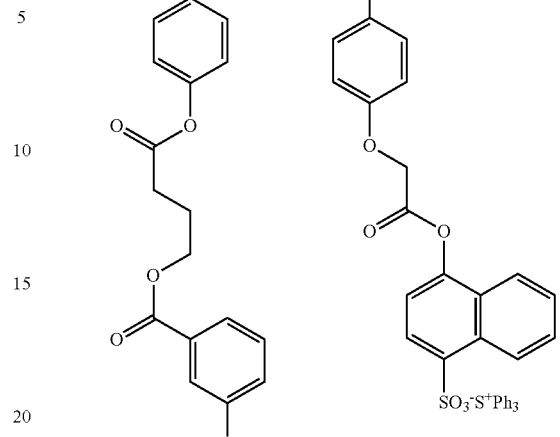
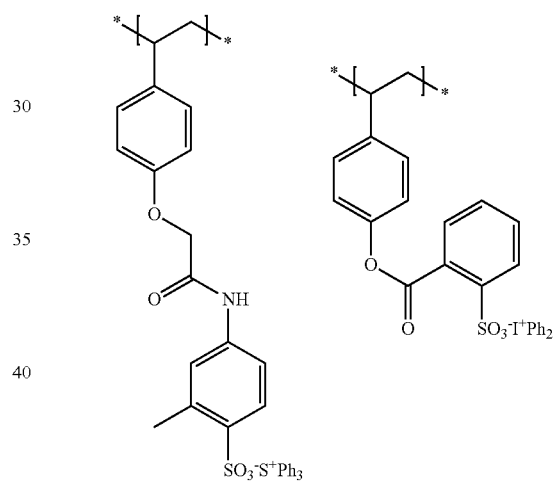
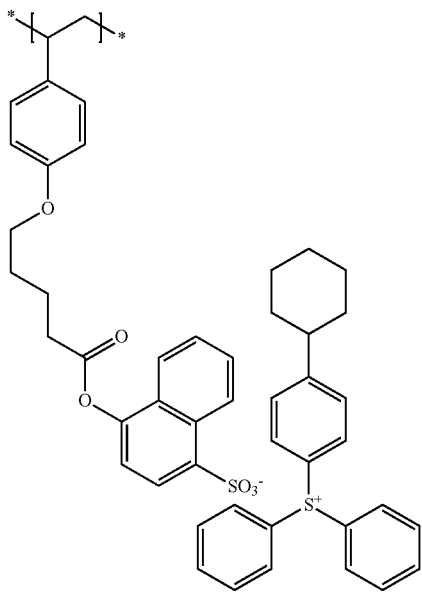

65
-continued
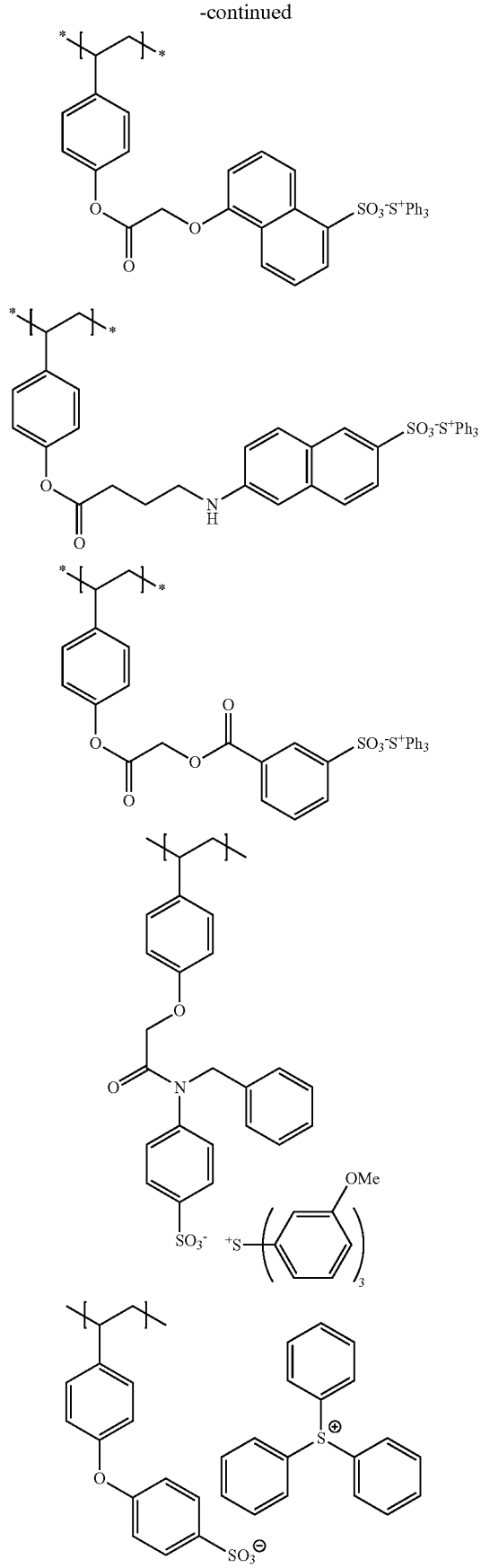
66
-continued
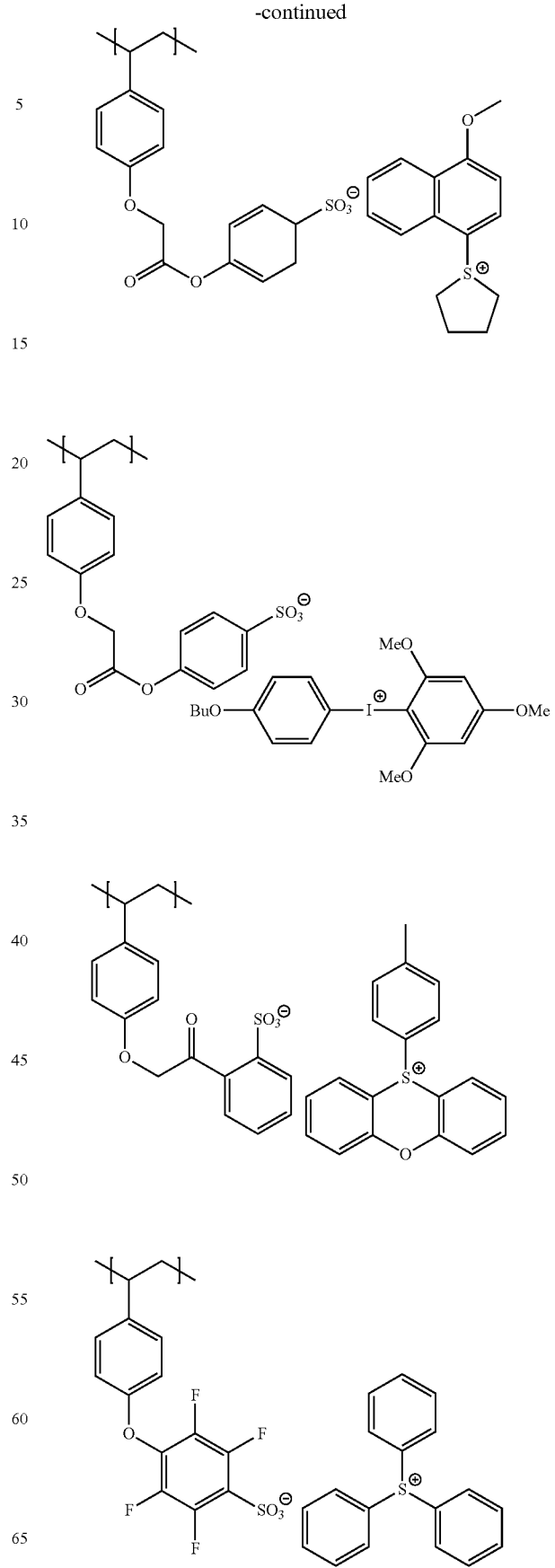

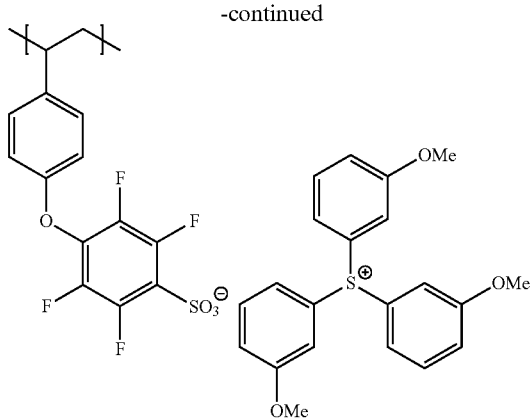
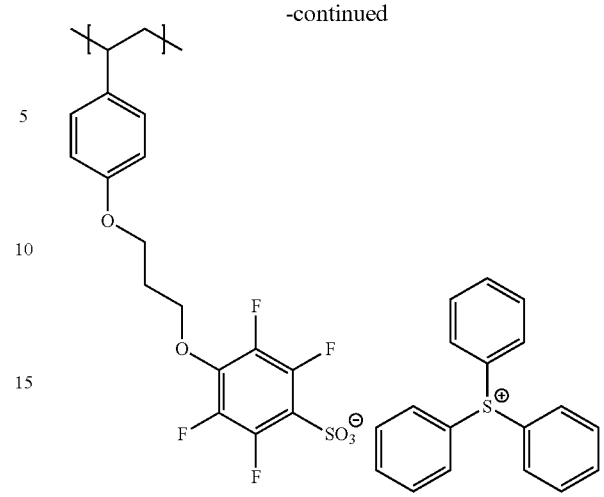
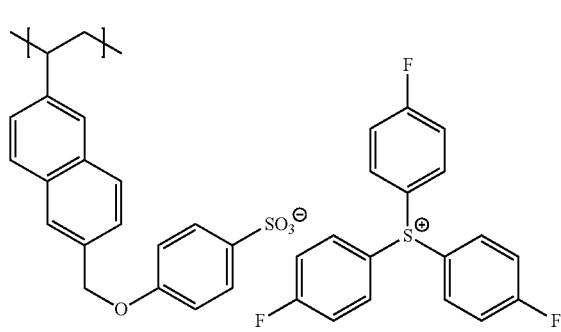
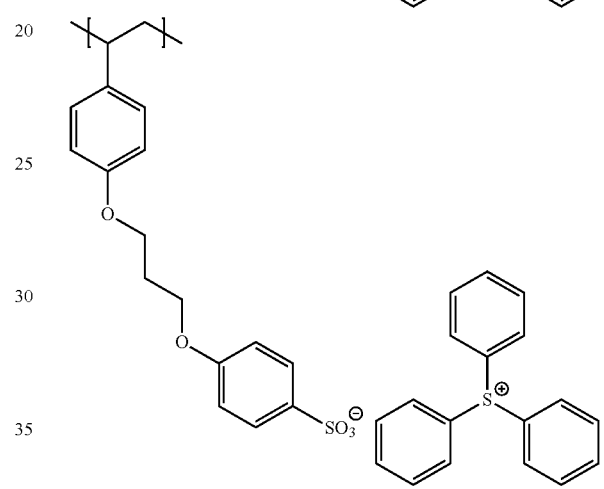
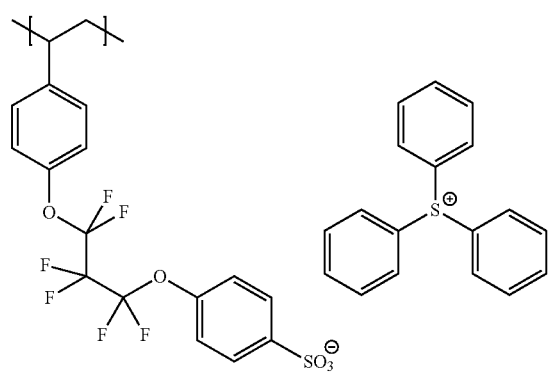
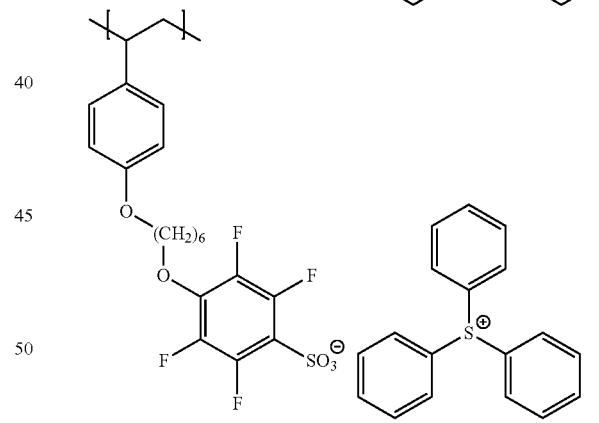
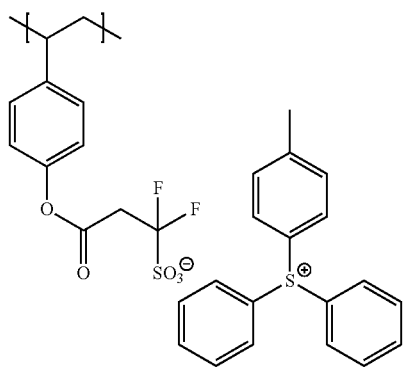

When the core is a polymer compound, the content of the repeating units represented by the General Formula (4) in the compound (P) of the present invention preferably ranges from 1 mol % to 30 mol %, more preferably ranges from 2 mol % to 15 mol %, and particularly preferably ranges from 2 mol % to 10 mol %, based on the total repeating units of the compound (P).

When the core is a polymer compound, the compound (P) used in the present invention preferably further contains a repeating unit described below as another repeating unit.

For example, the compound (P) may further contain a repeating unit having a group of which a dissolution rate in an alkaline developer is increased due to the degradation of the group caused by the action of the alkaline developer. Examples of such a group include a group having a lactone structure, a group having a phenyl ester structure, and the like. As the repeating unit having a group of which a dissolution rate in an alkaline developer is increased due to the degradation of the group caused by the action of the alkaline developer, a repeating unit represented by the following General Formula (AII) is more preferable.

[Chem. 32]

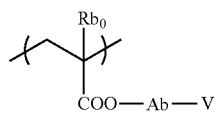

(AII)

In the General Formula (AII), V represents a group of which a dissolution rate in an alkaline developer is increased due to the degradation of the group caused by the action of the alkaline developer, $Rb_0$ represents a hydrogen atom or a methyl group, and Ab represents a single bond or a divalent organic group.

V is a group degraded by the action of an alkaline developer and is a group having an ester bond, and among such groups, a group having a lactone structure is more preferable. As the group having a lactone structure, any group can be used as long as the group has a lactone structure, but the group preferably has a 5- to 7-membered ring lactone structure. It is preferable that another ring structure be condensed with the 5- to 7-membered lactone structure while forming a bicyclo structure or a spiro structure.

Ab is preferably a single bond or a divalent linking group represented by -AZ—$CO_2$-(AZ is an alkylene group or an aliphatic ring group). AZ is preferably a methylene group, an ethylene group, a cyclohexylene group, an adamantylene group, or a norbornylene group.

Specific examples thereof are shown below. In the formulae, Rx represents H or $CH_3$.

[Chem. 33]

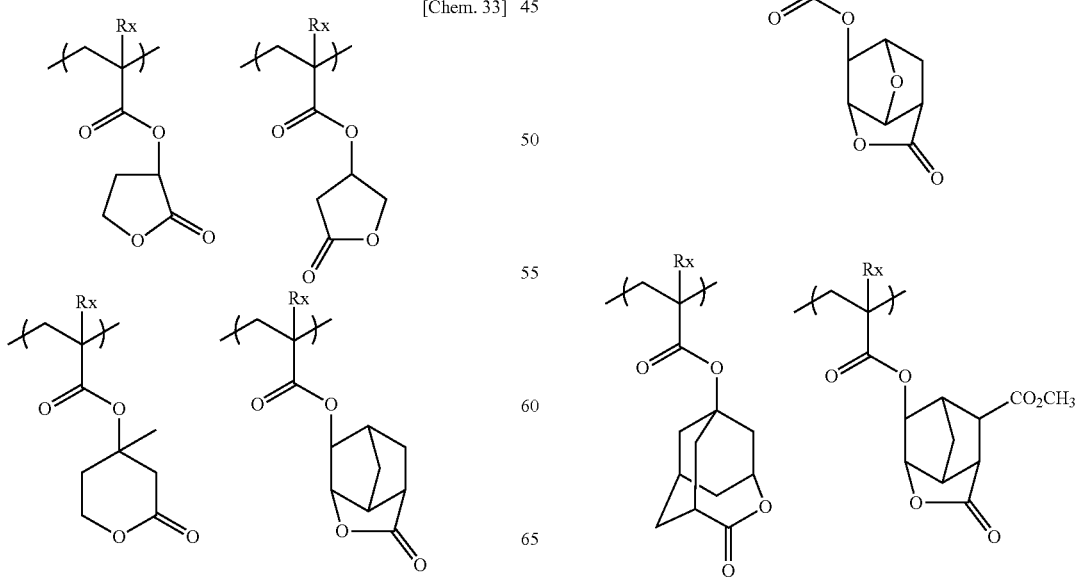

-continued

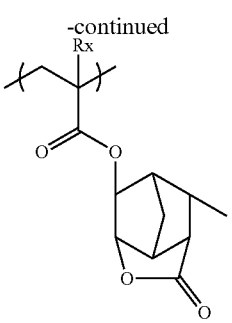

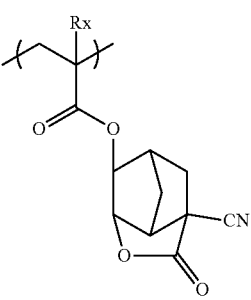

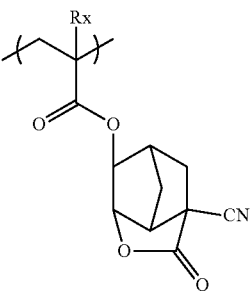

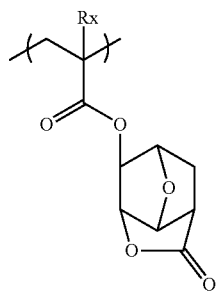

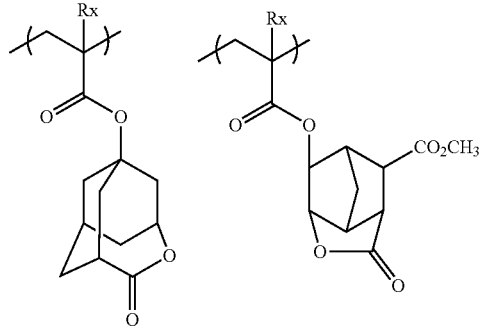

71
-continued
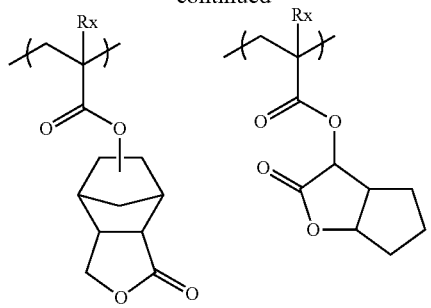
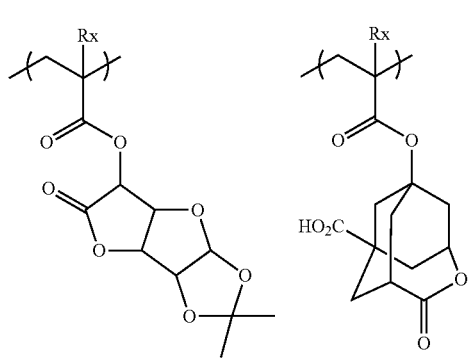
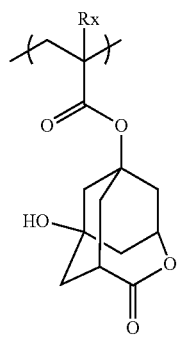
[Chem. 34]
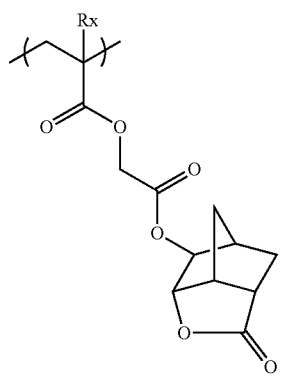
72
-continued
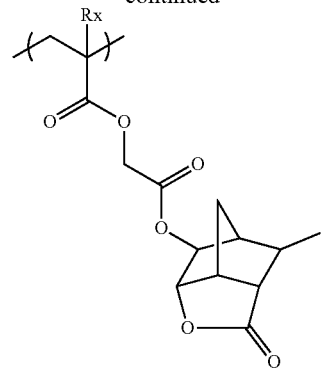
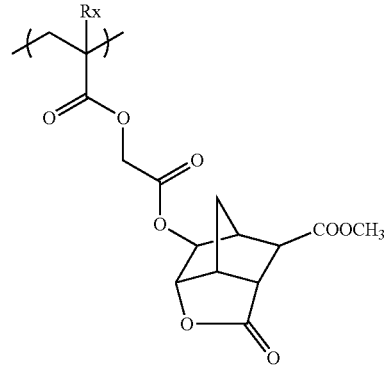
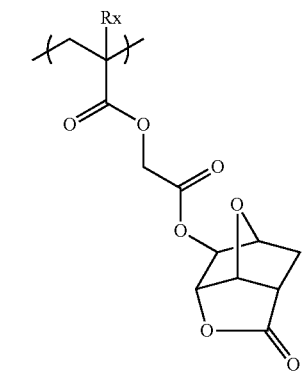
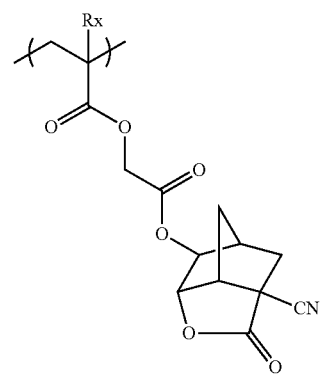

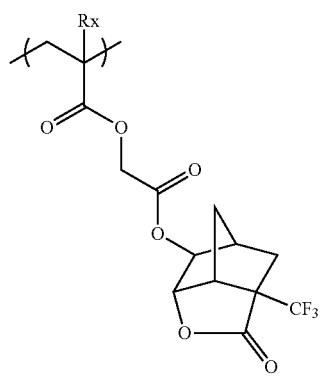
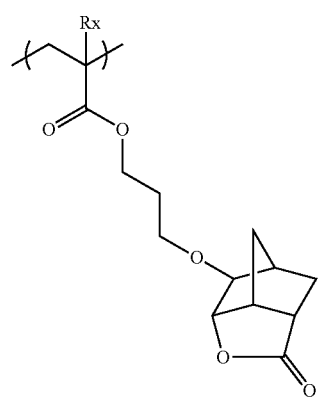
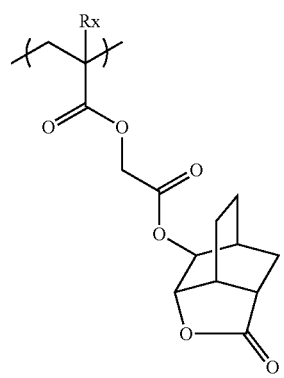
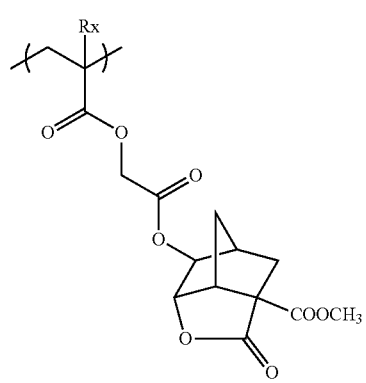
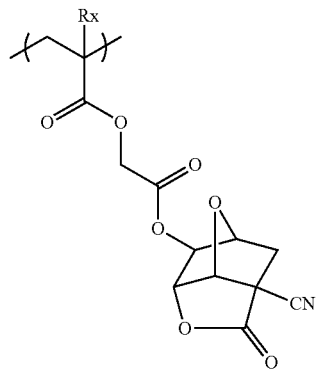
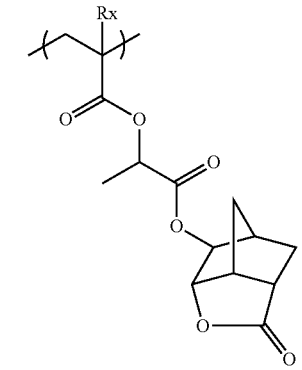
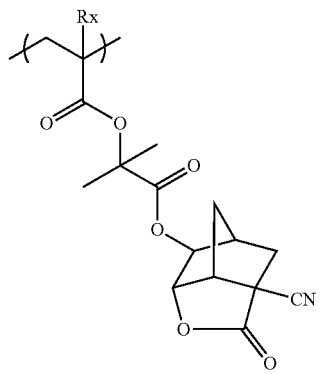
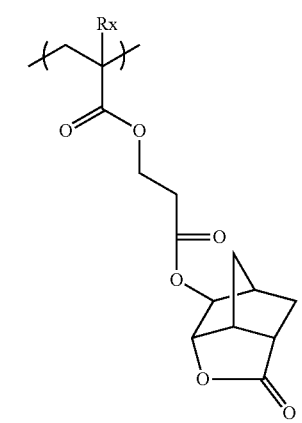

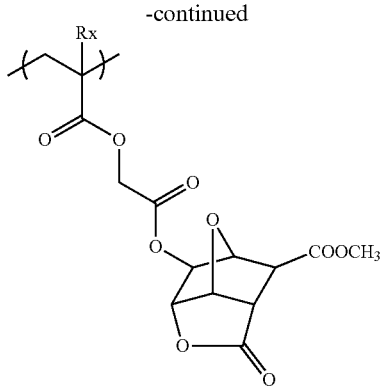

The compound (P) may or may not contain a repeating unit having a group of which a dissolution rate in an alkaline developer is increased due to the degradation of the group caused by the action of the alkaline developer. When compound (P) contains the repeating unit, the content of the repeating units having such a group preferably ranges from 10 mol % to 60 mol %, more preferably ranges from 15 mol % to 50 mol %, and even more preferably ranges from 15 mol % to 40 mol %, based on the total repeating units in the compound (P).

Examples of the polymerizable monomer for forming a repeating unit other than the above repeating unit in the compound (P) of the present invention include styrene, alkyl-substituted styrene, alkoxy-substituted styrene, O-alkylated styrene, O-acylated styrene, hydrogenated hydroxystyrene, maleic anhydride, an acrylic acid derivative (acrylic acid, acrylic acid ester, or the like), a methacrylic acid derivative (methacrylic acid, methacrylic acid ester, or the like), N-substituted maleimide, acrylonitrile, methacrylonitrile, vinyl naphthalene, vinyl anthracene, acenaphthylene, indene which may have a substituent, and the like. As substituted styrene, 4-(1-naphthylmethoxy)styrene, 4-benzyloxystyrene, 4-(4-chlorobenzyloxy)styrene, 3-(1-naphthylmethoxy)styrene, 3-benzyloxystyrene, 3-(4-chlorobenzyloxy)styrene, and the like are preferable.

The compound (P) may or may not contain these repeating units. When the compound (P) contains these repeating units, the content of these repeating units in the compound (P) generally ranges from 1 mol % to 20 mol %, and preferably ranges from 2 mol % to 10 mol %, based on the total repeating units constituting the compound (P).

When the core is a polymer compound, the compound (P) of the present invention can be synthesized by, for example, polymerizing an unsaturated monomer corresponding to the respective repeating units through radical polymerization, cationic polymerization, or anionic polymerization. In addition, an unsaturated monomer corresponding to a precursor of the respective repeating units may be used to polymerize a polymer, and then the synthesized polymer may be modified with a low-molecular weight compound so as to be converted into the desired repeating unit, whereby the compound (A) can be synthesized. In any case, it is preferable to use living polymerization such as living anionic polymerization since the molecular weight distribution of the obtained polymer compound becomes uniform.

The weight average molecular weight of the compound (P) used in the present invention is preferably from 1,000 to 200,000, more preferably from 2,000 to 50,000, and even more preferably from 2,000 to 15,000. A preferable dispersity (molecular weight distribution) (Mw/Mn) of the compound (P) is from 1.0 to 1.7, and more preferably from 1.0 to 1.3. The weight average molecular weight and the dispersity of the compound (P) are defined as values that are measured by GPC and expressed in terms of polystyrene. For example, the weight average molecular weight (Mw) and the number average molecular weight (Mn) of the compound (P) can be obtained by using an HLC-8120 (manufactured by TOSOH CORPORATION), a TSK gel Multipore HXL-M (manufactured by TOSOH CORPORATION, 7.8 mm IDx30.0 cm) as a column, and THF (tetrahydrofuran) as an eluent.

Specific examples of a case where the compound (P) is a polymer compound will be shown below, but the present invention is not limited thereto.

[Chem. 35]

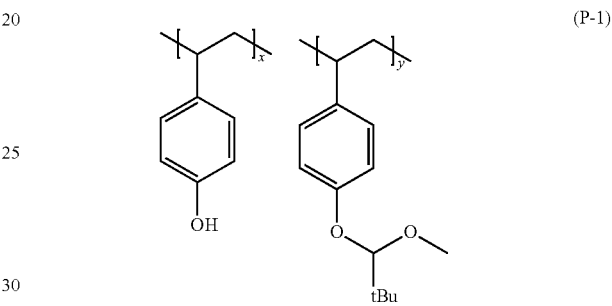

(P-1)

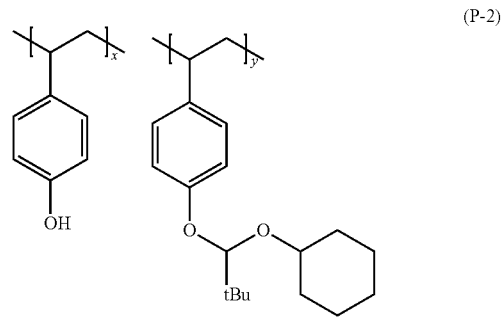

(P-2)

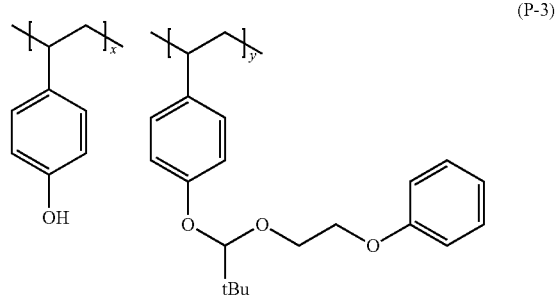

(P-3)

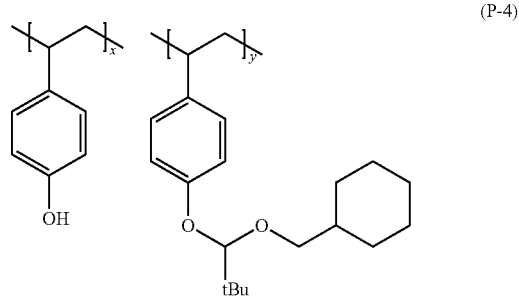

(P-4)

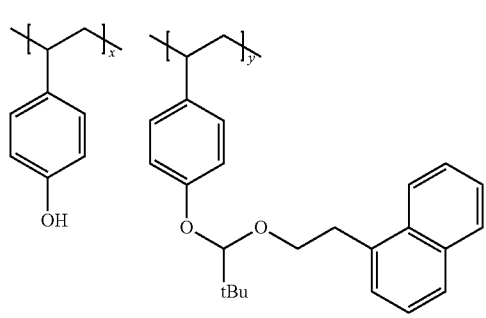
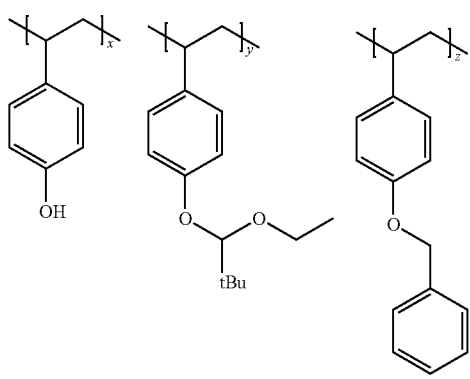

(P-14)
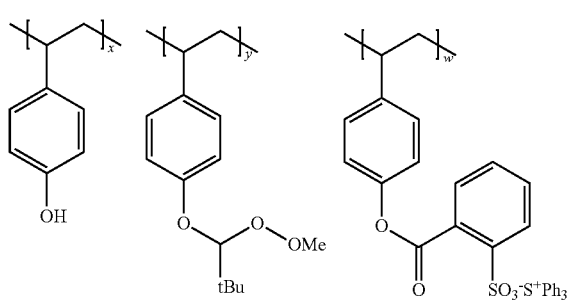
(P-15)
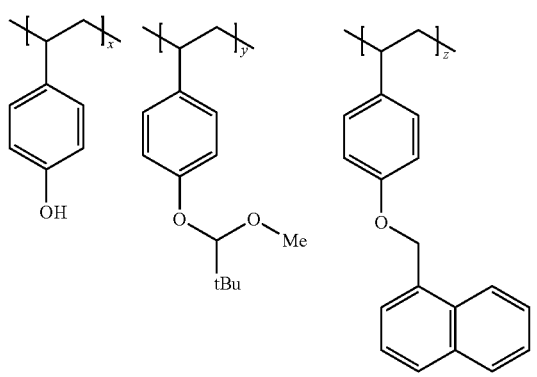
(P-16)
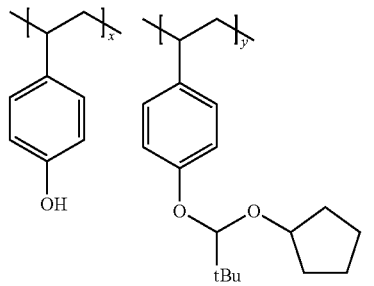
(P-17)
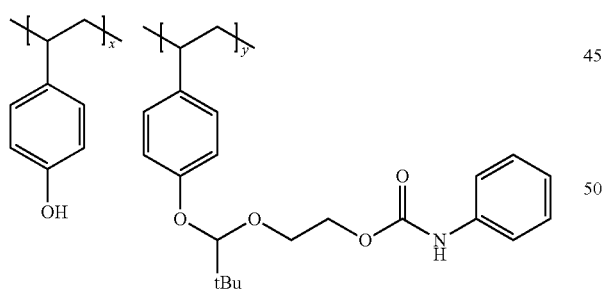
(P-18)
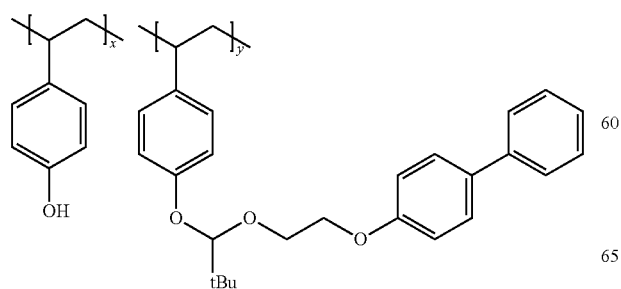
(P-19)
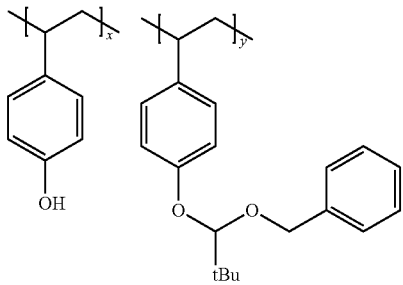
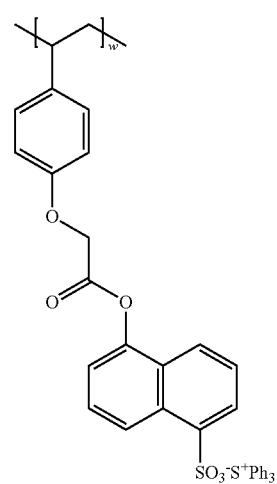
(P-20)
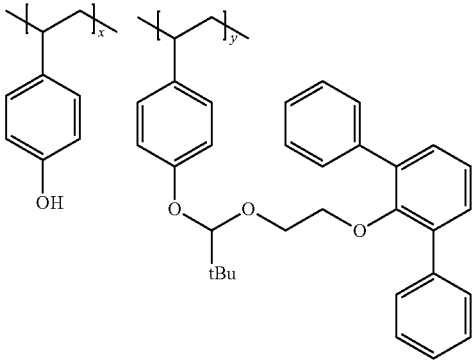
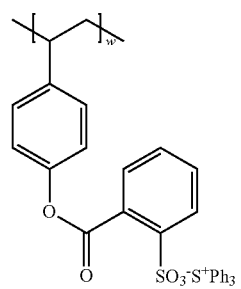

(P-21)
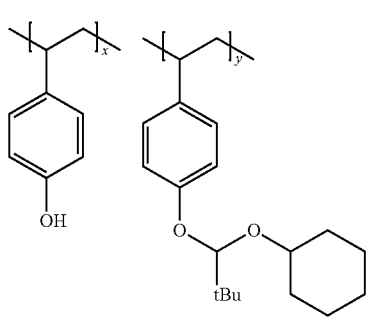
(P-22)
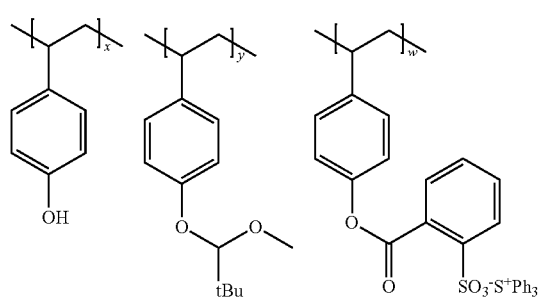
(P-23)
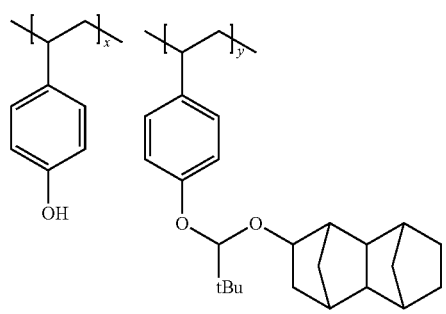
(P-24)
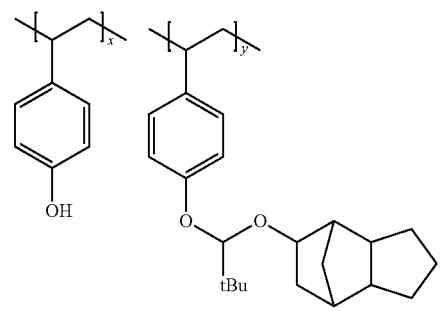
[Chem. 36]
(P-25)
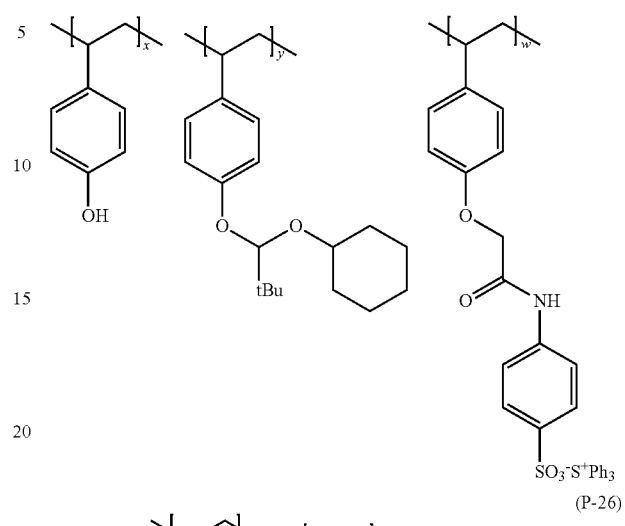
(P-26)
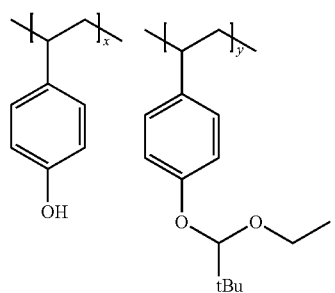
(P-26)

(P-27)
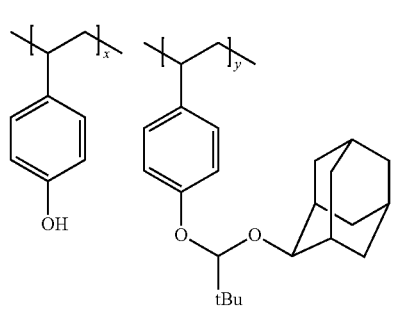
(P-28)
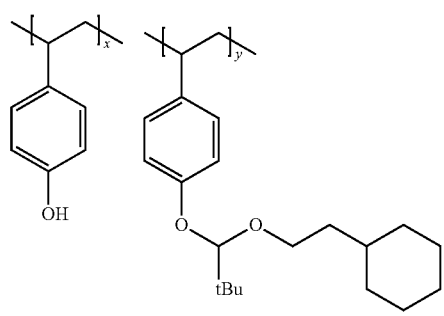
(P-29)
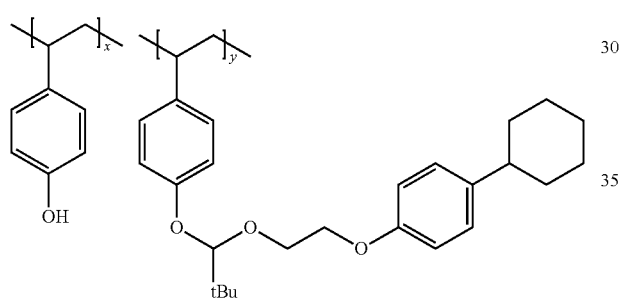
(P-30)
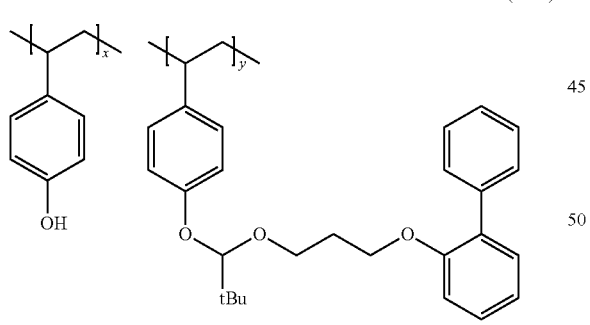
(P-31)
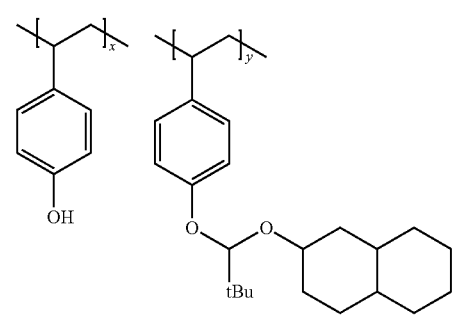
(P-32)
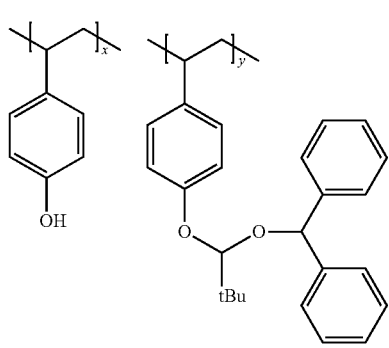
(P-33)
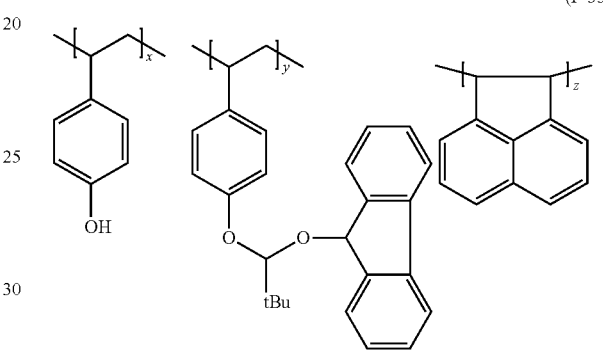
(P-34)
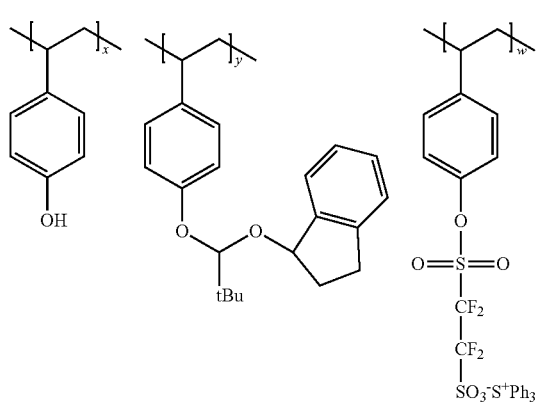
(P-35)

(P-36)
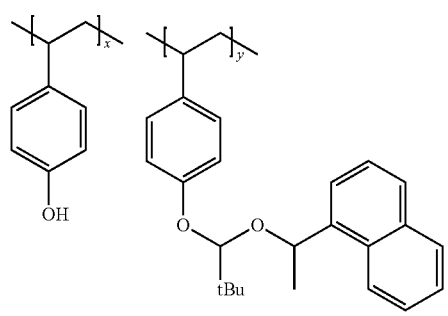
(P-37)
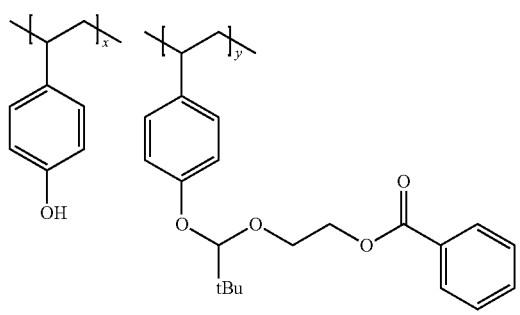
(P-38)
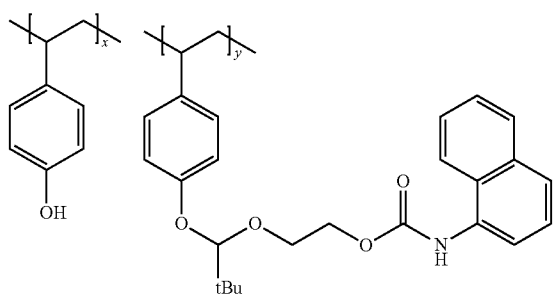
(P-39)
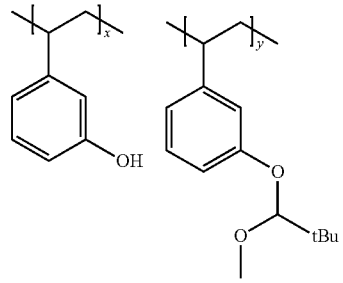
(P-40)
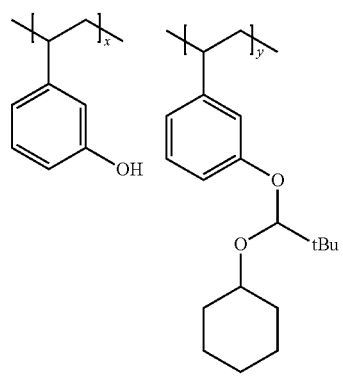
(P-41)
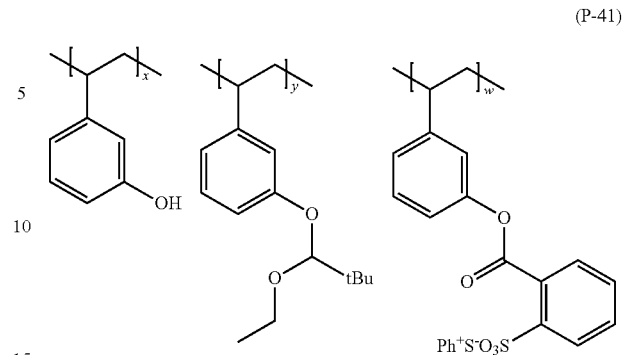
(P-42)
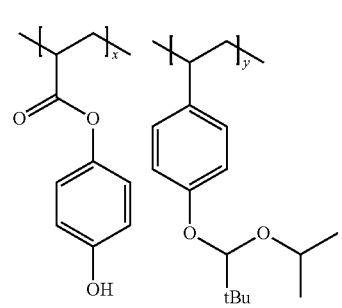
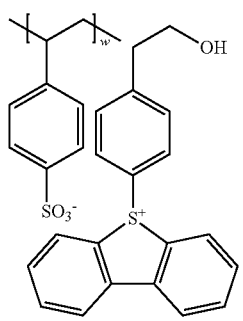
(P-43)
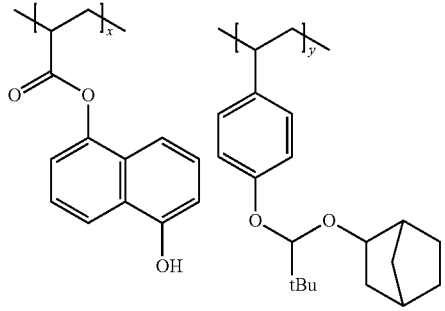
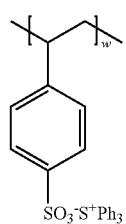

-continued
(P-44)
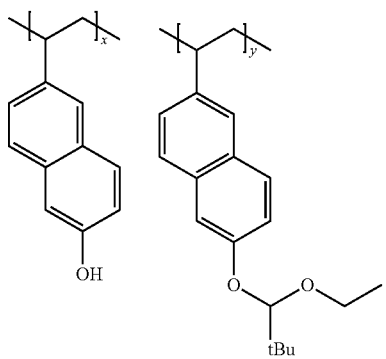
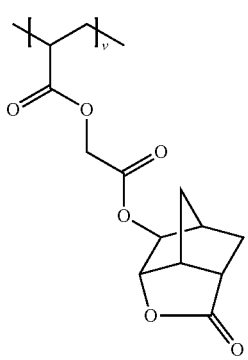
(P-45)
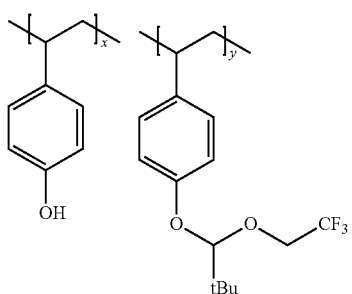
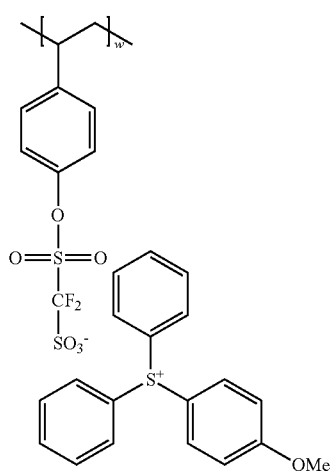
-continued
(P-46)
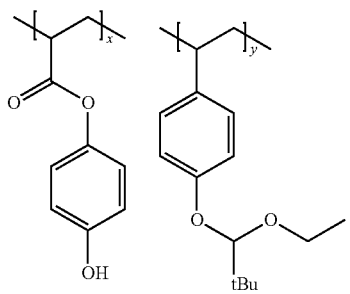
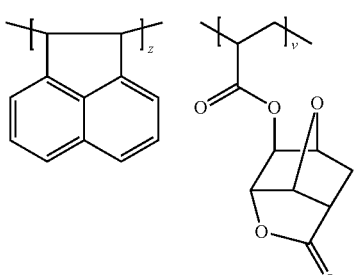
(P-47)
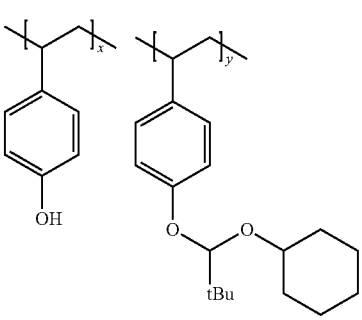
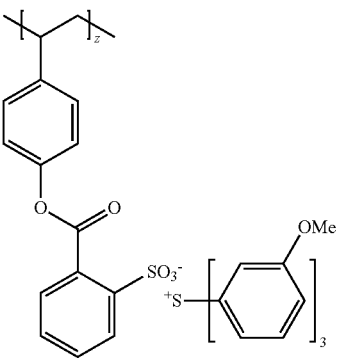
(P-48)
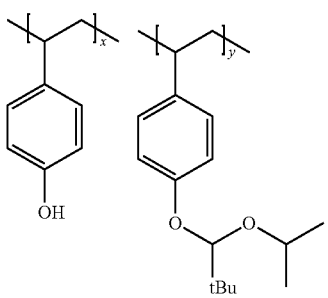

(P-49) 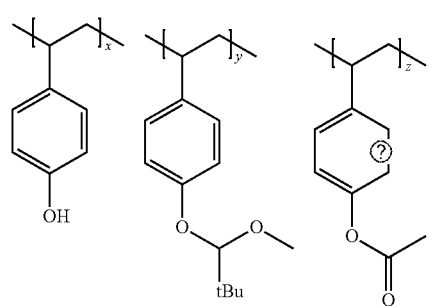
(P-50) 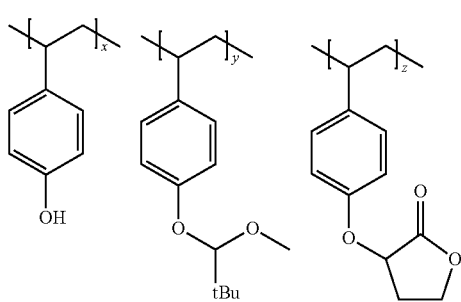
(P-51) 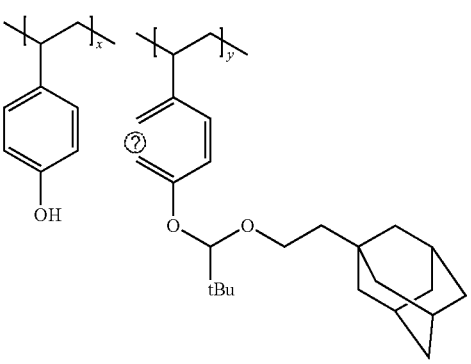
(P-52) 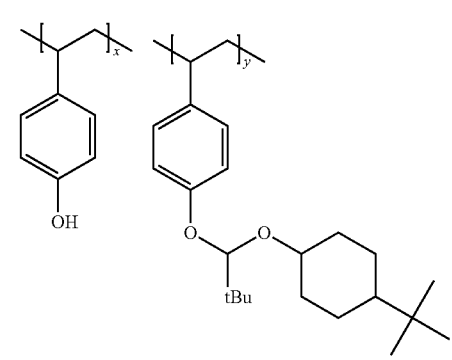
(P-53) 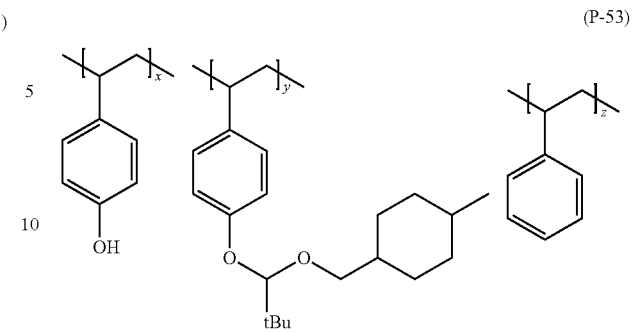
(P-54) 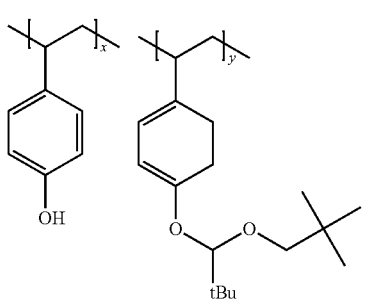
(P-55) 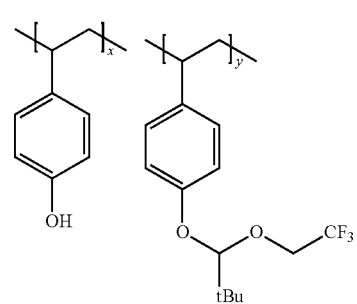
(P-56) 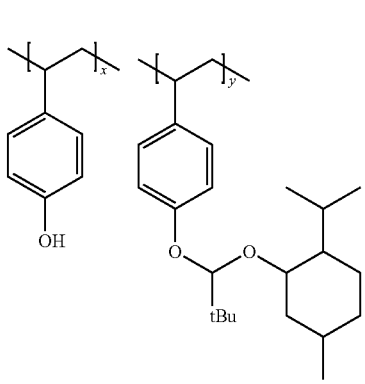
(P-57) 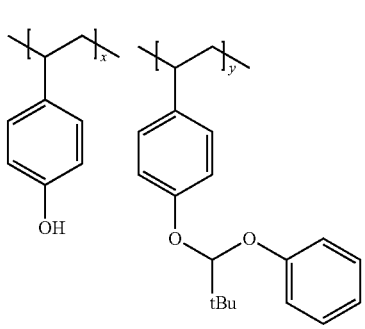

-continued
(P-58)
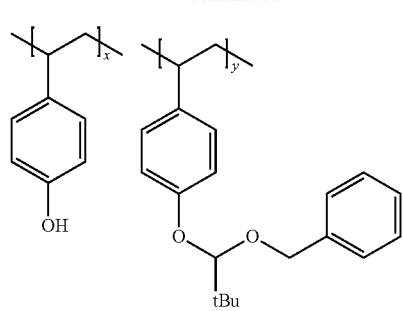
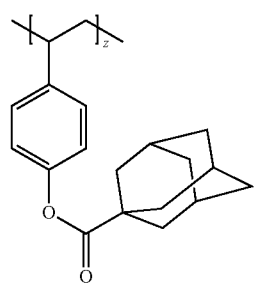
(P-59)
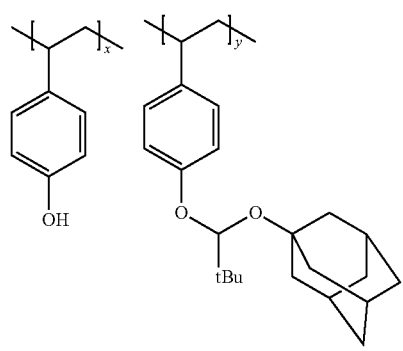
(P-60)
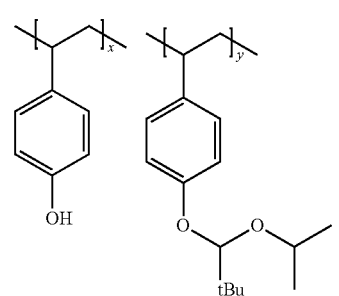
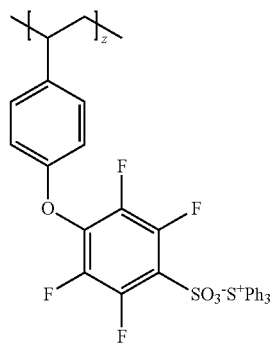
-continued
(P-61)
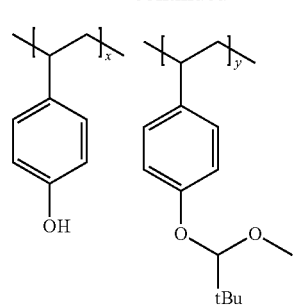
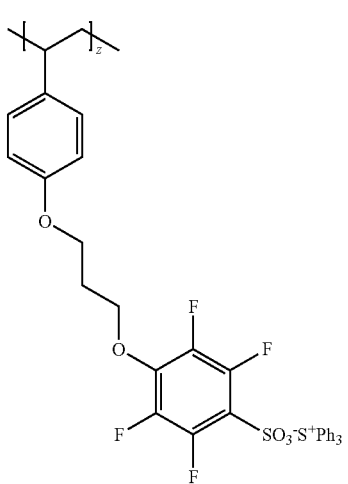
(P-62)
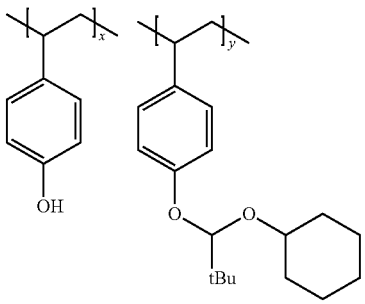
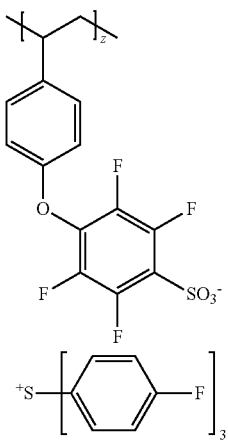

(P-63)

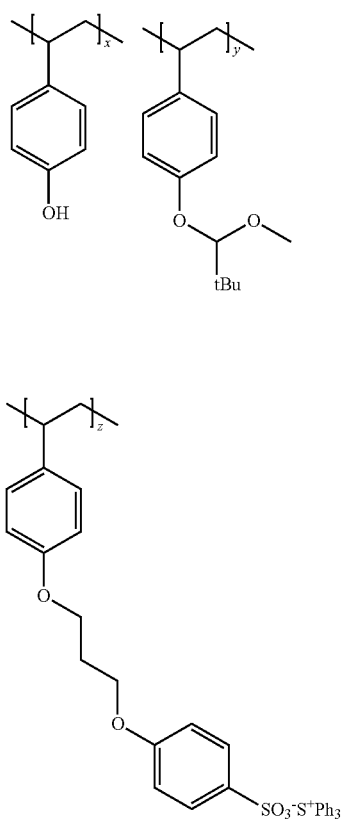

(P-64)

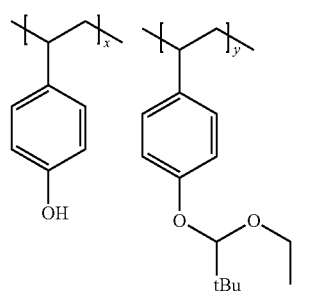

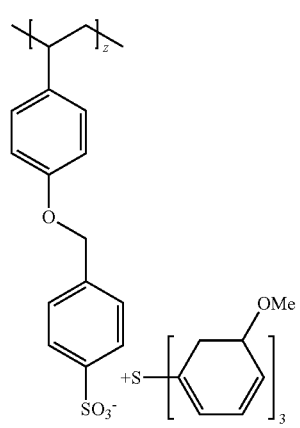

(P-65)

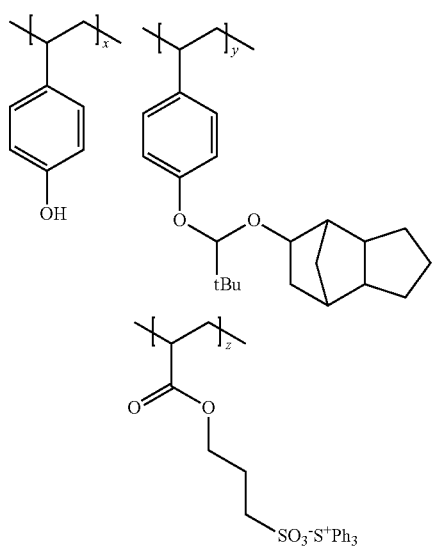

Next, a case where the compound (P) is a low-molecular weight compound will be described.

As described above, the compound (P) may be a low-molecular weight compound in which a hydrogen atom of a portion of phenolic hydroxyl groups in a core compound having a plurality of phenolic hydroxyl groups has been substituted with an acid labile group represented by General Formula (1). Herein, the "low-molecular weight compound" refers to, for example, a compound containing less than 10 repeating units derived from a polymerizable monomer, and the molecular weight of the compound is, for example, 3,000 or less, preferably from 300 to 2,000, and more preferably from 500 to 1,500.

In an embodiment, the low-molecular weight compound (P) has a structure represented by the following General Formula (T-I) or (T-II).

[Chem. 38]

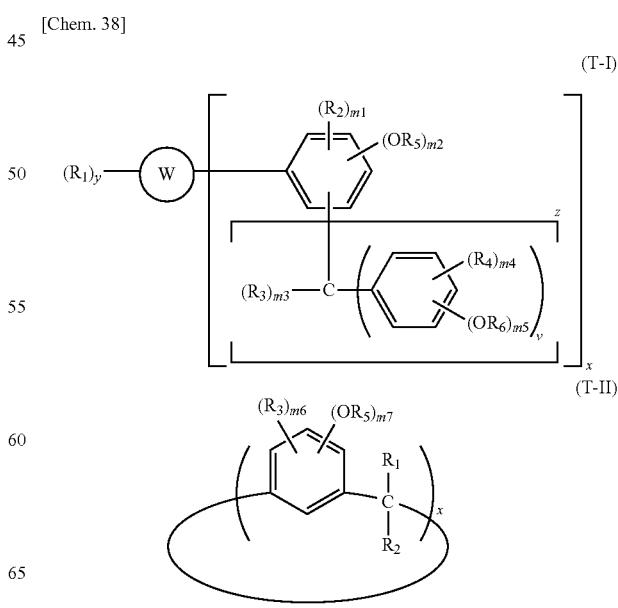

In General Formulae (T-I) and (T-II), each of $R_1$, $R_2$, $R_3$, and $R_4$ independently represents a hydrogen atom, an alkyl group, or a cycloalkyl group, a plurality of $R_1$s may form a ring by binding to each other, a plurality of $R_2$s may form a ring by binding to each other, a plurality of $R_3$s may form a ring by binding to each other, a plurality of $R_4$s may form a ring by binding to each other, and the plurality of $R_1$, $R_2$, $R_3$, and $R_4$ may be the same as or different from each other;

each of $R_5$ and $R_6$ independently represents a hydrogen atom or an organic group, a plurality of $R_5$s and $R_6$s may be the same as or different from each other, and at least one of the plurality of $R_5$s and $R_6$s is a group represented by General Formula (1);

W represents a single bond, an alkylene group, an arylene group, or a group including an arbitrary combination of the same;

x represents a positive integer;

y represents an integer of 0 or greater, and when W is a single bond, y is 0;

z represents an integer of 0 or greater;

v represents an integer of 0 or greater;

m1, m3, m4, and m6 represent a positive integer; and m2, m5, and m7 represent an integer of 0 or greater, here, m1+m2+z=5, m3+v=3, m4+m5=5, m2+m5≥2, and m6+m7=4.

The compound (P) represented by General Formula (T-I) is preferably a compound represented by any one of the General Formulae (T-III) to (T-V).

A phenolic hydroxyl group of a compound to be a core (core compound) such as a polyvalent phenol compound is allowed to react with a protection reaction agent so as to protect the phenolic hydroxyl group of the core compound with the group represented by General Formula (1), whereby the compound (P) can be synthesized. The protection reaction agent herein refers to a compound used for causing a reaction for introducing a protecting group. In addition, the ratio of the phenolic hydroxyl groups protected with an acid-degradable group to the total number of the phenolic hydroxyl groups contained in the core compound is called protection rate.

Specific examples of the core compound of the compound (P) represented by General Formula (T-I) will be shown below, but the present invention is not limited thereto.

[Chem. 39]

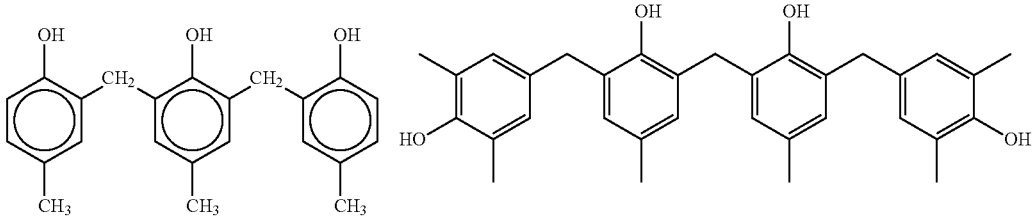

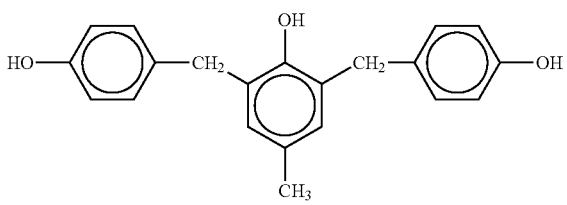

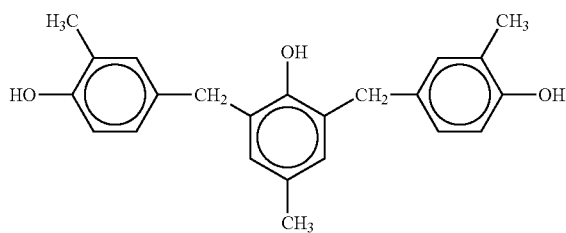

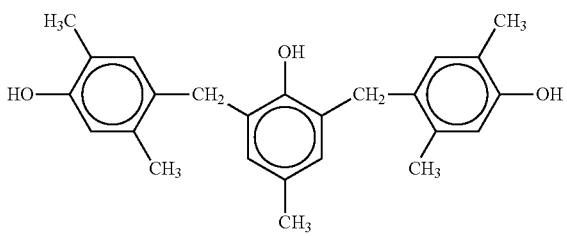

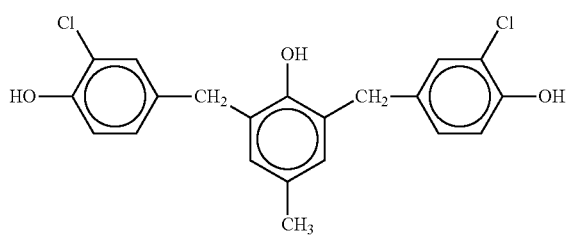

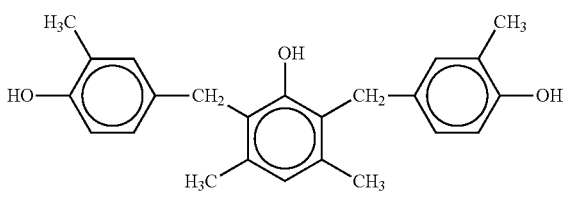

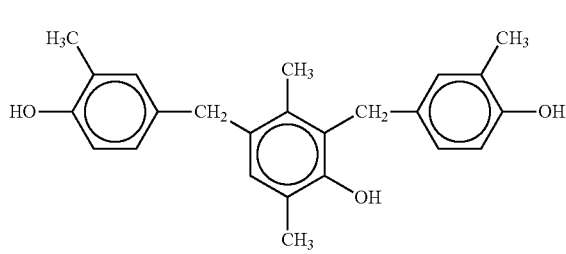

97 98
-continued
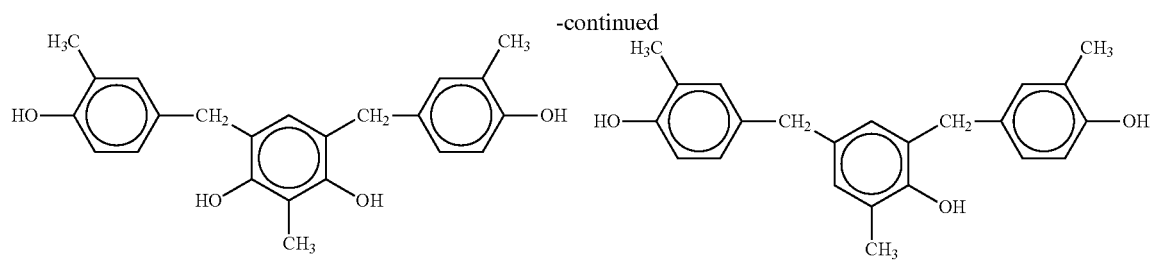
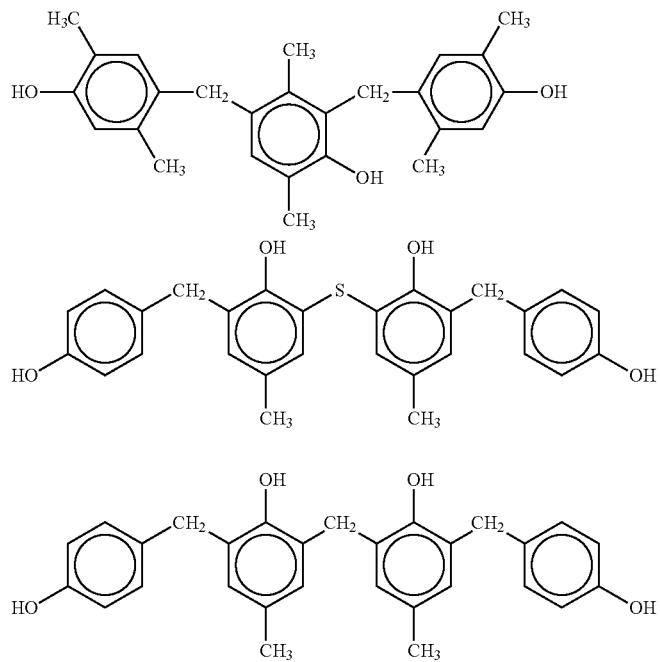
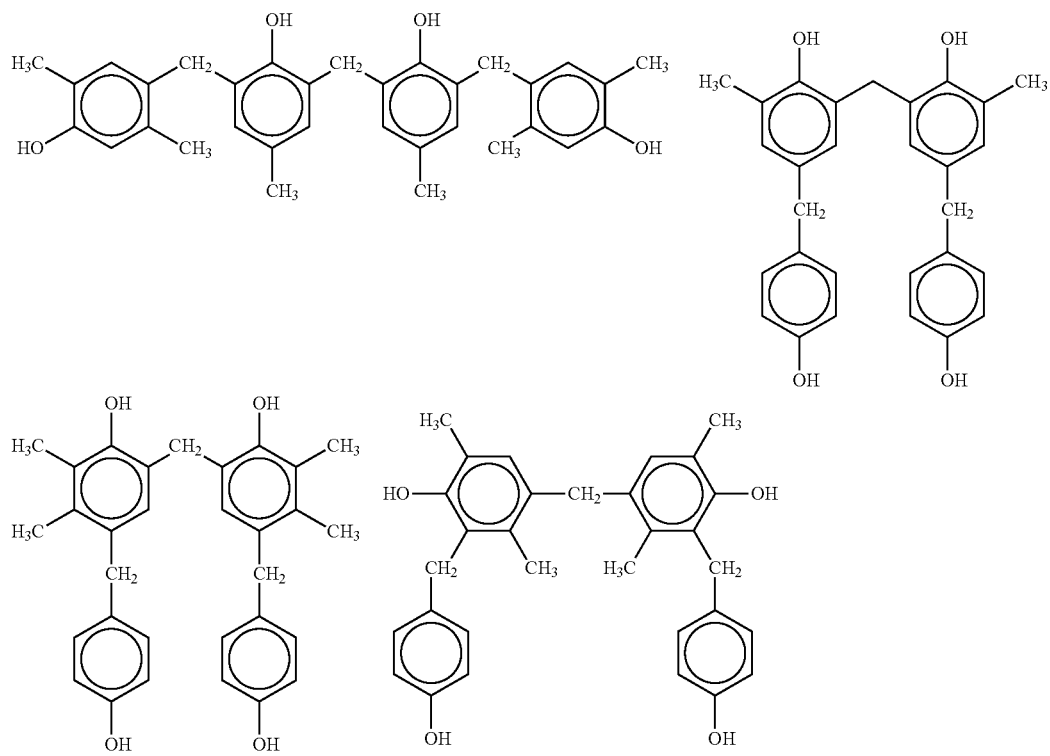
[Chem. 40]

-continued
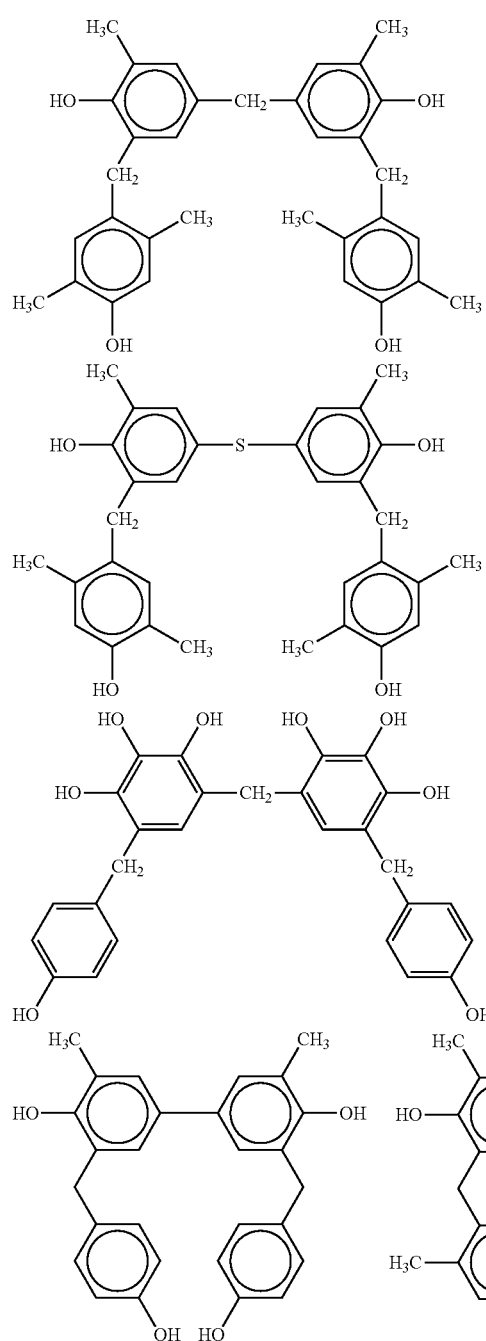
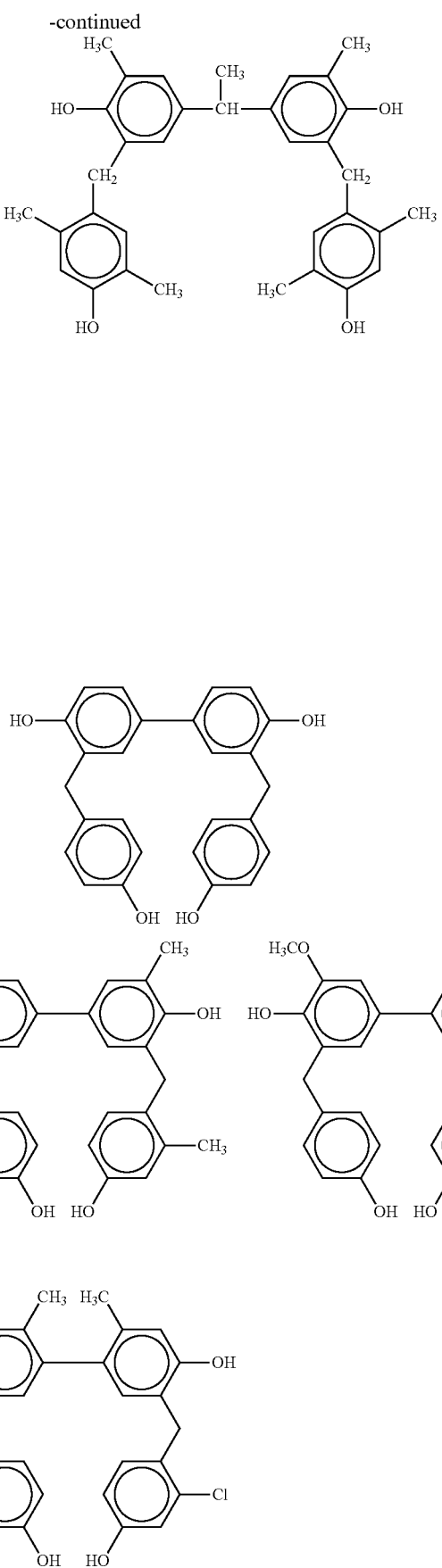

101
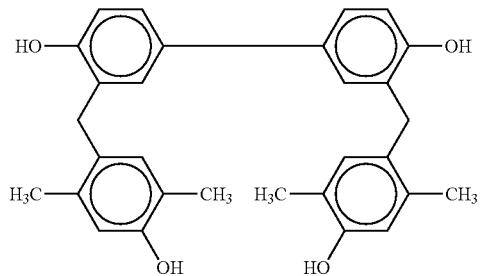
-continued
102
[Chem. 41]
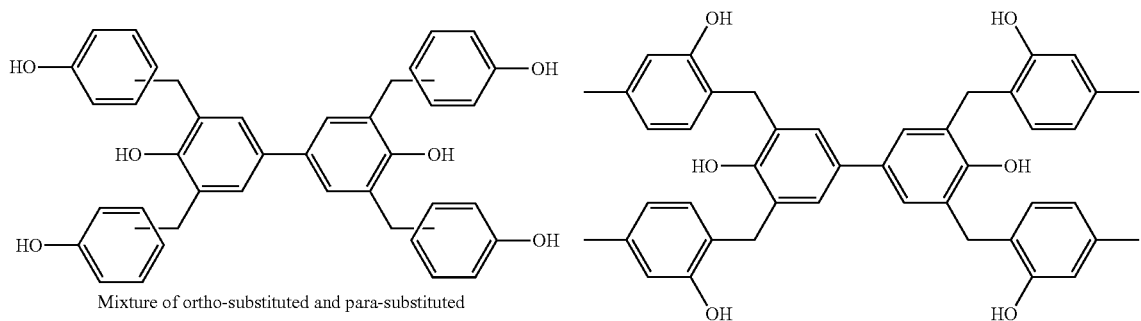
Mixture of ortho-substituted and para-substituted
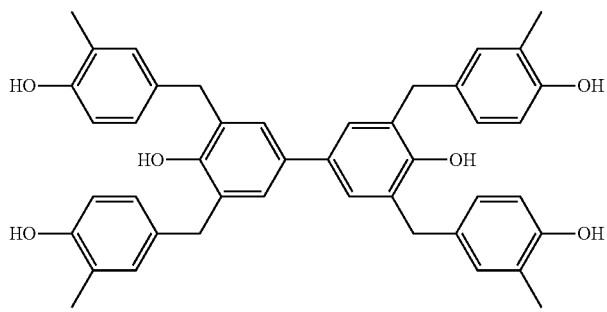
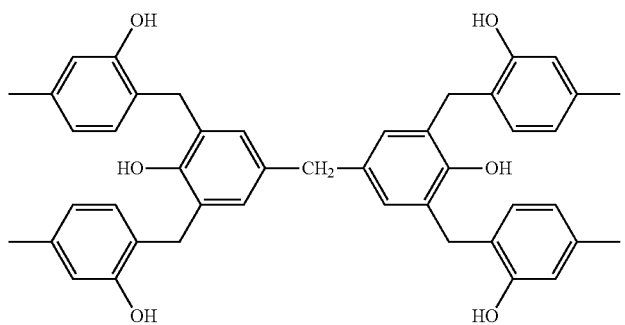
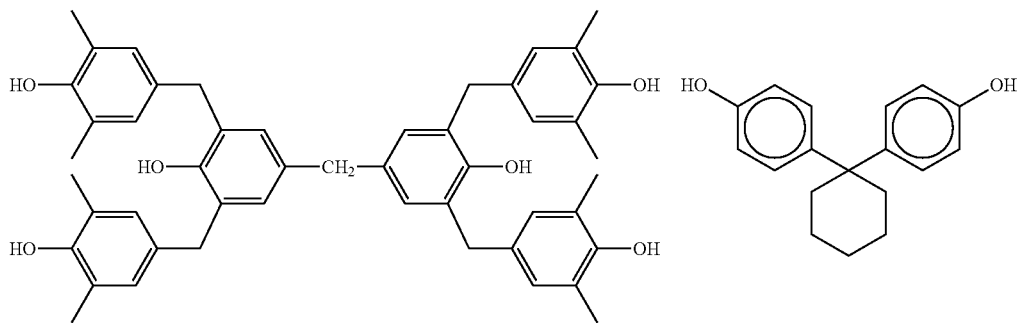

-continued
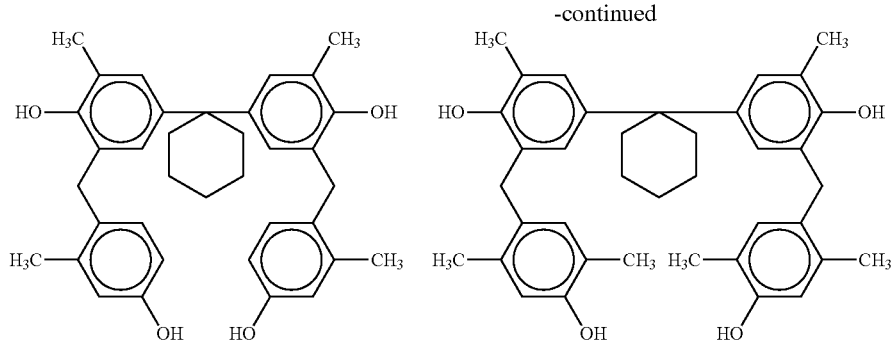
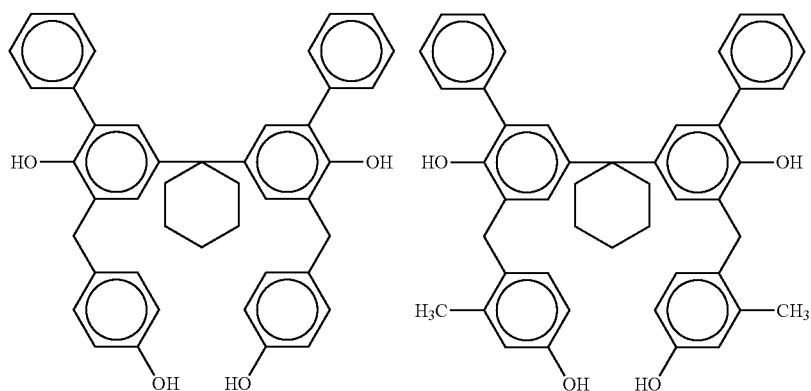
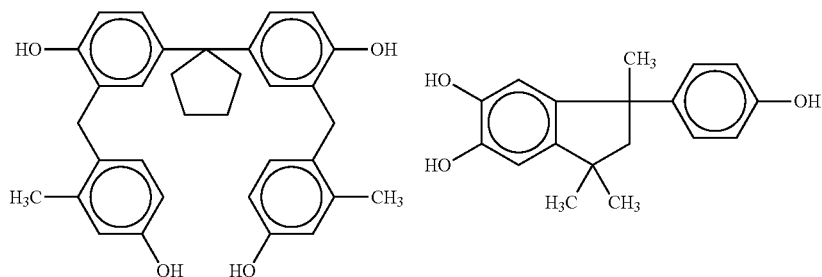
[Chem. 42]
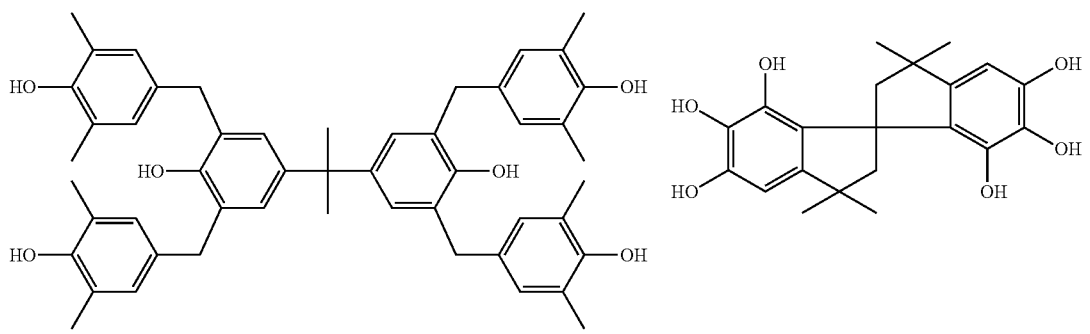
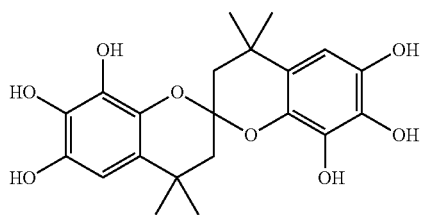

-continued
[Chem. 43]
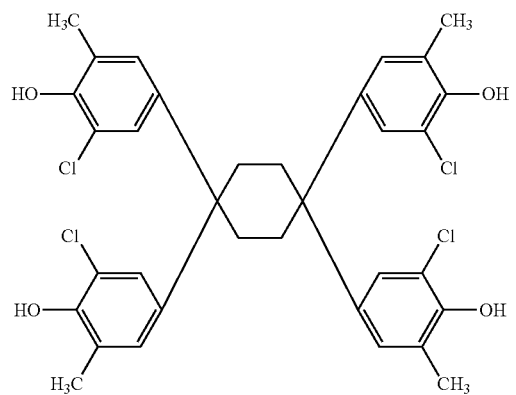
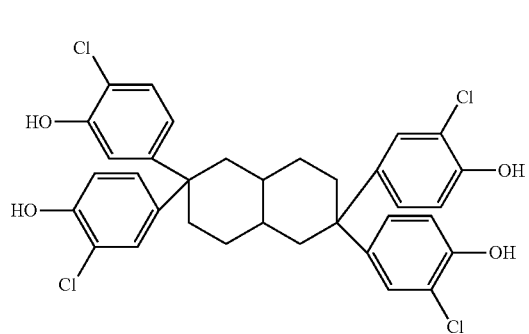
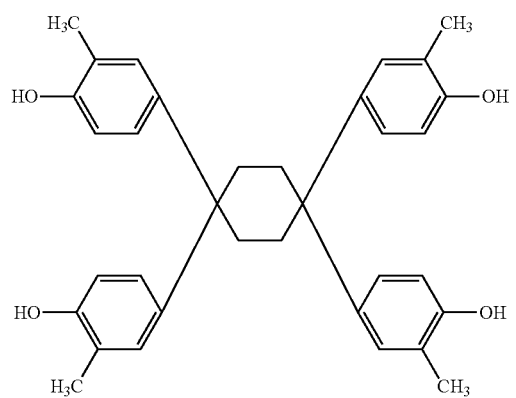
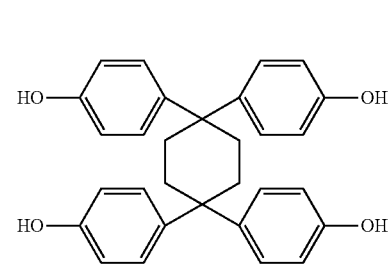
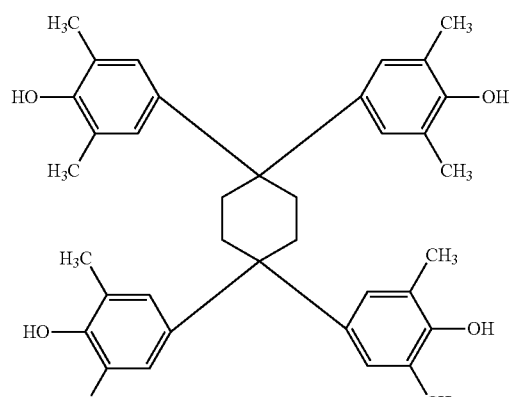
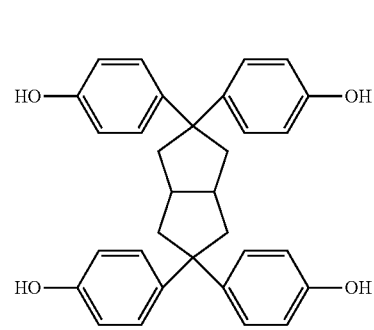
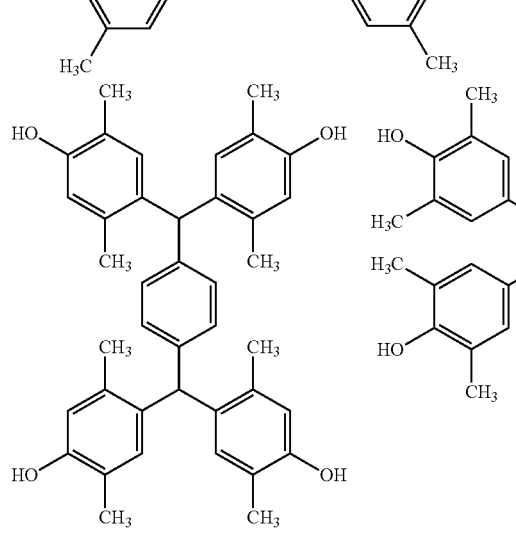
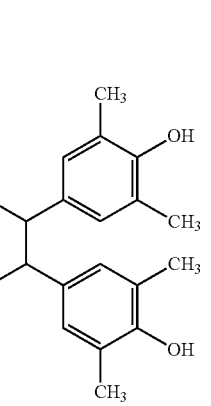

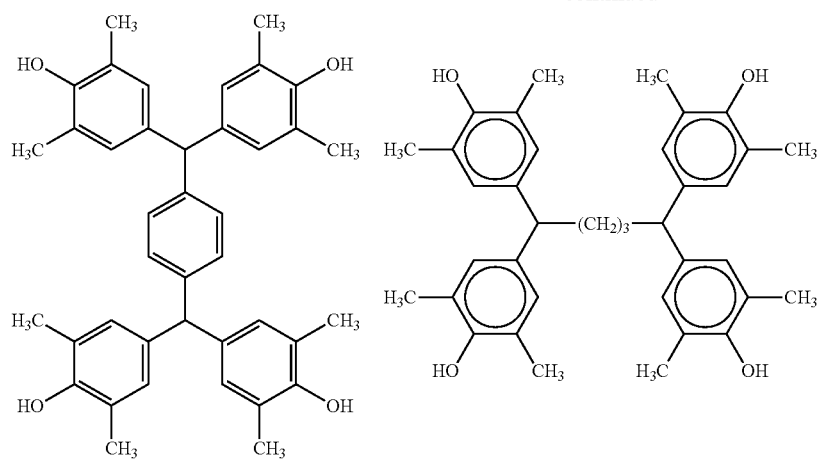
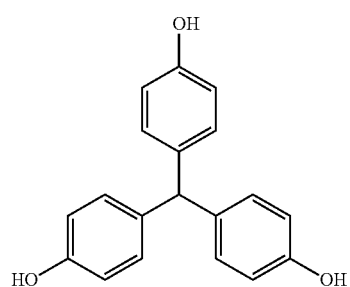
[Chem. 44]
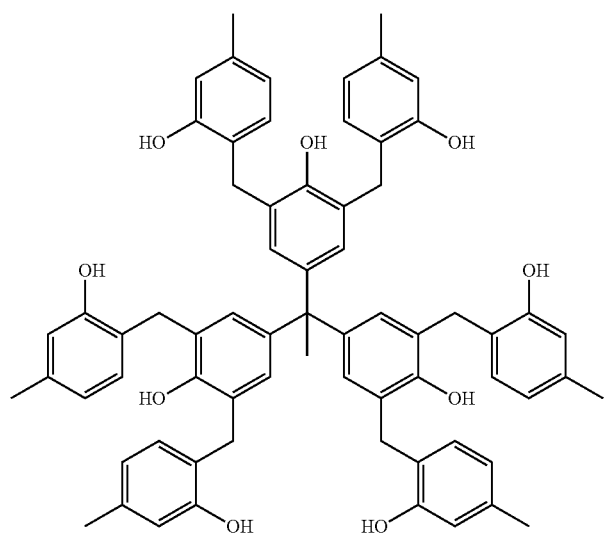

-continued
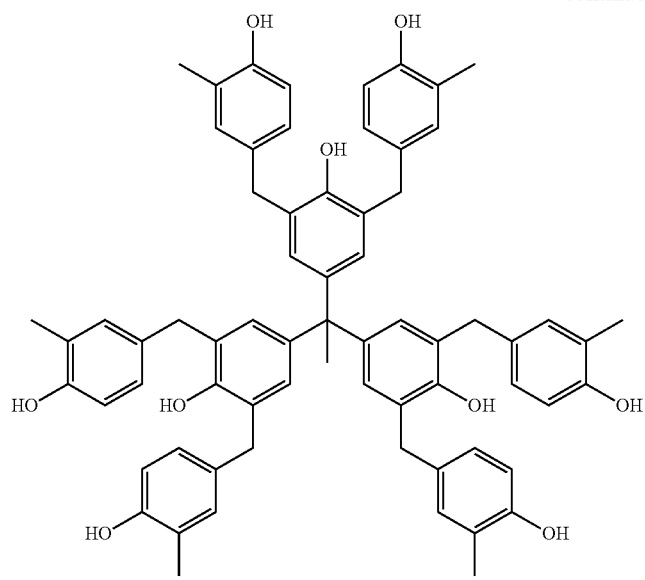
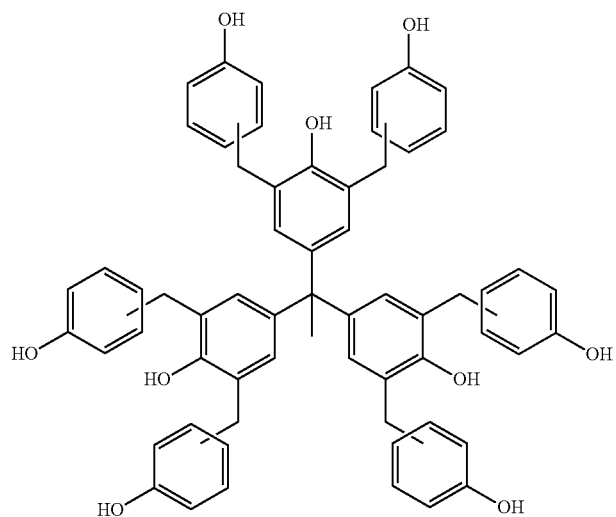
Mixture of ortho-substituted and para-substituted
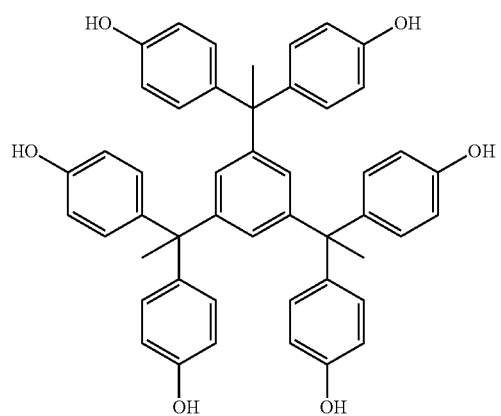

111 112
-continued
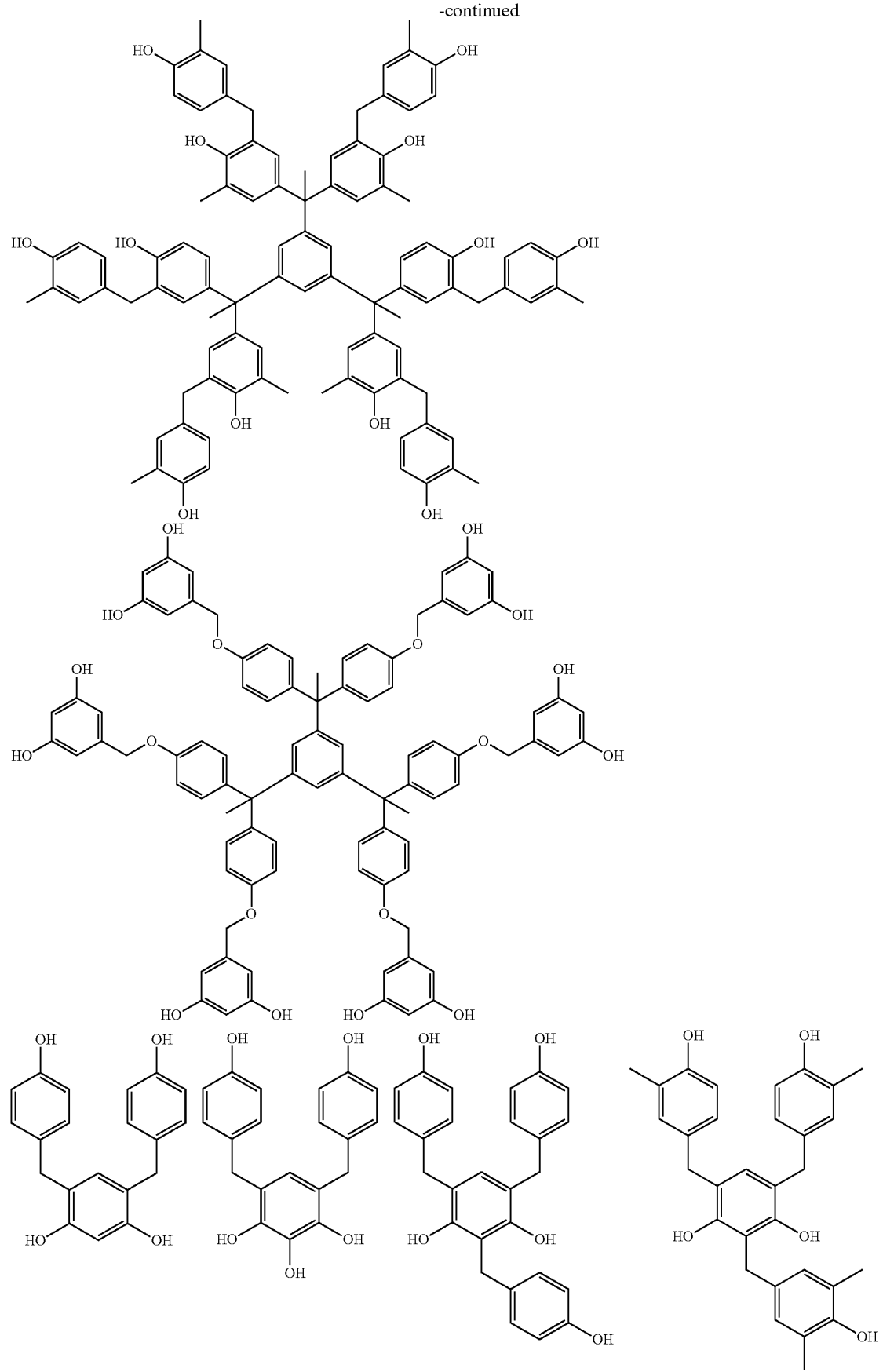

-continued
[Chem. 45]
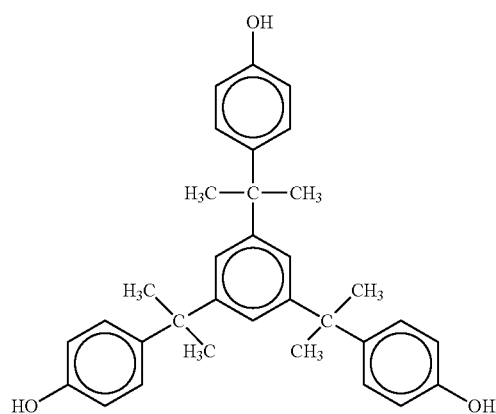
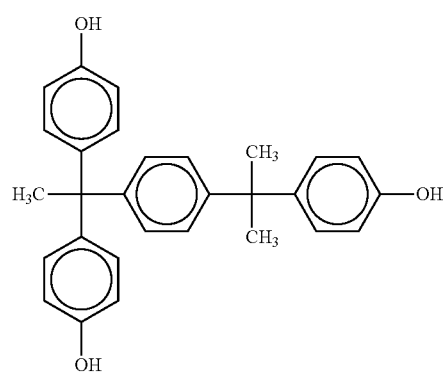
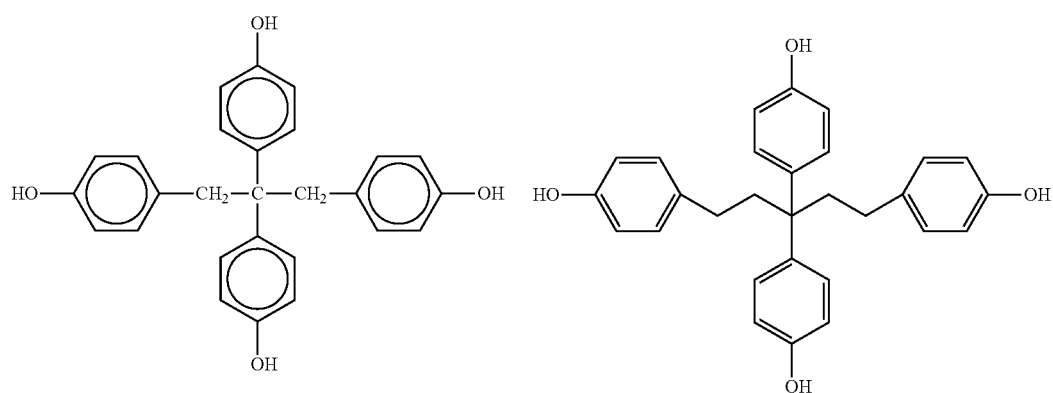
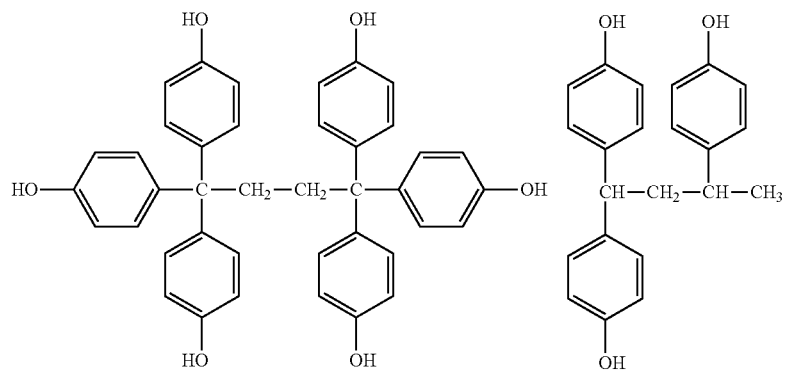
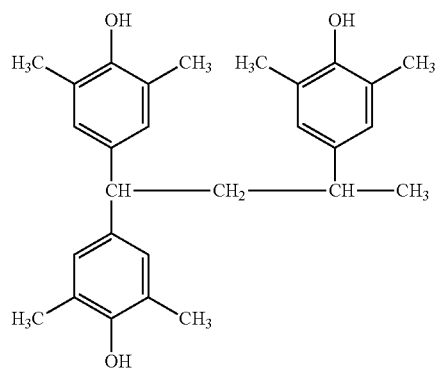

115
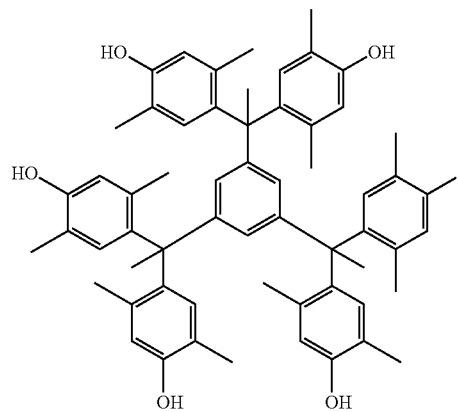
116
[Chem. 46]
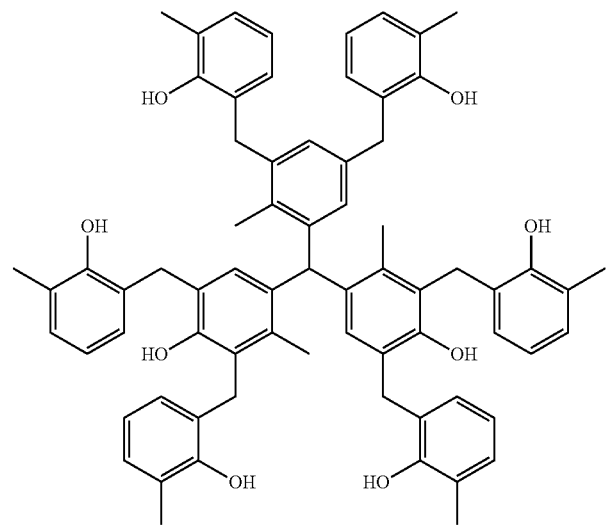
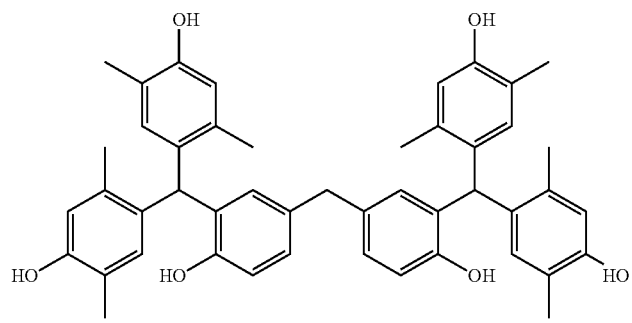
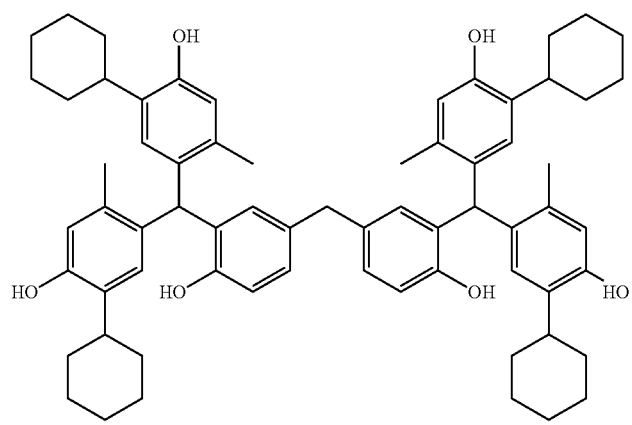

Next, specific examples of the core compound of the compound (P) represented by General Formula (T-II) will be shown, but the present invention is not limited thereto.

[Chem.47]

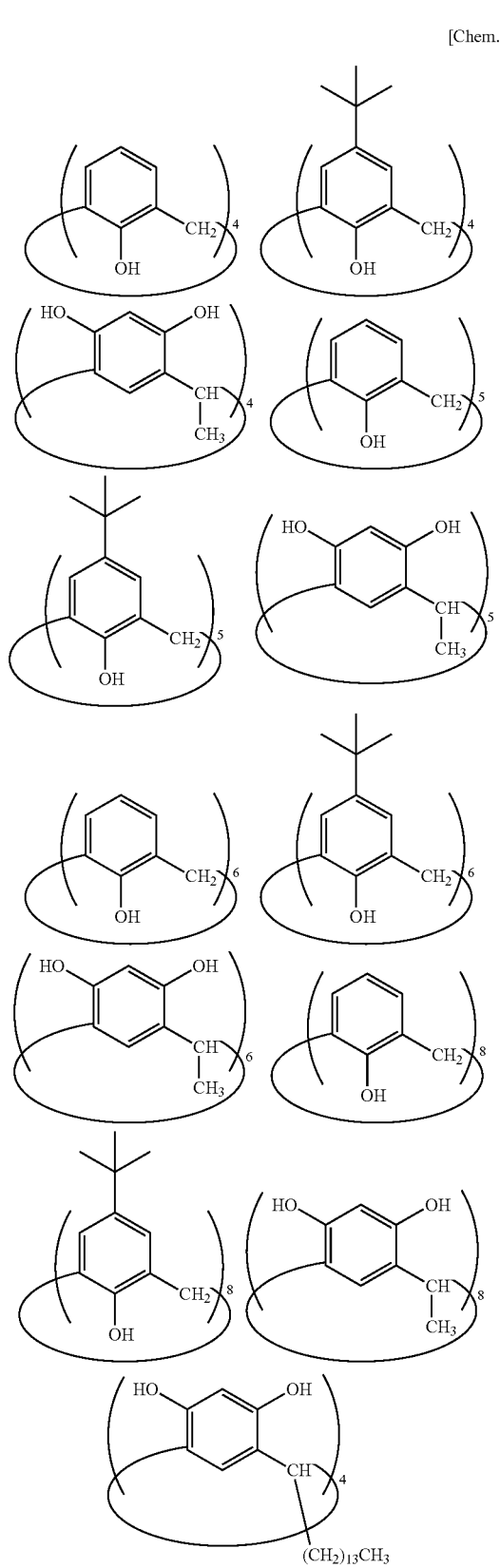

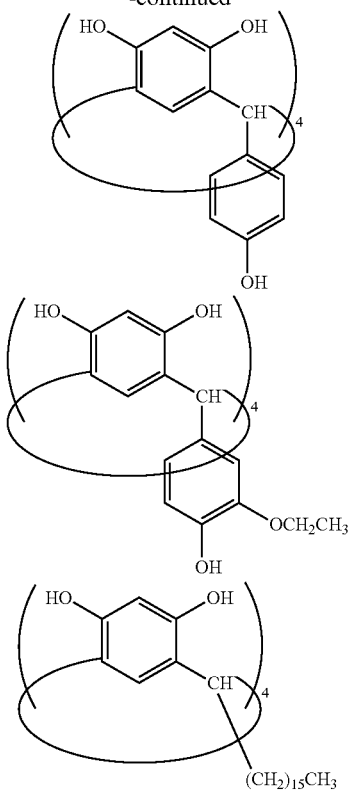

<Other Components>

The composition according to the present invention may further contain a basic compound, an acid-degradable resin, a photoacid generator, an organic solvent, a surfactant, an acid-degradable dissolution inhibiting compound, a dye, a plasticizer, a photosensitizer, a compound accelerating dissolution in a developer, a compound having a proton accepting functional group, and the like.

[2] Basic Compound

The composition according to the present invention may further contain a basic compound. When a basic compound is further contained, it is possible to further reduce changes in performance over time from exposure to heating. In addition, in this way, the acid generated by exposure can be inhibited from being diffused into a film.

The basic compound is preferably a nitrogen-containing organic compound. The compounds which are able to be used are not particularly limited, but for example, it is possible to use the compounds which are classified in (1) to (4) below.

(1) Compound represented by the following General Formula (BS-1)

[Chem. 48]

(BS-1)

In General Formula (BS-1),
each R independently represents a hydrogen atom or an organic group. Here, at least one out of the three of Rs is an organic group. This organic group is a linear or branched alkyl group, a monocyclic or polycyclic cycloalkyl group, an aryl group, or an aralkyl group.

The number of carbon atoms in the alkyl group as R is not particularly limited, but is normally from 1 to 20 and is preferably from 1 to 12.

The number of carbon atoms in the cycloalkyl group as R is not particularly limited, but is normally from 3 to 20 and is preferably from 5 to 15.

The number of carbon atoms in the aryl group as R is not particularly limited, but is normally from 6 to 20 and is preferably from 6 to 10. Specifically, examples include a phenyl group and a naphthyl group.

The number of carbon atoms in the aralkyl group as R is not particularly limited, but is normally from 7 to 20 and is preferably from 7 to 11. Specifically, examples include a benzyl group.

The alkyl group, the cycloalkyl group, the aryl group, and the aralkyl group as R may substitute a hydrogen atom with a substituent. Examples of the substituent include an alkyl group, a cycloalkyl group, an aryl group, an aralkyl group, a hydroxy group, a carboxyl group, an alkoxy group, an aryloxy group, an alkylcarbonyloxy group, and an alkyloxycarbonyl group.

Here, it is preferable that at least two of the Rs in the compound represented by the General Formula (BS-1) are organic groups.

Specific examples of the compound represented by the General Formula (BS-1) include tri-n-butylamine, tri-n-pentylamine, tri-n-octylamine, tri-n-decylamine, triisodecyl amine, dicyclohexyl methyl amine, tetradecyl amine, pentadecyl amine, hexadecyl amine, octadecyl amine, didecyl amine, octadecyl methyl amine, dimethyl amine undecyl, N,N-dimethyl dodecyl amine, methyl dioctadecyl amine, N,N-di-butyl aniline, N,N-dihexyl aniline, 2,6-diisopropyl aniline, and 2,4,6-tri(t-butyl)aniline.

In addition, an example of the preferable basic compound represented by the General Formula (BS-1) is an alkyl group where at least of one of Rs is substituted with a hydroxy group. Specifically, examples include triethanolamine and N,N-dihydroxy ethyl aniline.

Here, the alkyl group as R may have an oxygen atom in the alkyl chain. That is, an oxyalkylene chain may be formed. As the oxyalkylene chain, —CH$_2$CH$_2$O— is preferable. Specifically, examples include tris(methoxy ethoxy ethyl)amine and a compound which is disclosed on line 60 of column 3 in the specifications of U.S. Pat. No. 6,040,112A.

(2) Compound having nitrogen-containing heterocyclic structure

As the nitrogen-containing heterocyclic structure, the compound may or may not have an aromatic property. In addition, a plurality of nitrogen atoms may be contained. Furthermore, hetero atoms other than nitrogen atom may be contained. Specifically, examples include a compound having an imidazole structure (2-phenylbenzimidazole, 2,4,5-triphenylimidazole and the like), a compound having a piperidine structure (N-hydroxyethylpiperidine, bis(1,2,2,6,6-pentamethyl-4-piperidyl)sebacate and the like), a compound having a pyridine structure (4-dimethylaminopyridine and the like), and a compound having an antipyrine structure (antipyrine, hydroxyantipyrine, and the like).

A compound having two or more ring structures can also be preferably used. Specifically, examples include 1,5-diazabicyclo[4.3.0]non-5-ene, 1,8-diazabicyclo[5.4.0]undeca-7-ene.

(3) Amine Compound Having Phenoxy Group

An amine compound having a phenoxy group is a compound where a phenoxy group is provided at the terminal on the opposite side to the N atom of the alkyl group which is contained in an amine compound. The phenoxy group may have a substituent such as an alkyl group, an alkoxy group, a halogen atom, a cyano group, a nitro group, a carboxyl group, a carboxylic acid ester group, a sulfonic acid ester group, an aryl group, an aralkyl group, an acyloxy group, or an aryloxy group.

The compound more preferably has at least one oxyalkylene chain between the phenoxy group and the nitrogen atom. The number of oxyalkylene chains in one molecule is preferably from 3 to 9 and is more preferably from 4 to 6. Among the oxyalkylene chains, —CH$_2$CH$_2$O— is particularly preferable.

Specific examples include 2-[2-{2-(2,2-dimethoxy-phenoxyethoxy)ethyl}-bis-(2-methoxyethyl)]-amine, and compounds (C1-1) to (C3-3) disclosed in paragraph <0066> of US2007/0224539A 1.

(4) Ammonium Salt

It is possible to appropriately use an ammonium salt. The ammonium salt is preferably a hydroxide or a carboxylate. More specifically, a tetraalkylammonium hydroxide such as tetrabutylammonium hydroxide, a tetraalkylammonium benzoate such as tetrabutylammonium benzoate, a tetraalkylammonium salicylate such as tetrabutylammonium salicylate, a tetraalkylammonium acetate such as tetrabutylammonium acetate, or a tetraalkylammonium phenolate such as tetrabutylammonium phenolate is preferred.

Other than this, examples of compounds according to the present invention which are able to be used include the compounds synthesized in JP2002-363146A and the compounds disclosed in paragraph <0108> of JP2007-298569A.

In addition, a photosensitive basic compound may be used as the basic compound. It is possible to use a compound disclosed in JP2003-524799A, J. Photopolym. Sci & Tech. Vol. 8, P. 543-553 (1995), and the like as the photosensitive basic compound.

The molecular weight of the basic compound is preferably from 250 to 2,000 and is more preferably from 400 to 1,000.

The basic compound may use one type singly or two or more types may be used in combination.

In a case where the basic compound is contained in the composition according to the present invention, the amount thereof contained is normally from 0.001 to 10% by mass and preferably from 0.01 to 5% by mass based on the total solid content of the composition.

The molar ratio of the photoacid generator described later to the basic compound is preferably from 1.5 to 300. That is, the molar ratio of 1.5 or more is preferable from the point of view of improvement of sensitivity and resolution and 300 or less is preferable from the point of suppressing the reduction of resolution due to the thickening of the pattern over time after exposure until heat treatment. The molar ratio is more preferably from 2.0 to 200 and is even more preferably from 2.5 to 150.

When the compound (P) contains the repeating unit represented by the General Formula (4) described above, the photoacid generator in the above molar ratio is based on the total amount of the repeating unit and the photoacid generator described later.

[3] Acid Degradable Resin

The composition according to the present invention may further contain a resin of which a dissolution rate in an alkaline developer is increased due to the degradation of the resin caused by the action of an acid, that is, an acid-degradable resin, in addition to the compound (P).

The acid decomposable resin is typically provided with a group (referred to below as an acid-decomposable group) which is decomposed by the action of an acid and generates an alkali soluble group. The resin may be provided with the acid decomposable group on one of the main chain or a side chain, or both the main chain and the side chain. The resin is preferably provided with an acid decomposable group on the side chain.

As disclosed in EP254853B, JP1990-25850A (JP-H02-25850A), JP1991-223860A (JP-H03-223860A), and JP1992-251259A (JP-H04-251259A), for example, the acid decomposable resin can be obtained by reacting an alkali soluble resin with a precursor of a group which is desorbed by the action of an acid or by copolymerizing an alkali soluble resin monomer which is bonded to a group which is desorbed due to the action of an acid with various monomers.

As the acid decomposable group, a group where the hydrogen atom of an alkali soluble group such as a —COOH group or an —OH group is substituted with a group which is desorbed by the action of an acid is preferable.

Specific and preferable examples of the acid-degradable group include the same ones as "OY$^1$" of the General Formula (3) in the compound (P) and "COOY$^2$" in the General Formula (4).

The alkali soluble acid decomposable resin described above is not particularly limited and examples thereof include a resin containing a phenolic hydroxyl group and a resin containing a repeating unit having a carboxyl group such as (meth)acrylic acid or norbornene carboxylic acid.

Preferable examples of the resin containing a phenolic hydroxyl group include poly(o-hydroxystyrene), poly(m-hydroxystyrene), poly(p-hydroxystyrene), and a copolymer of the same; hydrogenated poly(hydroxystyrene); poly(hydroxystyrene)s having a substituent represented by the following structure; a styrene-hydroxystyrene copolymer; an α-methylsytrene-hydroxystyrene copolymer; and an alkali-soluble resin having a hydroxystyrene structural unit, such as a hydrogenated novolac resin.

[Chem. 49]

When measured at 23C by using 2.38% by mass of tetramethylammonium hydroxide (TMAH), an alkali dissolution rate of these alkali-soluble resins is preferably 170 Å/sec or higher, and more preferably 330 Å/sec or higher. More specifically, the alkali dissolution rate can be obtained by dissolving only an alkali soluble resin in a solvent such as propylene glycol monomethyl ether acetate (PGMEA), coating a composition having a solid content concentration of 4% by mass on a silicon wafer to form a film (thickness of 100 nm), and measuring the time (seconds) until the film is completely dissolved in a TMAH aqueous solution.

Examples of the monomer which are able to be adopted as the material of the resin include an alkylcarbonyloxy styrene (for example, t-butoxycarbonyloxy styrene), alkoxy styrene (for example, 1-alkoxyethoxystyrene or t-butoxystyrene), and a tertiary alkyl ester(meth)acrylate (for example, t-butyl(meth)acrylate, 2-alkyl-2-adamantyl(meth)acrylate, or dialkyl(1-adamantyl) methyl(meth)acrylate).

In a case where the composition according to the present invention is irradiated with KrF excimer laser light, an electron beam, X-rays, or a high energy light beam with a wavelength of 50 nm or lower (for example, EUV), the acid decomposable resin preferably contains a repeating unit provided with an aromatic group. In particular, the acid decomposable resin preferably contains hydroxystyrene as a repeating unit. Examples of such a resin include a copolymer with hydroxystyrene protected by a group which is desorbed by the action of an acid and hydroxystyrene or a copolymer of hydroxystyrene and a tertiary alkyl ester(meth)acrylate.

As the acid decomposable resin, a resin having the repeating unit represented by the General Formula (3) is particularly preferable.

The acid decomposable resin may have a repeating unit which is derived from another polymerizable monomer. Examples of other monomers include those described above as other polymerizable monomers that the compound (P) may contain. Here, the amount of the repeating unit which is derived from another polymerizable monomer contained is typical 50 mol % or less and is preferably 30 mol % or less based on the total of the repeating units.

In addition, the acid decomposable group may contain a repeating unit having an alkali soluble group such as a hydroxyl group, a carboxy group, and a sulfonate group, and the amount of the repeating unit having an alkali soluble group contained in this case is preferably from 1 to 99 mol %, is more preferably from 3 to 95 mol %, and is even more preferably from 5 to 90 mol % in the total of the repeating units which configure the acid decomposable resin.

The amount of the repeating unit having the acid decomposable group contained is preferably from 3 to 95 mol %, is more preferably from 5 to 90 mol %, and is even more preferably from 10 to 85 mol % in the total of the repeating units which configure the acid decomposable resin.

The weight average molecular weight of the acid-degradable resin is preferably 50,000 or less, more preferably from 1,000 to 20,000, and particularly preferably from 1,000 to 10,000 expressed in terms of polystyrene by a GPC method (solvent: THF).

The dispersity (Mw/Mn) of acid decomposable resin is preferably from 1.0 to 3.0, is more preferably from 1.05 to 2.0, and is even more preferably from 1.1 to 1.7.

In addition, the acid decomposable resin may use two or more types in combination.

Specific examples of the acid decomposable resin are shown below but are not limited thereto.

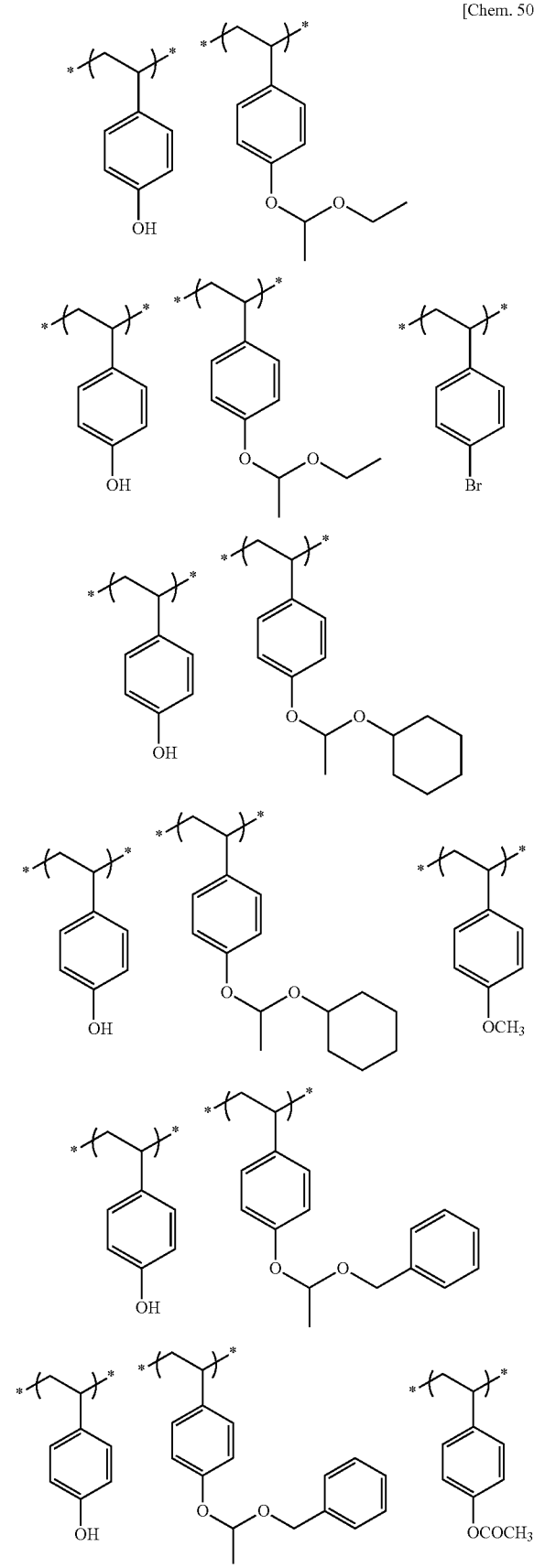

[Chem. 50]

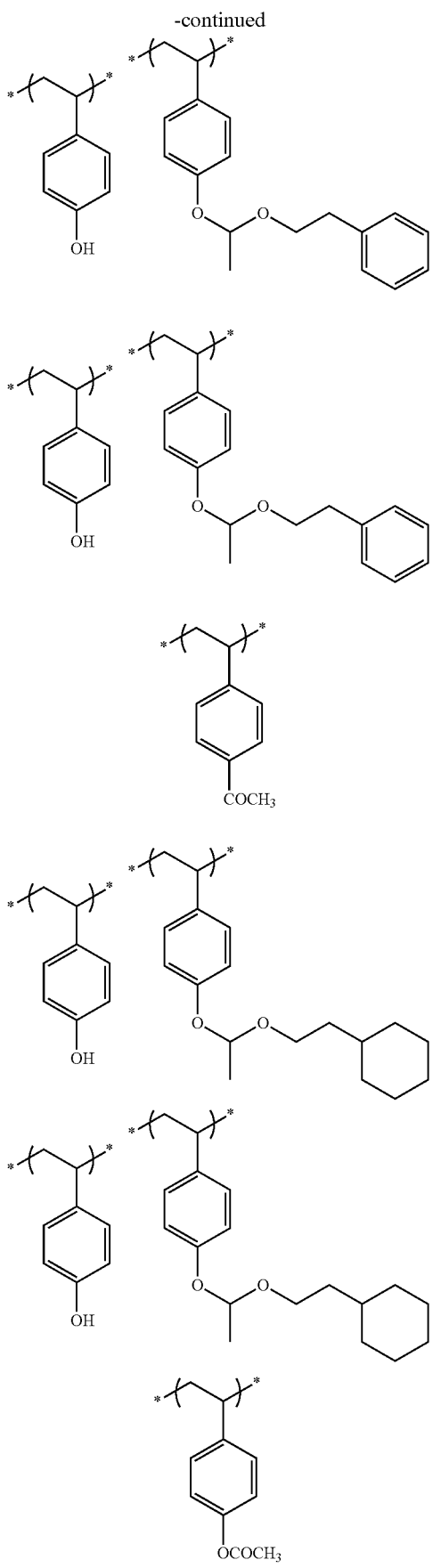

127
-continued
128
-continued
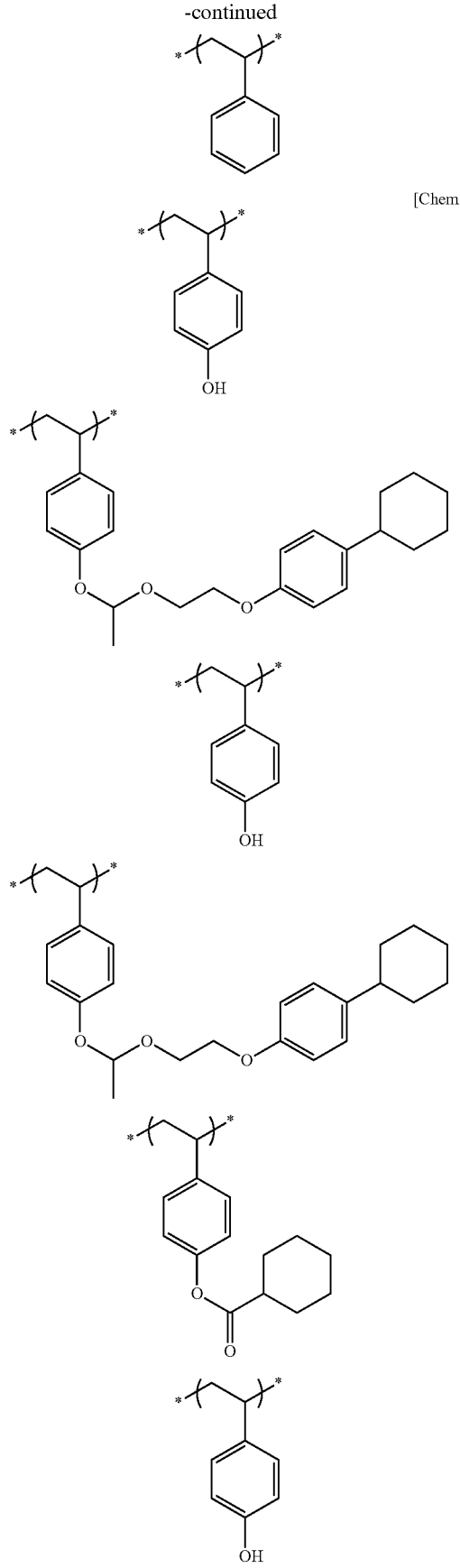
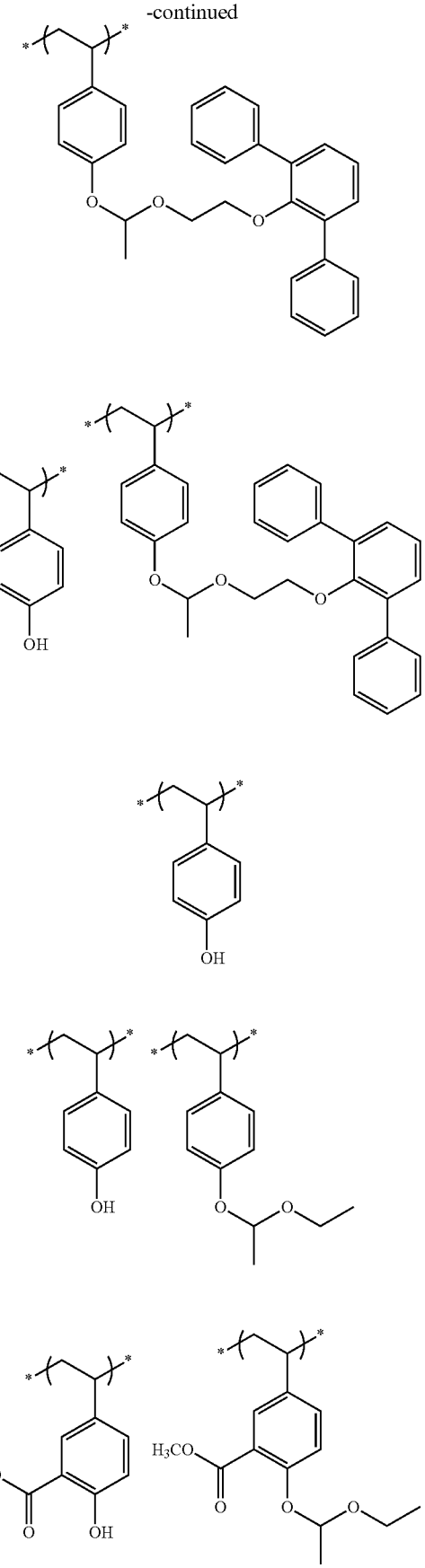
[Chem. 51]

129
-continued
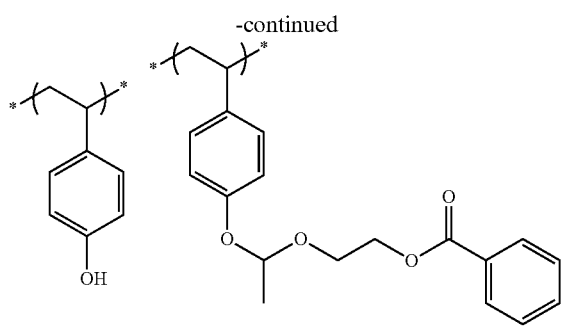
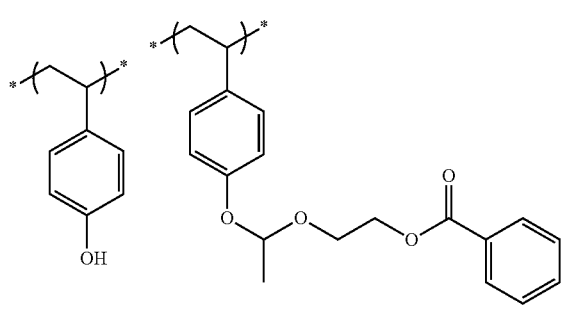
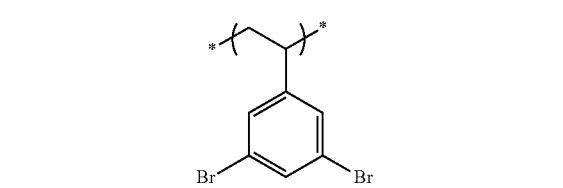
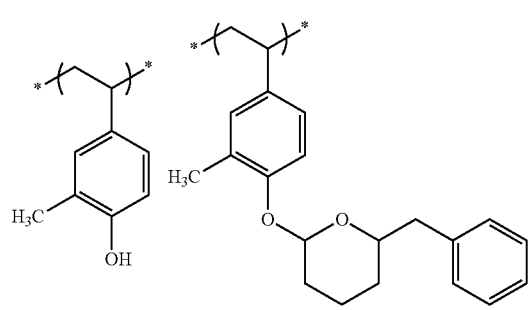
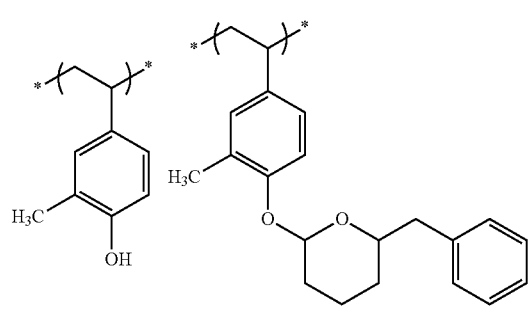
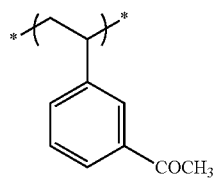
130
-continued
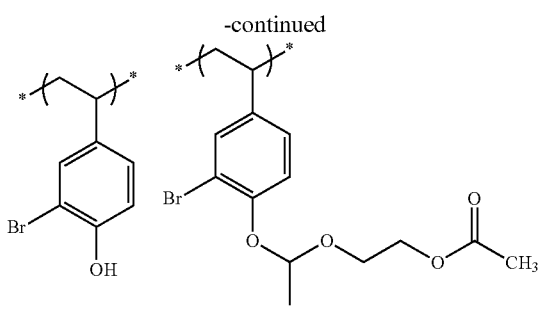
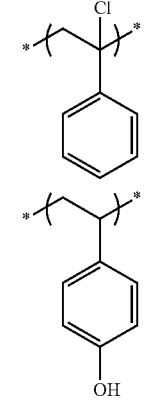
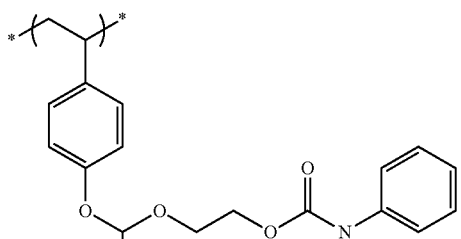
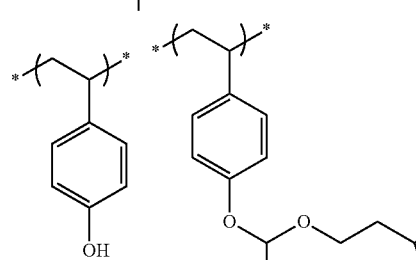
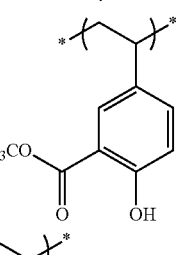
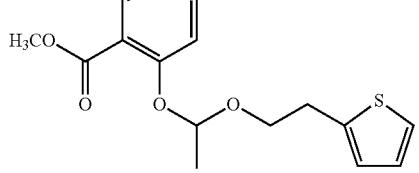

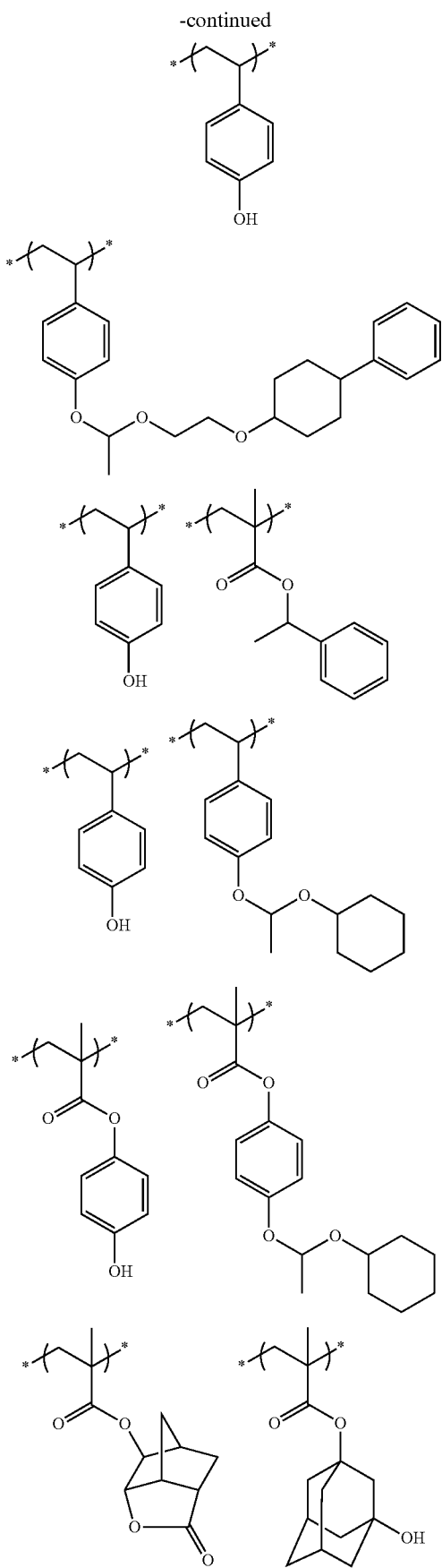

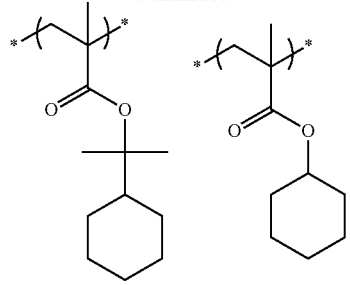

When the composition according to the present invention further contains a resin other than the compound (P), the content of the resin is preferably from 0.5% by mass to 80% by mass, more preferably from 5% by mass to 50% by mass, and even more preferably from 10% by mass to 30% by mass, based on the total solid contents of the composition.

[4] Photoacid Generator

A photoacid generator is a compound that generates an acid by being irradiated with actinic rays or radiation. As the photoacid generator, a photoinitiator of cationic photopolymerization, a photoinitiator of radical photopolymerization, a photodecolorant of dyes, a photodiscoloring agent, a known compound that is used for a micro resist or the like and generates an acid by being irradiated with actinic rays or radiation, and a mixture of the same can be appropriately selected and used. Examples of the photoacid generator include a sulfonium salt, an iodonium salt, bis(alkylsulfonyl)diazomethane, and the like.

As a preferable example of the photoacid generator, examples include the compounds according to the following General Formulae (ZI), (ZII), and (ZIII).

[Chem. 52]

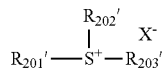
(ZI)

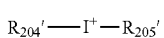
(ZII)

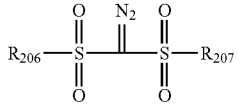
(ZIII)

In the General Formula (ZI), each of $R_{201}'$, $R_{202}'$, and $R_{203}'$ independently represents an organic group. The organic group represented by $R_{201}'$, $R_{202}'$, or $R_{203}'$ has, for example, 1 to 30 carbon atoms, and preferably has 1 to 20 carbon atoms.

In addition, a ring structure may be formed by bonding two out of $R_{201}'$ to $R_{203}'$ via a single bond or a linking group. In this case, examples of the linking group include an ether bond, a thioether bond, an ester bond, an amide bond, a carbonyl group, a methylene group, and an ethylene group. Examples of the group which is formed by the bonding of two out of $R_{201}'$ to $R_{203}'$ include an alkylene group such as a butylene group or a pentylene group.

Specific examples of $R_{201}'$, $R_{202}'$, and $R_{203}'$ include a group which corresponds to the compounds (ZI-1), (ZI-2), and (ZI-3) described later.

X⁻ represents a non-nucleophilic anion. Examples of X⁻ preferably include a sulfonate anion, a bis(alkylsulfonyl)amide anion, a tris(alkylsulfonyl)methide anion, $BF_4^-$, $PF_6^-$, and $SbF_6^-$. X⁻ is preferably an organic anion which contains a carbon atom. Examples of the organic anions preferably include an organic anion shown in AN1 to AN3 below.

[Chem. 53]

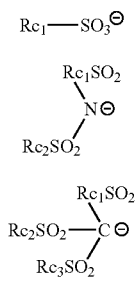

In the General Formulae AN1 to AN3, each of $Rc_1$ to $Rc_3$ independently represents an organic group. Examples of the organic group include an organic group having 1 to 30 carbon atoms and is preferably an alkyl group, an aryl group, or a group where a plurality of such groups are connected through a single bond or a linking group. Here, examples of the linking group include —O—, —$CO_2$—, —S—, —$SO_3$— and —$SO_2N(Rd_1)$—. Here, $Rd_1$ represents a hydrogen atom or an alkyl group and may form a ring with an alkyl group or an aryl group by bonding.

The organic group of $Rc_1$ to $Rc_3$ may be an alkyl group substituted by a fluorine atom or a fluoroalkyl group at the 1-position, or a phenyl group substituted by a fluorine atom or a fluoroalkyl group. Due to containing a fluorine atom or a fluoroalkyl group, it is possible to increase the acidity of the acid which is generated due to irradiation with light. Due to this, it is possible to improve the sensitivity of the actinic ray-sensitive or radiation-sensitive resin composition. Here, $Rc_1$ to $Rc_3$ may form a ring by bonding with another alkyl group, aryl group, or the like.

In addition, examples of a preferable X include a sulfonate anion represented by the General Formulae (SA1) or (SA2) below.

[Chem. 54]

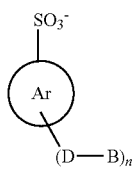

In the formula (SA1),
Ar represents an aryl group, and may further contain a substituent other than a sulfonate anion or a group represented by -(D-B);
n is an integer of 0 or more, and n is preferably from 1 to 4, more preferably from 2 or 3, and most preferably 3;
D represents a single bond or a divalent linking group, and examples of the divalent linking group can include an ether group, a thioether group, a carbonyl group, a sulfoxide group, a sulfone group, a sulfonic ester group, an ester group, a group which is a combination of two or more thereof, or the like; and
B represents a hydrocarbon group.

[Chem. 55]

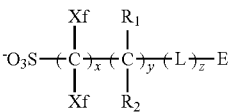

In the formula (SA2),
each Xf independently represents a fluorine atom or an alkyl group substituted with at least one fluorine atom;
each of $R_1$ and $R_2$ independently represents a hydrogen atom, a fluorine atom, or an alkyl group, and in a case where there is a plurality of $R_1$s and $R_2$s, each of $R_1$s and $R_2$s may be the same as or different from each other;
L represents a divalent linking group, and in a case where there is a plurality of Ls, Ls may be the same as or different from each other;
E represents an organic group with a ring structure;
x represents an integer of from 1 to 20;
y represents an integer of from 0 to 10; and
z represents an integer of from 0 to 10.
First, the sulfonate anion represented by the formula (SA1) will be described in detail.
In Formula (SA1), Ar is preferably an aromatic ring having 6 to 30 carbon atoms. Specifically, Ar is, for example, a benzene ring, a naphthalene ring, a pentalene ring, an indene ring, an azulene ring, a heptalene ring, an indecene ring, a perylene ring, a pentacene ring, an acenaphthalene ring, a phenanthrene ring, an anthracene ring, a naphthacene ring, a chrysene ring, a triphenylene ring, fluorene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring, or a phenazine ring. Among these, from the viewpoint of making roughness improvement compatible with sensitivity increase, a benzene ring, a naphthalene ring, or an anthracene ring is preferable, and a benzene ring is more preferable.

When Ar further has a substituent other than a sulfonate anion and a -(D-B) group, examples of the substituent include a halogen atom such as a fluorine atom, a chlorine atom, a bromine atom, and an iodine atom; a hydroxyl group; a carboxyl group; and a sulfonic acid group.

In the formula (SA1), D is preferably a single bond, an ether group, or an ester group. D is more preferably a single bond.

In the formula (SA1), for example, B is preferably an alkyl group, an alkenyl group, an alkynyl group, an aryl group, or a cycloalkyl group. B is preferably an alkyl group or a cycloalkyl group and is more preferably a cycloalkyl group. The alkyl group, the alkenyl group, the alkynyl group, the aryl group, or the cycloalkyl group as B may have a substituent.

An alkyl group as B is preferably a branched alkyl group. Examples of the branched alkyl group include an isopropyl group, a tert-butyl group, a tert-pentyl group, a neopentyl group, a sec-butyl group, an isobutyl group, an isohexyl group, a 3,3-dimethylpentyl group, and a 2-ethylhexyl group.

Examples of the alkenyl group as B include a vinyl group, a propenyl group, and a hexenyl group.

Examples of the alkynyl group as B include a propynyl group, and a hexynyl group.

Examples of the aryl group as B include a phenyl group and a p-tolyl group.

The cycloalkyl group as B may be a monocyclic cycloalkyl group or a polycyclic cycloalkyl group. Examples of the monocyclic cycloalkyl group include a cyclopropyl group, a cyclobutyl group, a cyclopentyl group, a cyclohexyl group, a cycloheptyl group, and a cyclooctyl group. Examples of the polycyclic cycloalkyl group include an adamantyl group, a norbornyl group, a bornyl group, a camphenyl group, a decahydronaphthyl group, a tricyclodecanyl group, a tetracyclodecanyl group, a camphoroyl group, a dicyclohexyl group, and a pinenyl group.

In a case where the alkyl group, the alkenyl group, the alkynyl group, the aryl group, or the cycloalkyl group as B has a substituent, examples of the substituent include the following. That is, examples of the substituent include a halogen atom such as a fluorine atom, a chlorine atom, a bromine atom, or an iodine atom; an alkoxy group such as a methoxy group, an ethoxy group, or a tert-butoxy group; an aryloxy group such as a phenoxy group or a p-tolyloxy group; an alkylthioxy group such as a methylthioxy group, an ethylthioxy group, or a tert-butylthioxy group; an arylthioxy group such as a phenylthioxy group or a p-tolylthioxy group; an alkoxycarbonyl group such as a methoxycarbonyl group, a butoxycarbonyl group, or a phenoxycarbonyl group; an acetoxy group; a linear alkyl group such as a methyl group, an ethyl group, a propyl group, a butyl group, a heptyl group, a hexyl group, a dodecyl group, or a 2-ethylhexyl group; a branched alkyl group; a cycloalkyl group such as a cyclohexyl group; an alkenyl group such as a vinyl group, a propenyl group, or a hexenyl group; an acetylene group; an alkynyl groups such as a propynyl group or a hexynyl group; an aryl group such as a phenyl group or a tolyl group; a hydroxy group; a carboxy group; a sulfonic group; and a carbonyl group. Among these, from the point of view of obtaining both improvement in roughness and higher sensitivity, a linear alkyl group and a branched alkyl group are preferable.

Next, a sulfonate anion represented by the formula (SA2) will be described in detail.

In the formula (SA2), Xf is a fluorine atom or an alkyl group which is substituted by at least one fluorine atom. The alkyl group preferably has 1 to 10 carbon atoms and more preferably has 1 to 4 carbon atoms. In addition, the alkyl group substituted with a fluorine atom is preferably a perfluoroalkyl group.

Xf is preferably a fluorine atom or a perfluoroalkyl group which has 1 to 4 carbon atoms. Specifically, Xf is preferably a fluorine atom, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, or $CH_2CH_2C_4F_9$. Among these, a fluorine atom or $CF_3$ is preferable, and a fluorine atom is most preferable.

In the formula (SA2), each of $R_1$ and $R_2$ independently represents a hydrogen atom, a fluorine atom, or an alkyl group. The alkyl group may have a substituent (preferably a fluorine atom) and preferably has 1 to 4 carbon atoms. As the alkyl group represented by $R_1$ and $R_2$ that may have a substituent, a perfluoroalkyl group having 1 to 4 carbon atoms is preferable. Specifically, examples of the alkyl group represented by $R_1$ and $R_2$ that may have a substituent include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F$, $CH_2CH_2C_2F_5$, $CH_2C_3F_7$, $CH_2CH_2C_3F_7$, $CH_2C_4F_9$, and $CH_2CH_2C_4F_9$. Among these, $CF_3$ is preferable.

In the formula (SA2), x is preferably from 1 to 8 and more preferably from 1 to 4. y is preferably from 0 to 4 and more preferably 0. z is preferably from 0 to 8 and more preferably from 0 to 4.

In the formula (SA2), L represents a single bond or a divalent linking group. Examples of the divalent linking group include —COO—, —OCO—, —CO—, —O—, —S—, —SO—, —SO$_2$—, an alkylene group, a cycloalkylene group, an alkenylene group, and a combination of two or more kinds of the same, and the divalent linking group preferably has 20 or less carbon atoms in total. Among these, —COO—, —OCO—, —CO—, —O—, —S—, —SO—, or —SO$_2$— is preferable, and —COO—, —OCO—, or —SO$_2$— is more preferable.

In the formula (SA2), E represents an organic group with a ring structure. Examples of E include a cyclic aliphatic group, an aryl group, and a heterocyclic group.

The cyclic aliphatic group as E may either be a monocyclic structure or a polycyclic structure. As the cyclic aliphatic group with a monocyclic structure, a monocyclic cycloalkyl group such as a cyclopentyl group, a cyclohexyl group, or a cyclooctyl group is preferred. As the cyclic aliphatic group with a ploycyclic structure, a polycyclic cycloalkyl group such as a norbornyl group, a tricyclodecanyl group, a tetracyclodecanyl group, a tetracyclododecanyl group or an adamantyl group is preferred. In particular, in a case where a bulky cyclic aliphatic group which has a ring having 6 or more members is adopted as E, it is possible to suppress in-film diffusion in the PEB (post-exposure bake) process and further improve resolving power and EL (Exposure Latitude).

Examples of the aryl group as E includes a benzene ring, a naphthalene ring, a phenanthrene ring, or an anthracene ring.

The group with a heterocyclic structure as E may be aromatic or non-aromatic. As a hetero atom contained in the group, a nitrogen atom or an oxygen atom is preferred. Specific examples of the heterocyclic structure include a furan ring, a thiophene ring, a benzofuran ring, a benzothiophene ring, a dibenzofuran ring, a dibenzothiophene ring, a pyridine ring, pyperidine ring, and a morpholine ring. Among these, a furan ring, a thiophene ring, a pyridine ring, pyperidine ring, and a morpholine ring are preferable.

E may have a substituent. Examples of the substituent include an alkyl group (may be linear, branched or cyclic and preferably has 1 to 12 carbon atoms), an aryl group (preferably having 6 to 14 carbon atoms), a hydroxy group, an alkoxy group, an ester group, an amido group, a urethane group, a ureido group, a thioether group, a sulfonamido group, and a sulfonic ester group.

As the photoacid generator, a compound with a plurality of structures represented by the General Formula (ZI) may be used. For example, a compound, which has a structure where at least one of $R_{201}'$ to $R_{203}'$ of a compound represented by the General Formula (ZI) is bonded to at least one of $R_{201}'$ to $R_{203}'$ of another compound represented by the General Formula (ZI), may be used.

Examples of the preferred (ZI) component can include the following compounds (ZI-1) to (ZI-4) which are described below.

The compound (ZI-1) is where at least one of $R_{201}'$ to $R_{203}'$ of the general formula (ZI) is an aryl group. That is, the compound (ZI-1) is an arylsulfonium compound, that is, a compound containing an arylsulfonium as a cation.

In the compound (ZI-1), all of $R_{201}'$ to $R_{203}'$ of the compound (ZI) may be aryl groups or a portion of $R_{201}'$ to $R_{203}'$ may be aryl groups and the remainder may be alkyl groups. Here, in a case where the compound (ZI-1) contains a plurality of aryl groups, the aryl groups may be the same as or different from each other.

Examples of the compound (ZI-1) include a triarylsulfonium compound, a diarylalkylsulfonium compound, and an aryldialkylsulfonium compound.

As the aryl group in the compound (ZI-1), a phenyl group, a naphthyl group, or a heteroaryl group such as an indole residue and a pyrrole residue are preferable, and among these, a phenyl group, a naphthyl group, or an indole residue is particularly preferred.

The alkyl group which is contained in the compound (ZI-1) according to necessity is preferably a linear, branched, or cycloalkyl group having 1 to 15 carbon atoms, and examples thereof include a methyl group, an ethyl group, a propyl group, an n-butyl group, a sec-butyl group, a t-butyl group, a cyclopropyl group, a cyclobutyl group, or a cyclohexyl group.

The aryl group and alkyl group may have a substituent. Examples of the substituent include an alkyl group (preferably, 1 to 15 carbon atoms), an aryl group (preferably, 6 to 14 carbon atoms), an alkoxy group (preferably, 1 to 15 carbon atoms), a halogen atom, a hydroxyl group, and a phenylthio group.

Examples of preferable substituents are a linear, branched or cyclic alkyl group having 1 to 12 carbon atoms and a linear, branched or cyclic alkoxy group having 1 to 12 carbon atoms. Examples of particularly preferable substituents are an alkyl group having 1 to 6 carbon atoms and an alkoxy group having 1 to 6 carbon atoms. The substituents may be substituted on any one of the three $R_{201}'$ to $R_{203}'$, or may be substituted into all of the three $R_{201}'$ to $R_{203}'$. In a case where $R_{201}'$ to $R_{203}'$ are phenyl groups, the substituent is preferably substituted at the p-position by the aryl group.

In addition, an embodiment where one or two of $R_{201}'$, $R_{202}'$, and $R_{203}'$ is an aryl group which may have a substituent and the remainder are linear, branched, or cyclic alkyl groups is also preferred. Specific examples of the structure include the structures represented in <0141> to <0153> of JP2004-210670A.

In this case, specifically, the aryl group is the same as the aryl groups as $R_{201}'$, $R_{202}'$, and $R_{203}'$, and preferably is a phenyl group or a naphthyl group. In addition, the aryl group preferably contains any one of a hydroxyl group, an alkoxy group, and an alkyl group as a substituent. The substituent is more preferably an alkoxy group having 1 to 12 carbon atoms and is even more preferably an alkoxy group having 1 to 6 carbon atoms.

The linear, branched, or cyclic alkyl group as the remaining groups are preferably an alkyl group having 1 to 6 carbon atoms. These groups may further contain a substituent. Further, when two groups are present as the remaining groups, the two groups may be bonded to each other and form a ring structure.

The compound (ZI-1) is, for example, the one represented by the following formula (ZI-1A).

[Chem. 56]

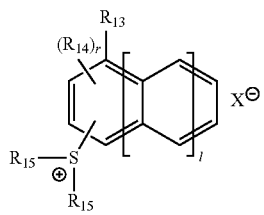

(ZI-1A)

In the General Formula (ZI-1A), $R_{13}$ represents a hydrogen atom, a fluorine atom, a hydroxyl group, an alkyl group, a cycloalkyl group, an alkoxy group, a cycloalkyloxy group, or an alkoxycarbonyl group;

each $R_{14}$ independently represents an alkyl group, a cycloalkyl group, an alkoxy group, an alkylsulfonyl group, or a cycloalkylsulfonyl group in a case of there being a plurality thereof;

each $R_{15}$ independently represents an alkyl group or a cycloalkyl group, and two $R_{15}$s may be bonded to each other and form a ring structure;

l is an integer of 0 to 2;

r is an integer of 0 to 8; and $X^-$ represents a non-nucleophilic anion and examples thereof include the same $X^-$ as in the General Formula (ZI).

The alkyl group represented by $R_{13}$, $R_{14}$, or $R_{15}$ may be a linear or branched alkyl group. The alkyl group preferably has 1 to 10 carbon atoms, and examples thereof include a methyl group, an ethyl group, an n-propyl group, an i-propyl group, an n-butyl group, a 2-methylpropyl group, a 1-methylpropyl group, a t-butyl group, an n-pentyl group, a neopentyl group, an n-hexyl group, an n-heptyl group, an n-octyl group, a 2-ethylhexyl group, an n-nonyl group, and an n-decyl group. Among these, a methyl group, an ethyl group, an n-butyl group, and a t-butyl group are particularly preferable.

Examples of the cycloalkyl group represented by R13, R14, or R15 include a cyclic or polycyclic cycloalkyl group (preferably a cycloalkyl group having 3 to 20 carbon atoms). Examples thereof include cyclopropyl, cyclobutyl, cyclopentyl, cyclohexyl, cycloheptyl, cyclooctyl, cyclododecanyl, cyclopentenyl, cyclohexenyl, and cyclooctadienyl groups. Among these, cyclopropyl, cyclopentyl, cyclohexyl, cycloheptyl, and cyclooctyl groups are particularly preferable.

Examples of an alkyl group portion of the alkoxy group represented by $R_{13}$ or $R_{14}$ include those exemplified above as the alkyl group represented by $R_{13}$, $R_{14}$, or $R_{15}$. As the alkoxy group, a methoxy group, an ethoxy group, an n-propoxy group, and an n-butoxy group are particularly preferable.

Examples of a cycloalkyl group portion of the cycloalkyloxy group represented by $R_{13}$ include those exemplified above as the cycloalkyl group represented by $R_{13}$, $R_{14}$, or $R_{15}$. As the cycloalkyloxy group, a cyclopentyloxy group and a cyclohexyloxy group are particularly preferable.

Examples of an alkoxy group portion of the alkoxycarbonyl group represented by $R_{13}$ include those described above as the alkoxy group represented by $R_{13}$ or $R_{14}$. As the alkoxycarbonyl group, a methoxycarbonyl group, an ethoxycarbonyl group, and an n-butoxycarbonyl group are particularly preferable.

Examples of an alkyl group portion of the alkylsulfonyl group represented by $R_{14}$ include those described above as the alkyl group represented by $R_{13}$, $R_{14}$, or $R_{15}$. Examples of a cycloalkyl group portion of the cycloalkylsulfonyl group represented by $R_{14}$ include those described above as the cycloalkyl group represented by $R_{13}$, $R_{14}$, or $R_{15}$. As the alkylsulfonyl group or the cycloalkyl sulfonyl group, a methane sulfonyl group, an ethane sulfonyl group, an n-propane sulfonyl group, an n-butane sulfonyl group, a cyclopentane sulfonyl group, and a cyclohexane sulfonyl group are particularly preferable.

l is preferably 0 or 1 and is more preferably 1. r is preferably 0 to 2.

The respective groups represented by $R_{13}$, $R_{14}$, or $R_{15}$ may further have a substituent. Examples of the substituent include a halogen atom such as a fluorine atom, a hydroxy group, a carboxy group, a cyano group, a nitro group, an alkoxy group, a cycloalkyloxy group, an alkoxyalkyl group, a cycloalkyloxyalkyl group, an alkoxycarbonyl group, a cycloalkyloxycarbonyl group, an alkoxycarbonyloxy group, and a cycloalkyloxycarbonyloxy group.

The alkoxy group may be linear or branched. Examples of the alkoxy group include a methoxy group, an ethoxy group, an n-propoxy group, an i-propoxy group, an n-butoxy group, a 2-methylpropoxy group, a 1-methylpropoxy group, a t-butoxy group, and the like having 1 to 20 carbon atoms.

Examples of the cycloalkyloxy group include a cyclopentyloxy group, a cyclohexyloxy group, and the like having 3 to 20 carbon atoms.

The alkoxyalkyl group may be linear or branched. Examples of the alkoxyalkyl group include a methoxymethyl group, an ethoxymethyl group, a 1-methoxyethyl group, a 2-methoxyethyl group, a 1-ethoxyethyl group, a 2-ethoxyethyl group, and the like having 2 to 21 carbon atoms.

Examples of the cycloalkyloxyalkyl group include a cyclopentyloxyethyl group, a cyclopentyloxypentyl group, a cyclohexyloxyethyl group, a cyclohexyloxypentyl group, and the like having 4 to 21 carbon atoms.

The alkoxycarbonyl group may be linear or branched. Examples of the alkoxycarbonyl group include a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, and the like having 2 to 21 carbon atoms.

Examples of the cycloalkyloxycarbonyl group include a cyclopentyloxycarbonyl group, a cyclohexyloxycarbonyl group, and the like having 4 to 21 carbon atoms.

The alkoxycarbonyloxy group may be linear or branched. Examples of the alkoxycarbonyloxy group include a methoxycarbonyloxy group, an ethoxycarbonyloxy group, an n-propoxycarbonyloxy group, an i-propoxycarbonyloxy group, an n-butoxycarbonyloxy group, a t-butoxycarbonyloxy group, and the like having 2 to 21 carbon atoms.

Examples of the cycloalkyloxycarbonyloxy group include a cyclopentyloxycarbonyloxy group, a cyclohexyloxycarbonyloxy group, and the like having 4 to 21 carbon atoms.

As the ring structure that the two $R_{15}$s may form by binding to each other, a structure that forms a 5- or 6-membered ring, particularly preferably a 5-membered ring (that is, a tetrahydrothiophene ring) together with an S atom in the General Formula (ZI-1A) is preferable.

The ring structure may have a further substituent. Examples of the substituent include a hydroxy group, a carboxy group, a cyano group, a nitro group, an alkyl group, a cycloalkyl group, an alkoxy group, an alkoxyalkyl group, an alkoxycarbonyl group, and an alkoxycarbonyloxy group. With regard to the ring structure described above, a plurality of the substituent may exist, and these substituents may form a ring (an aromatic or non-aromatic hydrocarbon ring, an aromatic or non-aromatic heterocycle, or a polycyclic condensed ring including a combination of two or more of these rings) by binding to each other.

As $R_{15}$, a methyl group, an ethyl group, and a divalent group in which two $R_{15}$s bind to each other and form a tetrahydrothiophene ring structure together with a sulfur atom are particularly preferable.

The alkyl group, the cycloalkyl group, the alkoxy group, and the alkoxycarbonyl group represented by $R_{13}$, and the alkyl group, the cycloalkyl group, the alkoxy group, the alkylsulfonyl group, and the cycloalkylsulfonyl group represented by $R_{14}$ may further have a substituent. As the substituent, a hydroxy group, an alkoxy group, an alkoxycarbonyl group, and a halogen atom (particularly, a fluorine atom) are preferable.

Specific preferable examples of the cation in the compound represented by the General Formula (ZI-1A) are shown below.

[Chem. 57]

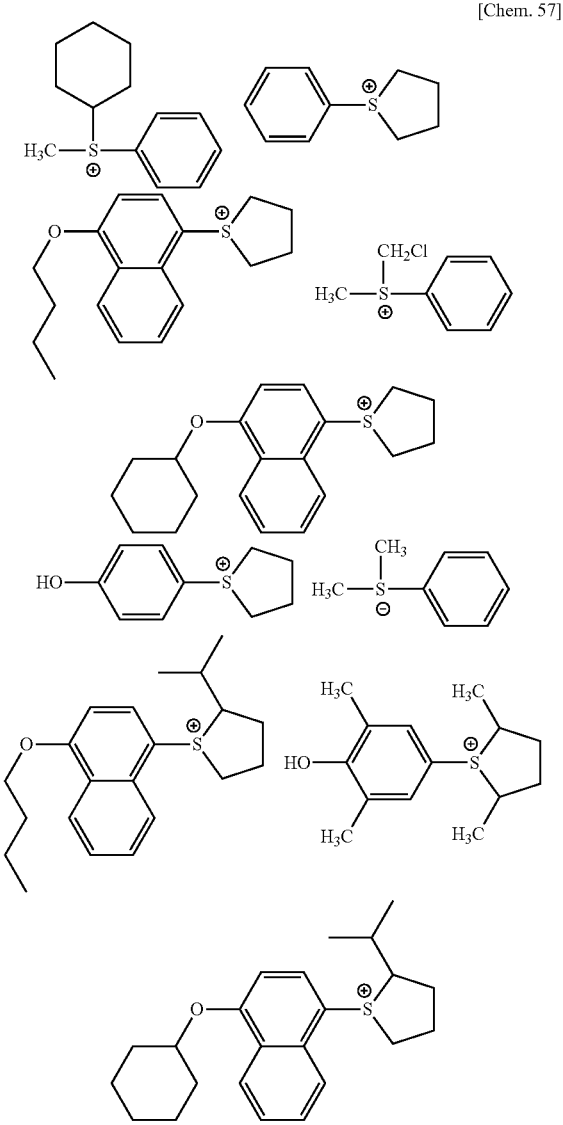

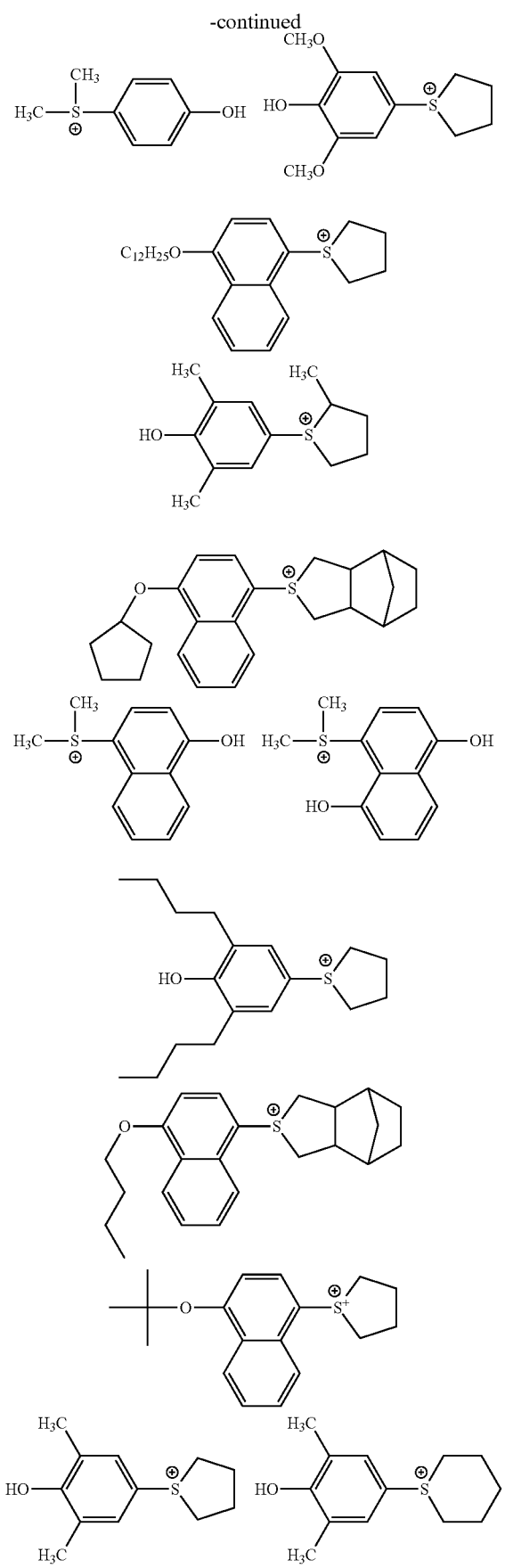
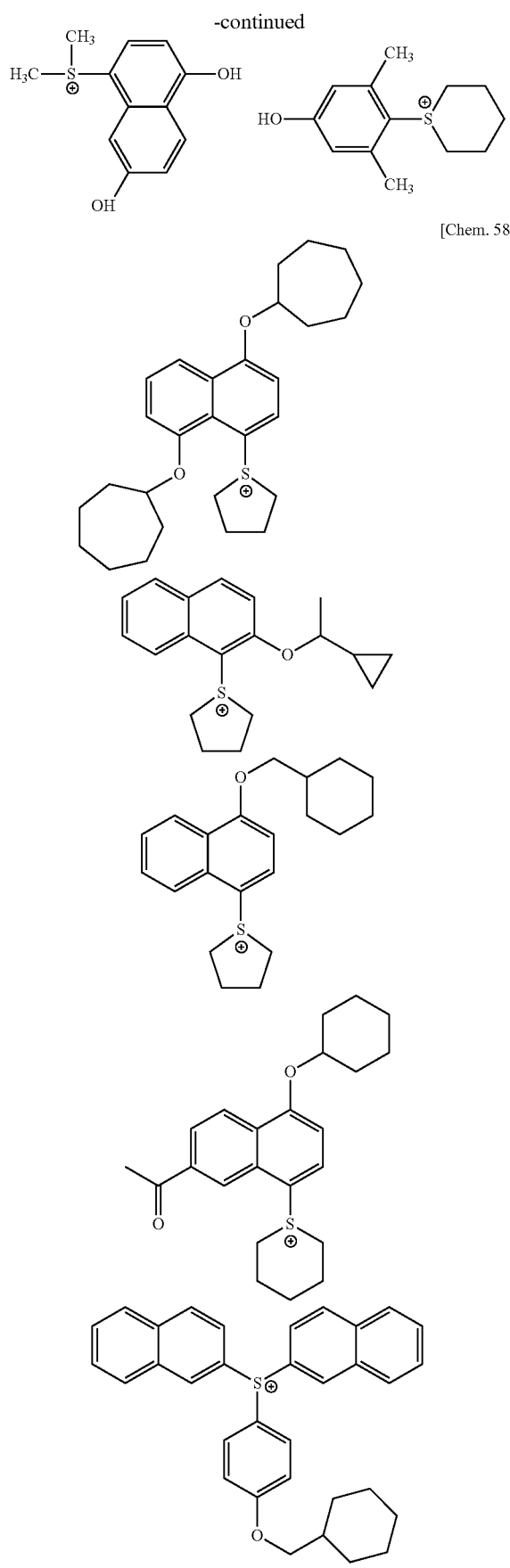

143
-continued
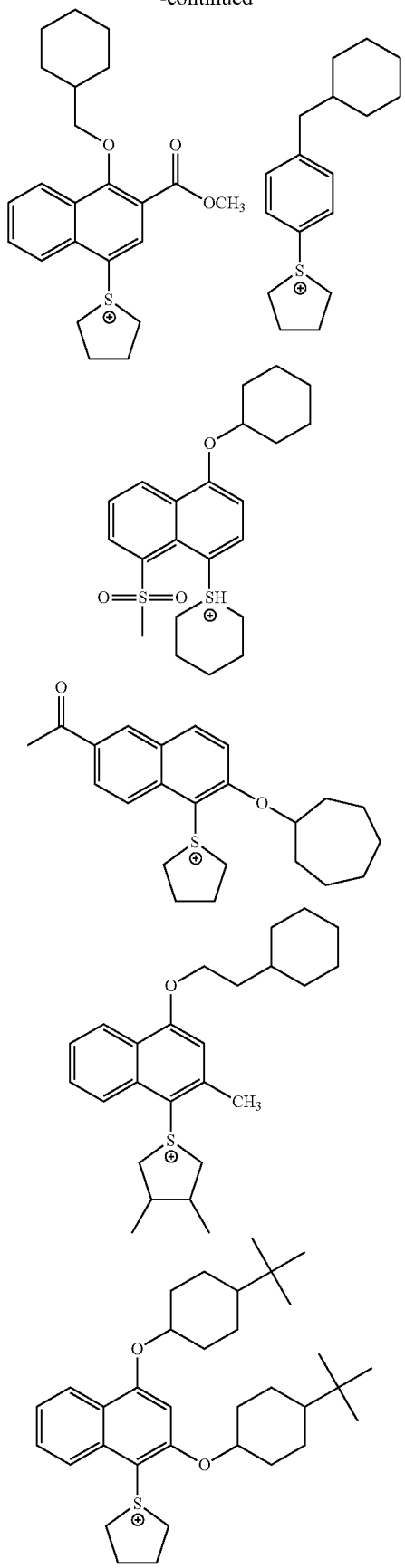
144
-continued
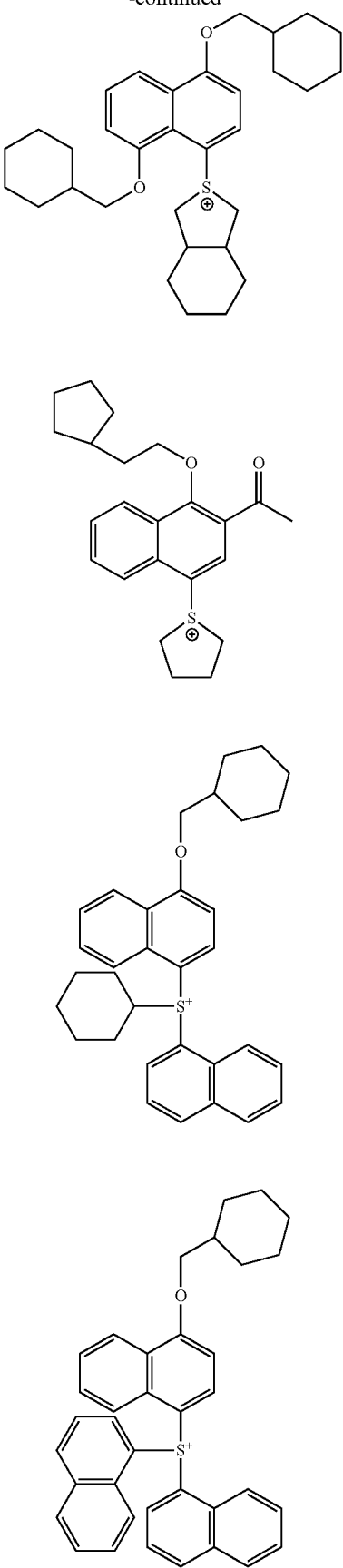

-continued

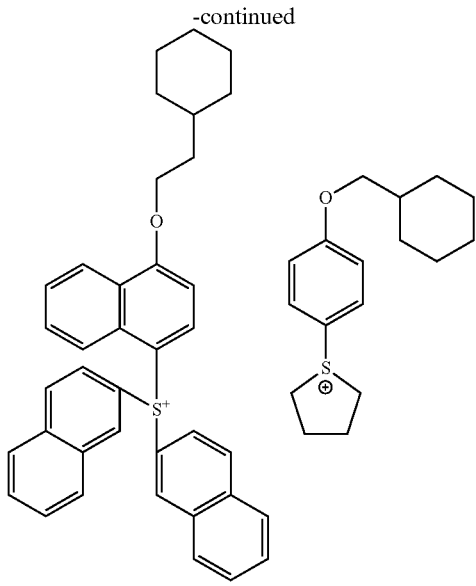

Next, the compound (ZI-2) will be described.

The compound (ZI-2) is a compound in which each of $R_{201}'$ to $R_{203}'$ in the formula (ZI) independently represents an organic group not containing an aromatic ring. The aromatic ring herein also includes an aromatic ring containing a hetero atom.

The organic group that is represented by $R_{201}'$ to $R_{203}'$ and does not contain an aromatic ring has, for example, 1 to 30 carbon atoms, and preferably has 1 to 20 carbon atoms.

Each of $R_{201}'$ to $R_{203}'$ preferably independently represents an alkyl group, a cycloalkyl group, a 2-oxoalkyl group, an alkoxycarbonyl methyl group, an allyl group, or a vinyl group. More preferably, each of $R_{201}'$ to $R_{203}'$ independently represents a linear, branched, or cyclic 2-oxoalkyl group or alkoxycarbonyl methyl group, and among these, a linear or branched 2-oxoalkyl group is particularly preferable.

Preferable examples of the alkyl group and the cycloalkyl group represented by $R_{201}'$ to $R_{203}'$ include a linear or branched alkyl group (for example, a methyl group, an ethyl group, a propyl group, a butyl group, or a pentyl group) having 1 to 10 carbon atoms and a cycloalkyl group (a cyclopentyl group, a cyclohexyl group, or a norbornyl group) having 3 to 10 carbon atoms.

The 2-oxoalkyl group represented by $R_{201}'$ to $R_{203}'$ may be linear, branched, or cyclic, and preferable examples thereof include a group having >C=O in the second position of the above-described alkyl group.

Preferable examples of the alkoxy group in the alkoxycarbonyl methyl group represented by $R_{201}'$ to $R_{203}'$ include an alkoxy group (a methoxy group, an ethoxy group, a propoxy group, a butoxy group, or a pentoxy group) having 1 to 5 carbon atoms.

$R_{201}'$ to $R_{203}'$ may be further substituted with, for example, a halogen atom, an alkoxy group (having 1 to 5 carbon atoms for example), a hydroxyl group, a cyano group and/or a nitro group.

Two of $R_{201}'$ to $R_{203}'$ may form a ring structure by binding to each other. The ring structure may contain an oxygen atom, a sulfur atom, an ester bond, an amide bond and/or a carbonyl group in the ring. Examples of the group that two of $R_{201}'$ to $R_{203}'$ form by binding to each other include an alkylene group (for example, a butylene group or a pentylene group).

Examples of the ring structure include an aromatic or non-aromatic hydrocarbon ring, an aromatic or non-aromatic heterocycle, or a polycyclic condensed ring including a combination of two or more of these rings. Examples of the ring structure include 3- to 10-membered rings, and among these, 4- to 8-membered rings are preferable, and 5- to 6-membered rings are more preferable.

Next, the compound (ZI-3) will be described.

The compound (ZI-3) is a compound which is represented by the following General Formula (ZI-3) and has a phenacyl sulfonium salt structure.

[Chem. 59]

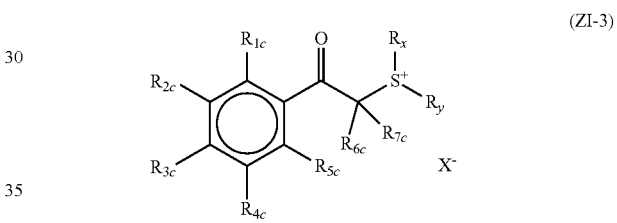

(ZI-3)

In the formula, each of $R_{1c}$ to $R_{5c}$ independently represents a hydrogen atom, an alkyl group, an alkoxy group, or a halogen atom, and the alkyl group and the alkoxy group preferably have 1 to 6 carbon atoms;

each of $R_{6c}$ and $R_{7c}$ independently represent a hydrogen atom or an alkyl group, and the alkyl group preferably has 1 to 6 carbon atoms; and each of $R_x$ and $R_y$ independently represents an alkyl group, a 2-oxoalkyl group, an alkoxycarbonyl methyl group, an allyl group, or a vinyl group, and these atomic groups preferably have 1 to 6 carbon atoms.

Any two or more of $R_{1c}$ to $R_{7c}$, may be bonded with each other, and may form a ring structure. Additionally, $R_x$ and $R_y$ may be bonded with each other and form a ring structure. These ring structures may contain an oxygen atom, a sulfur atom, an ester bond, and/or an amide bond.

$X^-$ in the General Formula (ZI-3) has the same definition as $X^-$ in the General Formula (ZI).

Specific examples of the compound (ZI-3) include compounds disclosed as example compounds in Paragraphs <0046> and <0047> in JP2004-233661A or Paragraphs <0040> to <0046> in JP2003-35948A.

Next, the compound (ZI-4) will be described.

The compound (ZI-4) is a compound having a cation represented by the following General Formula (ZI-4). This compound (ZI-4) is effective for inhibiting outgassing.

[Chem. 60]

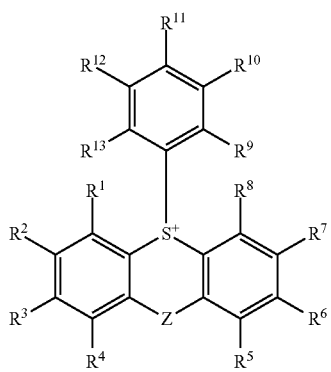

(ZI-4)

In the General Formula (ZI-4), $R^1$ to $R^{13}$ each independently represents a hydrogen atom or a substituent, at least one of $R^1$ to $R^{13}$ may be a substituent containing an alcoholic hydroxyl group, and the "alcoholic hydroxyl group" herein refers to a hydroxyl group binding to a carbon atom of an alkyl group; and Z represents a single bond or a divalent linking group.

In a case where $R^1$ to $R^{13}$ is a substituent containing an alcoholic hydroxyl group, $R^1$ to $R^{13}$ is preferably a group represented by —(W—Y). Here, Y represents an alkyl group substituted with one or more hydroxyl group, and W represents a single bond or a divalent linking group.

Preferable examples of the alkyl group represented by Y include an ethyl group, a propyl group, and an isopropyl group. Y particularly preferably has a structure represented by —$CH_2CH_2OH$.

Though not particularly limited, the divalent linking group represented by W is preferably a divalent group obtained by substituting an arbitrary hydrogen atom in a single bond, an alkoxy group, an acyloxy group, an acylamino group, alkyl and arylsulfonylamino groups, an alkylthio group, an alkylsulfonyl group, an acyl group, an alkoxycarbonyl group, or a carbamoyl group with a single bond. The divalent linking group is more preferably a divalent group obtained by substituting an arbitrary hydrogen atom in a single bond, an acyloxy group, an alkylsulfonyl group, an acyl group, or an alkoxycarbonyl group with a single bond.

When $R^1$ to $R^{13}$ are substituents containing an alcoholic hydroxyl group, these substituents preferably have 2 to 10 carbon atoms, more preferably have 2 to 6 carbon atoms, and particularly preferably have 2 to 4 carbon atoms.

The substituents that are represented by $R^1$ to $R^{13}$ and contain an alcoholic hydroxyl group may have two or more alcoholic hydroxyl groups. The number of alcoholic hydroxyl groups included in the substituents that are represented by $R^1$ to $R^{13}$ and contain an alcoholic hydroxyl group is from 1 to 6, preferably from 1 to 3, and even more preferably 1.

In the compound represented by the General Formula (ZI-4), the total number of alcoholic hydroxyl groups of all of $R^1$ to $R^{13}$ is from 1 to 10, preferably from 1 to 6, and even more preferably from 1 to 3.

When $R^1$ to $R^{13}$ do not contain an alcoholic hydroxyl group, examples of the substituents represented by $R^1$ to $R^{13}$ include a halogen atom, an alkyl group, a cycloalkyl group, an alkenyl group, a cycloalkenyl group, an alkynyl group, an aryl group, a heterocyclic group, a cyano group, a nitro group, a carboxyl group, an alkoxy group, an aryloxy group, silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, alkyl and arylsulfonylamino groups, a mercapto group, an alkylthio group, an arylthio group, a heterocyclic thio group, a sulfamoyl group, a sulfo group, alkyl and arylsulfinyl groups, alkyl and arylsulfonyl groups, an acyl group, an aryloxycarbonyl group, an alkoxycarbonyl group, a carbamoyl group, aryl and heterocyclic azo groups, an imide group, a phosphino group, a phosphinyl group, a phosphinyloxy group, a phosphinylamino group, a phosphono group, a silyl group, a hydrazino group, a ureide group, a boronic acid group [—$B(OH)_2$], a phosphate group [—$OPO(OH)_2$], a sulfate group (—$OSO_3H$), and other known substituents.

When $R^1$ to $R^{13}$ do not contain an alcoholic hydroxyl group, $R^1$ to $R^{13}$ are preferably hydrogen atoms, halogen atoms, alkyl groups, cycloalkyl groups, alkenyl groups, cycloalkenyl groups, alkynyl groups, aryl groups, cyano groups, carboxyl groups, alkoxy groups, aryloxy groups, acyloxy groups, carbamoyloxy groups, acylamino groups, aminocarbonylamino groups, alkoxycarbonylamino groups, aryloxycarbonylamino groups, sulfamoylamino groups, alkyl and arylsulfonylamino groups, alkylthio groups, arylthio groups, sulfamoyl groups, alkyl and arylsulfonyl groups, aryloxycarbonyl groups, alkoxycarbonyl groups, carbamoyl groups, imide groups, silyl groups, or ureide groups.

When $R^1$ to $R^{13}$ do not contain an alcoholic hydroxyl group, $R^1$ to $R^3$ are more preferably hydrogen atoms, halogen atoms, alkyl groups, cycloalkyl groups, cyano groups, alkoxy groups, acyloxy groups, acylamino groups, aminocarbonylamino groups, alkoxycarbonylamino groups, alkyl and arylsulfonylamino groups, alkylthio groups, sulfamoyl groups, alkyl and arylsulfonyl groups, alkoxycarbonyl groups, or carbamoyl groups.

When $R^1$ to $R^{13}$ do not contain an alcoholic hydroxyl group, $R^1$ to $R^{13}$ are particularly preferably hydrogen atoms, alkyl groups, cycloalkyl groups, halogen atoms, or alkoxy groups.

Among $R^1$ to $R^{13}$, two adjacent groups may form a ring by binding to each other. This ring includes aromatic and non-aromatic hydrocarbon rings and heterocycles. These rings may form a condensed ring by being further combined.

The compound (ZI-4) preferably has a structure in which at least one of $R^1$ to $R^{13}$ contains an alcoholic hydroxyl group, and more preferably has a structure in which at least one of $R^9$ to $R^{13}$ has an alcoholic hydroxyl group.

As described above, Z represents a single bond or a divalent linking group. Examples of the divalent linking group include an alkylene group, an arylene group, a carbonyl group, a sulfonyl group, a carbonyloxy group, a carbonylamino group, a sulfonylamide group, an ether group, a thioether group, an amino group, a disulfide group, an acyl group, an alkylsulfonyl group, —CH=CH—, an aminocarbonylamino group, and an aminosulfonylamino group.

The divalent linking group may have substituents. Examples of the substituents include the same as those exemplified above for $R^1$ to $R^{13}$.

Z is preferably a bond or a group that does not withdraw electrons, such as a single bond, an alkylene group, an arylene group, an ether group, a thioether group, an amino group, —CH=CH—, an aminocarbonylamino group, and an aminosulfonylamino group. Z is more preferably a single bond, an ether group, or a thioether group, and particularly preferably a single bond.

Hereinbelow, General Formulae (ZII) and (ZIII) will be described.

In the General Formulae (ZII) and (ZIII), each of $R_{204}'$, $R_{205}'$, $R_{206}$, and $R_{207}$ independently represents an aryl group, an alkyl group or a cycloalkyl group. The aryl group, the alkyl group, and the cycloalkyl group may contain may have a substituent.

Preferable examples of the aryl group represented by $R_{204}'$, $R_{205}'$, $R_{206}$, and $R_{207}$ include the same groups as exemplified above for $R_{201}'$ to $R_{203}'$ in the General Formula (ZI-1).

Preferable examples of the alkyl group and the cycloalkyl group represented by $R_{204}'$, $R_{205}'$, $R_{206}$, and $R_{207}$ include the linear, branched, or cyclic alkyl groups exemplified above for $R_{201}'$ to $R_{203}'$ in the General Formula (ZI-2).

The aryl group, the alkyl group, and the cycloalkyl group of $R_{204}'$, $R_{205}'$, $R_{206}$, and $R_{207}$ may have a substituent. Examples of the substituent that the aryl group, the alkyl group, and the cycloalkyl group represented by $R_{204}'$, $R_{205}'$, $R_{206}$, and $R_{207}$ may have include an alkyl group (having 1 to 15 carbon atoms for example), a cycloalkyl group (having 3 to 15 carbon atoms for example), an aryl group (having 6 to 15 carbon atoms for example), an alkoxy group (having 1 to 15 carbon atoms for example), a halogen atom, a hydroxyl group, a phenylthio group, and the like.

$X^-$ in the General Formula (ZII) has the same definition as X in the General Formula (ZI).

Other preferable examples of the photoacid generator include compounds represented by the following General Formula (ZIV), (ZV), or (ZVI).

[Chem. 61]

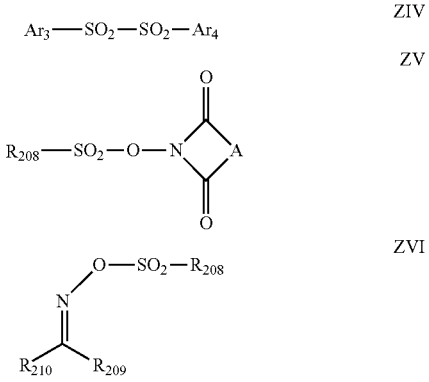

In the General Formulae (ZIV) to (ZVI), each of $Ar_3$ and $Ar_4$ independently represents a substituted or unsubstituted aryl group;

each of $R_{208}$ in the General Formulae (ZV) to (ZVI) independently represents an alkyl group, a cycloalkyl group or an aryl group, and this alkyl group, this cycloalkyl group, and this aryl group may be substituted or unsubstituted;

these groups are preferably substituted with a fluorine atom, and if so, the acidity of an acid generated by the photoacid generator can be increased; and each of $R_{209}$ and $R_{210}$ independently represents an alkyl group, a cycloalkyl group, an aryl group, or an electron-withdrawing group, this alkyl group, this cycloalkyl group, this aryl group, and this electron-withdrawing group may be substituted or unsubstituted, and examples of substituents that the alkyl group, the cycloalkyl group, the aryl group, and the electron-withdrawing group may have include a halogen atom, an alkoxy group (having 1 to 5 carbon atoms for example), a hydroxyl group, a cyano group, and a nitro group.

Preferable examples of $R_{209}$ include a substituted or unsubstituted aryl group.

Preferable examples of $R_{210}$ include an electron-withdrawing group. Preferable examples of the electron-withdrawing group include a cyano group and a fluoroalkyl group.

A represents an alkylene group, an alkenylene group, or an arylene group. The alkylene group, the alkenylene group, and the arylene group may have a substituent.

Specific examples of the aryl group represented by $Ar_3$, $Ar_4$, $R_{208}$, $R_{209}$, and $R_{210}$ respectively include the same ones as the specific examples of the aryl group represented by $R_{201}'$, $R_{202}'$, and $R_{203}'$ in the General Formula (ZI-1).

Specific examples of the alkyl group and the cycloalkyl group represented by $R_{208}$, $R_{209}$, and $R_{210}$ respectively include the same ones as the specific examples of the alkyl group and the cycloalkyl group represented by $R_{201}'$, $R_{202}'$, and $R_{203}'$ in the General Formula (ZI-2).

Examples of the alkylene group as A can include an alkylene group with 1 to 12 carbon atoms (for example, a methylene group, an ethylene group, a propylene group, an iso-propylene group, a butylene group, an isobutylene group and the like), examples of the alkenylene group as A can include an alkenylene group with 2 to 12 carbon atoms (for example, an ethenylene group, a propenylene group, a butenylene group and the like), and examples of the arylene group as A can include an arylene group with 6 to 10 carbon atoms (for example, a phenylene group, a tolylene group, a naphthylene group, and the like).

As the photoacid generator, a compound having a plurality of structures represented by the General Formula (ZVI) is also preferable. Examples of such a compound include a compound having a structure in which $R_{209}$ or $R_{210}$ of the compound represented by the General Formula (ZVI) binds to $R_{209}$ or $R_{210}$ of another compound represented by the General Formula (ZVI).

As the photoacid generator, compounds represented by the General Formulae (ZI) to (ZIII) are more preferable, the compound represented by the General Formula (ZI) is even more preferable, and compounds (ZI-1) to (ZI-3) are particularly preferable.

Specific examples of the photoacid generator are shown below but the scope of the present invention is not limited thereto.

[Chem. 62]

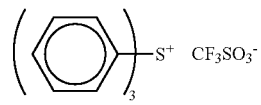

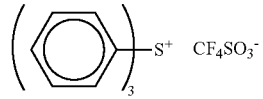

-continued
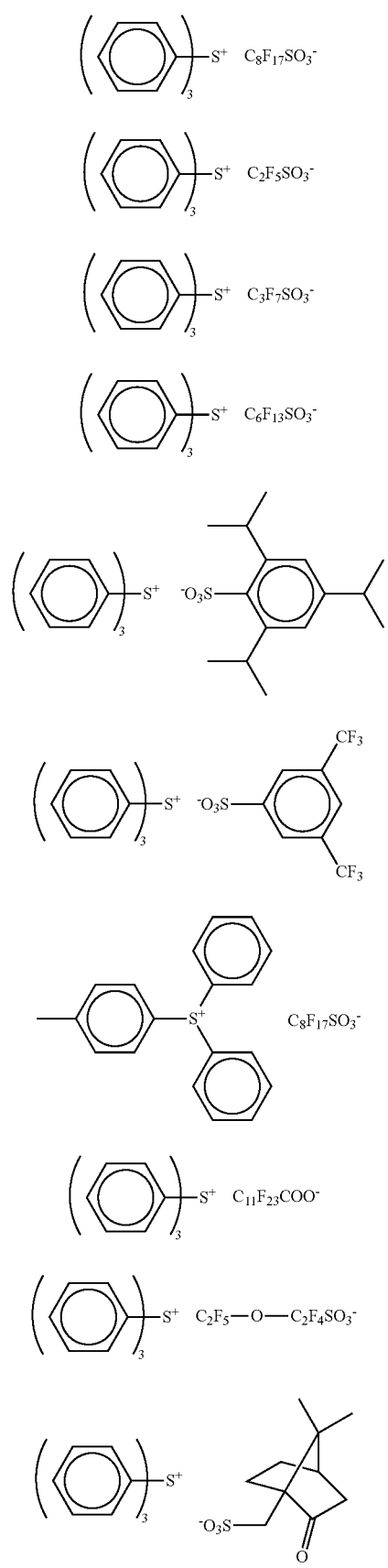
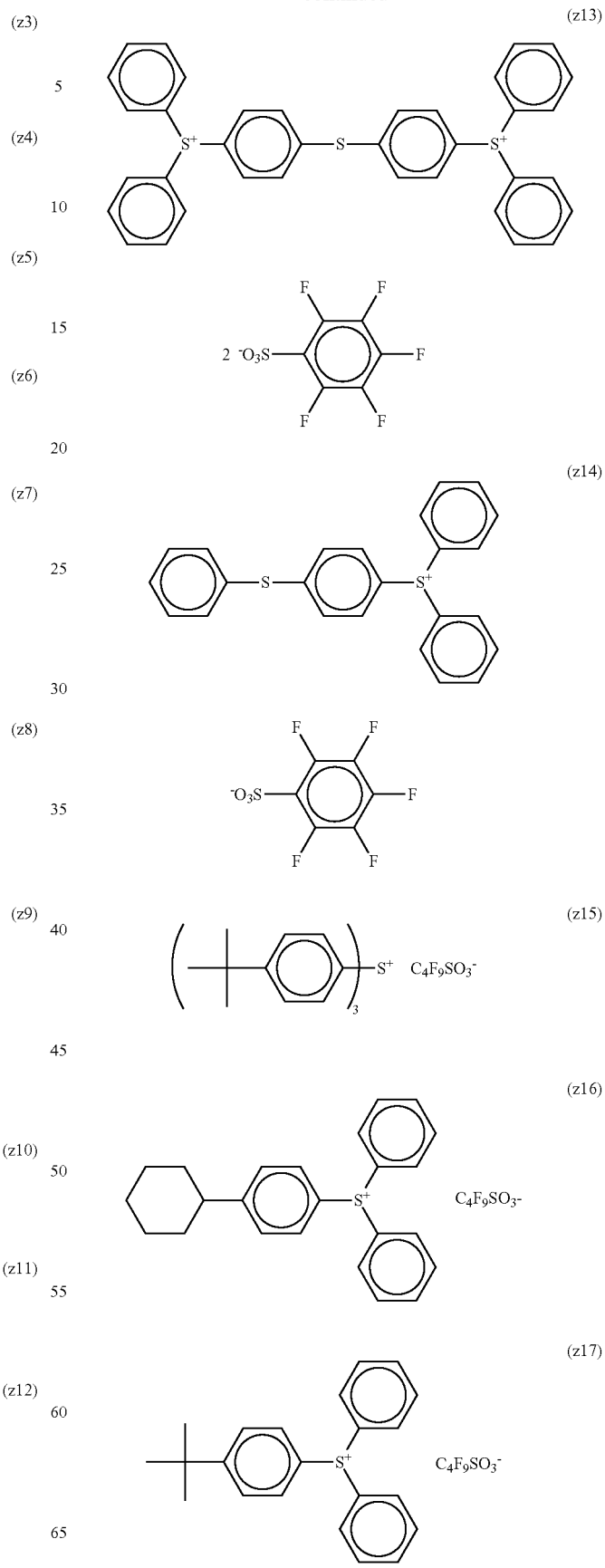

-continued
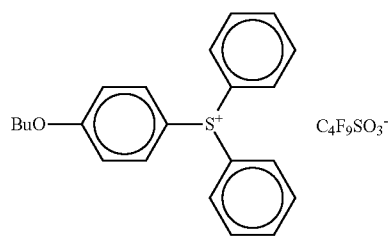 (z18)
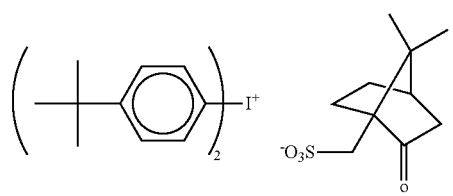 (z19)
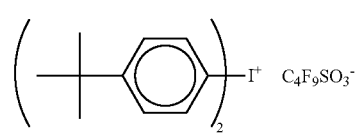 (z20)
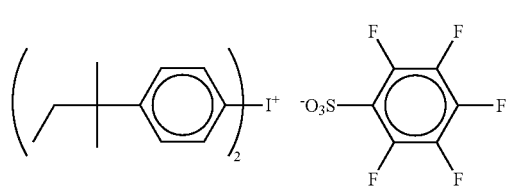 (z21)
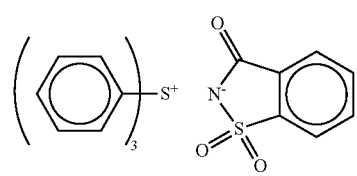 (z22)
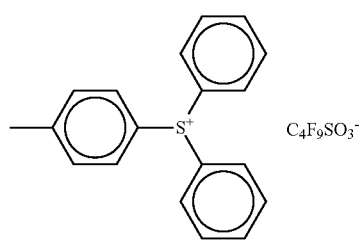 (z23)
[Chem. 63]
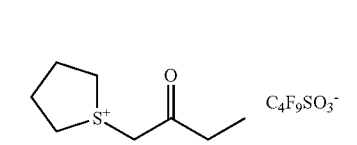 (z24)
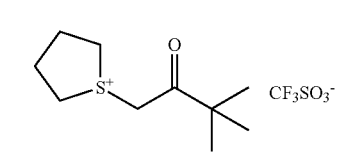 (z25)
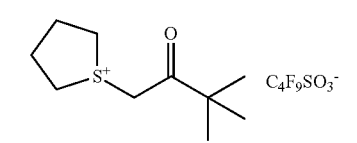 (z26)
-continued
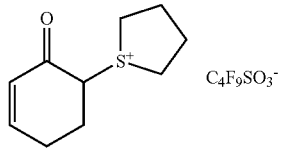 (z27)
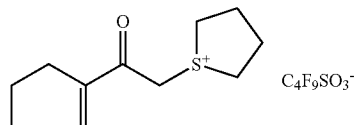 (z28)
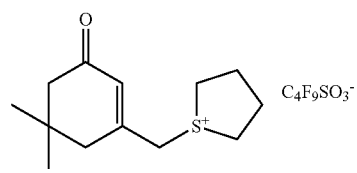 (z29)
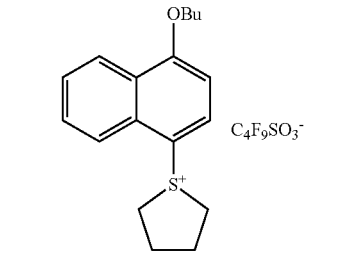 (z30)
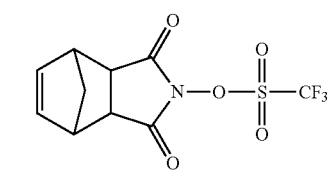 (z31)
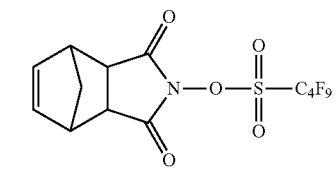 (z32)
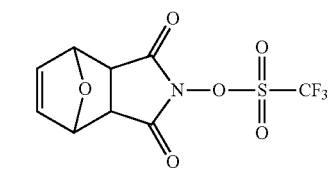 (z33)
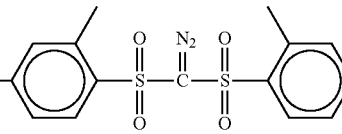 (z34)
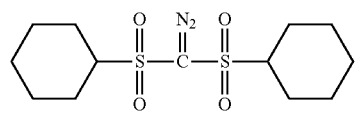 (z35)

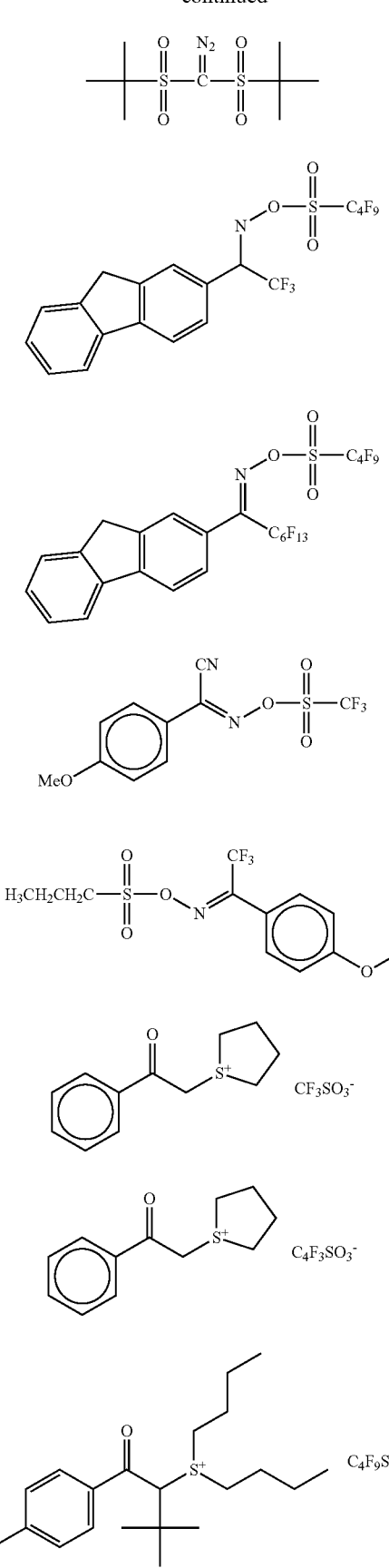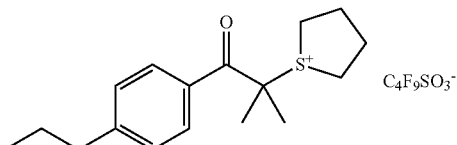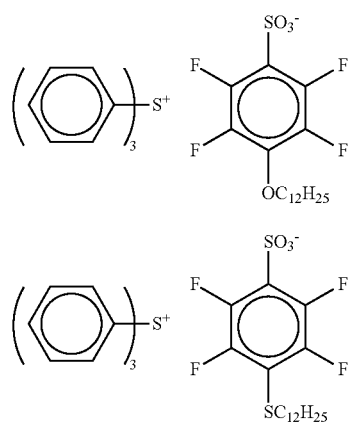

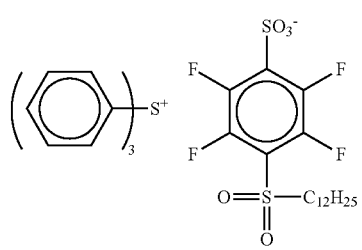
(z52)
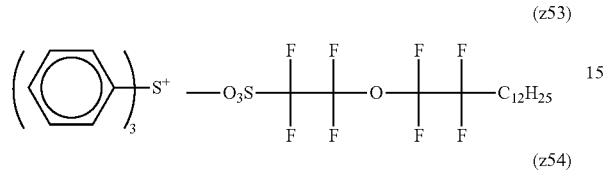
(z53)
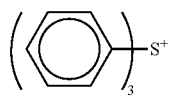
(z54)
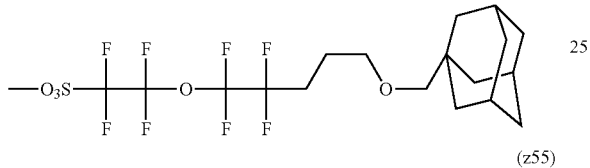
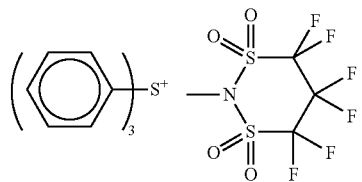
(z55)
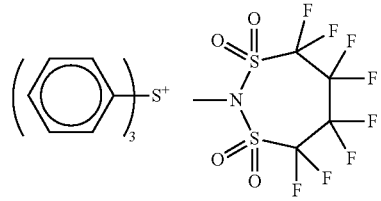
(z56)
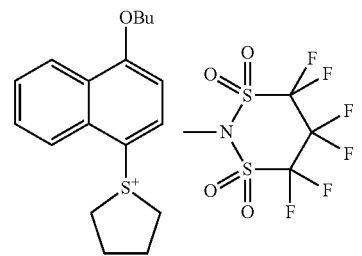
(z57)
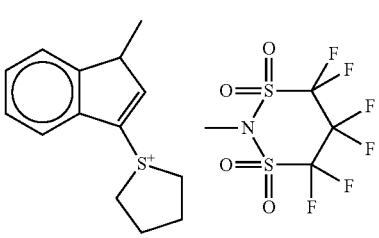
(z58)
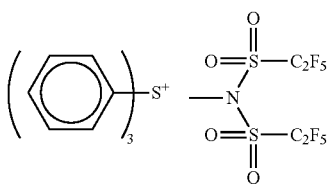
(z59)
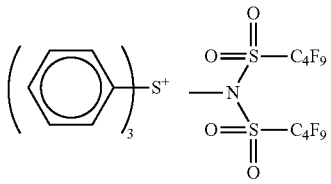
(z60)
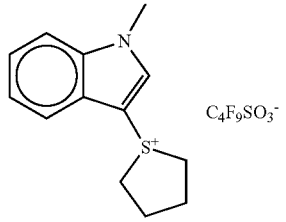
(z61)
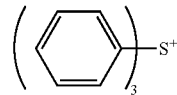
(z62)
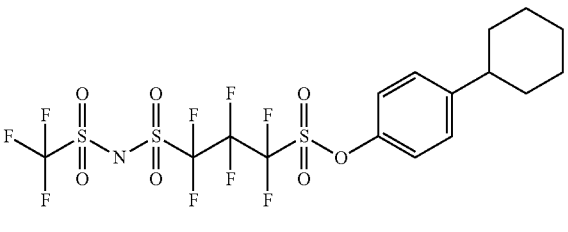
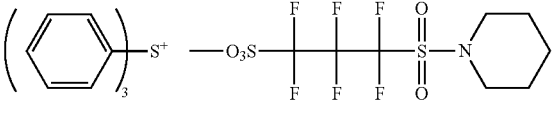
(z63)
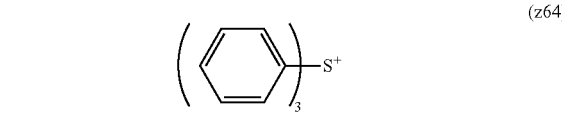
(z64)
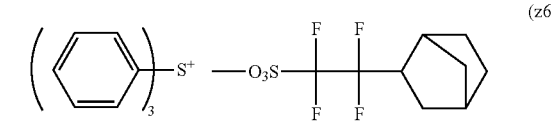
(z65)

-continued
(z66) 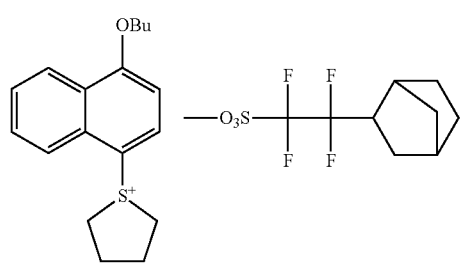
(z67) 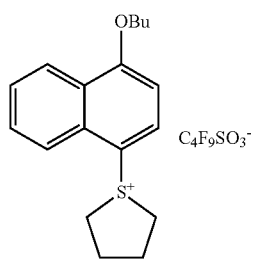
[Chem. 65]
(z68) 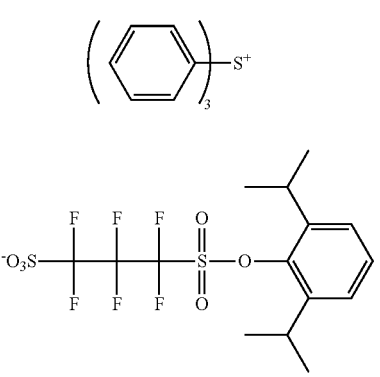
(z69) 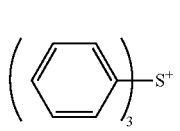
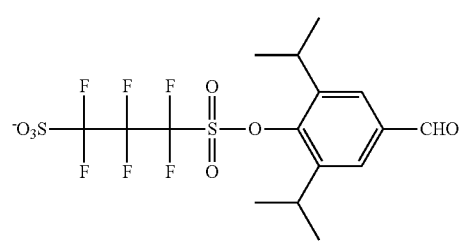
(z70) 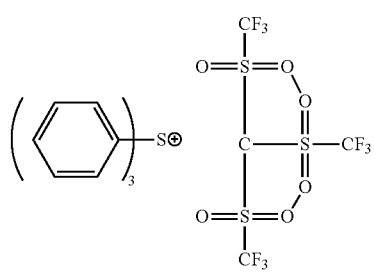
-continued
(z71) 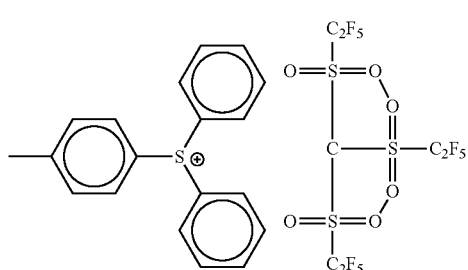
(z72) 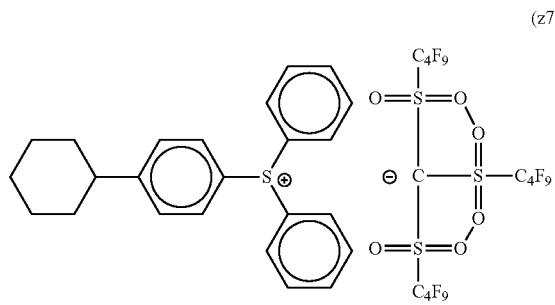
(z73) 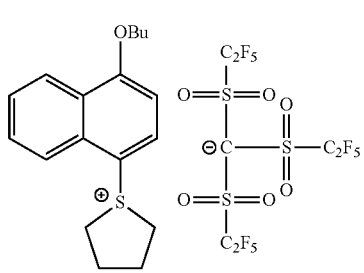
(z74) 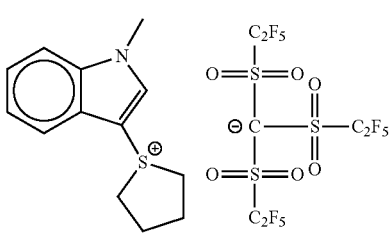
(z75) 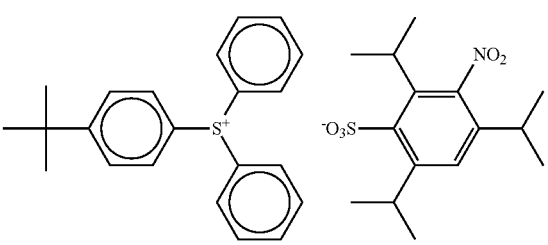
(z76) 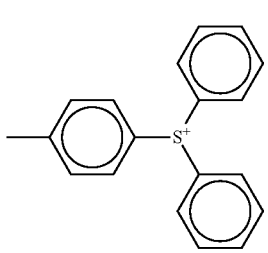

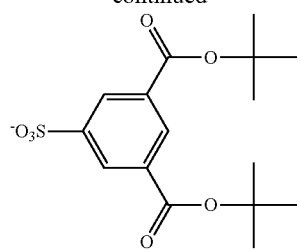 (z77)
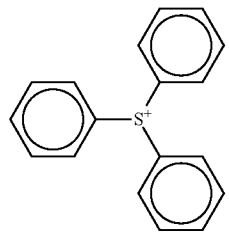 (z78)
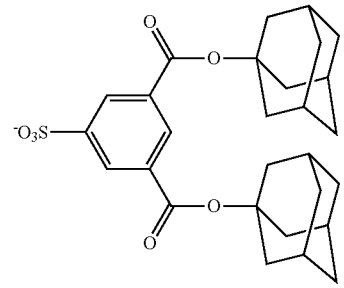 (z79)
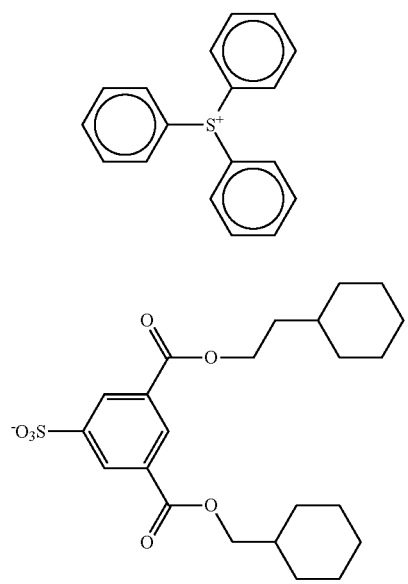
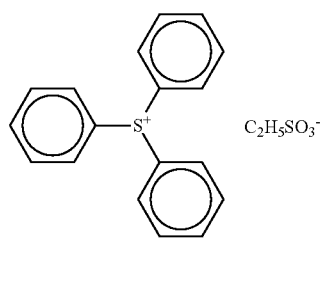 (z80)
[Chem. 67]
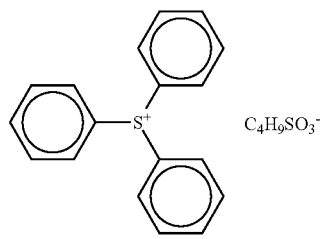 (z81)
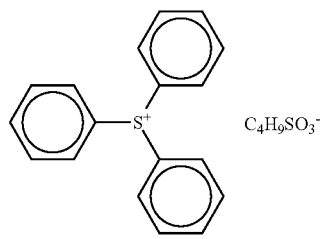 (z82)
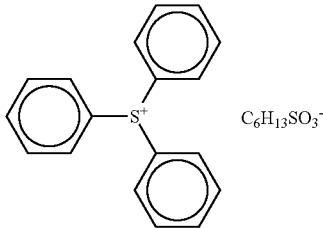 (z83)
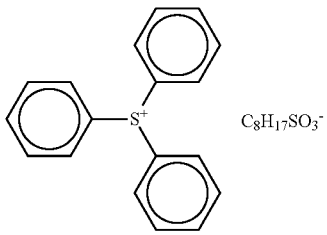 (z84)
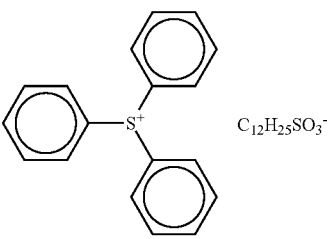 (z85)

(z86) 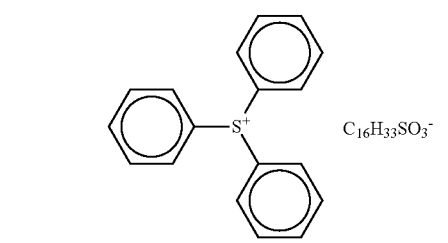
(z87) 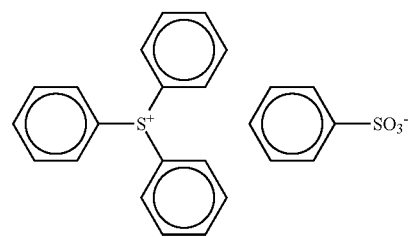
(z88) 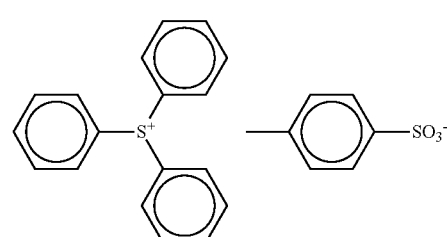
(z89) 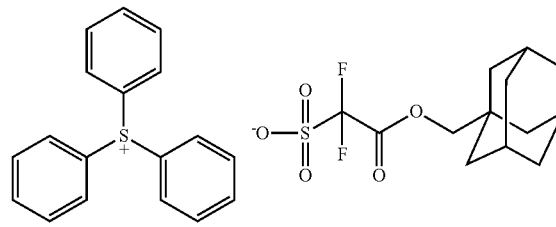
(z90) 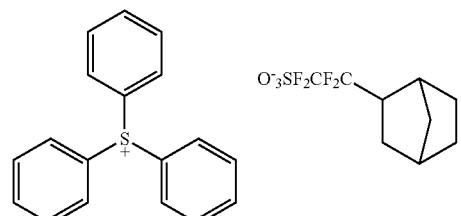
(z91) 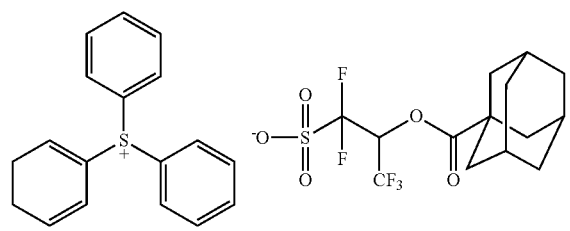
(z92) 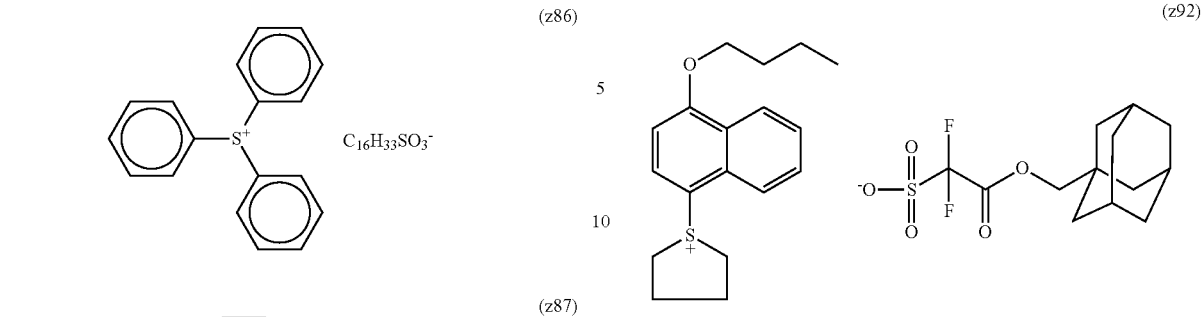
(z93) 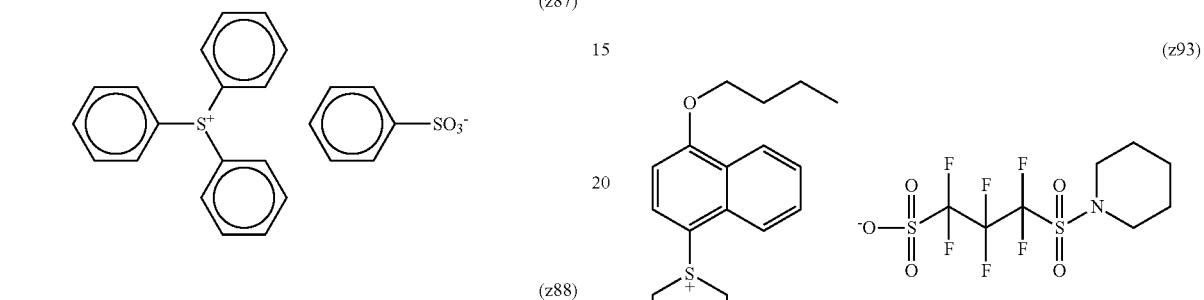
(z94) 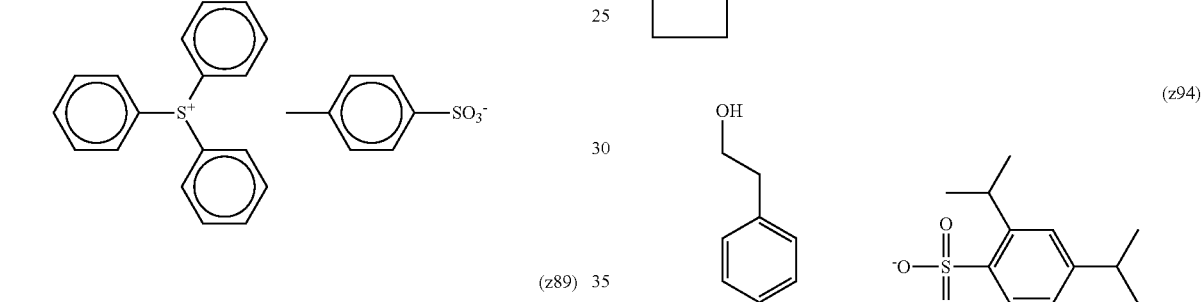
(z95) 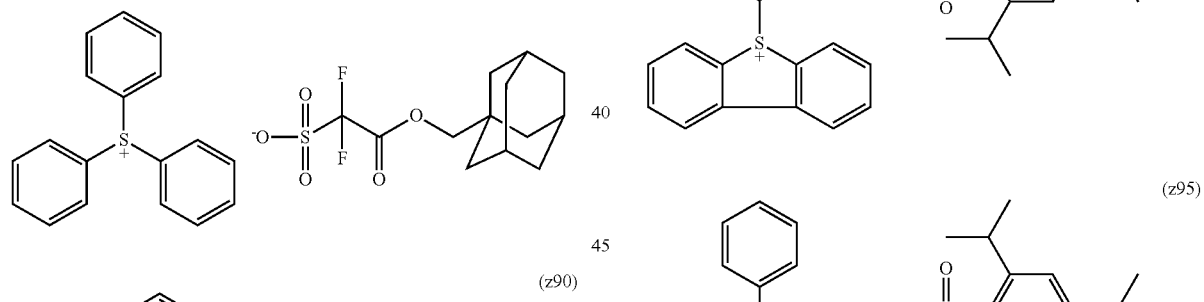
(z96) 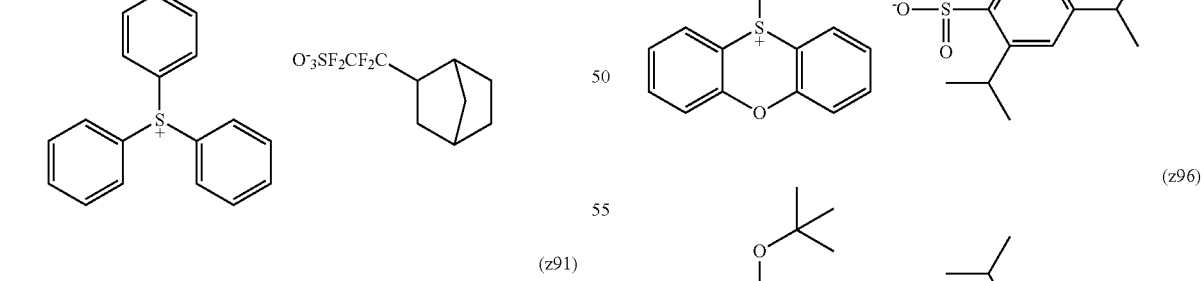

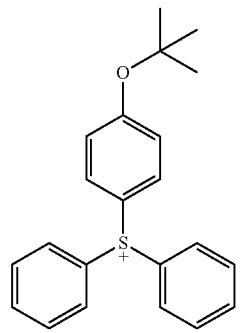
(z97)
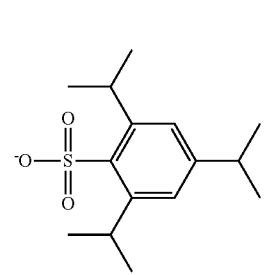
(z98)
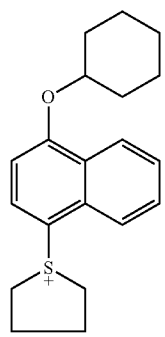
(z99)
(z100)
(z101)
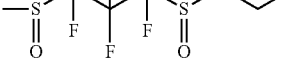
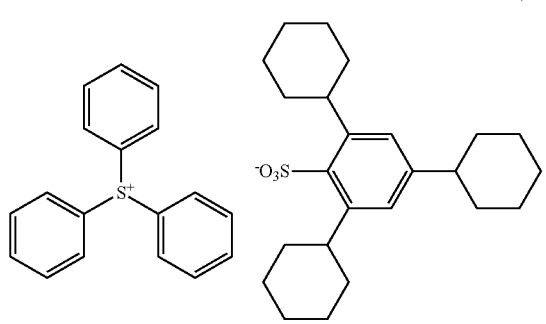
(z102)
(z103)
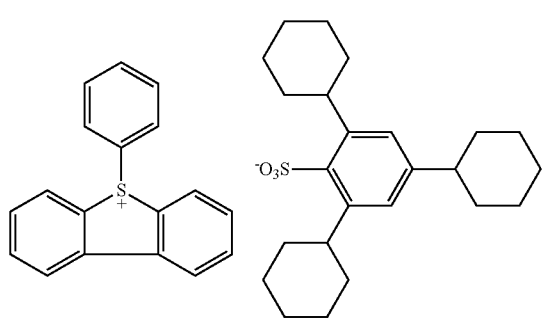
(z104)
(z105)
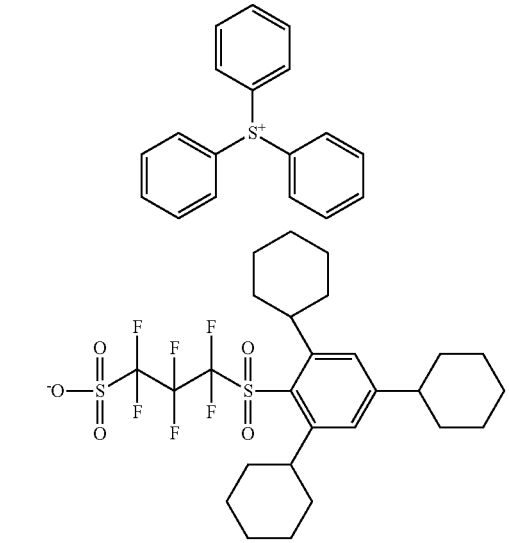

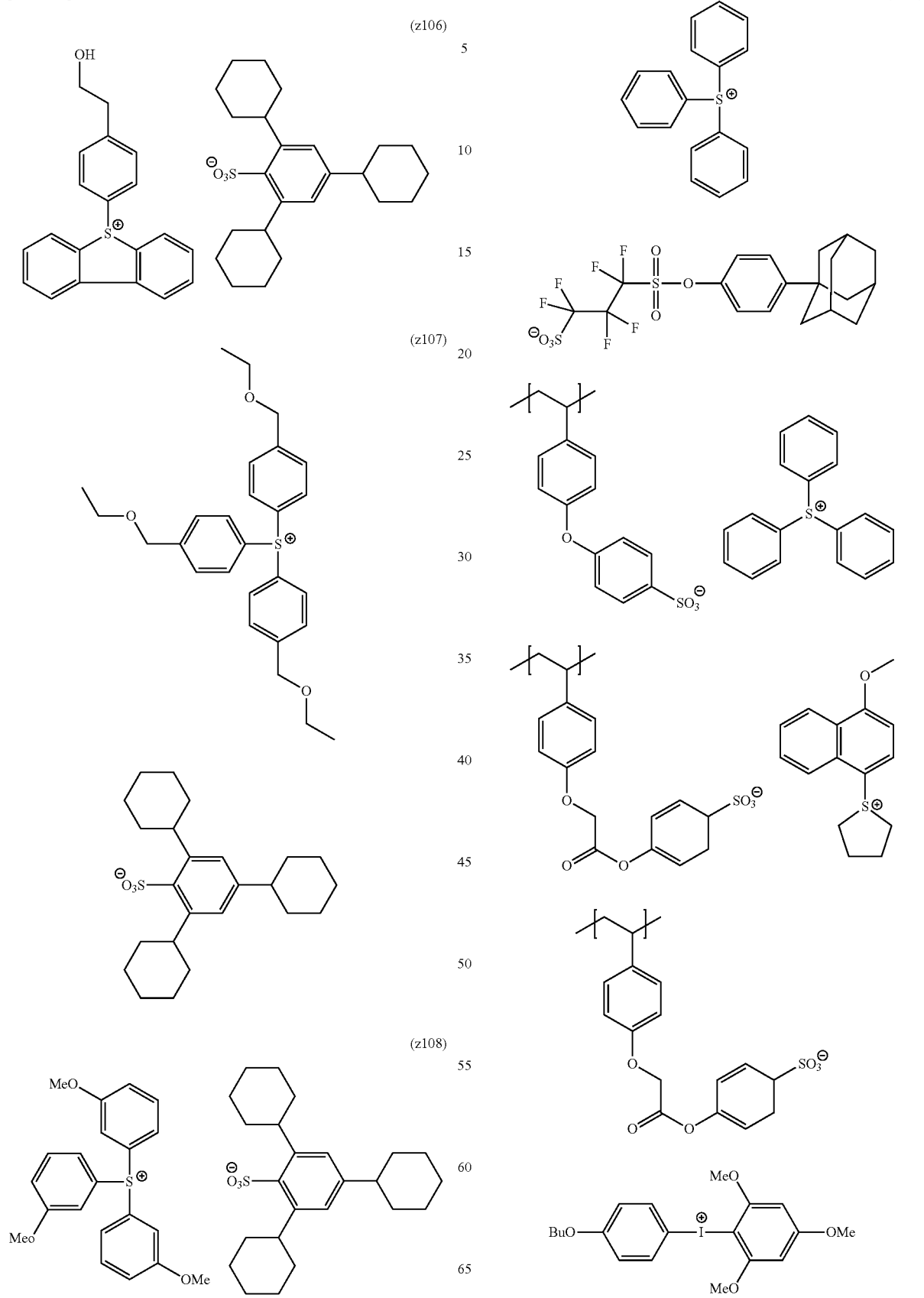

169
-continued
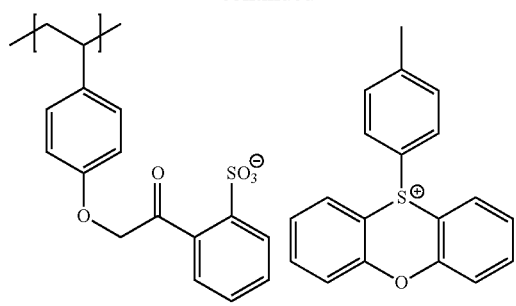
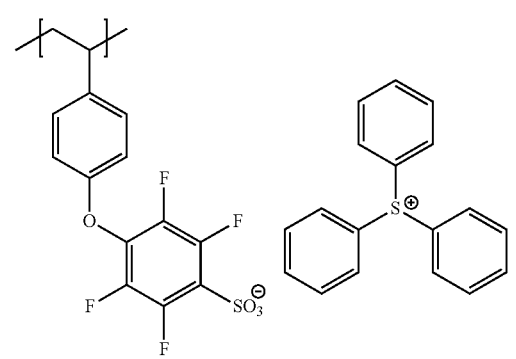
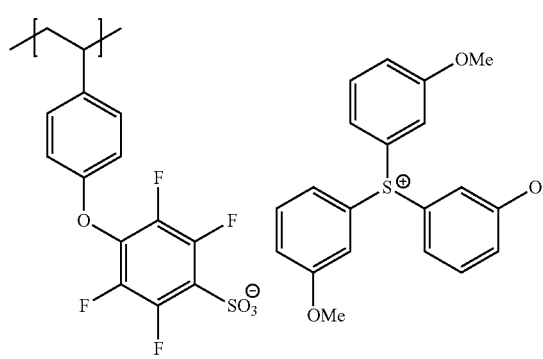
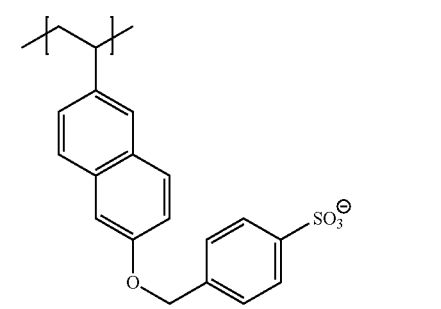
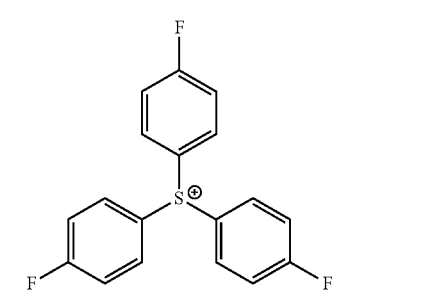
170
-continued
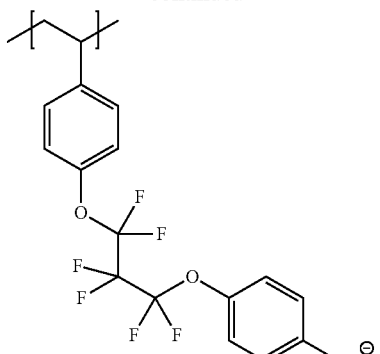
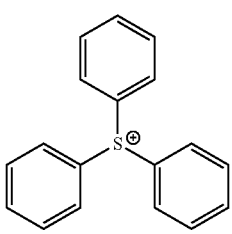
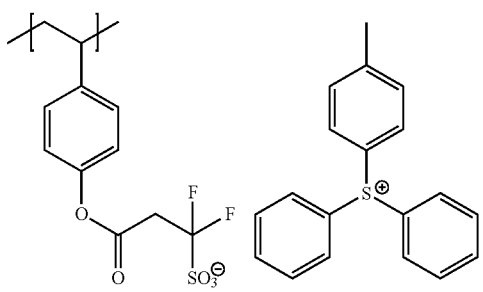
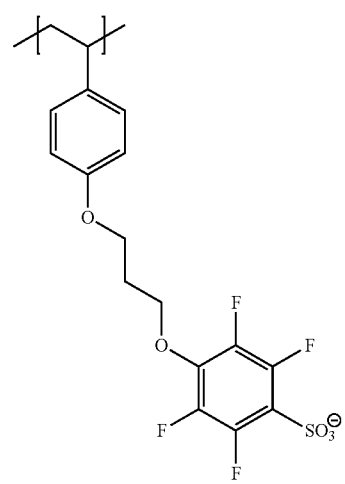
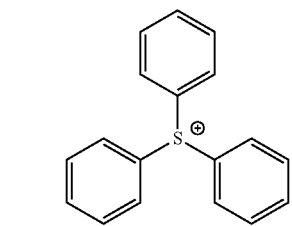

-continued

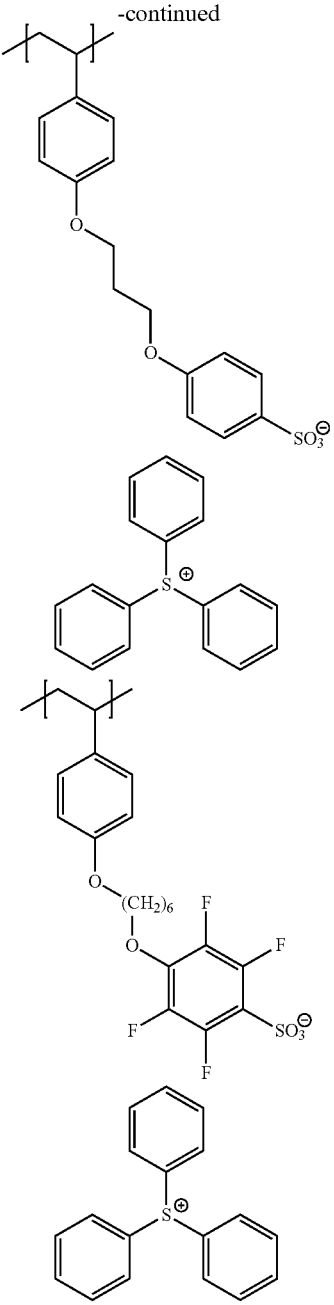

Here, the photoacid generator may use one type singly, or two or more types may be used in combination. When two or more types are used in combination, it is preferable that a compound, which generates two types of different organic acids where the sum of the carbon atoms excluding the hydrogen atoms is two or more, is combined.

It is possible and preferable to appropriately intensify the generated acid when the compound (P) of the present invention uses a compound (ZI-1) and a compound (ZI-4) which have a sulfonate anion represented by the General Formula (SA1).

In a case where the composition according to the present invention further contains the photoacid generator, the content thereof preferably ranges from 0.1 mass % to 40 mass %, more preferably ranges from 0.5 mass % to 30 mass %, and particularly preferably ranges from 1 mass % to 20 mass %, based on the total solid content of the composition.

[5] Solvent

The composition according to the present invention preferably contains a solvent.

The solvent which is able to be used when preparing the composition is not particularly limited as long as each component is soluble and examples thereof include an alkylene glycol mono alkyl ether carboxylate (propylene glycol monomethyl ether acetate (PGMEA; other name of 1-methoxy-2-acetoxypropane) and the like), an alkylene glycol monoalkyl ether (propylene glycol monomethyl ether (PGME; other name 1-methoxy-2-propanol) and the like), an alkyl lactate ester (ethyl lactate, methyl lactate, and the like), a cyclic lactone (γ-butyrolactone and the like which preferably has 4 to 10 carbon atoms), a chain-like or a cyclic ketone (2-heptanone, cyclohexanone, and the like which preferably has 4 to 10 carbon atoms), an alkylene carbonate (ethylene carbonate, propylene carbonate, and the like), an alkyl carboxylate (an alkyl acetate such as butyl acetate is preferable), an alkyl alkoxy acetate (ethyl ethoxypropionate), and the like. Other examples of the solvent which is able to be used are the solvents which are disclosed in paragraph <0244> and beyond in US2008/0248425A1 and the like.

Among the solvent described above, an alkylene glycol mono alkyl ether carboxylate, an alkylene glycol monoalkyl ether, or an ethyl lactate are preferable.

These solvents may be used singly or two or more types may be mixed and used. In a case where two or more types may be mixed and used, it is preferable to mix a solvent containing a hydroxyl group and a solvent not containing a hydroxyl group. The mass ratio of the solvent containing a hydroxyl group and the solvent not containing a hydroxyl group is normally 1/99 to 99/1, is preferably 10/90 to 90/10, and even more preferably 20/80 to 60/40.

The solvent containing a hydroxyl group is preferably an alkylene glycol monoalkyl ether or an alkyl lactate ester and the solvent not containing a hydroxyl group is preferably an alkylene glycol mono alkyl ether carboxylate. It is particularly preferable to use a solvent where propylene glycol monomethyl ether is 50 mass % or more of the solvent.

The amount of the solvent used is determined such that the concentration of the total solid contents of the composition becomes preferably from 0.1% by weight to 10% by weight, more preferably from 2.0% by weight to 6.0% by weight, and even more preferably from 3.0% by weight to 5.0% by weight.

[6] Surfactant

The composition according to the present invention preferably may further contain a surfactant. As the surfactant, a fluorine based and/or a silicon based surfactant is particularly preferable.

Examples of the surfactant include Megaface F176 and Megaface R08 manufactured by DIC Corporation, PF656 and PF6320 manufactured by OMNOVA Solutions Inc., Troysol S-366 manufactured by Troy Chemical Corp., Fluorad FC430 manufactured by Sumitomo 3M Ltd., Polysiloxane polymer KP-341 manufactured by Shin-Etsu Chemical Co., Ltd., and the like.

In addition, it is possible to use other surfactants other than fluorine based and/or silicon based surfactants. More specifically, examples thereof can include polyoxyethylene alkyl ethers, polyoxyethylene alkyl aryl ethers, and the like.

Other than this, it is possible to appropriately use a known surfactant. Examples of surfactants which are able to be used include are surfactants which are disclosed from paragraph <0273> and beyond in US2008/0248425A1.

The surfactant may be used singly or two or more types may be used.

In a case where the composition according to the present invention further contains a surfactant, the content of the surfactant is preferably 0.0001 to 2 mass % and is more preferably 0.001 to 1 mass % based on the total solid content of the composition.

[7] Dissolution Inhibiting Compound

The composition of the present invention may further contain a dissolution inhibiting compound (referred to below as "dissolution inhibiting compound") with a molecular weight of 3,000 or less which increases the solubility in an alkaline developer by being decomposed due to the action of an acid.

As the dissolution inhibiting compound, an alicyclic or aliphatic compound which contains an acid decomposable group such as a cholic acid derivative which includes an acid decomposable group which is described in the Proceedings of SPIE, 2724, 355 (1996) is preferable in order for permeability at 220 nm or less not to be reduced. Examples of the acid-degradable group include the same groups as "$OY^1$" of the General Formula (3) and "$COOY^2$" of the General Formula (4) in the above compound (P).

In the case of exposing the composition according to the present invention using a KrF excimer laser or irradiating using an electron beam, it is preferable that the dissolution inhibiting compound is a compound containing a structure where the phenolic hydroxyl group of a phenol compound is substituted by an acid decomposable group. As the phenol compound, a compound containing from 1 to 9 phenol skeletons is preferable and more preferably from 2 to 6 phenol skeletons.

The molecular weight of the dissolution inhibiting compound is 3,000 or less and is preferably 300 to 3000, and is more preferably 500 to 2500.

In a case where the composition according to the present invention further contains a dissolution inhibiting compound, the amount of the dissolution inhibiting compound added is preferably 0.0001 to 20 mass % and is more preferably 0.5 to 10 mass % based on the total solid content of the composition.

Specific examples of the dissolution inhibiting compound are shown below, but the present invention is not limited thereto.

[Chem. 70]

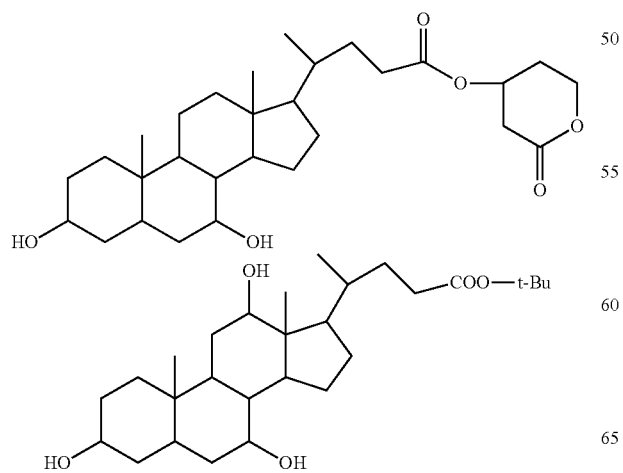

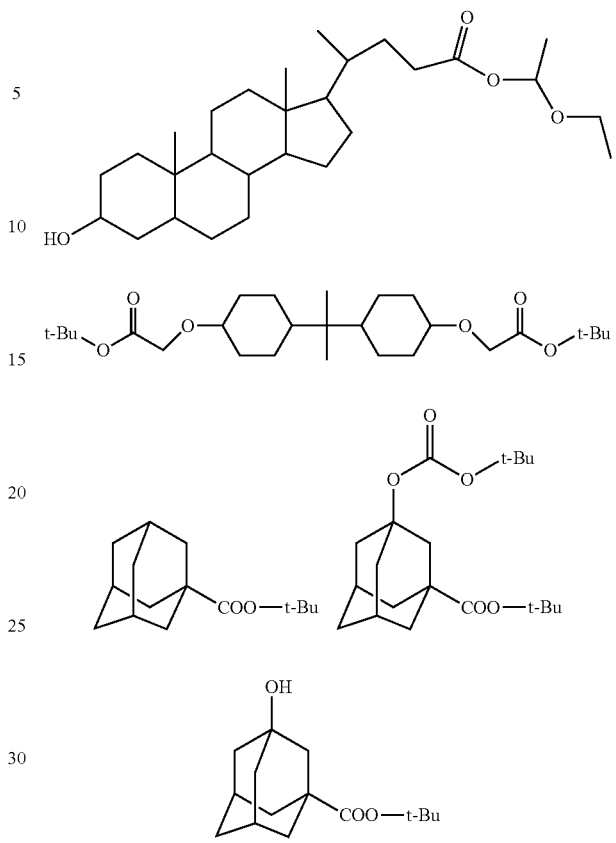

[8] Hydrophobic Resin (HR)

The composition according to the present invention may further contain a hydrophobic resin (HR) in addition to the compound (P).

The hydrophobic resin (HR) preferably contains a group having a fluorine atom, a group having a silicon atom or a hydrocarbon group having 5 or more carbon atoms, in order to unevenly distribute the resin onto the surface of the actinic ray-sensitive or radiation-sensitive film. These groups may be provided on the main chain of the hydrophobic resin or may be substituted on the side chain. Specific examples of the hydrophobic resin (HR) are shown below.

[Chem. 71]

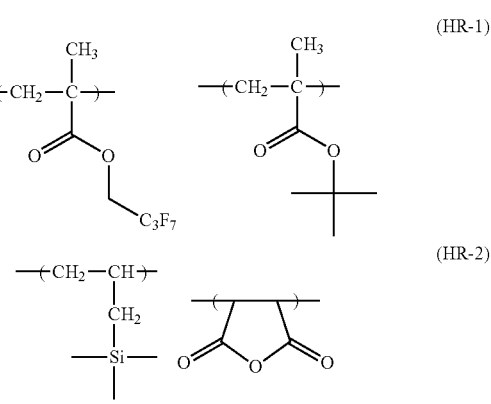

-continued
(HR-3) 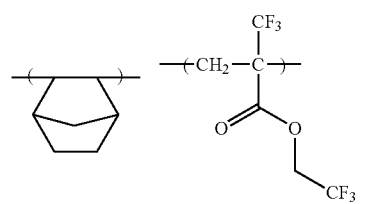
(HR-4) 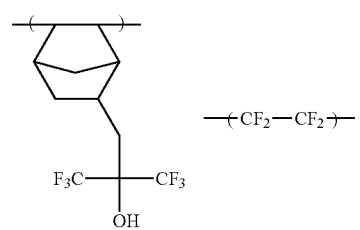
(HR-5) 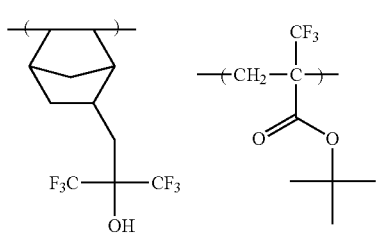
(HR-6) 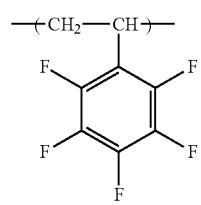
(HR-7) 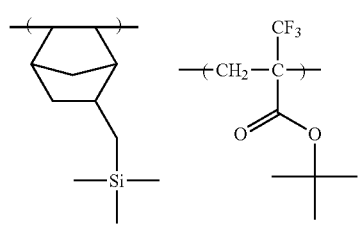
(HR-8) 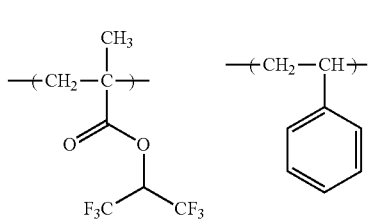
-continued
(HR-9) 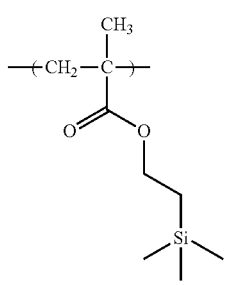 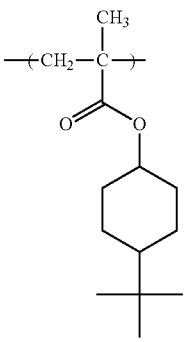
(HR-10) 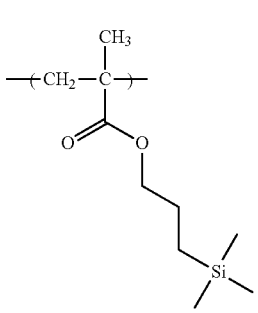 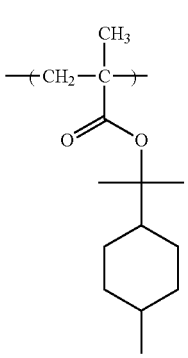
(HR-11) 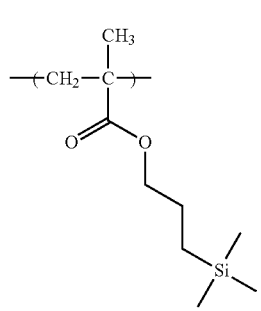 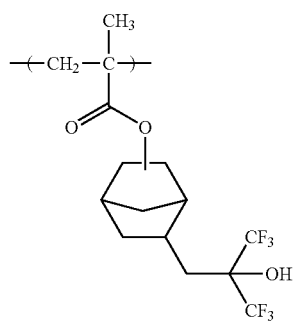
(HR-12) 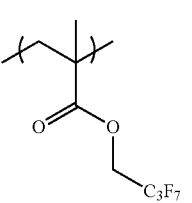 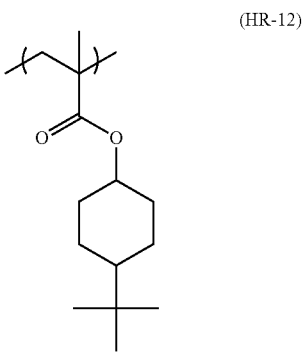

(HR-13) 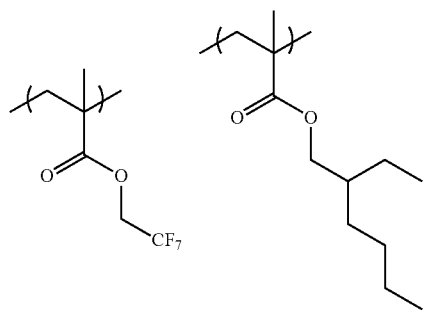
(HR-14) 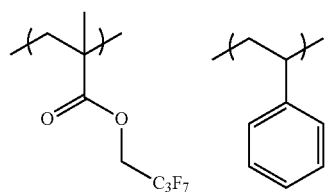
(HR-15) 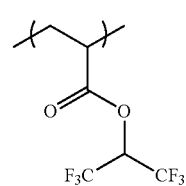
(HR-16) 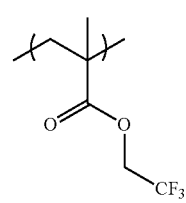
(HR-17) 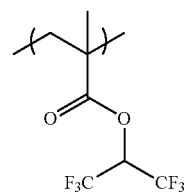
(HR-18) 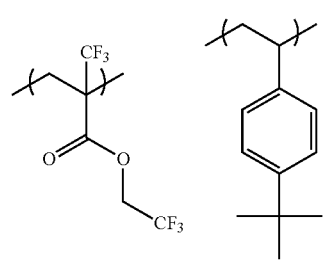
(HR-19) 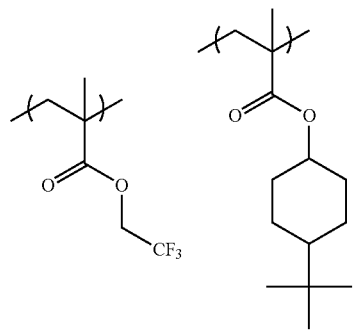
(HR-20) 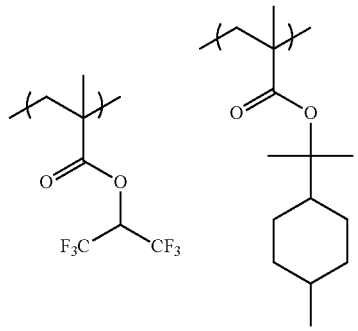
(HR-21) 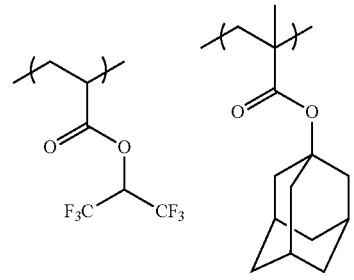
(HR-22) 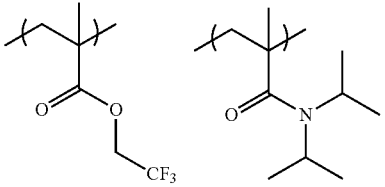
(HR-23) 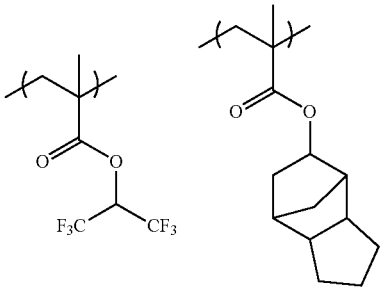

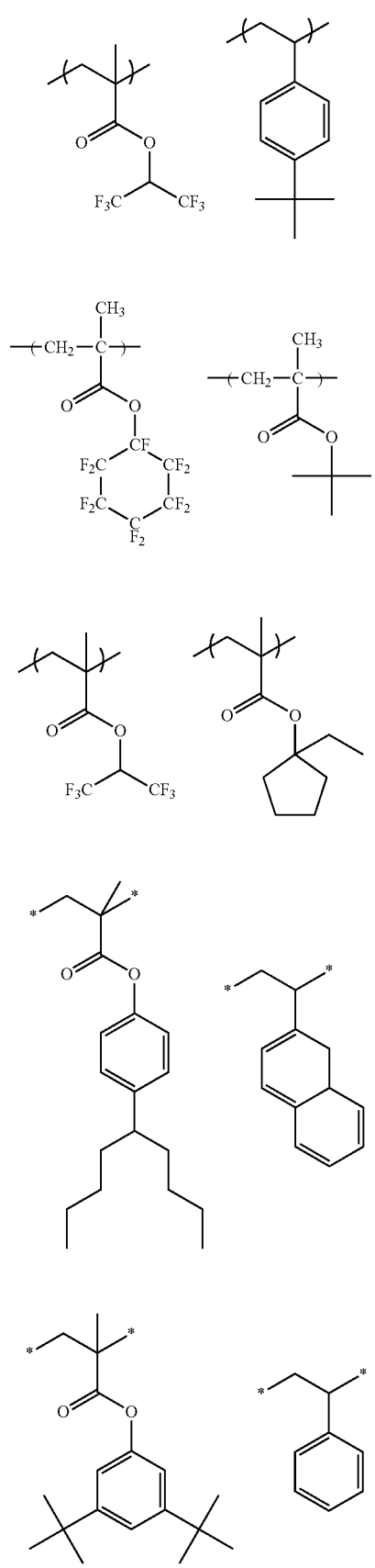
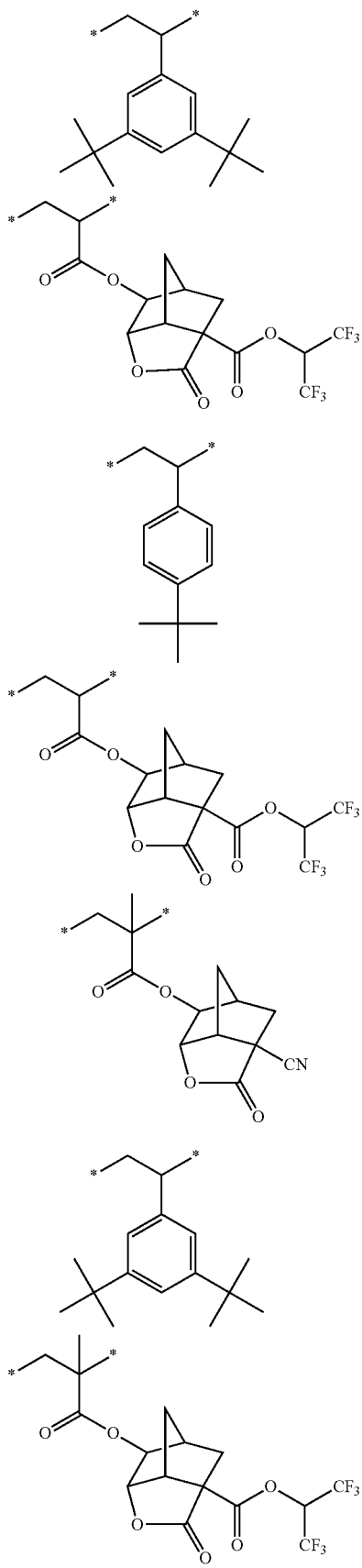

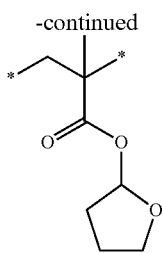

HR-32

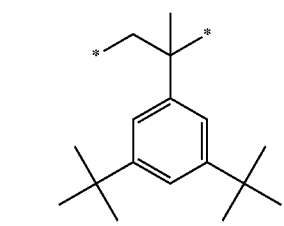

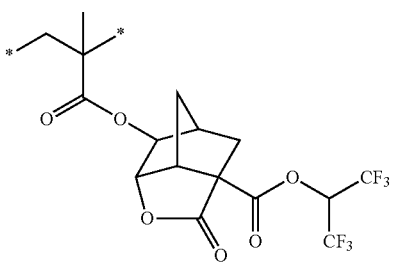

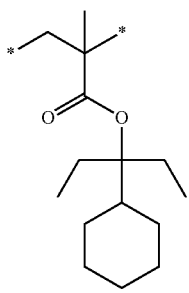

HR-33

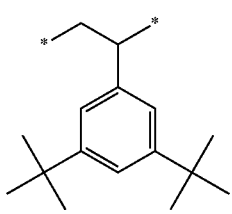
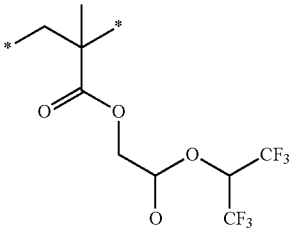

HR-34

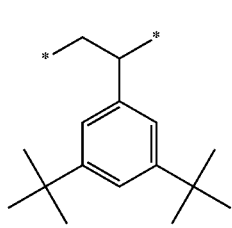
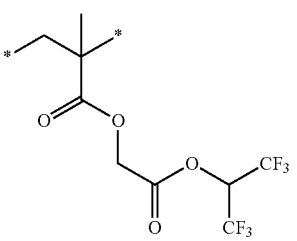

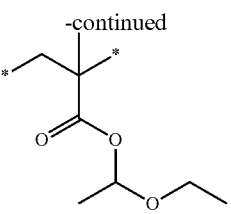

HR-35

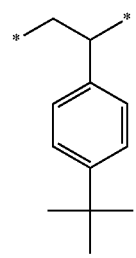

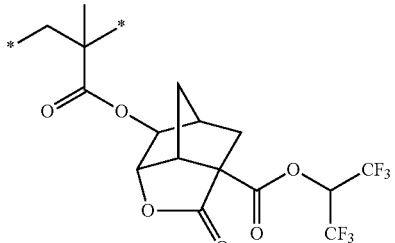

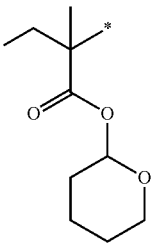

HR-36

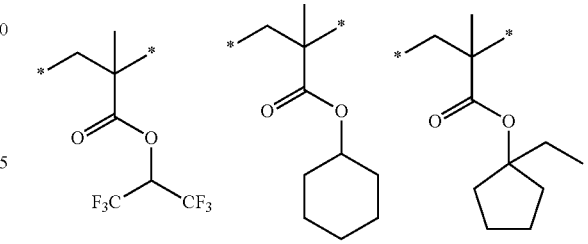

As the hydrophobic resin (HR), it is possible to preferably use a compound disclosed in JP2011-248019, JP2010-175859 and JP2012-032544, in addition to the above-described compound.

Particularly, it is preferable to use hydrophobic resin having a group (an acid-decomposable group) which is decomposed by the action of an acid and generates an alkali soluble group.

[9] Compound which is Decomposed by Action of Acid and Generates Acid

The composition according to the present invention may contain one type or two or more types of the compound which is decomposed by the action of an acid and generates an acid. The acid generated by the compound which is decomposed by the action of an acid and generates an acid is preferably sulfonic acid, methide acid, and imidic acid.

Hereinafter, an example of the compound which may be used in the present invention and is decomposed by the action of an acid and generates an acid will be shown but the present invention is not limited thereto.
[Chem. 73]
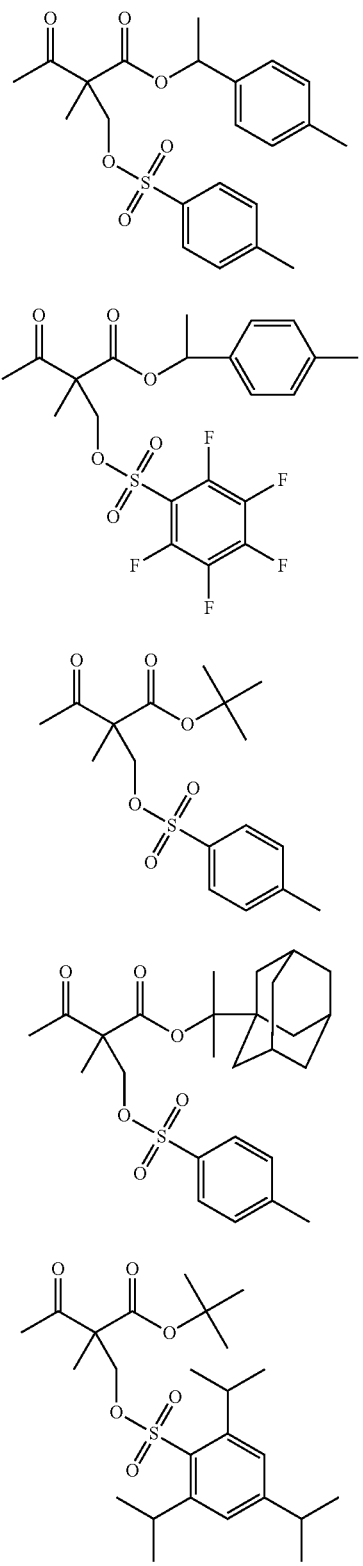
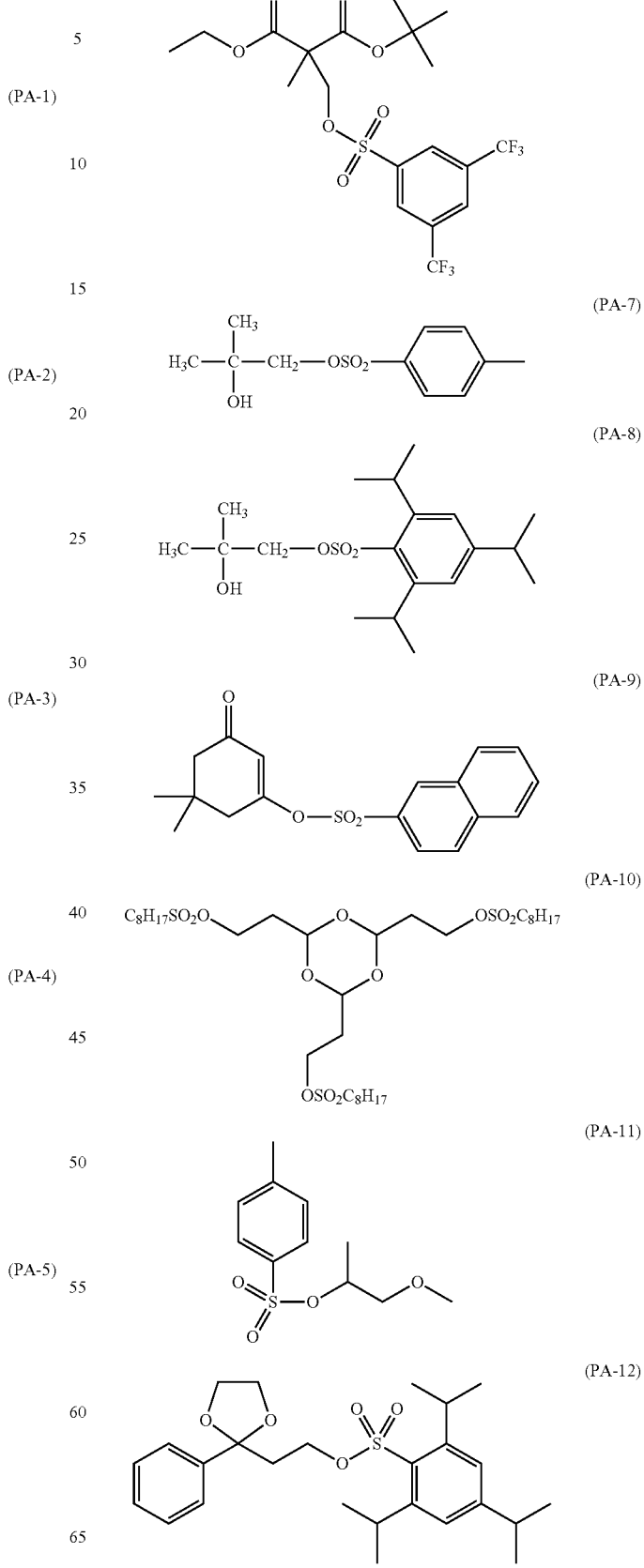

-continued

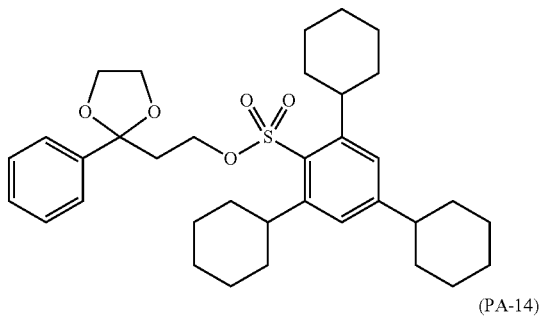
(PA-13)

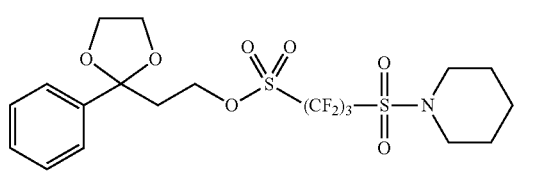
(PA-14)

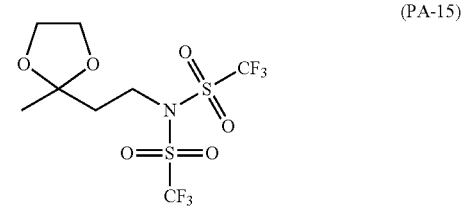
(PA-15)

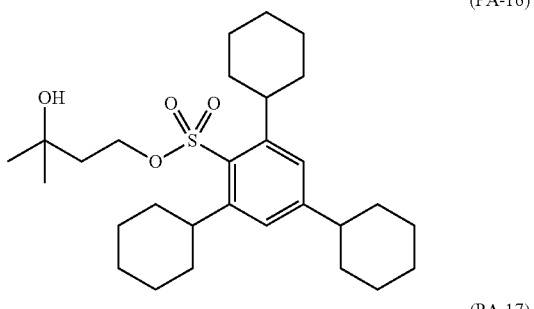
(PA-16)

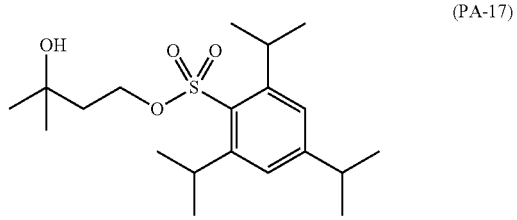
(PA-17)

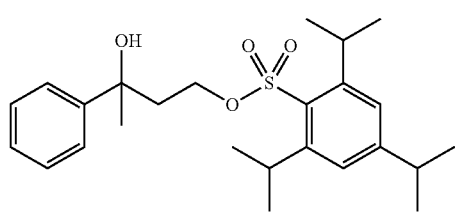
(PA-18)

The compound which is decomposed by the action of an acid and generates an acid may use one type singly, or two or more types may be used in combination.

The content of the compound which is decomposed by the action of an acid and generates an acid is preferably from 0.1% by mass to 40% by mass, more preferably from 0.5% by mass to 30% by mass, and still more preferably from 1.0% by mass to 20% by mass, based on the total solid content of the resin composition.

[9] Other Additives

The composition according to the present invention can further contain a dye, a plasticizer, a photosensitizer, a light absorber, a compound for promoting dissolution in a developer (referred to below as a dissolution promoting compound), and the like. In addition, a compound provided with a proton accepting functional group disclosed in JP2006-208781A and JP2007-286574A can be appropriately used.

The dissolution promoting compound is a low-molecular weight compound with a molecular weight of 1,000 or less having 2 or more phenolic hydroxyl groups or 1 or more carboxy groups. When the compound has a carboxy group, the dissolution promoting compound is preferably an alicyclic or aliphatic compound.

The amount of the dissolution accelerating compound added is preferably from 0% by mass to 50% by mass, and more preferably from 5% by mass to 30% by mass, based on the mass of the compound (P). The added amount is preferably 50 mass % or less from the point of view of suppressing development residue and preventing pattern deformation during development.

Here, the dissolution promoting compound can be easily synthesized by referencing, for example, JP1992-122938A (JP-H04-122938A), JP1990-28531A (JP-H02-28531A), U.S. Pat. No. 4,916,210A, and EP219,294B.

[10] Pattern Forming Method (1)

The composition according to the present invention may typically be used as below. That is, the composition according to the present invention is typically coated on a support body such as a substrate and a film is formed. The thickness of the film is preferably from 0.01 μm to 0.1 μm, and more preferably from 0.02 μm to 0.1 μm. As a method of coating on the substrate, spin coating is preferable and the rotational frequency thereof is preferably 1,000 to 3,000 rpm.

For example, the composition according to the present invention is coated using an appropriate coating method such as a spinner or a coater on a substrate (example: silicon/silicon dioxide coating, quartz substrate with a silicon nitride and a chromium layer which are deposited, and the like) which is used in the manufacturing of precision integrated circuit elements and the like. After this, the actinic ray-sensitive or radiation-sensitive film (referred to below as a resist film) is obtained by the drying thereof. Here it is also possible to coat a known antireflection film in advance.

Next, the resist film is irradiated with an actinic ray or radiation (preferably, an electron beam, X-rays, or EUV light) and is developed preferably after baking is performed (normally at 80 to 150° C. and more preferably at 90 to 130° C.). Due to this, it is possible to obtain an excellent pattern. Then, using the pattern as a mask, an appropriate etching process, ion implantation, and the like are performed and a fine semiconductor circuit, an imprint mold structure, and the like is formed.

Regarding the detail of the process for preparing a mold for imprint by using the composition of the present invention, for example, JP4109085B, JP2008-162101A, "Fundamentals of Nanoimprint and Technical Development/Application Deployment-Substrate Technique of Nanoimprint and Latest Application Deployment", edited by Yoshihiko Hirai (Frontier Publishing), and the like may be referenced. In addition, in particular, for an appropriate manufacturing method of a mold structure in the manufacturing of an information recording medium, refer to, for example, JP4109085B and JP2008-162101A.

In the development process, a normal alkaline developer is used. The developing method appropriately uses a known method such as paddle forming, dipping, dynamic dispensing, and the like. As the alkaline developer, various aqueous alkaline solutions can be used, but normally, a tetramethyl ammonium hydroxide alkaline aqueous solution is used. Alcohols or a surfactant may be added in an appropriate amount to the alkaline developer.

The concentration of the alkaline developer is generally 0.1 to 20% by mass. The pH of the alkaline developer is normally 10.0 to 15.0.

In addition, the resist film may be formed on mask blank in the pattern forming method of the present invention.

Here, the mask blanks is a material for forming a photomask which is used in a semiconductor manufacturing process, and normally, a light shielding film is provided on a transparent substrate (preferably a glass substrate). The forming method of the light shielding film with regard to the transparent substrate is not particularly limited, but for example, a material which configures the light shielding material is able to be formed on the transparent substrate using chemical deposition.

As the material which configures the light shielding film, a metal such as tantalum, chromium, molybdenum, titanium, zirconium, tin, gallium, and aluminum is a main component and an oxide, nitride, and oxide nitride of a metal element can be appropriately used. Specifically, examples thereof can include chromium oxide, chromium nitride, chromium, tantalum oxide, tantalum nitride, tantalum, molybdenum silicide oxide, molybdenum silicide nitride, molybdenum silicide oxide nitride, molybdenum, and the like.

The light shielding film may be a single layer but is preferably a multi-layer structure where a plurality of material are coated and overlapped. In a case of a multi-layer structure, the thickness of the film for each single layer is not particularly limited, but is preferably 5 nm to 100 nm and is more preferably 10 nm to 80 nm. The thickness of the entire light shielding film is not particularly limited but is preferably 5 nm to 200 nm and is more preferably 10 nm to 150 nm.

By forming, exposing, and developing the resist film is formed on such mask blanks, it is possible to obtain a photomask.

[11] Pattern Forming Method (2)

In the present invention, a topcoat layer is formed on the resist film obtained from the pattern forming method (1). Subsequently, the resist film having the topcoat layer as the upper layer may be typically irradiated with an actinic ray or radiation (preferably, an electron beam, X-rays, or EUV light) through a mask and may be developed preferably after baking is performed (normally at 80 to 150° C. and more preferably at 90 to 130° C.), thereby forming a pattern. Due to this, it is possible to obtain an excellent pattern.

The topcoat layer may be formed on the resist film by the same method as the forming method for forming the resist film on the substrate. At this time, it is preferable that the resist film be dried before forming the topcoat layer. The thickness of the topcoat layer is preferably 10 nm to 200 nm, more preferably 20 nm to 100 nm, and still more preferably 40 nm to 80 nm.

A solvent contained in a topcoat composition which is used in forming the topcoat layer is preferably water or an organic solvent, and water is more preferably used.

When the topcoat composition contains the organic solvent, it is preferable that the organic solvent be a solvent which does not dissolve the resist film. As the solvent which may be used, an alcohol-based solvent, a fluorine-based solvent, a hydrocarbon-based solvent are preferable and a non-fluorinated alcohol-based solvent is more preferable. As the alcohol-based solvent, primary alcohol is preferable and primary alcohol having 4 to 8 carbon atoms is more preferable, from the view point of coating properties. As the primary alcohol having 4 to 8 carbon atoms, linear, a branched or cyclic alcohol may be used, but the linear or branched alcohol is preferable. Specifically, examples thereof include 1-butanol, 1-hexanol, 1-pentanol, or 3-methyl-1-butanol.

When the topcoat composition of the present invention contains water as a solvent, it is preferable that the topcoat composition further contain a water-soluble resin. Due to this, it is considered that the uniformity of wettability of the developer can be further improved. Examples of the preferable water-soluble resin include polyacrylic acid, polymethacrylic acid, polyhydroxystyrene, polyvinylpyrrolidone, polyvinyl alcohol, polyvinyl ether, polyvinyl acetal, polyacrylimide, polyethyleneglycol, polyethylene oxide, polyethylenimine, polyester polyol, polyether polyol, and polysaccharides. Among these, polyacrylic acid, polymethacrylic acid, polyhydroxystyrene, polyvinylpyrrolidone and polyvinyl alcohol are particularly preferable. In addition, the water-soluble resin is not only limited to a homopolymer but also may be a copolymer. For example, the water-soluble resin may be a copolymer having a monomer corresponding to the repeating unit of the above-described homopolymer and other monomer units. Specifically, examples thereof include acrylic acid-methacrylic acid copolymer and acrylic acid-hydroxystyrene copolymer.

In addition, as the resin for the topcoat composition, it is possible to preferably use resin having an acid group disclosed in JP2009-134177 and JP2009-91798.

A weight average molecular weight of the water-soluble resin is not particularly limited but is preferably from 2,000 to 1,000,000, more preferably from 5,000 to 500,000, and particularly preferably from 10,000 to 100,000. Herein, the weight average molecular weight of the water-soluble resin represents a molecular weight in terms of polystyrene that is measured by GPC (carrier: THF or N-methyl-2-pyrrolidone (NMP)).

A pH value of the topcoat composition is not particularly limited but is preferably from 1 to 10, more preferably from 2 to 8, and particularly preferably from 3 to 7.

When the topcoat composition contains the organic solvent, it is preferable that the topcoat composition contain a hydrophobic resin. As the hydrophobic resin, it is preferable to use a hydrophobic resin disclosed in JP2008-209889.

The concentration of the resin (water-soluble resin or hydrophobic resin) in the topcoat composition is preferably from 0.1% by mass to 10% by mass, more preferably from 0.2% by mass to 5% by mass, and still more preferably from 0.3% by mass to 3% by mass.

The topcoat composition may contain components other than the resin but a proportion of the resin to the solid content of the topcoat composition is preferably from 80% by mass to 100% by mass, more preferably from 90% by mass to 100% by mass, and still more preferably from 95% by mass to 100% by mass. Examples of the components other than the resin which may be added to the topcoat composition include a surfactant, a photoacid generator, and a basic compound. As specific examples of the photoacid generator and the basic compound, the same compound as the above-described photoacid generator and basic compound is exemplified.

When the surfactant is used, the amount of the surfactant used is preferably from 0.0001% by mass to 2% by mass and more preferably from 0.001% by mass to 1% by mass, based on the total amount of the topcoat composition.

By adding the surfactant to the topcoat composition, the coating properties when coating the topcoat composition are improved. Examples of the surfactant include a nonionic surfactant, an anionic surfactant, a cationic surfactant and an amphoteric surfactant.

Examples of the nonionic surfactant include Plufarac series (manufactured by BASF); ELEBASE series, Finesurf series and Brownon series (manufactured by Aoki Oil Industrial Co., Ltd.); Adeka Pluronic P-103 (manufactured by Asahi Denka Co., Ltd.); Emargen series, Amiet series, Aminon PK-025, Emanon CH-25 and Reodol series (manufactured by Kao Corporation); Surflon S-141 (maunufactured by AGC Seimi Chemical Co., Ltd.); Neugen series (manufactured by Daiichi Kogyo Seiyaku Co., Ltd.); Newcargen series (manufactured by Takemoto Oil & Fat Co., Ltd.); DYNOL 604, EnviroGem AD01, Olfin EXP series and Surfinol series (manufactured by Nisshin Chemical Industry Co., Ltd.); and Phthagent 300 (manufactured by Ryoko Chemical Co., Ltd.)

Examples of the anionic surfactant include Emal 20T and Poise 532A (manufactured by Kao Corporation); Phosphanol ML-200 (manufactured by Toho Chemical Industry Co., Ltd.); EMULSOGEN series (manufactured by Clariant Japan Co., Ltd.); Surflon S-111N and Surflon S-211 (manufactured by AGC Seimi Chemical Co., Ltd.); Plysurf series (manufactured by Daiichi Kogyo Seiyaku Co., Ltd.); Pionin series (manufactured by Takemoto Oil & Fat Co., Ltd.); Olfin PD-201 and Olfin PD-202 (manufactured by Nisshin Chemical Industry Co., Ltd.); AKYPO RLM45 and ECT-3 (manufactured by Nihon Surfactant Kogyo K. K.); and Lipon (manufactured by Lion Corporation).

Examples of the cationic surfactant include Acetamin 24 or Acetamin 86 (manufactured by Kao Corporation).

Examples of the amphoteric surfactant include Surflon S-131 (manufactured by AGC Seimi Chemical Co., Ltd.); and Enagicol C-40H and Lipomin LA (all manufactured by Kao Corporation).

These surfactants may use one type singly or two or more types may be used in arbitrarily combination.

EXAMPLES

Hereinbelow, the present invention will be described in further detail using examples, but the content of the invention is not limited by this.

Synthesis of Compound (P)

Synthesis of Compound (P-1M)

Synthesis of Chloroether Compound 30.0 g of pivalaldehyde, 44.36 g of trimethyl orthoformate, and 809 mg of camphorsulfonic acid were added to a 300 mL egg-plant shaped flask, followed by stirring at 25° C. for 1 hour. Loss of pivalaldehyde and formation of acetal compound 1 were confirmed by NMR. Subsequently, the reaction liquid was cooled down in an ice water bath. 27.34 g of acetyl chloride and then 5 mg of zinc chloride were added thereto, followed by reacting in an ice water bath for 3 hours. Thereafter, unreacted acetyl chloride was removed under reduced pressure, thereby obtaining a solution containing a chloroether compound 1. The composition of the obtained solution was determined by NMR as described below. The chloroether compound 1 (70.4% by mass), the acetal compound 1 (8.4% by mass), and methyl acetate (21.2% by mass).

$^1$H-NMR of the chloroether compound 1 (CDCl$_3$:ppm) δ:1.03 (9H, s), 3.53 (3H, s), 5.21 (1H, s)

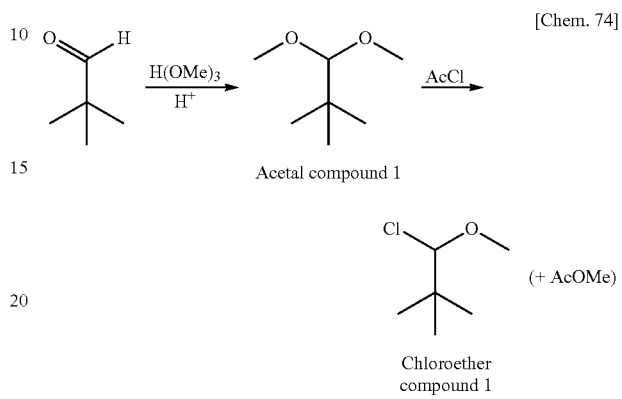

(Synthesis of Compound (P-1M))

10.0 g of poly(p-hydroxystyrene) (VP-2500, manufactured by NIPPON SODA CO., LTD.) as a phenolic compound was dissolved in 60 g of tetrahydrofuran (THF), and 8.85 g of triethylamine was added thereto, followed by stirring in an ice water bath. The chloroether compound 1 (4.04 g) obtained as above was added dropwise to the reaction liquid and stirred for 4 hours. Thereafter, distilled water was added to stop the reaction. The reactant was dissolved in ethyl acetate by distilling off THF under reduced pressure. After the obtained organic layer has been washed 5 times using distilled water, the organic layer was added dropwise to 1.0 L of hexane. After the obtained precipitate was filtered off and washed using a small amount of hexane, the precipitate was dissolved in 35 g of propylene glycol monomethyl ether acetate (PGMEA). A low-boiling point solvent was removed from the obtained solution by using an evaporator, thereby obtaining 43.7 g of a PGMEA solution (24.0% by mass) of a compound (P-1M).

Regarding the obtained compound (P-1M), a weight average molecular weight (Mw: expressed in terms of polystyrene), a number average molecular weight (Mn: expressed in terms of polystyrene), and dispersity (Mw/Mn, hereinafter, also referred to as "PDI") of the compound (P-1M) were calculated by a GPC (solvent: THF) measurement. In addition, the composition ratio (molar ratio) of the compound (P-1M) was calculated by the $^1$H-NMR measurement in the method described below.

($^1$H-NMR Measurement Method)

0.5 g of PGMEA solution of the compound (P-1M) was diluted with 1.5 ml of ethyl acetate and 0.5 ml of triethylamine and added dropwise to 50 g of hexane. The obtained precipitate was filtered and dried. 75 mg of the obtained powder was dissolved in 1.1 g of DMSO-d$^6$ and the solution thus obtained was measured by $^1$H-NMR.

A $^1$H-NMR chart of the obtained compound (P-1M) is shown in Table 1.

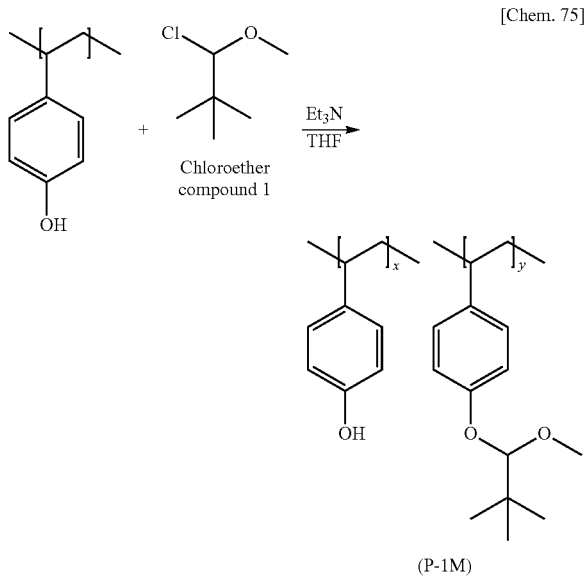

(P-1M)

Synthesis of Compound (P-2M)

Synthesis of Chloroether Compound 20.0 g of pivalaldehyde, 46.52 g of cyclohexanol, 2.70 g of camphorsulfonic acid, 20.0 g of anhydrous magnesium sulfate and 100 mL of hexane were added to a 500 mL egg-plant shaped flask, followed by stirring at 25° C. for 1 hour. 20.0 g of anhydrous magnesium sulfate was further added thereto and the mixture was stirred for 1 hour. Thereafter, 2.35 g of triethylamine was added thereto. The reaction liquid was transferred to a separating funnel. Thereafter, the organic layer was washed 4 times with 100 mL of distilled water, dried over anhydrous magnesium sulfate and then concentrated. In this manner, 49.6 g of acetal compound 2 was obtained.

Next, 22.0 g of acetal compound 2 and 7.72 g of acetyl chloride were added to a 100 mL egg-plant shaped flask, followed by stirring at 45° C. for 3 hours. Unreacted acetyl chloride was removed under reduced pressure, thereby obtaining a solution containing a chloroether compound 2. The composition of the obtained solution was determined by NMR as described below. The chloroether compound 2 (46.1% by mass), cyclohexyl acetate (50.7% by mass), and cyclohexanol (3.2% by mass).

$^1$H-NMR of the chloroether compound 2 (CDCl$_3$:ppm) δ:1.03 (9H, s), 1.16-1.93 (10H, m), 3.74 (1H, m), 5.48 (1H, s)

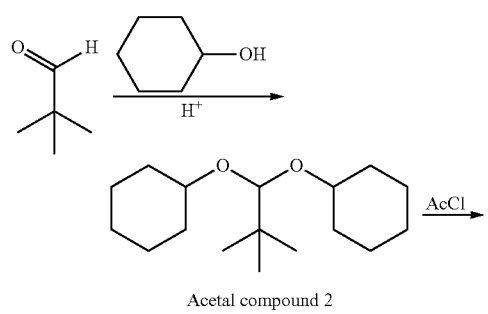

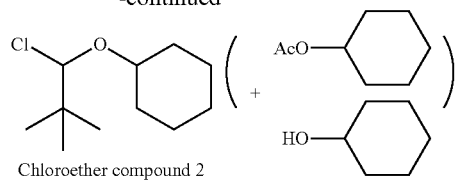

Chloroether compound 2

(Synthesis of Compound (P-2M))

10.0 g of poly(p-hydroxystyrene) (VP-2500, manufactured by NIPPON SODA CO., LTD.) as a phenolic compound was dissolved in 60 g of tetrahydrofuran (THF), and 8.85 g of triethylamine was added thereto, followed by stirring in an ice water bath. The chloroether compound 2 (12.46 g) obtained as above was added dropwise to the reaction liquid and stirred for 4 hours. Thereafter, distilled water was added to stop the reaction. The reactant was dissolved in ethyl acetate by distilling off THF under reduced pressure. After the obtained organic layer has been washed 5 times using distilled water, the organic layer was added dropwise to 1.0 L of hexane. The obtained precipitate was filtered and washed with a little amount of hexane, followed by dissolving in 45 g of PGMEA. A low-boiling point solvent was removed from the obtained solution by using an evaporator, thereby obtaining 58.4 g of a PGMEA solution (20.0% by mass) of a compound (P-2M).

In a similar way to the compound (P-1M), a composition ratio (molar ratio), a weight average molecular weight (Mw: expressed in terms of polystyrene), a number average molecular weight (Mn: expressed in terms of polystyrene), and dispersity (Mw/Mn, hereinafter, also referred to as "PDI") of the obtained compound (P-2M) were calculated.

A $^1$H-NMR chart of the obtained compound (P-2M) is shown in Table 2.

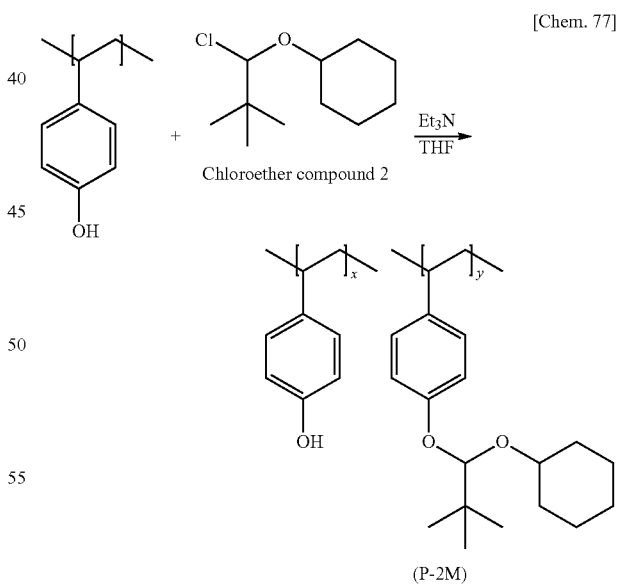

Synthesis of Other Compounds P

Compounds P shown in Table 1 were synthesized in the same synthesis manner as in the compound (P-1M) or the compound (P-2M), except that the phenolic compound and chloroether compound used were appropriately changed.

The composition ratios, weight average molecular weights, and dispersities of the synthesized compounds P are shown in the following Table. In addition, regarding the naming of compounds P, "P-(number)" means that the structure thereof corresponds to that of specific examples of the compound P. When the composition of molecular weight in the same structure is different, L, M, N or Z is affixed to the end of "P-(number)" to differentiate the compositional differences.

TABLE 1

| Resin | Compositional ratio (corresponding from the left in the order) | Weight average molecular weight (Mw) | Dispersity (PDI) |
|---|---|---|---|
| P-1L | 71/29 | 4100 | 1.13 |
| P-1M | 69/31 | 4200 | 1.14 |
| P-1N | 66/34 | 4300 | 1.14 |
| P-2L | 74/26 | 4400 | 1.12 |
| P-2M | 69/31 | 4500 | 1.13 |
| P-3 | 75/25 | 4500 | 1.12 |
| P-6 | 71/29 | 4400 | 1.14 |
| P-8L | 73/27 | 11600 | 1.07 |
| P-8M | 69/31 | 4300 | 1.14 |
| P-9 | 74/26 | 4100 | 1.13 |
| P-13 | 68/29/3 | 4100 | 1.14 |
| P-14 | 60/37/3 | 4900 | 1.14 |
| P-17 | 73/27 | 4400 | 1.13 |
| P-21 | 54/40/6 | 4800 | 1.15 |
| P-24 | 79/21 | 4200 | 1.14 |
| P-26 | 68/29/3 | 12000 | 1.09 |
| P-28 | 76/24 | 4400 | 1.14 |
| P-29 | 86/14 | 11500 | 1.08 |
| P-31 | 74/26 | 4700 | 1.14 |
| P-33 | 80/10/10 | 5600 | 1.43 |
| P-35 | 73/27 | 4800 | 1.15 |
| P-40 | 76/24 | 4400 | 1.23 |
| P-42 | 70/27/3 | 4900 | 1.31 |
| P-44 | 71/19/10 | 5300 | 1.38 |
| P-46 | 56/26/8/10 | 5800 | 1.40 |
| P-47 | 62/35/3 | 4500 | 1.14 |
| P-1Z | 71/29 | 14000 | 1.11 |
| P-2Z | 74/26 | 12000 | 1.14 |
| P-48L | 72/28 | 4400 | 1.12 |
| P-48M | 62/38 | 4700 | 1.09 |
| P-48Z | 75/25 | 15000 | 1.13 |
| P-49 | 65/30/5 | 4100 | 1.15 |
| P-54 | 69/31 | 4800 | 1.15 |
| P-55 | 65/35 | 4200 | 1.16 |
| P-61 | 58/35/7 | 4500 | 1.17 |
| P-63 | 64/30/6 | 14000 | 1.41 |

Synthesis of Compounds (P-66) and (P-67)

Compounds (P-66) and (P-67) of the present invention were synthesized in the same synthesis manner as in the compound (P-1M) or the compound (P-2M), except that the polyhydroxystyrene compound was changed to 4-tert-butyl-calix[8]arene and 1,3,5-tri(1',1'-di(4-hydroxyphenyl)ethyl)benzene.

[Chem. 78]

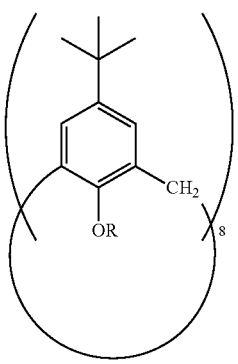

(P-66)

R = H (55%)

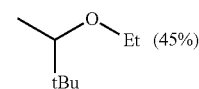

(45%)

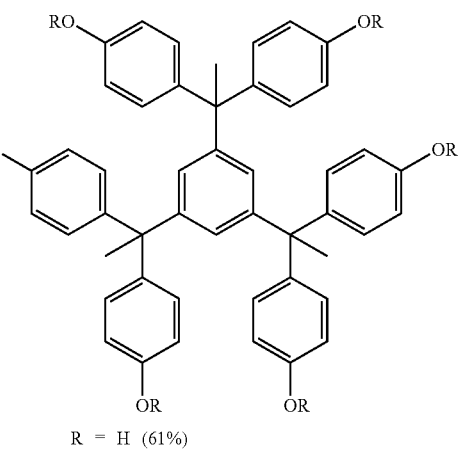

(P-67)

R = H (61%)

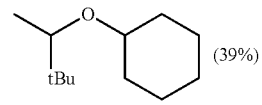

(39%)

For comparison, the compounds below were used. The compounds are shown below with the composition ratio, the weight average molecular weight, and the dispersity.

[Chem. 79]

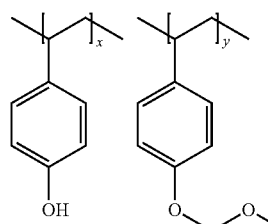

(R-1)

x/y = 70/30
Mw = 4700, PDI = 1.17

-continued
(R-2)
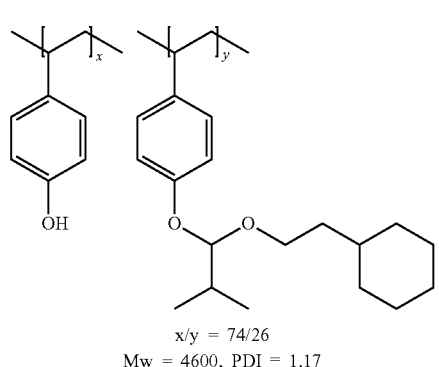
x/y = 74/26
Mw = 4600, PDI = 1.17
(R-3)
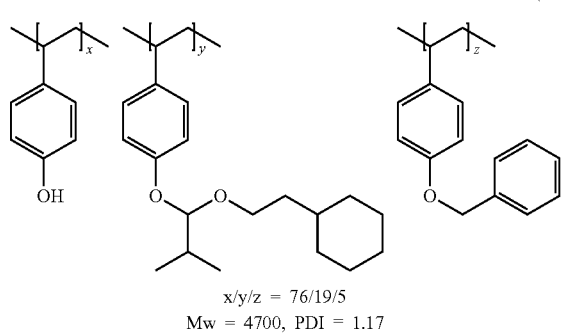
x/y/z = 76/19/5
Mw = 4700, PDI = 1.17
(R-4)
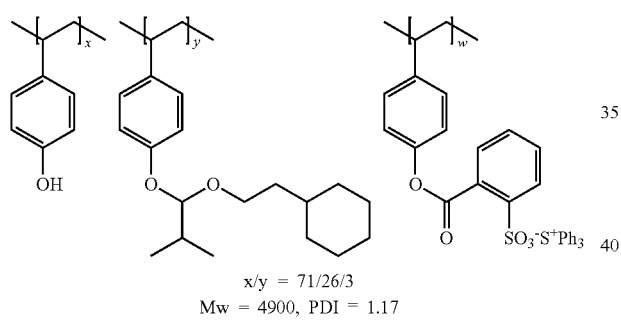
x/y = 71/26/3
Mw = 4900, PDI = 1.17
(R-5)
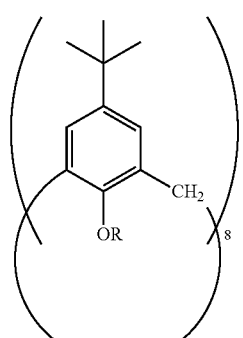
R = H (57%)
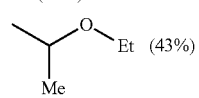 (43%)
[Photoacid Generator]
The compounds represented by the following formulae were used as the photoacid generator.
[Chem. 80]
PAG-1
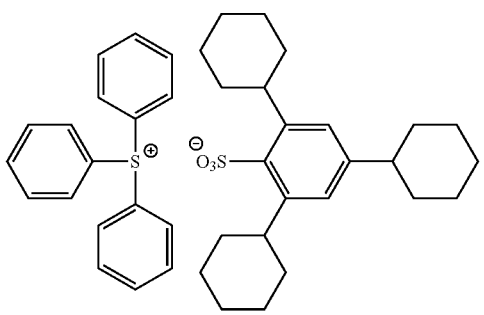
PAG-2
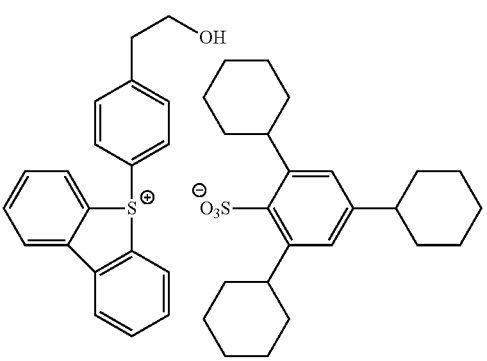
PAG-3
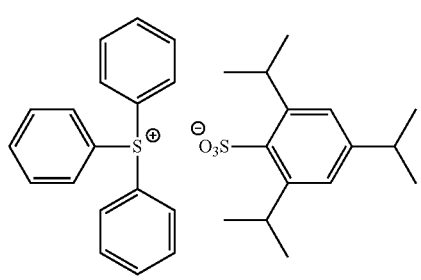
PAG-4
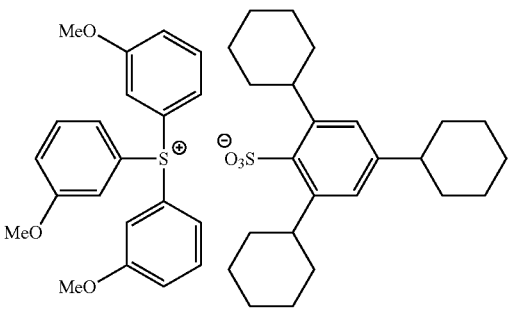
PAG-5
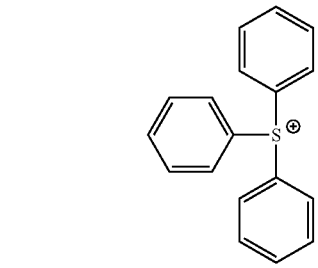

-continued

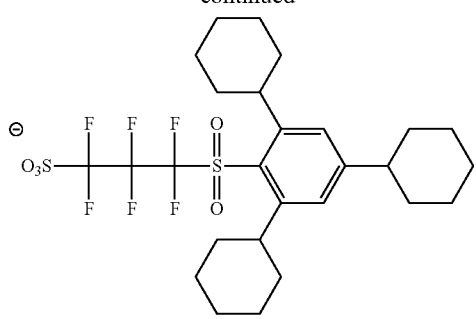

PAG-6

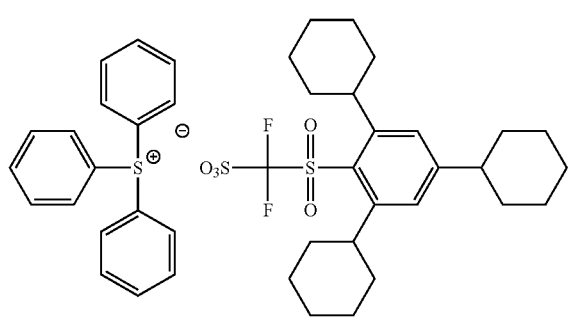

PAG-7

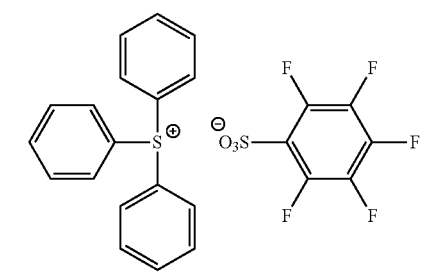

PAG-8

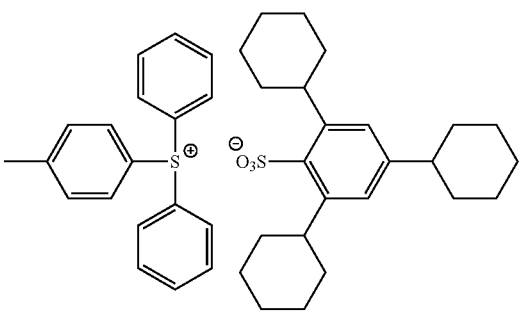

PAG-9

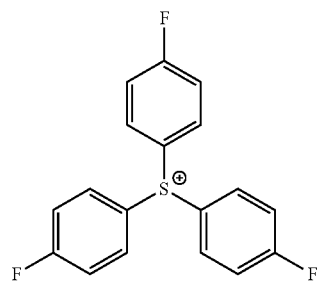

-continued

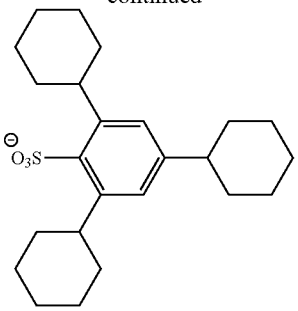

PAG-10

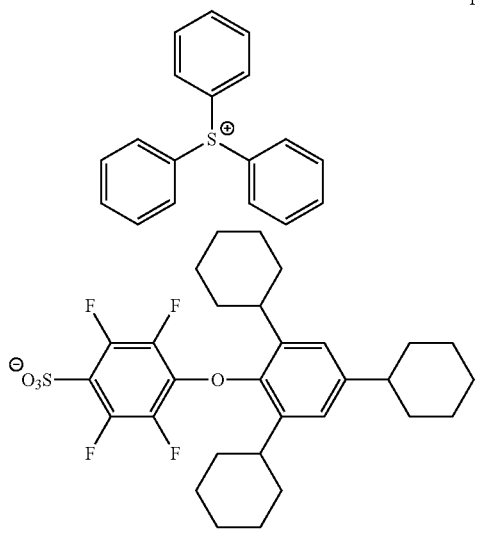

Synthesis Example

PAG-1

Synthesis of Tricyclohexylbenzene

To 20.0 g of benzene, 6.83 g of aluminum chloride was added, cooled by 3° C. and stirred, and 40.4 g of cyclohexyl chloride was slowly added dropwise. After the dropwise addition, the mixture was stirred for 5 hours at room temperature and was poured into ice water. An organic layer was extracted using ethyl acetate and the obtained organic layer was distilled off at reduced pressure at 40° C. After further distilling off at reduced pressure at 170° C., the organic layer was cooled to room temperature, 50 ml of acetone was introduced and recrystallized. The precipitated crystals were filtered off and 14 g of tricyclohexylbenzene was obtained.

Synthesis of Sodium Tricyclohexylbenzene Sulfonate

In 50 ml of methylene chloride, 30 g of tricyclohexylbenzene was dissolved, cooled by 3° C. and stirred, and 15.2 g of chlorosulfonic acid was slowly added dropwise. After the dropwise addition, the mixture was stirred for 5 hours at room temperature, and after the introduction of 10 g of ice, 40 g of 50% aqueous sodium hydroxide was introduced. After a further 20 g of ethanol was added and stirring for 1 hour at 50° C., the undissolved portion was filtered off and removed and the mixture was distilled off at reduced pressure at 40° C. The precipitated crystals were filtered off and washed with hexane, and 30 g of sodium 1,3,5-tricyclohexylbenzen sulfonate was obtained.

Synthesis of PAG-1

To 20 ml of methanol, 4.0 g of triphenyl sulfonium bromide was added and 5.0 g of sodium 1,3,5-tricyclohexylbenzen sulfonate which was dissolved in 20 ml of methanol was added. The resultant was stirred at room temperature for 2 hours, and 50 ml of ion exchange water was added thereto, followed by extraction using chloroform. After the obtained organic layer was washed using water, the organic layer was distilled off at reduced pressure at 40° C. and the obtained crystals were recrystallized using a methanol and ethyl acetate solution. Due to this, 5.0 g of the compound PAG-1 was obtained.

$^1$H-NMR (400 MHz, CDCl$_3$) δ=7.85 (d, 6H), 7.68 (t, 3H), 7.59 (t, 6H), 6.97 (s, 2H), 4.36-4.27 (m, 2H), 2.48-2.38 (m, 1H), 1.97-1.16 (m, 30H)

In the same manner, PAG-2 to PAG-8 were synthesized.

[Basic Compound]

Compounds represented by the following formulae were used as basic compounds.

[Chem. 81]

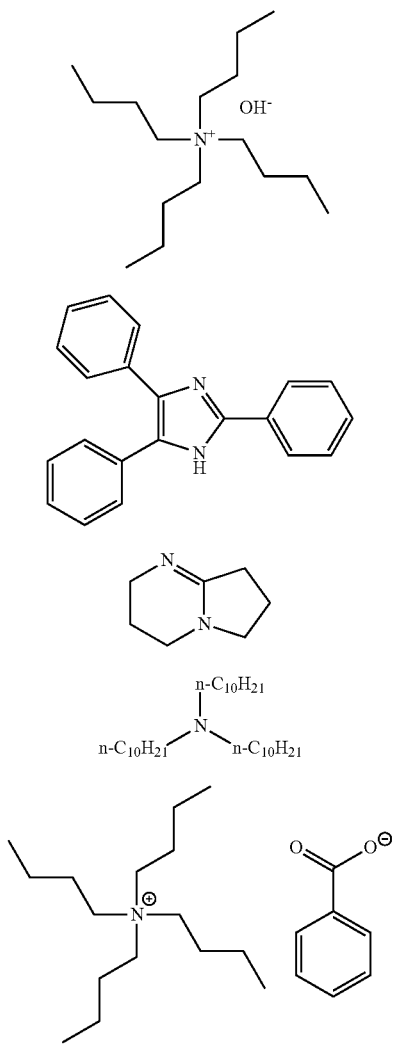

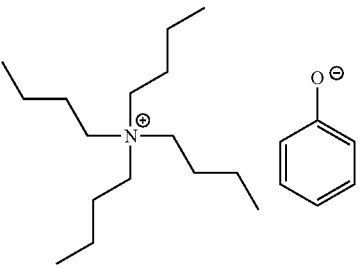

[Surfactant and Solvent]

The following were used as surfactants.

W-1: Megafac F176 (based on fluorine, manufactured by DIC CORPORATION)

W-2: Megafac R08 (based on fluorine and silicon, manufactured by DIC CORPORATION)

W-3: PF6320 (based on fluorine, manufactured by OMNOVA Solutions Inc.)

The following were used as solvents.

S1: propylene glycol monomethyl ether acetate (PGMEA)

S2: propylene glycol monomethyl ether (PGME)

S3: ethyl lactate (EL)

S4: cyclohexanone (Cy)

<Hydrophobic Resin (HR)>

Compounds represented by the following formulae were used as hydrophobic resin. The compounds are shown below with the composition ratio, the weight average molecular weight, and the dispersity.

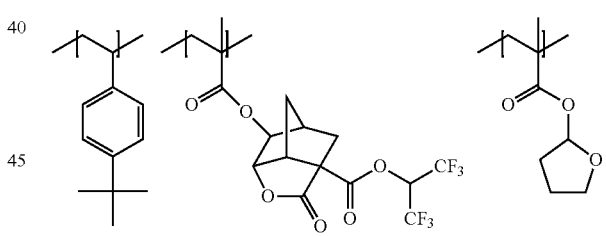

composition ratio: 10/80/10
Mw: 15000
Mw/Mn: 1.58

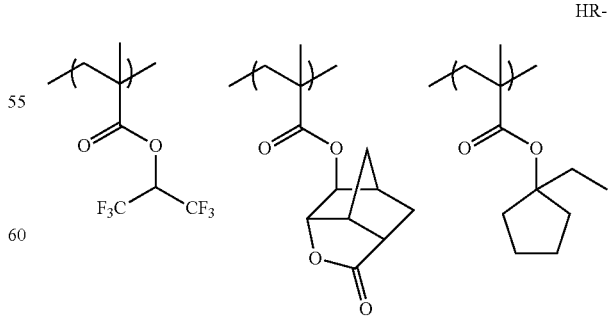

composition ratio: 40/40/20
Mw: 7000
Mw/Mn: 1.67

-continued

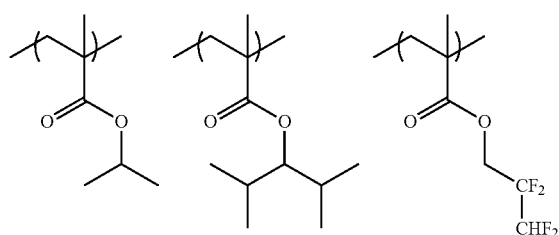

HR-3 composition ratio: 30/65/5
Mw: 30000
Mw/Mn: 1.68

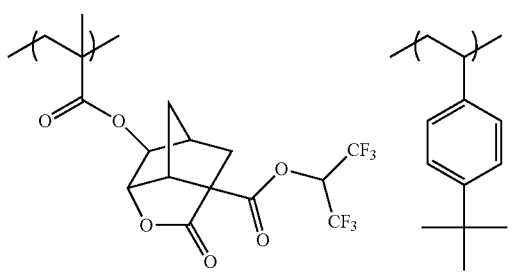

HR-4 composition ratio: 90/10
Mw: 9000
Mw/Mn: 1.77

EB Exposure Evaluation 1

Examples 1 to 24, 54 to 66 and Comparative Examples 1 to 7

Each of the components shown in Table 2 was dissolved in the solvents shown in the same table. This was filtered using a polytetrafluoroethylene filter with a pore size of 0.1 μm. Due to this, a positive type resist solution with the total solid content concentration shown in Table 2 was prepared. Here, the concentration of each of the components shown in Table 2 is the mass concentration based on the mass of the total solid content.

<Resist Evaluation>

The prepared positive type resist solution was uniformly coated on a silicon substrate, where a hexamethyl disilazane treatment had been carried out, using a spin coater. Next, heating and drying were performed over 90 seconds at 130° C. using a hot plate. Due to this, a resist film with a film thickness of 30 nm was formed.

With respect to the resist film, by using an electron beam irradiation instrument (JBX 6,000 manufactured by JEOL, Ltd.; accelerating voltage of 50 keV), a line pattern (a longitudinal direction: 0.5 mm, the number of drawing lines: 40) with a line width of 20 nm to 30 nm was exposed for every 2.5 nm while changing the irradiation amount. Immediately after irradiation, the resist film was heated on a hot plate for 90 seconds at 110° C. After this, the resist film was developed for 180 seconds at 23° C. using an aqueous solution of tetramethylammonium hydroxide with a concentration of 0.8% by mass and was dried after being rinsed using pure water for 30 seconds. Due to this, a line and space pattern (line:space=1:1) was formed. Further, in the following description, the line and space pattern is abbreviated to LS pattern in some cases.

[Shape]

The cross-sectional shapes of the obtained respective patterns were observed with a scanning electron microscope (S-9220 manufactured by Hitachi, Ltd.). The shape of the LS pattern of 30 nm was observed. A shape close to a rectangle was marked as A, and other shapes were marked as B, C, and D in the order close to a rectangle. Comments about a shape were described together.

[Resolution]

The limit resolution (smallest line width where the lines and spaces are separated and resolved) was set as the resolution (nm).

[Line Edge Roughness (LER)]

For arbitrary 30 points in a longitudinal direction of 50 μm of the line pattern with a line width of 30 nm, a distance from a base line where the edge was supposed to be present was measured using a scanning electron microscope (S-9220 manufactured by Hitachi, Ltd.), and the standard deviation and 30 were calculated. As the value gets smaller, the line edge roughness improves.

TABLE 2-1

| Example | Compound P (% by mass) | Photoacid generator (% by mass) | Basic compound (% by mass) | Solvent (mass ratio) | Surfactant (% by mass) | Total solid content concentration (% by mass) | LS resolution (nm) | LER (nm) | Shape |
|---|---|---|---|---|---|---|---|---|---|
| Example 1 | P-1M (69.95) | PAG-4 (28.00) | BASE-1 (2.00) | S1/S2 (80/20) | W-3 (0.05) | 1.3 | 22.5 | 4.6 | B (reverse-tapered) |
| Example 2 | P-1L (30.00) P-1N (39.95) | PAG-4 (28.00) | BASE-1 (2.00) | S1/S2 (80/20) | W-3 (0.05) | 1.3 | 22.5 | 4.7 | B (reverse-tapered) |
| Example 3 | P-2L (72.95) | PAG-1 (25.00) | BASE-1 (2.00) | S1/S2/S3 (40/40/20) | W-3 (0.05) | 1.3 | 20.0 | 3.7 | B (tapered) |
| Example 4 | P-2M (72.95) | PAG-1 (25.00) | BASE-1 (2.00) | S1/S2/S3 (40/40/20) | W-3 (0.05) | 1.3 | 20.0 | 3.6 | A |
| Example 5 | P-6 (69.95) | PAG-4 (28.00) | BASE-1 (2.00) | S1/S2 (80/20) | W-3 (0.05) | 1.3 | 20.0 | 4.0 | B (reverse-tapered) |
| Example 6 | P-8M (72.75) | PAG-8 (25.20) | BASE-1 (2.00) | S1/S2 (80/20) | W-3 (0.05) | 1.3 | 22.5 | 4.1 | B (reverse-tapered) |
| Example 7 | P-9 (71.75) | PAG-2 (26.20) | BASE-1 (2.00) | S1/S2/S 3 (40/40/20) | W-1 (0.05) | 1.3 | 20.0 | 3.9 | A |
| Example 8 | P-13 (70.95) | PAG-4 (28.00) | BASE-3 (1.00) | S1/S2 (80/20) | W-2 (0.05) | 1.3 | 20.0 | 4.1 | A |
| Example 9 | P-14 (99.25) | — | BASE-1 (0.70) | S1/S2 (60/40) | W-3 (0.05) | 1.3 | 20.0 | 3.5 | A |

TABLE 2-1-continued

| Example | Compound P (% by mass) | Photoacid generator (% by mass) | Basic compound (% by mass) | Solvent (mass ratio) | Surfactant (% by mass) | Total solid content concentration (% by mass) | LS resolution (nm) | LER (nm) | Shape |
|---|---|---|---|---|---|---|---|---|---|
| Example 10 | P-17 (67.95) | PAG-1 (15.00) PAG-4 (15.00) | BASE-1 (2.00) | S1/S2/S3 (40/40/20) | W-3 (0.05) | 1.3 | 22.5 | 4.4 | B (reverse-tapered) |
| Example 11 | P-21 (98.55) | — | BASE-1 (1.40) | S1/S2/S3 (40/40/20) | W-3 (0.05) | 1.3 | 20.0 | 3.6 | A |
| Example 12 | P-24 (69.95) | PAG-4 (28.00) | BASE-1 (2.00) | S1/S2 (80/20) | W-3 (0.05) | 1.3 | 20.0 | 3.9 | A |
| Example 13 | P-27 (69.95) | PAG-4 (28.00) | BASE-1 (2.00) | S1/S2 (80/20) | W-3 (0.05) | 1.3 | 22.5 | 4.2 | B (reverse-tapered) |
| Example 14 | P-29 (72.47) | PAG-8 (25.20) | BASE-2 (2.28) | S1/S2 (80/20) | W-3 (0.05) | 1.3 | 22.5 | 4.3 | B (reverse-tapered) |

TABLE 2-2

| Example | Compound P (% by mass) | Photoacid generator (% by mass) | Basic compound (% by mass) | Solvent (mass ratio) | Surfactant (% by mass) | Total solid content concentration (% by mass) | LS resolution (nm) | LER (nm) | Shape |
|---|---|---|---|---|---|---|---|---|---|
| Example 15 | P-31 (71.38) | PAG-8 (25.20) | BASE-4 (3.37) | S1/S2 (80/20) | W-3 (0.05) | 1.3 | 20.0 | 3.8 | A |
| Example 16 | P-33 (69.95) | PAG-4 (28.00) | BASE-1 (2.00) | S1/S2 (80/20) | W-3 (0.05) | 1.3 | 22.5 | 4.2 | A |
| Example 17 | P-35 (69.95) | PAG-4 (28.00) | BASE-1 (2.00) | S1/S2 (80/20) | W-3 (0.05) | 1.3 | 20.0 | 3.9 | A |
| Example 17 | | | | | | 1.3 | 22.5 | 3.7 | A |
| Example 18 | P-40 (72.95) | PAG-1 (25.00) | BASE-1 (2.00) | S1/S2/S3 (40/40/20) | W-3 (0.05) | 1.3 | 20.0 | 4.0 | A |
| Example 19 | P-42 (99.25) | | BASE-1 (0.70) | S1/S2 (60/40) | W-3 (0.05) | | | | |
| Example 20 | P-44 (72.95) | PAG-1 (25.00) | BASE-1 (2.00) | S1/S2/S3 (40/40/20) | W-3 (0.05) | 1.3 | 22.5 | 4.4 | B (reverse-tapered) |
| Example 21 | P-46 (69.95) | PAG-4 (28.00) | BASE-1 (2.00) | S1/S2 (80/20) | W-3 (0.05) | 1.3 | 22.5 | 4.3 | B (reverse-tapered) |
| Example 22 | P-47 (99.25) | — | BASE-1 (0.70) | S1/S2 (60/40) | W-3 (0.05) | 1.3 | 20.0 | 3.5 | A |
| Example 23 | P-66 (71.38) | PAG-8 (25.20) | BASE-4 (3.37) | S1/S2 (80/20) | W-3 (0.05) | 1.3 | 22.5 | 3.9 | B (reverse-tapered) |
| Example 24 | P-67 (71.38) | PAG-8 (25.20) | BASE-4 (3.37) | S1/S2 (80/20) | W-3 (0.05) | 1.3 | 20.0 | 3.7 | A |

TABLE 2-3

| Example | Compound P (% by mass) | Photoacid generator (% by mass) | Basic compound (% by mass) | Solvent (mass ratio) | Surfactant (% by mass) | Total solid content concentration (% by mass) | LS resolution (nm) | LER (nm) | Shape |
|---|---|---|---|---|---|---|---|---|---|
| Example 54 | P-1M (69.95) | PAG-9 (28.00) | BASE-1 (2.00) | S1/S2 (70/30) | W-3 (0.05) | 1.3 | 20.5 | 3.8 | A |
| Example 55 | P-1N (70.0) | PAG-4 (28.00) | BASE-5 (2.00) | S1/S2 (80/20) | — | 1.3 | 20.0 | 4.0 | A |
| Example 56 | P-1Z (72.95) | PAG-10 (25.00) | BASE-6 (2.00) | S1/S2 (80/20) | W-3 (0.05) | 1.3 | 21.0 | 3.7 | B (reverse-tapered) |
| Example 57 | P-2Z (72.95) | PAG-1 (25.00) | BASE-5 (2.00) | S1/S2 (80/20) | W-1 (0.05) | 1.3 | 20.0 | 3.6 | A |
| Example 58 | P-48L (69.95) | PAG-4 (28.00) | BASE-1 (2.00) | S1/S2 (80/20) | W-3 (0.05) | 1.3 | 21.0 | 4.0 | A |
| Example 59 | P-48M (72.75) | PAG-10 (25.20) | BASE-1 (2.00) | S1/S2 (80/20) | W-3 (0.05) | 1.3 | 22.5 | 4.2 | B (reverse-tapered) |
| Example 60 | P-48Z (71.75) | PAG-8 (26.20) | BASE-5 (2.00) | S1/S2 (80/20) | W-1 (0.05) | 1.3 | 20.0 | 3.8 | A |
| Example 61 | P-49 (70.95) | PAG-4 (28.00) | BASE-4 (1.00) | S1/S2 (80/20) | W-2 (0.05) | 1.3 | 20.0 | 4.1 | B (reverse-tapered) |
| Example 62 | P-54 (69.95) | PAG-9 (28.00) | BASE-6 (2.00) | S1/S2 (80/20) | W-3 (0.05) | 1.3 | 21.5 | 3.8 | B (reverse-tapered) |

TABLE 2-3-continued

| Example | Compound P (% by mass) | Photoacid generator (% by mass) | Basic compound (% by mass) | Solvent (mass ratio) | Surfactant (% by mass) | Total solid content concentration (% by mass) | LS resolution (nm) | LER (nm) | Shape |
|---|---|---|---|---|---|---|---|---|---|
| Example 63 | P-55 (72.95) | PAG-1 (25.00) | BASE-1 (2.00) | S1/S2 (80/20) | W-3 (0.05) | 1.3 | 22.5 | 4.2 | B (reverse-tapered) |
| Example 64 | P-61 (98.55) | — | BASE-1 (1.40) | S1/S2 (80/20) | W-1 (0.05) | 1.3 | 20.0 | 3.8 | A |
| Example 65 | P-61 (98.55) | — | BASE-5 (1.40) | S1/S2/S3 (50/40/10) | W-3 (0.05) | 1.3 | 20.5 | 3.9 | A |
| Example 66 | P-63 (98.55) | — | BASE-5 (1.40) | S1/S2 (80/20) | W-3 (0.05) | 1.3 | 21.0 | 4.2 | B (reverse-tapered) |

TABLE 2-4

| Example | Compound P (% by mass) | Photoacid generator (% by mass) | Basic compound (% by mass) | Solvent (mass ratio) | Surfactant (% by mass) | Total solid content concentration (% by mass) | LS resolution (nm) | LER (nm) | Shape |
|---|---|---|---|---|---|---|---|---|---|
| Comparative Example 1 | R-1 (69.95) | PAG-4 (28.00) | BASE-1 (2.00) | S1/52 (80/20) | W-3 (0.05) | 1.3 | 30.0 | 5.2 | D (film reduction) |
| Comparative Example 2 | R-1 (72.95) | PAG-1 (25.00) | BASE-1 (2.00) | S1/S2/S3 (40/40/20) | W-3 (0.05) | 1.3 | 30.0 | 5.3 | D (film reduction) |
| Comparative Example 3 | R-2 (69.95) | PAG-4 (28.00) | BASE-1 (2.00) | S1/S2 (80/20) | W-3 (0.05) | 1.3 | 25.0 | 4.7 | C (tapered) |
| Comparative Example 4 | R-2 (72.95) | PAG-1 (25.00) | BASE-1 (2.00) | S1/S2/S3 (40/40/20) | W-3 (0.05) | 1.3 | 25.0 | 4.5 | C (tapered) |
| Comparative Example 5 | R-3 (69.95) | PAG-4 (28.00) | BASE-1 (2.00) | S1/52 (80/20) | W-3 (0.05) | 1.3 | 25.0 | 4.4 | C (tapered) |
| Comparative Example 6 | R-4 (99.25) | — | BASE-1 (0.70) | S1/52 (60/40) | W-3 (0.05) | 1.3 | 25.0 | 4.2 | C (tapered) |
| Comparative Example 7 | R-5 (71.38) | PAG-8 (25.20) | BASE-4 (3.37) | S1/52 (80/20) | W-3 (0.05) | 1.3 | 27.5 | 4.4 | D (film reduction) |

As shown in Table 2, the compositions according to Examples 1 to 24 and 54 to 66 were superior in LS resolution, LER, and pattern shape, compared to the compositions according to Comparative Examples 1 to 7.

EB Exposure Evaluation 2

Examples 25 to 28 and Comparative Example 8

Positive type resist films were formed, and resist evaluation was performed in the same manner as in Examples 1 to 24, except that the number of drawing lines was changed from 40 to 500 so as to confirm the performance of the resist film in a large area exposure. The results are shown in Table 3.

As shown in Table 3, the compositions according to Examples 25 to 28 were superior in LS resolution, LER, and pattern shape, compared to the compositions according to Comparative Example 8. From the results shown in Table 2 and Table 3, it was found that the resist pattern forming method according to the present invention can be also applied to production of molds for nanoimprint.

EB Exposure Evaluation 3

Examples 29 to 42 and Comparative Examples 9 to 13

Each of the components shown in Table 4 was dissolved in the solvents shown in the same table to prepare each solution. Each solution was filtered using a polytetrafluoro-

TABLE 3

| Example | Compound P (% by mass) | Photoacid generator (% by mass) | Basic compound (% by mass) | Solvent (mass ratio) | Surfactant (% by mass) | Total solid content concentration (% by mass) | LS resolution (nm) | LER (nm) | Shape |
|---|---|---|---|---|---|---|---|---|---|
| Example 25 | P-2M (72.95) | PAG-1 (25.00) | BASE-1 (2.00) | S1/S2/S3 (40/40/20) | W-3 (0.05) | 1.3 | 20.0 | 4.2 | A |
| Example 26 | P-27 (69.95) | PAG-4 (28.00) | BASE-1 (2.00) | S1/S2 (80/20) | W-3 (0.05) | 1.3 | 22.5 | 4.3 | A |
| Example 27 | P-31 (71.38) | PAG-8 (25.20) | BASE-4 (3.37) | S1/S2 (80/20) | W-3 (0.05) | 1.3 | 20.0 | 4.4 | A |
| Example 28 | P-35 (69.95) | PAG-4 (28.00) | BASE-1 (2.00) | S1/S2 (80/20) | W-3 (0.05) | 1.3 | 20.0 | 4.1 | B (tapered) |
| Comparative Example 8 | R-2 (69.95) | PAG-4 (28.00) | BASE-1 (2.00) | S1/S2 (80/20) | W-3 (0.05) | 1.3 | 25.0 | 5.1 | D (film reduction) | ethylene filter with a pore size of 0.1 μm. Due to this, a positive type resist solution with the total solid content concentration shown in Table 4 was prepared. Here, the concentration of each of the components shown in Table 4 is the mass concentration based on the mass of the total solid content.

<Resist Evaluation>

The prepared positive type resist solution was uniformly coated onto a glass substrate on which a chromium oxide film (light shielding film) having a thickness of 100 nm was provided by chemical vapor deposition, by using a spin coater. Next, heating and drying were performed over 600 seconds at 140° C. using a hot plate. Due to this, a resist film with a film thickness of 100 nm was formed.

With regard to the resist film, electron beam irradiation was performed using an electron beam irradiation device (HL750 manufactured by Hitachi, Ltd.; acceleration voltage 50 keV). Immediately after irradiation, the resist film was heated on a hot plate for 600 seconds at 120° C. After this, the resist film was developed for 60 seconds at 23° C. using an aqueous solution of tetramethylammonium hydroxide with a concentration of 2.38% by mass and was dried after being rinsed using pure water for 30 seconds. Due to this, a line and space pattern (line:space=1:1) and an independent line pattern (line:space=1:>100) were formed. Here, below, the line and space pattern is abbreviated as LS and the independent line pattern is abbreviated as IL.

[Shape]

The cross-sectional shape of each pattern which was obtained was observed by using a scanning electron microscope (S-4800 manufactured by Hitachi, Ltd.). For the pattern shape, the shape of the IL pattern of 100 nm was observed. A shape close to a rectangle was marked as A, a shape showing slight film reduction was marked as B, and a tapered shape was marked as C.

[Resolution]

Limit resolution (a minimum line width at which a line and a space are separately resolved) in the irradiation amount at which the above sensitivity was exhibited was taken as resolution (nm).

[Line Edge Roughness (LER)]

For 30 arbitrary points in a longitudinal direction of 50 μm of the line pattern with a line width of 100 nm in the irradiation amount at which the above sensitivity was exhibited, a distance from a base line where the edge was supposed to be present was measured using a scanning electron microscope (S-4800 manufactured by Hitachi, Ltd.), and the standard deviation and 3σ were calculated. As the value gets smaller, the line edge roughness improves.

TABLE 4-1

| Example | Compound P (% by mass) | Photoacid generator (% by mass) | Basic compound (% by mass) | Solvent (mass ratio) | Surfactant (% by mass) | Total solid content concentration (% by mass) | LS resolution (nm) | IL resolution (nm) | IL shape | LER (nm) |
|---|---|---|---|---|---|---|---|---|---|---|
| Example 29 | P-1N (88.80) | PAG-1 (9.70) | BASE-1 (1.50) | S1/S2 (80/20) | — | 4 | 37.5 | 37.5 | A | 4.8 |
| Example 30 | P-1N (88.75) | PAG-1 (9.70) | BASE-1 (1.50) | S1/S2 (80/20) | W-3 (0.05) | 4 | 37.5 | 37.5 | A | 4.8 |
| Example 31 | P-2M (89.67) | PAG-1 (4.85) PAG-3 (3.98) | BASE-1 (1.50) | S1/S2 (80/20) | — | 4 | 37.5 | 37.5 | A | 3.8 |
| Example 32 | P-3 (90.54) | PAG-3 (7.96) | BASE-1 (1.50) | S1/S2 (80/20) | — | 4 | 37.5 | 37.5 | A | 5.1 |
| Example 33 | P-8L (88.80) | PAG-1 (9.70) | BASE-1 (1.50) | S1/S2 (80/20) | — | 4 | 37.5 | 37.5 | A | 4.7 |
| Example 34 | P-9 (88.55) | PAG-8 (9.90) | BASE-1 (1.50) | S1/S2 (80/20) | W-3 (0.05) | 4 | 37.5 | 37.5 | A | 4.2 |
| Example 35 | P-14 (98.50) | — | BASE-1 (1.50) | S1/S2 (60/40) | — | 4 | 37.5 | 37.5 | A | 4.0 |
| Example 36 | P-21 (97.30) | — | BASE-1 (2.70) | S1/S2 (50/50) | — | 4 | 37.5 | 37.5 | A | 4.1 |
| Example 37 | P-24 (79.34) | PAG-1 (9.70) PAG-3 (7.96) | BASE-1 (3.00) | S1/S2/S3 (40/40/20) | — | 3 | 37.5 | 37.5 | A | 3.6 |
| Example 38 | P-29 (88.80) | PAG-1 (9.70) | BASE-1 (1.50) | S1/S2 (80/20) | — | 4 | 37.5 | 37.5 | A | 4.7 |
| Example 39 | P-33 (88.60) | PAG-8 (9.90) | BASE-1 (1.50) | S1/S2 (80/20) | — | 4 | 37.5 | 37.5 | A | 4.5 |
| Example 40 | P-40 (88.80) | PAG-1 (9.70) | BASE-1 (1.50) | S1/S2 (80/20) | — | 4 | 37.5 | 37.5 | A | 4.3 |
| Example 41 | P-44 (88.80) | PAG-1 (9.70) | BASE-1 (1.50) | S1/S2 (80/20) | — | 4 | 37.5 | 37.5 | A | 4.8 |
| Example 42 | P-49 (88.80) | PAG-1 (9.70) | BASE-1 (1.50) | S1/S2 (80/20) | — | 4 | 37.5 | 37.5 | A | 4.0 |

TABLE 4-2

| Example | Compound P (% by mass) | Photoacid generator (% by mass) | Basic compound (% by mass) | Solvent (mass ratio) | Surfactant (% by mass) | Total solid content concentration (% by mass) | LS resolution (nm) | IL resolution (nm) | IL shape | LER (nm) |
|---|---|---|---|---|---|---|---|---|---|---|
| Comparative Example 9 | R-1 (88.80) | PAG-1 (9.70) | BASE-1 (1.50) | S1/S2 (80/20) | — | 4 | 50.0 | 62.5 | C | 6.4 |
| Comparative Example 10 | R-2 (88.80) | PAG-1 (9.70) | BASE-1 (1.50) | S1/S2 (80/20) | — | 4 | 37.5 | 50.0 | B | 5.5 |

TABLE 4-2-continued

| Example | Compound P (% by mass) | Photoacid generator (% by mass) | Basic compound (% by mass) | Solvent (mass ratio) | Surfactant (% by mass) | Total solid content concentration (% by mass) | LS resolution (nm) | IL resolution (nm) | IL shape | LER (nm) |
|---|---|---|---|---|---|---|---|---|---|---|
| Comparative Example 11 | R-3 (88.80) | PAG-1 (9.70) | BASE-1 (1.50) | S1/S2 (80/20) | — | 4 | 37.5 | 50.0 | C | 5.3 |
| Comparative Example 12 | R-4 (98.50) | — | BASE-1 (1.50) | S1/S2 (60/40) | — | 4 | 37.5 | 50.0 | B | 5.0 |
| Comparative Example 13 | R-5 (88.80) | PAG-1 (9.70) | BASE-1 (1.50) | S1/S2 (80/20) | — | 4 | 37.5 | 50.0 | C | 4.9 |

As shown in Table 4, the compositions of according to Examples 29 to 42 were superior in the IL resolution, the IL pattern shape, and the LER, compared to the compositions according to Comparative Examples 9 to 13. By exposing and developing mask blanks in which a resist film formed of the compositions of the present invention is formed, photo masks suitable for producing semiconductors are obtained.

EUV Exposure Evaluation

Examples 43 to 53, 67 to 80 and Comparative Examples 14 to 17

Positive resist films were formed in the same manner as in Examples 1 to 24, except that the thickness of the resist film was changed from 30 nm to 50 nm so as to confirm the performance of the resist film in EUV exposure.

With regard to the resist film, EUV light was irradiated using an EUV exposure device (wavelength=13.5 nm, Na=0.3). Immediately after irradiation, the resist film was heated on a hot plate for 90 seconds at 110° C. After this, the resist film was developed for 30 seconds at 23° C. using an aqueous solution of tetramethylammonium hydroxide with a concentration of 2.38% by mass and was dried after being rinsed using pure water for 30 seconds. Due to this, a line and space pattern (line:space=1:1) was formed.

(Sensitivity)

First, the cross-sectional shape of each line and space pattern which was obtained was observed using a scanning electron microscope (S-9380 manufactured by Hitachi, Ltd.). Then, the amount of exposure when a line with a line width of 35 nm (line:space=1:1) was resolved is set as ($E_{opt}$).

(Pattern Shape)

The cross-sectional shape of the 35 nm line pattern (line:space=1:1) with the exposure amount where the sensitivity above was exhibited was observed using a scanning electron microscope (S-4800 manufactured by Hitachi, Ltd.). Then, the shape thereof was evaluated in three stages of rectangular, reverse tapered shape, and tapered shape.

(Roughness Characteristics: LWR)

The 35 nm line pattern (line:space=1:1) described above was observed using a scanning electron microscope (S-9380 manufactured by Hitachi, Ltd.). Then, with regard to 50 arbitrary points at equal intervals included in a 2 μm length direction, the distance between the reference line which is to be an edge and the actual edge was measured. The standard deviation of the distance and 3σ were calculated, and the 3σ was taken as "LWR (nm)". As the value gets smaller, the roughness characteristics improve.

The evaluation results thereof are shown in the following Table 5.

TABLE 5-1

| Example | Compound (P) (% by mass) | Photoacid generator (% by mass) | Basic compound (% by mass) | Solvent (mass ratio) | Surfactant (% by mass) | Total solid content concentration (% by mass) | Sensitivity (mJ/cm$^2$) | Pattern shape | LWR (nm) |
|---|---|---|---|---|---|---|---|---|---|
| Example 43 | P-2M (85.95) | PAG-4 (12.8) | BASE-1 (1.20) | S1/S2 (80/20) | W-3 (0.05) | 4 | 21.7 | Rectangle | 4.6 |
| Example 44 | P-8M (85.55) | PAG-2 (13.20) | BASE-1 (1.20) | S1/S2 (80/20) | W-3 (0.05) | 4 | 22.6 | Rectangle | 4.9 |
| Example 45 | P-9 (83.86) | PAG-5 (14.89) | BASE-1 (1.20) | S1/S2 (80/20) | W-3 (0.05) | 4 | 21.2 | Rectangle | 4.2 |
| Example 46 | P-21 (84.85) | — | BASE-1 (1.70) | S1/S2 (50/50) | W-3 (0.05) | 4 | 21.3 | Rectangle | 4.1 |
| Example 47 | P-24 (86.10) | PAG-6 (13.20) | BASE-3 (0.65) | S1/S2 (80/20) | W-3 (0.05) | 4 | 21.7 | Rectangle | 4.8 |
| Example 48 | P-31 (89.95) | PAG-7 (8.63) | BASE-2 (1.37) | S1/S2 (80/20) | W-3 (0.05) | 4 | 21.5 | Rectangle | 5.0 |
| Example 49 | P-33 (85.55) | PAG-2 (13.20) | BASE-1 (1.20) | S1/S2 (80/20) | W-3 (0.05) | 4 | 22.0 | Rectangle | 4.5 |
| Example 50 | P-42 (97.65) | — | BASE-1 (1.00) | S1/S2 (60/40) | W-3 (0.05) | 4 | 21.7 | Rectangle | 4.3 |
| Example 51 | P-46 (85.95) | PAG-4 (12.8) | BASE-1 (1.20) | S1/S2 (80/20) | W-3 (0.05) | 4 | 22.5 | Rectangle | 4.4 |
| Example 52 | P-47 (97.65) | — | BASE-1 (1.00) | S1/S2 (60/40) | W-3 (0.05) | 4 | 21.3 | Rectangle | 4.1 |
| Example 53 | P-49 (85.95) | PAG-4 (12.8) | BASE-1 (1.20) | S1/S2 (80/20) | W-3 (0.05) | 4 | 22.2 | Rectangle | 4.3 |

TABLE 5-2

| Example | Compound (P) (% by mass) | Photoacid generator (% by mass) | Basic compound (% by mass) | Solvent (mass ratio) | Surfactant (% by mass) | Total solid content concentration (% by mass) | Sensitivity (mJ/cm$^2$) | Pattern shape | LWR (nm) |
|---|---|---|---|---|---|---|---|---|---|
| Example 67 | P-1M (69.95) | PAG-9 (28.00) | BASE-1 (2.00) | S1/S2 (70/30) | W-3 (0.05) | 1.3 | 21.3 | Rectangle | 4.2 |
| Example 68 | P-1N (70.0) | PAG-4 (28.00) | BASE-5 (2.00) | S1/S2 (80/20) | — | 1.3 | 21.0 | Rectangle | 4.1 |
| Example 69 | P-1Z (72.95) | PAG-10 (25.00) | BASE-6 (2.00) | S1/S2 (80/20) | W-3 (0.05) | 1.3 | 21.5 | Rectangle | 4.4 |
| Example 70 | P-2Z (73.00) | PAG-1 (25.00) | BASE-5 (2.00) | S1/S2 (70/30) | — | 1.3 | 21.2 | Rectangle | 4.5 |
| Example 71 | P-48L (69.95) | PAG-4 (28.00) | BASE-1 (2.00) | S1/S2 (80/20) | W-3 (0.05) | 1.3 | 20.8 | Rectangle | 4.2 |
| Example 72 | P-48M (72.75) | PAG-10 (25.20) | BASE-1 (2.00) | S1/S2 (80/20) | W-3 (0.05) | 1.3 | 22.1 | Rectangle | 4.8 |
| Example 73 | P-48Z (71.80) | PAG-4 (26.20) | BASE-5 (2.00) | S1/S2 (80/20) | — | 1.3 | 22.5 | Rectangle | 4.5 |
| Example 74 | P-49 (70.95) | PAG-4 (28.00) | BASE-4 (1.00) | S1/S2 (70/30) | W-2 (0.05) | 1.3 | 21.5 | Rectangle | 4.8 |
| Example 75 | P-54 (69.95) | PAG-9 (28.00) | BASE-5 (2.00) | S1/S2 (80/20) | W-3 (0.05) | 1.3 | 22.5 | Rectangle | 4.6 |
| Example 76 | P-55 (72.95) | PAG-1 (25.00) | BASE-1 (2.00) | S1/S2 (70/30) | W-3 (0.05) | 1.3 | 21.3 | Rectangle | 4.5 |
| Example 77 | P-61 (98.55) | — | BASE-1 (1.40) | S1/S2 (80/20) | W-1 (0.05) | 1.3 | 21.8 | Rectangle | 4.3 |
| Example 78 | P-61 (98.60) | — | BASE-5 (1.40) | S1/S2/S3 (50/40/10) | — | 1.3 | 20.5 | Rectangle | 4.1 |
| Example 79 | P-63 (98.55) | — | BASE-5 (1.40) | S1/S2 (70/30) | W-3 (0.05) | 1.3 | 20.4 | Rectangle | 4.2 |
| Example 80 | P-63 (93.00) | PAG-1 (5.00) | BASE-1 (2.00) | S1/S2/S3 (70/25/5) | — | 1.3 | 20.1 | Rectangle | 4.3 |

TABLE 5-3

| Example | Compound (P) (% by mass) | Photoacid generator (% by mass) | Basic compound (% by mass) | Solvent (mass ratio) | Surfactant (% by mass) | Total solid content concentration (% by mass) | Sensitivity (mJ/cm$^2$) | Pattern shape | LWR (nm) |
|---|---|---|---|---|---|---|---|---|---|
| Comparative Example 14 | R-1 (85.95) | PAG-4 (12.8) | BASE-1 (1.20) | S1/S2 (80/20) | W-3 (0.05) | 4 | 24.8 | Tapered | 5.8 |
| Comparative Example 15 | R-2 (85.95) | PAG-4 (12.8) | BASE-1 (1.20) | S1/S2 (80/20) | W-3 (0.05) | 4 | 25.2 | Tapered | 6.1 |
| Comparative Example 16 | R-4 (97.65) | — | BASE-1 (1.00) | S1/S2 (60/40) | W-3 (0.05) | 4 | 23.8 | Tapered | 5.3 |
| Comparative Example 17 | R-5 (85.95) | PAG-4 (12.8) | BASE-1 (1.20) | S1/S2 (80/20) | W-3 (0.05) | 4 | 24.8 | Tapered | 5.3 |

As shown in Table 5, the compositions of the examples were superior in terms of sensitivity, pattern shape, and LWR compared to the compositions of the comparative examples.

KrF Exposure Evaluation

Examples 81 to 87 and Comparative Example 18

Development Defect

The positive type resist solution prepared as above was uniformly coated onto a substrate on which an antireflection film with a thickness of 60 nm (DUV 44 manufactured by Brewer Science, Inc.) was coated by using a spin coater Mark 8 (manufactured by Tokyo Electron Ltd.). Next, heating and drying were performed for 60 seconds at 130° C. Due to this, a positive type resist film with an average film thickness of 60 nm was formed. With respect to the resist film, using a KrF excimer laser scanner (manufactured by ASML, PAS5500/850C, wavelength of 248 nm), the entire surface of the wafer was subjected to checkered-flag exposure including alternate exposure of open-frame exposed and unexposed portions having an area of 15 mm square (exposure condition: NA=0.80, a=0.89, 20 mJ). After irradiation, the resist film was baked at 110° C. for 60 seconds, immersed in an aqueous solution of tetramethylammonium hydroxide (TMAH) of 2.38% by mass for 60 seconds, rinsed with water for 30 seconds and dried.

With respect to the obtained wafer with a pattern, the number of development defects was measured using KLA-2360 (manufactured by KLA-Tencor Corporation). At this time, the measurement was performed by setting the total inspection area to 205 cm$^2$, a pixel size to 0.25 μm, a threshold value to 30, and using visible light as inspection light. The evaluation was performed in such a manner that a value obtained by dividing the obtained value by the inspection area was set to be a defect number (number/cm$^2$). A case where the value was less than 1.0 was denoted as A, a case where the value was 1.0 or more and less than 5.0 was denoted as B, a case where the value was 5.0 or more and less than 10.0 was denoted as C, and a case where the value was 10.0 or more was denoted as D. A smaller value indicates higher performance.

TABLE 6

| Example | Compound (P) (% by mass) | Photoacid generator (% by mass) | Basic compound (% by mass) | Hydrophobic resin (% by mass) | Solvent (mass ratio) | Surfactant (% by mass) | Total solid content concentration (% by mass) | Defect number |
|---|---|---|---|---|---|---|---|---|
| Example 81 | P-1N (64.95) | PAG-4 (28.00) | BASE-5 (2.00) | HR-1 (5.00) | S1/S2 (70/30) | W-3 (0.05) | 1.3 | A |
| Example 82 | P-2M (65.0) | PAG-9 (28.00) | BASE-1 (2.00) | HR-4 (5.00) | S1/S2 (80/20) | — | 1.3 | B |
| Example 83 | P-1N (69.95) | PAG-4 (28.00) | BASE-5 (2.00) | — | S1/S2 (70/30) | W-3 (0.05) | 1.3 | C |
| Example 84 | P-24 (70.00) | PAG-1 (25.00) | BASE-5 (2.00) | HR-1 (3.00) | S1/S2 (70/30) | — | 1.3 | A |
| Example 85 | P-48M (64.95) | PAG-4 (28.00) | BASE-1 (2.00) | HR-2 (5.00) | S1/S2 (80/20) | W-3 (0.05) | 1.3 | B |
| Example 86 | P-61 (92.95) | — | BASE-1 (2.00) | HR-1 (5.00) | S1/S2 (80/20) | W-3 (0.05) | 1.3 | A |
| Example 87 | P-63 (93.00) | — | BASE-5 (2.00) | HR-3 (5.00) | S1/S2 (80/20) | — | 1.3 | C |
| Comparative Example 18 | R-1 (64.95) | PAG-4 (28.00) | BASE-5 (2.00) | HR-1 (5.00) | S1/S2 (70/30) | W-3 (0.05) | 1.3 | D |

As shown in Table 6, the compositions of the examples were superior in terms of the defect number compared to the composition of the comparative example. In addition, when Examples 81, 82, 84 to 87 using the hydrophobic resin (HR) are compared to Example 83 not using the hydrophobic resin (HR), it is found that, by adding the hydrophobic resin (HR) to the composition of the present invention, the composition is superior in terms of the defect number.

Examples 88 to 95 and Comparative Example 19

Preparation of Topcoat Composition

The component (topcoat resin) shown in the following Table 7 was dissolved in the solvent (topcoat coating solvent) shown in Table 7. This was filtered by using a polytetrafluoroethylene filter with a pore size of 0.1 μm. Due to this, a topcoat composition with the total solid content concentration of 1% by mass was prepared.

<Resist Evaluation (EB)>

The prepared positive type resist solution was uniformly coated onto a silicon substrate, where a hexamethyl disilazane treatment had been carried out, by using a spin coater. Next, heating and drying were performed for 90 seconds at 120° C. by using a hot plate. Due to this, a resist film with a film thickness of 60 nm was formed.

The topcoat composition described in Table 7 was uniformly coated onto the resist film by using a spin coater. Next, heating and drying were performed for 90 seconds at 120° C. by using a hot plate. Due to this, a film with a total film thickness of the resist film and the topcoat layer of 100 nm was formed.

Using an electron beam irradiation instrument (HL 750 manufactured by Hitachi, Ltd.; accelerating voltage of 50 keV), the electron beam irradiation was performed onto the film. Immediately after irradiation, the film was heated on a hot plate for 90 seconds at 110° C. Further, the film was developed for 60 seconds at 23° C. using an aqueous solution of tetramethylammonium hydroxide with a concentration of 2.38% by mass and then was dried after being rinsed using pure water for 30 seconds. Due to this, a line and space pattern was formed. The obtained pattern was evaluated by the following method.

[Evaluation of Outgassing]

The entire surface of the film was exposed by using an electron beam irradiation instrument (HL 750 manufactured by Hitachi, Ltd.; accelerating voltage of 50 keV). When the minimum irradiation energy necessary for the complete dissolution by the development was regarded as Eth, an outgassing amount was briefly evaluated from the degree of decrease in the film thickness (shrink film thickness) after the irradiation energy of 1.5 times the Eth was applied and then exposure was performed. Since the shrink film thickness is correlated to the amount of the component volatilized from the resist film by exposure, it is found that a smaller shrink film thickness is superior in terms of the outgassing characteristics.

TABLE 7

| Example | Compound (P) (% by mass) | Photoacid generator (% by mass) | Basic compound (% by mass) | Solvent (mass ratio) | Surfactant (% by mass) | Total solid content concentration (% by mass) | Topcoat resin | Topcoat coating solvent | Outgassing amount (nm) |
|---|---|---|---|---|---|---|---|---|---|
| Example 88 | P-1N (69.95) | PAG-4 (28.00) | BASE-5 (2.00) | S1/S2 (70/30) | W-3 (0.05) | 1.3 | T-1 | Water | 1.0 |
| Example 89 | P-2M (69.0) | PAG-9 (28.00) | BASE-1 (2.00) | S1/S2 (80/20) | — | 1.3 | T-2 | Water | 1.5 |
| Example 90 | P-1N (69.95) | PAG-4 (28.00) | BASE-5 (2.00) | S1/S2 (70/30) | W-3 (0.05) | 1.3 | U-2 | SL-1 | 2.0 |
| Example 91 | P-1N (69.95) | PAG-4 (28.00) | BASE-5 (2.00) | S1/S2 (70/30) | W-3 (0.05) | 1.3 | — | — | 4.2 |
| Example 92 | P-24 (73.00) | PAG-1 (25.00) | BASE-5 (2.00) | S1/S2 (70/30) | — | 1.3 | T-3 | Water | 2.1 |
| Example 93 | P-48M (69.95) | PAG-4 (28.00) | BASE-1 (2.00) | S1/S2 (80/20) | W-3 (0.05) | 1.3 | U-2 | SL-2 | 1.8 |

TABLE 7-continued

| Example | Compound (P) (% by mass) | Photoacid generator (% by mass) | Basic compound (% by mass) | Solvent (mass ratio) | Surfactant (% by mass) | Total solid content concentration (% by mass) | Topcoat resin | Topcoat coating solvent | Outgassing amount (nm) |
|---|---|---|---|---|---|---|---|---|---|
| Example 94 | P-61 (97.95) | — | BASE-1 (2.00) | S1/S2 (80/20) | W-3 (0.05) | 1.3 | U-3 | SL-3 | 0.5 |
| Example 95 | P-63 (98.00) | — | BASE-5 (2.00) | S1/S2 (80/20) | — | 1.3 | U-2 | SL-1 | 0.8 |
| Comparative Example 19 | R-1 (69.95) | PAG-4 (28.00) | BASE-5 (2.00) | S1/S2 (70/30) | W-3 (0.05) | 1.3 | T-1 | Water | 6.5 |

<Resin Used for Preparation Topcoat Composition>
T-1: polyacrylic acid Jurymer AC-10L (manufactured by Nihon Junyaku K. K.)
T-2: poly(N-vinylpyrrolidone) Luviskol K90 (manufactured by BASF Japan)
T-3: (vinyl alcohol 60/vinyl acetate 40) copolymer SMR-8M (manufactured by Shin-Etsu Chemical Co., Ltd.)

U-2

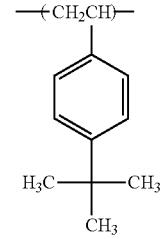

Mw = 3600 (Mw/Mn = 1.44)

U-4

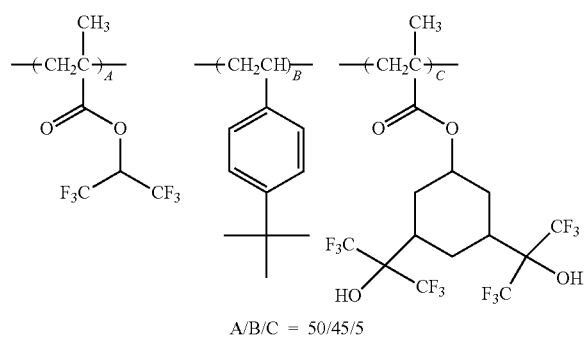

A/B/C = 50/45/5
Mw = 3400 (Mw/Mn = 1.41)

U-5

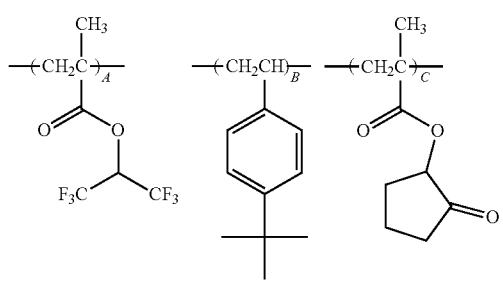

A/B/C = 50/45/5
Mw = 3600 (Mw/Mn = 1.47)

<Topcoat Coating Solvent>
SL-1: 1-butanol
SL-2: perfluoro-2-butyltetrahydrofuran As shown in Table 7, the compositions of the examples were superior in terms of the outgassing amount compared to the composition of the comparative example. In addition, when Examples 88 to 90 and 92 to 95 using the topcoat resin are compared to Example 91 not using the topcoat resin, it is found that, by adding the topcoat resin to the composition of the present invention, the composition of the present invention is superior in terms of the outgassing amount.

What is claimed is:

1. A polymer compound containing a repeating unit represented by the following General Formula (2),

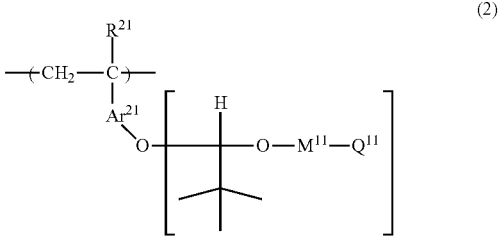

wherein in the formula,
$R^{21}$ represents a hydrogen atom or a methyl group;
$Ar^{21}$ represents an arylene group; and
a group represented by $-M^{11}-Q^{11}$ is an aryloxyalkyl group.

2. An actinic ray-sensitive or radiation-sensitive resin composition comprising:
a compound (P) that contains at least one phenolic hydroxyl group and at least one group in which a hydrogen atom of a phenolic hydroxyl group has been substituted with a group represented by the following General Formula (1),

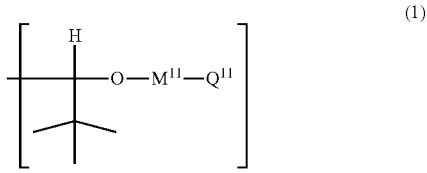

wherein in the formula,
a group represented by $-M^{11}-Q^{11}$ is an aryloxyalkyl group.

3. The composition according to claim 2,
wherein the compound (P) is a polymer compound containing a repeating unit represented by the following General Formula (2) or the following General Formula (7),

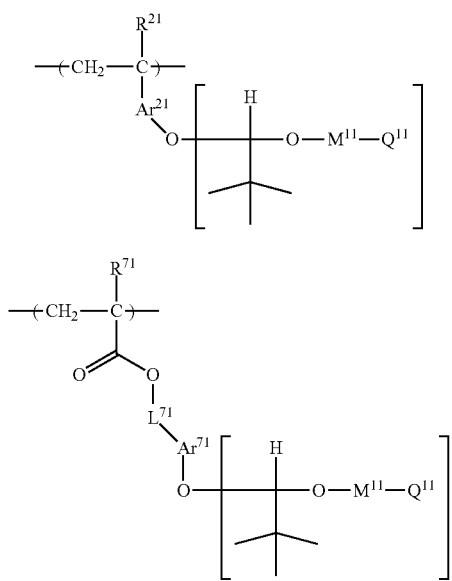

(2)

(7)

wherein in the General Formula (2),
$R^{21}$ represents a hydrogen atom or a methyl group;
$Ar^{21}$ represents an arylene group;
a group represented by -$M^{11}$-$Q^{11}$ is an aryloxyalkyl group, and
wherein in the General Formula (7),
$R^{71}$ represents a hydrogen atom or a methyl group;
$L^{71}$ represents a single bond or an alkylene group;
$Ar^{71}$ represents an arylene group;
a group represented by -M11-$Q^{11}$ is an aryloxyalkyl group.

4. The composition according to claim 3, wherein $Ar^{21}$ and $Ar^{71}$ are a phenylene group.

5. The composition according to claim 3, wherein the compound (P) contains a repeating unit represented by the following General Formula (5) or the following General Formula (6),

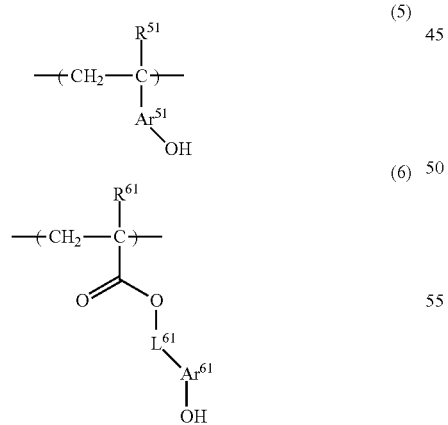

wherein in the General Formula (5),
$R^{51}$ represents a hydrogen atom or a methyl group; and
$Ar^{51}$ represents an arylene group, and
wherein in the General Formula (6),
$R^{61}$ represents a hydrogen atom or a methyl group;
$L^{61}$ represents a single bond or an alkylene group; and
$Ar^{61}$ represents an arylene group.

6. The composition according to claim 3, wherein the compound (P) further contains a non-degradable repeating unit represented by the following General Formula (3),

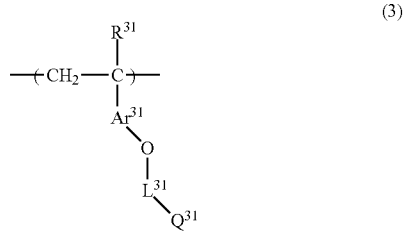

(3)

wherein in the formula,
$R^{31}$ represents a hydrogen atom or a methyl group;
$Ar^{31}$ represents an arylene group;
$L^{31}$ represents a single bond or a divalent linking group; and
$Q^{31}$ represents a cycloalkyl group or an aryl group.

7. The composition according to claim 3, wherein the compound (P) further contains a repeating unit represented by the following General Formula (4),

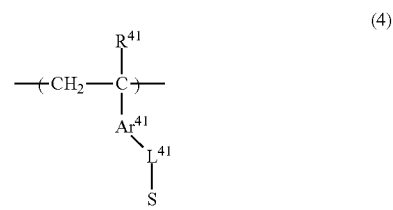

(4)

wherein in the formula,
$R^{41}$ represents a hydrogen atom or a methyl group;
$Ar^{41}$ represents an arylene group;
$L^{41}$ represents a single bond or a divalent linking group; and
S represents a structural moiety capable of degrading by actinic ray irradiation or radiation irradiation to generate an acid on a side chain.

8. The composition according to claim 2, which is exposed with an electron beam, X-rays, or EUV light.

9. An actinic ray-sensitive or radiation-sensitive film formed using the composition according to claim 2.

10. A pattern forming method comprising:
irradiating the film according to claim 9 with an actinic ray or radiation ray; and
developing the film irradiated with the actinic ray or radiation ray.

11. The pattern forming method according to claim 10, wherein an electron beam, X-rays, or EUV light is used as the actinic ray or radiation ray.

12. An actinic ray-sensitive or radiation-sensitive resin composition comprising:
a compound (P) that contains;
at least one phenolic hydroxyl group,
at least one group in which a hydrogen atom of a phenolic hydroxyl group has been substituted with a group represented by the following General Formula (1), and
a repeating unit represented by the General Formula (6), and
a hydrophobic resin that includes a repeating unit having a group which increases a dissolution rate in an alkaline developer due to the degradation of the group caused by an action of the alkaline developer,

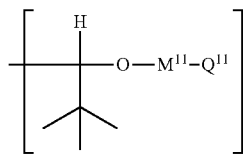
(1)

wherein in the formula (1),
$M^{11}$ represents a single bond or a divalent linking group; and
$Q^{11}$ represents an alkyl group, a cycloalkyl group or an aryl group, and

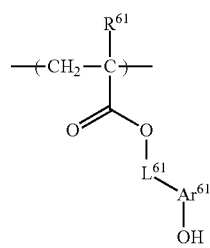
(6)

wherein in the General Formula (6),
$R^{61}$ represents a hydrogen atom or a methyl group;
$L^{61}$ represents a single bond or an alkylene group; and
$Ar^{61}$ represents an arylene group.

13. The composition according to claim 12, further comprising a repeating unit represented by the following General Formula (5),

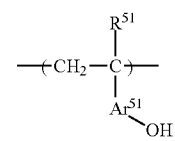
(5)

wherein in the General Formula (5),
$R^{51}$ represents a hydrogen atom or a methyl group; and
$Ar^{51}$ represents an arylene group.

* * * * *